US012424176B2

(12) United States Patent
Yu et al.

(10) Patent No.: US 12,424,176 B2
(45) **Date of Patent: *Sep. 23, 2025**

(54) DRIVING CIRCUIT, DRIVING METHOD, DRIVING MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ziyang Yu, Beijing (CN); Haijun Qiu, Beijing (CN); Ming Hu, Beijing (CN); Zhiliang Jiang, Beijing (CN); Jianpeng Wu, Beijing (CN); Tianyi Cheng, Beijing (CN); Erjin Zhao, Beijing (CN); Wenbo Chen, Beijing (CN); Sifei Ai, Beijing (CN); Cong Liu, Beijing (CN); Yonglin Guo, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/839,667

(22) PCT Filed: Dec. 18, 2023

(86) PCT No.: PCT/CN2023/139454

§ 371 (c)(1),
(2) Date: Aug. 19, 2024

(87) PCT Pub. No.: WO2024/131713

PCT Pub. Date: Jun. 27, 2024

(65) Prior Publication Data

US 2025/0166574 A1 May 22, 2025

(30) Foreign Application Priority Data

Dec. 19, 2022 (WO) ................ PCT/CN2022/140042
Dec. 19, 2022 (WO) ................ PCT/CN2022/140044
(Continued)

(51) Int. Cl.
*G09G 3/3266* (2016.01)

(52) U.S. Cl.
CPC ... *G09G 3/3266* (2013.01); *G09G 2300/0819* (2013.01); *G09G 2300/0852* (2013.01);
(Continued)

(58) Field of Classification Search
CPC ... G09G 2300/0819; G09G 2300/0842; G09G 2300/0852; G09G 2300/0861;
(Continued)

(56) References Cited

U.S. PATENT DOCUMENTS

2001/0022572 A1 9/2001 Murade
2004/0021650 A1 2/2004 Yamashita
(Continued)

FOREIGN PATENT DOCUMENTS

CN 102779478 A 11/2012
CN 104392686 A 3/2015
(Continued)

OTHER PUBLICATIONS

Exparte Quayle Action for U.S. Appl. No. 18/558,383, dated Feb. 13, 2025, 20 Pages.

(Continued)

*Primary Examiner* — Nitin Patel
*Assistant Examiner* — Amen W Bogale
(74) *Attorney, Agent, or Firm* — BROOKS KUSHMAN P.C.

(57) ABSTRACT

A driving circuit includes a first driving signal generation circuit, a first output control circuit, a first gating circuit, a
(Continued)

first first energy storage circuit, a first second energy storage circuit and a first output circuit; N is a positive integer; the first gating circuit controls to write the gating input signal into the first first node under the control of the gating control signal; the first output circuit controls to connect the Nth stage of output driving terminal and the first voltage terminal under the control of the potential of the first second node, and controls to connect the Nth stage of output driving terminal and the second voltage terminal under the control of the potential of the first third control node; the first third control node and the first second control node are different nodes.

20 Claims, 75 Drawing Sheets

(30) Foreign Application Priority Data

Dec. 19, 2022 (WO) ................ PCT/CN2022/140045
Dec. 19, 2022 (WO) ................ PCT/CN2022/140046

(52) U.S. Cl.
CPC . *G09G 2310/08* (2013.01); *G09G 2320/0247* (2013.01); *G09G 2330/021* (2013.01)

(58) Field of Classification Search
CPC ... G09G 2310/0251; G09G 2310/0289; G09G 2320/0219; G09G 2320/043; G09G 3/3233; G09G 3/3266; G09G 2310/08; G09G 2320/0247; G09G 2330/021
See application file for complete search history.

(56) References Cited

U.S. PATENT DOCUMENTS

| | | | | |
|---|---|---|---|---|
| 2011/0205196 | A1 | 8/2011 | Okuno et al. | |
| 2014/0253418 | A1 | 9/2014 | Pyun et al. | |
| 2015/0034950 | A1 | 2/2015 | Miyazawa et al. | |
| 2016/0351112 | A1 | 12/2016 | Qing et al. | |
| 2018/0082652 | A1* | 3/2018 | Lv | G09G 3/3677 |
| 2019/0304375 | A1* | 10/2019 | Kim | G09G 3/3258 |
| 2020/0184898 | A1 | 6/2020 | Choi et al. | |
| 2020/0251044 | A1 | 8/2020 | Lin et al. | |
| 2021/0193040 | A1 | 6/2021 | Na | |
| 2021/0366402 | A1* | 11/2021 | In | G09G 3/296 |
| 2022/0076618 | A1* | 3/2022 | Lai | G09G 3/3266 |
| 2022/0148509 | A1* | 5/2022 | Yamamoto | G09G 3/3233 |
| 2023/0252933 | A1* | 8/2023 | Guo | G09G 3/3266 345/55 |
| 2025/0029542 | A1* | 1/2025 | Liu | G09G 3/3266 |
| 2025/0078739 | A1* | 3/2025 | Yu | G11C 19/28 |
| 2025/0087163 | A1* | 3/2025 | Yu | G09G 3/3258 |
| 2025/0087166 | A1* | 3/2025 | Yu | G11C 19/28 |
| 2025/0104640 | A1* | 3/2025 | Yu | G09G 3/3258 |
| 2025/0124873 | A1* | 4/2025 | Yu | G09G 3/32 |

FOREIGN PATENT DOCUMENTS

| | | | |
|---|---|---|---|
| CN | 106157923 | A | 11/2016 |
| CN | 106971692 | A | 7/2017 |
| CN | 106991973 | A | 7/2017 |
| CN | 107393473 | A | 11/2017 |
| CN | 107784977 | A | 3/2018 |
| CN | 108597437 | A | 9/2018 |
| CN | 108694894 | A | 10/2018 |
| CN | 109427293 | A | 3/2019 |
| CN | 109830256 | A | 5/2019 |
| CN | 110322834 | A | 10/2019 |
| CN | 111508433 | A | 8/2020 |
| CN | 111933083 | A | 11/2020 |
| CN | 111933084 | A | 11/2020 |
| CN | 112687230 | A | 4/2021 |
| CN | 112927644 | A | 6/2021 |
| CN | 112992246 | A | 6/2021 |
| CN | 113178161 | A | 7/2021 |
| CN | 113178221 | A | 7/2021 |
| CN | 113192551 | A | 7/2021 |
| CN | 113421528 | A | 9/2021 |
| CN | 113689824 | A | 11/2021 |
| CN | 113689825 | A | 11/2021 |
| CN | 113793570 | A | 12/2021 |
| CN | 113870786 | A | 12/2021 |
| CN | 114222615 | A | 3/2022 |
| CN | 114495784 | A | 5/2022 |
| CN | 114974067 | A | 8/2022 |
| CN | 111798788 | B | 9/2022 |
| CN | 217606538 | U | 10/2022 |
| CN | 115376441 | A | 11/2022 |
| CN | 115482780 | A | 12/2022 |
| CN | 116778868 | A | 9/2023 |
| CN | 117059033 | A | 11/2023 |
| JP | 2022000833 | A | 1/2022 |
| KR | 20170079775 | A | 7/2017 |
| WO | 2021161505 | A1 | 8/2021 |
| WO | 2022252092 | A1 | 12/2022 |
| WO | 2023213175 | A1 | 11/2023 |

OTHER PUBLICATIONS

Ex Parte Quayle Office Action for U.S. Appl. No. 18/288,412, dated Jan. 8, 2025, 16 Pages.
International Search Report and Written Opinion for Application No. PCT/CN2022/140042, dated Sep. 11, 2023, 12 Pages.
International Search Report and Written Opinion for Application No. PCT/CN2022/140044, dated Aug. 30, 2023, 12 Pages.
International Search Report and Written Opinion for Application No. PCT/CN2022/140045, dated Jul. 20, 2023, 14 Pages.
International Search Report and Written Opinion for Application No. PCT/CN2022/140046, dated Aug. 18, 2023, 14 Pages.
International Search Report and Written Opinion for Application No. PCT/CN2023/139454, dated Mar. 7, 2024, 14 Pages.
International Search Report and Written Opinion for Application No. PCT/CN2024/101236, dated Sep. 18, 2024, 24 Pages.

* cited by examiner

DRIVING CIRCUIT, DRIVING METHOD, DRIVING MODULE AND DISPLAY DEVICE

CROSS-REFERENCE TO RELATED APPLICATIONS

This application is the U.S. national phase of PCT Application No. PCT/CN2023/139454 filed on Dec. 18, 2023, which claims priority to PCT Application No. PCT/CN2020/140042 filed on Dec. 19, 2022, to PCT Application No. PCT/CN2020/140044 filed on Dec. 19, 2022, to PCT Application No. PCT/CN2020/140046 filed on Dec. 19, 2022 and to PCT Application No. PCT/CN2020/140045 filed on Dec. 19, 2022, which are incorporated herein by reference in their entireties.

TECHNICAL FIELD

The present disclosure relates to the field of display technology, in particular to a driving circuit, a driving method, a driving module and a display device.

BACKGROUND

In the related art, when an organic light emitting diode (OLED) display updates the screen, it is necessary to initialize and write the pixel voltage of all rows of pixel circuits within one frame time. However, in some special screens (such as the AOD display screen, the AOD display screen is a screen that controls the partial lighting of the screen without lighting the entire mobile phone screen, static screens or rarely updated screens), most of the pixel circuits on the entire screen do not need to update the pixel voltage, that is, most of the pixel circuits can be maintained at the original display brightness through low-leakage low-temperature polycrystalline oxide (LTPO) thin-film transistor (TFT), and the repeated refresh of these pixel circuits causes a waste of power consumption.

SUMMARY

In one aspect, the present disclosure provides in some embodiments a driving circuit, including a first driving signal generation circuit, a first output control circuit, a first gating circuit, a first first energy storage circuit, a first second energy storage circuit and a first output circuit; wherein N is a positive integer; the first driving signal generation circuit is electrically connected to a first first control node, a first second control node and an Nth stage of driving signal output terminal respectively, and is configured to generate and output an Nth stage of driving signal through the Nth stage of driving signal output terminal under the control of a potential of the first first control node and a potential of the first second control node; the first output control circuit is electrically connected to a first first node, the first first control node and a first second node respectively, and is configured to control to connect the first first control node and the first second node under the control of a potential of the first first node;

the first gating circuit is electrically connected to the first first node, a gating input terminal and a gating control terminal respectively, and is configured to control to write a gating input signal provided by the gating input terminal into the first first node under the control of a gating control signal provided by the gating control terminal; the first first energy storage circuit is electrically connected to the first first node and the first second node respectively, and is configured to control a potential of the first second node according to the potential of the first first node; the first second energy storage circuit is electrically connected to a first third control node and an Nth stage of output driving terminal respectively, and is configured to control a potential of the first third control node according to an Nth stage of driving output signal provided by the Nth stage of output driving terminal; the first output circuit is electrically connected to the first second node, the first third control node, a first voltage terminal, a second voltage terminal and the Nth stage of output driving terminal respectively, and is configured to control the connection between the Nth stage of output driving terminal and the first voltage terminal under the control of the potential of the first second node, and control the connection between the Nth stage of output driving terminal and the second voltage terminal under the control of the potential of the first third control node; the first third control node and the first second control node are different nodes.

Optionally, the first gating circuit is configured to control to write the gating input signal provided by the gating input terminal into the first first node when a potential of an (N−1)th stage of the first third node is a second voltage and a potential of an Nth stage of driving signal is the second voltage.

Optionally, the first gating circuit includes a first first transistor; a gate electrode of the first first transistor is electrically connected to the gating control terminal, a first electrode of the first first transistor is electrically connected to the first first node, and a second electrode of the first first transistor is electrically connected to the gating input terminal.

Optionally, the gating control terminal includes a first gating control terminal and a second gating control terminal; the first gating circuit includes a first first transistor and a first second transistor; a gate electrode of the first first transistor is electrically connected to the first gating control terminal, a first electrode of the first first transistor is electrically connected to the first first node, and a second electrode of the first first transistor is electrically connected to a first electrode of the first second transistor; a gate electrode of the first second transistor is electrically connected to the second gating control terminal, and a second electrode of the first second transistor is electrically connected to the gating input terminal; the first gating control terminal is the Nth stage of driving signal output terminal, the second gating control terminal is the (N−1)th stage of first third node, and the first first transistor and the first second transistor are both p-type transistors; or, the first gating control terminal is the (N−1)th stage of first third node, the second gating control terminal is the Nth stage of driving signal output terminal, and the first first transistor and the first second transistor are both p-type transistors; or, the first gating control terminal is the (N−1)th stage of driving signal output terminal, the second gating control terminal is the Nth stage of driving signal output terminal, the first first transistor is an n-type transistor, and the first second transistor is a p-type transistor; or, the first gating control terminal is the Nth stage of driving signal output terminal, the second gating control terminal is the (N−1)th stage of driving signal output terminal, the first first transistor is a p-type transistor, and the first second transistor is an n-type transistor; or, the first gating control terminal is connected to an inverted signal of the (N−1)th stage of driving signal, the second gating control terminal is the Nth stage of driving signal output terminal, and the first first transistor and the first second transistor are both p-type transistors; or, the first gating control terminal is the Nth stage of driving signal output terminal, and the second gating control terminal is connected to the inverted signal of the (N−1)th stage of driving signal; the first first transistor and the first second transistor are both p-type transistors; or, the first gating control terminal is the (N−1)th stage of driving signal terminal, the second gating control terminal is connected to an inverted signal of the Nth stage of driving signal, and the first first transistor and the first second transistor are both n-type transistors; or, the first gating control terminal is connected to the inverted signal of the Nth stage of driving signal, the second gating control terminal is the (N−1)th stage of driving signal terminal, and the first first transistor and the first second transistor are both n-type transistors.

Optionally, the first first energy storage circuit includes a first first capacitor, and the first second energy storage circuit includes a first second capacitor;

a first terminal of the first first capacitor is electrically connected to the first first node, and a second terminal of the first first capacitor is electrically connected to the first second node; a first terminal of the first second capacitor is electrically connected to the first third control node, and a second terminal of the first second capacitor is electrically connected to the Nth stage of output driving terminal.

Optionally, the first output control circuit includes a first third transistor; a gate electrode of the first third transistor is electrically connected to the first first node, a first electrode of the first third transistor is electrically connected to the first first control node, and a second electrode of the first third transistor is electrically connected to the first second node.

Optionally, the driving circuit further includes a first second node control circuit; wherein the first second node control circuit is electrically connected to the first third control node, the first second node and the first voltage terminal, respectively, and is configured to control the connection between the first second node and the first voltage terminal under the control of the potential of the first third control node.

Optionally, the driving circuit further includes a first second node control circuit; wherein the first second node control circuit is electrically connected to the first third control node, the Nth stage of output driving terminal, the first second node and the first voltage terminal respectively, and is configured to control the connection between the first second node and the first voltage terminal under the control of the potential of the first third control node and the Nth stage of driving output signal provided by the Nth stage of output driving terminal.

Optionally, the first second node control circuit comprises a first fourth transistor; a gate electrode of the first fourth transistor is electrically connected to the first third control node, a first electrode of the first fourth transistor is electrically connected to the first second node, and a second electrode of the first fourth transistor is electrically connected to the first voltage terminal.

Optionally, the first second node control circuit comprises a first fourth transistor and a first control transistor; a gate electrode of the first fourth transistor is electrically connected to the first third control node, a first electrode of the first fourth transistor is electrically connected to a second electrode of the first control transistor, and a second electrode of the first fourth transistor is electrically connected to the first voltage terminal; a gate electrode of the first control transistor is electrically connected to the Nth stage of output driving terminal, and a first electrode of the first control transistor is electrically connected to the first second node.

Optionally, the first output circuit comprises a first fifth transistor, a first sixth transistor and a first third capacitor; a gate electrode of the first fifth transistor is electrically connected to the first second node, a first electrode of the first fifth transistor is electrically connected to the first voltage terminal, and a second electrode of the first fifth transistor is electrically connected to the Nth stage of output driving terminal; a gate electrode of the first sixth transistor is electrically connected to the first third control node, a first electrode of the first sixth transistor is electrically connected to the Nth stage of output driving terminal, and a second electrode of the first sixth transistor is electrically connected to the second voltage terminal; a first terminal of the first third capacitor is electrically connected to the first second node, and a second terminal of the first third capacitor is electrically connected to the first voltage terminal.

Optionally, the driving circuit further includes a first initialization circuit; wherein the first initialization circuit is electrically connected to an initial control terminal, the second voltage terminal and the first first node respectively, and is configured to control the connection between the first first node and the second voltage terminal under the control of an initial control signal provided by the initial control terminal.

Optionally, the driving circuit further includes a first first node control circuit; wherein the first first node control circuit is electrically connected to a first fourth node, the second voltage terminal and the first first node respectively, and is configured to control the connection between the first first node and the second voltage terminal under the control of a potential of the first fourth node.

Optionally, the first initialization circuit comprises a first seventh transistor; a gate electrode of the first seventh transistor is electrically connected to the initial control terminal, a first electrode of the first seventh transistor is electrically connected to the first first node, and a second electrode of the first seventh transistor is electrically connected to the second voltage terminal.

Optionally, the first first node control circuit comprises a first eighth transistor; a gate electrode of the first eighth transistor is electrically connected to the first fourth node, a first electrode of the first eighth transistor is electrically connected to the first first node, and a second electrode of the first eighth transistor is electrically connected to the second voltage terminal.

Optionally, the driving circuit further includes a first third control node control circuit; wherein the first third control node control circuit is electrically connected to the first first node, a first fifth node, the first second control node, the first third control node and a first sixth node, respectively, and is configured to control the connection between the first fifth node and the first third control node under the control of the potential of the first first node, control the connection between the first second control node and the first sixth node under the control of the potential of the first sixth node, and control the connection between the first sixth node and the first third control node.

Optionally, the first third control node control circuit includes a first ninth transistor, a first tenth transistor and a first eleventh transistor; a gate electrode of the first ninth transistor is electrically connected to the first first node, a first electrode of the first ninth transistor is electrically connected to the first fifth node, and a second electrode of the first ninth transistor is electrically connected to the first third control node; a gate electrode of the first tenth transistor and a second electrode of the first tenth transistor are both electrically connected to the first sixth node, and a first electrode of the first tenth transistor is electrically connected to the first second control node; a gate electrode of the first eleventh transistor and a first electrode of the first eleventh transistor are both electrically connected to the first sixth node, and a second electrode of the first eleventh transistor is electrically connected to the first third control node.

Optionally, the driving circuit further includes a first output pull-down circuit; wherein the first output pull-down circuit is electrically connected to the first first control node, the Nth stage of driving signal output terminal and the second voltage terminal respectively, and is configured to control the connection between the Nth stage of driving signal output terminal and the second voltage terminal under the control of the potential of the first first control node.

Optionally, the first driving signal generation circuit includes a first first driving output circuit, a first second driving output circuit, a first first control node control circuit and a first second control node control circuit; the first first control node control circuit is configured to control the potential of the first control node; the first second control node control circuit is configured to control the potential of the second control node; the first first driving output circuit is electrically connected to the first first control node, the first voltage terminal and the Nth stage of driving signal output terminal respectively, and is configured to control the connection between the Nth stage of driving signal output terminal and the first voltage terminal under the control of the potential of the first first control node; the first second driving output circuit is electrically connected to the first second control node, the second voltage terminal and the Nth stage of driving signal output terminal respectively, and is configured to control the connection between the Nth stage of driving signal output terminal and the second voltage terminal under the control of the potential of the first second control node.

Optionally, the first first control node control circuit includes a first seventh node control circuit, a first eighth node control circuit, a first third node control circuit and a first first control circuit; the first seventh node control circuit is electrically connected to a first seventh node, the second voltage terminal, a first clock signal terminal and a first fifth node respectively, and is configured to control the connection between the first seventh node and the second voltage terminal under the control of a first clock signal provided by the first clock signal terminal, and to control the connection between the first seventh node and the first clock signal terminal under the control of a potential of the first fifth node; the first eighth node control circuit is electrically connected to the second voltage terminal, a first seventh node and a first eighth node respectively, and is configured to control the connection between the first seventh node and the first eighth node under the control of the second voltage signal provided by the second voltage terminal; the first third node control circuit is electrically connected to the first eighth node, a second clock signal terminal and the first third node respectively, and is configured to control the first third node to be electrically connected to the second clock signal terminal under the control of a potential of the first eighth node, and control the potential of the first third node according to the potential of the first eighth node; the first first control circuit is electrically connected to the second clock signal terminal, the first third node, the first first control node, the first fifth node and the first voltage terminal respectively, and is configured to control the first third node to be connected to the first first control node under the control of a second clock signal provided by the second clock signal terminal, and control the first first control node to be connected to the first voltage terminal under the control of the potential of the first fifth node.

Optionally, the first second control node control circuit includes a first sixth node control circuit, a first fifth node control circuit, a first ninth node control circuit, a first fourth node control circuit and a first second control circuit; the first sixth node control circuit is electrically connected to the second voltage terminal, the first ninth node, the first sixth node and the first fourth node respectively, and is configured to control the connection between the first ninth node and the first sixth node under the control of the second voltage signal provided by the second voltage terminal, and control the potential of the first sixth node according to the potential of the first fourth node; the first fifth node control circuit is electrically connected to the (N−1)th stage of driving signal output terminal, the first clock signal terminal, the first fifth node, the initial control terminal and the first voltage terminal respectively, and is configured to control the connection between the first fifth node and the (N−1)th stage of driving signal output terminal under the control of the first clock signal provided by the first clock signal terminal, and control the first fifth node to be connected to the first voltage terminal; the first ninth node control circuit is electrically connected to the first clock signal terminal, the (N−1)th stage of driving signal output terminal and the first ninth node respectively, and is configured to control the connection between the first ninth node and the (N−1)th stage of driving signal output terminal under the control of the first clock signal provided by the first clock signal terminal; the first fourth node control circuit is electrically connected to the first seventh node, the first voltage terminal, the first fourth node, the second clock signal terminal and the first sixth node respectively, and is configured to control the connection between the first fourth node and the first voltage terminal under the control of the potential of the first seventh node, and control the connection between the first fourth node and the second clock signal terminal under the control of the potential of the first sixth node; the first second control circuit is electrically connected to the second voltage terminal, the first fifth node and the first second control node respectively, and is configured to control the connection between the first fifth node and the first second control node under the control of the second voltage signal provided by the second voltage terminal.

Optionally, the first seventh node control circuit includes a first twelfth transistor and a first thirteenth transistor, the first eighth node control circuit includes a first fourteenth transistor, the first third node control circuit includes a first fifteenth transistor and a first fourth capacitor, and the first first control circuit includes a first sixteenth transistor and a first seventeenth transistor; a gate electrode of the first twelfth transistor is electrically connected to the first clock signal terminal, a first electrode of the first twelfth transistor is electrically connected to the second voltage terminal, and a second electrode of the first twelfth transistor is electrically connected to the first seventh node; a gate electrode of the first thirteenth transistor is electrically connected to the first fifth node, a first electrode of the first thirteenth transistor is electrically connected to the first seventh node, and a second electrode of the first thirteenth transistor is electrically connected to the first clock signal terminal; a gate electrode of the first fourteenth transistor is electrically connected to the second voltage terminal, a first electrode of the first fourteenth transistor is electrically connected to the first seventh node, and a second electrode of the first fourteenth transistor is electrically connected to the first eighth node; a gate electrode of the first fifteenth transistor is electrically connected to the first eighth node, a first electrode of the first fifteenth transistor is electrically connected to the second clock signal terminal, and a second electrode of the first fifteenth transistor is electrically connected to the first third node; a first terminal of the first fourth capacitor is electrically connected to the first eighth node, and a second terminal of the first fourth capacitor is electrically connected to the first third node; a gate electrode of the first sixteenth transistor is electrically connected to the second clock signal terminal, a first electrode of the first sixteenth transistor is electrically connected to the first third node, and a second electrode of the first sixteenth transistor is electrically connected to the first first control node; a gate electrode of the first seventeenth transistor is electrically connected to the first fifth node, a first electrode of the first seventeenth transistor is electrically connected to the first first control node, and a second electrode of the first seventeenth transistor is electrically connected to the first voltage terminal.

Optionally, the first sixth node control circuit includes a first eighteenth transistor and a first fifth capacitor, the first fifth node control circuit includes a first nineteenth transistor and a first twentieth transistor, the first ninth node control circuit includes a first twenty-first transistor, the first fourth node control circuit includes a first twenty-second transistor and a first twenty-third transistor, and the first second control circuit includes a first twenty-fourth transistor; a gate electrode of the first eighteenth transistor is electrically connected to the second voltage terminal, a first electrode of the first eighteenth transistor is electrically connected to the first ninth node, and a second electrode of the first eighteenth transistor is electrically connected to the first sixth node; a first terminal of the first fifth capacitor is electrically connected to the first fourth node, and a second terminal of the first fifth capacitor is electrically connected to the first sixth node; a gate electrode of the first nineteenth transistor is electrically connected to the first clock signal terminal, a first electrode of the first nineteenth transistor is electrically connected to the (N−1) th stage of driving signal output terminal, and a second electrode of the first nineteenth transistor is electrically connected to the first fifth node; a gate electrode of the first twentieth transistor is electrically connected to the initial control terminal; a first electrode of the first twentieth transistor is electrically connected to the first voltage terminal, and a second electrode of the first twentieth transistor is electrically connected to the first fifth node; a gate electrode of the first twenty-first transistor is electrically connected to the first clock signal terminal, a first electrode of the first twenty-first transistor is electrically connected to the (N−1)th stage of driving signal output terminal, and a second electrode of the first twenty-first transistor is electrically connected to the first ninth node; a gate electrode of the first twenty-second transistor is electrically connected to the first seventh node, a first electrode of the first twenty-second transistor is electrically connected to the first voltage terminal, and a second electrode of the first twenty-second transistor is electrically connected to the first fourth node; a gate electrode of the first twenty-third transistor is electrically connected to the first sixth node, a first electrode of the first twenty-third transistor is electrically connected to the first fourth node, and a second electrode of the first twenty-third transistor is electrically connected to the second clock signal terminal; a gate electrode of the first twenty-fourth transistor is electrically connected to the second voltage terminal, a first electrode of the first twenty-fourth transistor is electrically connected to the first ninth node, and a second electrode of the first twenty-fourth transistor is electrically connected to the first second control node.

Optionally, the first first driving output circuit includes a first twenty-fifth transistor and a first sixth capacitor, and the first second driving output circuit includes a first twenty-sixth transistor and a first seventh capacitor; a gate electrode of the first twenty-fifth transistor is electrically connected to the first first control node, a first electrode of the first twenty-fifth transistor is electrically connected to the first voltage terminal, and a second electrode of the first twenty-fifth transistor is electrically connected to the Nth stage of driving signal output terminal; a first terminal of the first sixth capacitor is electrically connected to the first first control node, and a second terminal of the first sixth capacitor is electrically connected to the first voltage terminal; a gate electrode of the first twenty-sixth transistor is electrically connected to the first second control node, a first electrode of the first twenty-sixth transistor is electrically connected to the Nth stage of driving signal output terminal, and a second electrode of the first twenty-sixth transistor is electrically connected to the second voltage terminal; a first terminal of the first seventh capacitor is electrically connected to the Nth stage of driving signal output terminal, and a second terminal of the first seventh capacitor is electrically connected to the second voltage terminal.

Optionally, the first output pull-down circuit comprises a first twenty-seventh transistor; a gate electrode of the first twenty-seventh transistor is electrically connected to the first first control node, a first electrode of the first twenty-seventh transistor is electrically connected to the Nth stage of driving signal output terminal, and a second electrode of the first twenty-seventh transistor is electrically connected to the second voltage terminal.

In a second aspect, an embodiment of the present disclosure provides a driving method, applied to the driving circuit, includes: generating and outputting, by the first driving signal generation circuit, the Nth stage of driving signal through the Nth stage of driving signal output terminal under the control of the potential of the first first control node and the potential of the first second control node; controlling, by the first output control circuit, the connection between the first first control node and the first second node under the control of the potential of the first first node; controlling, by the first gating circuit, the gating input signal to be written into the first first node under the control of the gating control signal; controlling, by the first first energy storage circuit, the potential of the first second node according to the potential of the first first node; controlling, by the first second energy storage circuit, the potential of the first third control node according to the Nth stage of driving output signal provided by the Nth stage of output driving terminal; controlling, by the first output circuit, the connection between the Nth stage of output driving terminal and the first voltage terminal under the control of the potential of the first second node, and controlling the connection between the Nth stage of output driving terminal and the second voltage terminal under the control of the potential of the first third control node; wherein the first third control node and the first second control node are different nodes, and N is a positive integer.

In a third aspect, an embodiment of the present disclosure provides a driving module, including a plurality of driving circuits; wherein an Nth driving circuit is electrically connected to the driving signal output terminal of an (N−1)th driving circuit; N is a positive integer.

In a fourth aspect, an embodiment of the present disclosure provides a display device, including the driving module.

DETAILED DESCRIPTION

The technical solutions in the embodiments of the present disclosure will be clearly and completely described below with reference to the accompanying drawings in the embodiments of the present disclosure. Obviously, the described embodiments are only some of the embodiments of the present disclosure, rather than all of the embodiments. Based on the embodiments in the present disclosure, all other embodiments obtained by those of ordinary skill in the art without making creative efforts fall within the scope of protection of the present disclosure.

The transistors used in all embodiments of the present disclosure may be thin film transistors, field effect transistors, or other devices with the same characteristics. In the embodiment of the present disclosure, in order to distinguish the two electrodes of the transistor except the gate electrode, one electrode is called the first electrode and the other electrode is called the second electrode.

In actual operation, when the transistor is a thin film transistor or a field effect transistor, the first electrode may be a drain electrode, and the second electrode may be a source electrode; or, the first electrode may be a source electrode, the second electrode may be a drain electrode.

Figure 1:
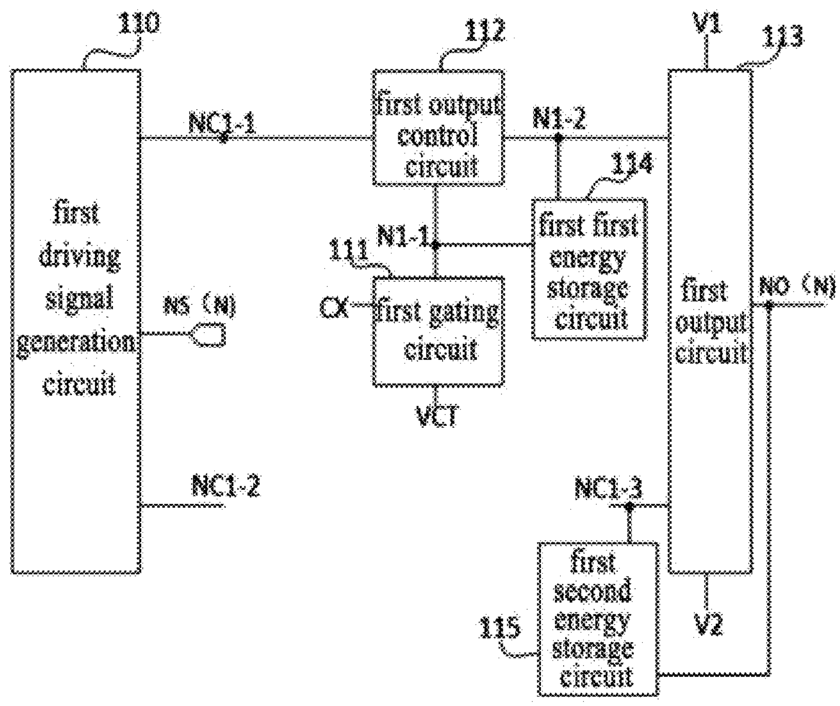
FIG. 1 is a structural diagram of a driving circuit according to an embodiment of the present disclosure.

As shown in FIG. 1, the driving circuit according to the embodiment of the present disclosure includes a first driving signal generation circuit 110, a first gating circuit 111, a first output control circuit 112, a first output circuit 113, a first first energy storage circuit 114 and a first second energy storage circuit 115; N is a positive integer;

The first driving signal generation circuit 110 is electrically connected to the first first control node NC1-1, the first second control node NC1-2 and the Nth stage of driving signal output terminal NS (N) respectively, and is configured to generate and output the Nth stage of driving signal through the Nth stage of driving signal output terminal NS (N) under the control of the potential of the first first control node NC1-1 and the potential of the first second control node NC1-2;

The first gating circuit 111 is electrically connected to the first first node N1-1, the gating input terminal VCT and the gating control terminal CX respectively, and is configured to control to write the gating input signal provided by the gating input terminal VCT into the first first node N1-1 under the control of the gating control signal provided by the gating control terminal CX;

The first output control circuit 112 is electrically connected to the first first node N1-1, the first first control node NC1-1 and the first second node N1-2 respectively, and is configured to control to connect the first first control node NC1-1 and the first second node N1-2 under the control of the potential of the first first node N1-1;

The first first energy storage circuit 114 is electrically connected to the first first node N1-1 and the first second node N1-2 respectively, and is configured to control the potential of the first second node N1-2 according to the potential of the first first node N1-1;

The first second energy storage circuit 115 is electrically connected to the first third control node NC1-3 and the Nth stage of output driving terminal NO (N) respectively, and is configured to control the potential of the first third control node NC1-3 according to the Nth stage of driving output signal provided by the Nth stage of output driving terminal NO (N);

The first output The circuit 113 is electrically connected to the first second node N1-2, the first third control node NC1-3, the first voltage terminal V1, the second voltage terminal V2 and the Nth stage of output driving terminal NO (N) respectively, and is configured to control the connection between the Nth stage of output driving terminal NO (N) and the first voltage terminal V1 under the control of the potential of the first second node N1-2, and control the connection between the Nth stage of output driving terminal NO (N) and the second voltage terminal V2 under the control of the potential of the first third control node NC1-3;

The first third control node NC1-3 and the first second control node NC1-2 are different nodes.

When the driving circuit shown in FIG. 1 of the present disclosure is working, the first driving signal generation circuit 110 generates and outputs the Nth stage of driving signal through the Nth stage of driving signal output terminal NS (N) under the control of the potential of the first first control node NC1-1 and the potential of the first second control node NC1-2; the first gating circuit 111 controls to write the gating input signal provided by the gating input terminal VCT into the first first node N1-1 under the control of the gating control signal provided by the gating control terminal CX; the first output control circuit 112 controls to connect the first first control node NC1-1 and the first second node NC1-2 under the control of the potential of the first first node N1-1; the first first energy storage circuit 114 controls the potential of the first second node N1-2 according to the potential of the first first node N1-1; the first second energy storage circuit 115 controls the potential of the first third control node NC1-3 according to the Nth stage of driving output signal provided by the Nth stage of output driving terminal NO (N); the first output circuit 113 controls the connection between the Nth stage of output driving terminal NO (N) and the first voltage terminal V1 under the control of the potential of the first second node N1-2, and controls the connection between the Nth stage of output driving terminal NO (N) and the second voltage terminal V2 under the control of the potential of the first third control node NC1-3.

Optionally, the first voltage terminal can be a high voltage terminal, but is not limited to this.

The driving circuit shown in FIG. 1 of the present disclosure can be an Nth stage of driving circuit.

When the driving circuit shown in FIG. 1 of the present disclosure is working, within one frame time, before the Nth stage of driving signal providing phase, the first gating circuit 111 writes the gating input signal provided by the gating input terminal VCT into the first first node N1-1 under the control of the gating control signal;

when the gating input signal is a high voltage signal, in the Nth stage of driving signal providing phase, the Nth stage of driving signal output terminal NS (N) outputs a high voltage signal, the potential of the first first node N1-1 is a high voltage, the first output control circuit 112 controls the first first control node NC1-1 to be disconnected from the first second node N1-2 under the control of the potential of the first first node N1-1, the first first energy storage circuit 114 controls the potential of the first second node N1-2 to be a high voltage according to the potential of the first first node N1-1, and the first output circuit 113 controls the output driving terminal NO (N) to maintain to output the low voltage signal, which can control the corresponding row of pixel circuits not to update the pixel voltage;

When the gating input signal is a low voltage signal, in the Nth stage of driving signal providing phase, the Nth stage of driving signal output terminal NS (N) outputs a high voltage signal, the potential of the first first node N1-1 is a low voltage, and the first output control circuit 112 controls the connection between the first first control node NC1-1 and the first second node N1-2 under the control of the potential of the first first node N1-1, so that the potential of the first second node N1-2 is a low voltage, and the first output circuit 113 controls the connection between the output driving terminal NO (N) and the first voltage terminal V1 under the control of the potential of the first second node N1-2, so that NO (N) outputs a high voltage signal, which can control the corresponding row of pixel circuits to update the pixel voltage.

When the driving circuit shown in FIG. 1 of the present disclosure is working, when the potential of the Nth stage of driving output signal provided by NO (N) is reduced from a high voltage to a low voltage, the potential of the first third control node NC1-3 can be pulled down, so that the transistor whose gate electrode is electrically connected to the first third control node NC1-3 included in the first output circuit 113 can be better turned on, and the potential of the Nth stage of driving output signal is maintained at a low voltage.

The embodiment of the present disclosure can realize the update of the partial screen of the display screen by controlling the gating input signal provided by the gating input terminal VCT, thereby reducing power consumption, or realize ultra-low power consumption of OLED display products such as wearable products, mobile terminals, NB (laptop computers) by partial updating of the display screen.

Figure 2:
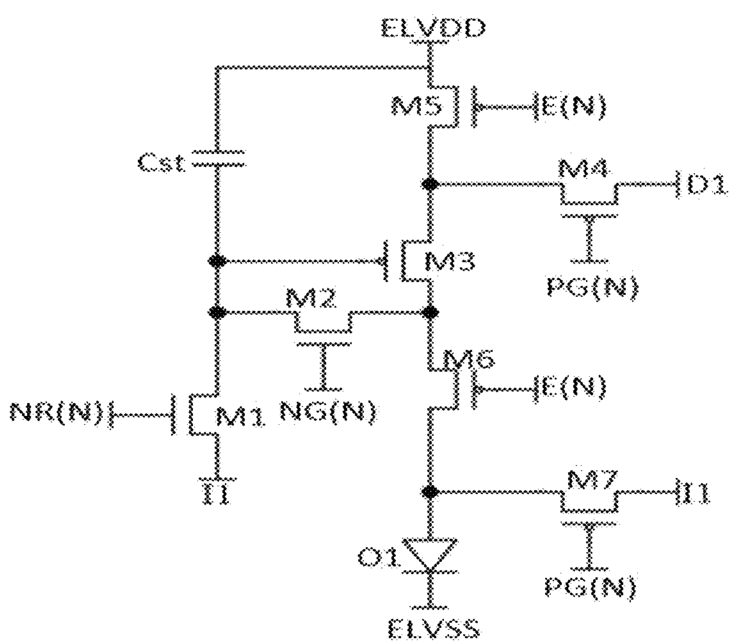
FIG. 2 is a circuit diagram of a related pixel circuit.

As shown in FIG. 2, the relevant pixel circuit may include a first display control transistor M1, a second display control transistor M2, a driving transistor M3, a fourth display control transistor M4, a fifth display control transistor M5, a sixth display control transistor M6, a seventh display control transistor M7, a storage capacitor Cst and an organic light emitting diode O1;

The gate electrode of M1 is electrically connected to the first reset terminal NR (N), the source electrode of M1 is electrically connected to the initial voltage terminal I1, and the drain electrode of M1 is electrically connected to the gate electrode of M3;

The gate electrode of M2 is electrically connected to the first scanning terminal NG (N), the source electrode of M2 is electrically connected to the gate electrode of M3, and the drain electrode of M2 is electrically connected to the drain electrode of M3;

The gate electrode of M4 is electrically connected to the second scanning terminal PG (N), the source electrode of M4 is electrically connected to the data line D1, and the drain electrode of M4 is electrically connected to the source electrode of M3;

The gate electrode of M5 is electrically connected to the light emitting control terminal E (N), the source electrode of M5 is electrically connected to the power supply voltage terminal ELVDD, and the drain electrode of M5 is electrically connected to the source electrode of M3;

The gate electrode of M6 is electrically connected to the light emitting control terminal E (N), the source electrode of M6 is electrically connected to the drain electrode of M3, and the drain electrode of M6 is electrically connected to the anode of O1; the cathode of O1 is electrically connected to the low stage of terminal ELVSS;

The gate electrode of M7 is electrically connected to the second scanning terminal PG (N), the source electrode of M7 is electrically connected to the initial voltage terminal I1, and the drain electrode of M7 is electrically connected to the anode of O1.

In the specific implementation, the first reset terminal NR (N) can be the (N−1)th stage of first scanning terminal NG (N), but it is not limited to this.

In the relevant pixel circuit shown in FIGS. 2, M1 and M2 are n-type transistors, M3, M4, M5, M6 and M7 are all p-type transistors, M1 and M2 are IGZO TFTs with small leakage current, and M3, M4, M5, M6 and M7 are all LTPS TFTs.

In the relevant pixel circuit shown in FIGS. 2, M1 and M2 are IGZO TFTs. When using low-frequency display, IGZO TFTs can ensure that Cst can maintain the voltage of the gate electrode of M3 for a long time.

In the relevant pixel circuit shown in FIG. 2, the second scanning terminal PG (N) is responsible for resetting the voltage of the anode of O1 and writing the data voltage on the data line into the source electrode of the driving transistor, and the first scanning terminal NG (N) is responsible for resetting Cst, extracting Vth (Vth is the threshold voltage of the driving transistor) and writing the data voltage into the gate electrode of the driving transistor.

In the specific implementation, the first scanning signal provided by the first scanning terminal NG (N) and the second scanning signal provided by the second scanning terminal PG (N) can be mutually inverted, but not limited to this.

The driving circuit according to at least one embodiment of the present disclosure can provide a first scanning signal to the first scanning terminal NG (N) through the output driving terminal NO (N), but is not limited to this.

Figure 3:
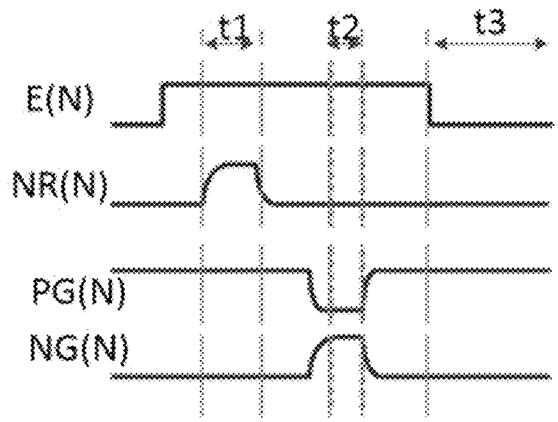
FIG. 3 is a working timing diagram of a related pixel circuit shown in FIG. 2.

As shown in FIG. 3, when the relevant pixel circuit shown in FIG. 2 is working, the display period may include a first display control phase t1, a second display control phase t2 and a third display control phase t3 which are set successively;

In the first display control phase t1, E (N) outputs a high voltage signal, NR (N) provides a high voltage signal, PG (N) provides a high voltage signal, NG (N) provides a low voltage signal, M5 and M6 are turned off, M1 is turned on, and the potential of the gate electrode of M3 is pulled down to the initial voltage Vinit; the initial voltage terminal I1 is configured to provide the initial voltage Vinit;

In the second display control phase t2, E (N) outputs a high voltage signal, NR (N) provides a low voltage signal, PG (N) provides a low voltage signal, NG (N) provides a high voltage signal, M5 and M6 are turned off, M1 is turned off, M2 is turned on, M4 is turned on, M2 and M3 form a diode structure, and the data voltage Vdata provided by the data line D1 charges Cst until M3 is turned off, at this time the gate voltage of M3 is Vdata+Vth, and Vth is the threshold voltage of M3; M7 is turned on to reset the anode voltage of O1;

In the third display control phase t3, E (N) outputs a low voltage signal, NR (N) provides a low voltage signal, PG (N) provides a high voltage signal, NG (N) provides a low voltage signal, M5 and M6 are turned on, and M3 drives O1 to emit light; O1 emits light according to the voltage setting of Vdata.

From the working process of the above related pixel circuit, it can be seen that NG (N) can control whether the data voltage Vdata (the data voltage Vdata can be the pixel voltage) is written to the gate electrode of M3 in the second display control phase.

Figure 4:
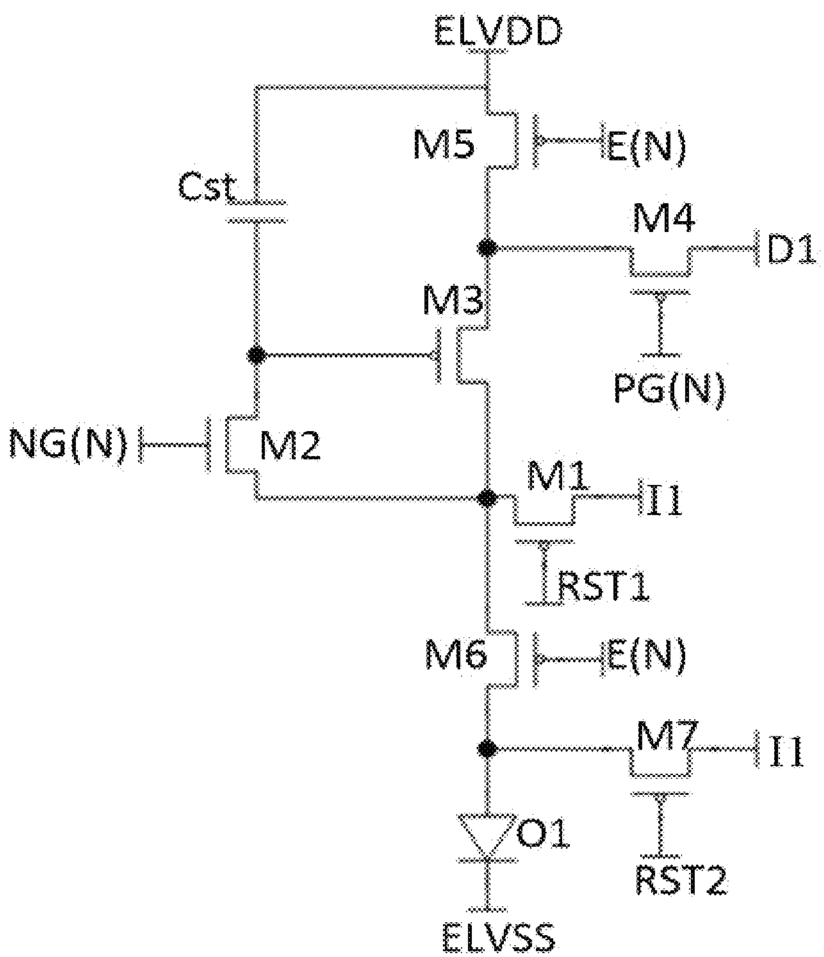
FIG. 4 is a circuit diagram of a related pixel circuit.

FIG. 4 is a circuit diagram of the related pixel circuit.

As shown in FIG. 4, the relevant pixel circuit may include a first display control transistor M1, a second display control transistor M2, a driving transistor M3, a fourth display control transistor M4, a fifth display control transistor M5, a sixth display control transistor M6, a seventh display control transistor M7, a storage capacitor Cst and an organic light emitting diode O1;

- The gate electrode of M1 is electrically connected to the third reset terminal RST1, the source electrode of M1 is electrically connected to the initial voltage terminal I1, and the drain electrode of M1 is electrically connected to the drain electrode of M3;
- The gate electrode of M2 is electrically connected to the first scanning terminal NG (N), the source electrode of M2 is electrically connected to the gate electrode of M3, and the drain electrode of M2 is electrically connected to the drain electrode of M3;
- The gate electrode of M4 is electrically connected to the second scanning terminal PG (N), the source electrode of M4 is electrically connected to the data line D1, and the drain electrode of M4 is electrically connected to the source electrode of M3;
- The gate electrode of M5 is electrically connected to the light emitting control terminal E (N), the source electrode of M5 is electrically connected to the power supply voltage terminal ELVDD, and the drain electrode of M5 is electrically connected to the source electrode of M3;
- The gate electrode of M6 is electrically connected to the light emitting control terminal E (N), the source electrode of M6 is electrically connected to the drain electrode of M3, and the drain electrode of M6 is electrically connected to the anode of O1; the cathode of O1 is electrically connected to the low stage of terminal ELVSS;
- The gate electrode of M7 is electrically connected to the fourth reset terminal RST2, the source electrode of M7 is electrically connected to the initial voltage terminal I1, and the drain electrode of M7 is electrically connected to the anode of O1.

When the relevant pixel circuit shown in FIG. 4 is working, NG (N) can control whether the data voltage Vdata on the data line D1 is written to the gate electrode of the driving transistor M3.

In specific implementation, the first scanning signal provided by NG (N) can be configured to control to turn on or off the first second transistor to control whether the data voltage on the data line is written into the gate electrode of the driving transistor, thereby controlling whether the brightness of the pixel circuit of this row is updated; when NG (N) outputs a high voltage signal, the first second transistor is turned on, and the brightness of the pixel circuit of this row can be updated; when NG (N) outputs a low voltage signal, the first second transistor is always turned off, and the change of the data voltage on the data line will not be written into the gate electrode of the driving transistor, and the brightness of the organic light emitting diode will not change, that is, the display brightness of the pixel circuit of the current row in the current frame remains unchanged. In summary, it can be seen that the pixel brightness can be refreshed by controlling the on or off of the N-type transistor, so when it is desired to not to refresh of some pixels, it is sufficient to ensure that the N-type transistor is turned off.

In at least one embodiment of the present disclosure, the first gating circuit is configured to control to write the gating input signal provided by the gating input terminal into the first first node when the potential of the (N−1)th stage of the first third node is the second voltage and the potential of the Nth stage of driving signal is the second voltage.

Optionally, the second voltage may be a low voltage, but is not limited thereto.

Optionally, the first gating circuit includes a first first transistor; the gate electrode of the first first transistor is electrically connected to the gating control terminal, the first electrode of the first first transistor is electrically connected to the first first node, and the second electrode of the first first transistor is electrically connected to the gating input terminal.

Figure 5:
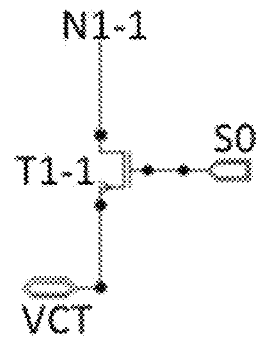
FIG. 5 is a circuit diagram of a first gating circuit in a driving circuit according to an embodiment of the present disclosure.

As shown in FIG. 5, the first gating circuit may include a first first transistor T1-1;

- The gate electrode of the first first transistor T1-1 is electrically connected to the gating control terminal S0, the drain electrode of the first first transistor T1-1 is electrically connected to the first first node N1-1, and the source electrode of the first first transistor T1-1 is electrically connected to the gating input terminal VCT;
- T1-1 is a p-type transistor.

Figure 6:
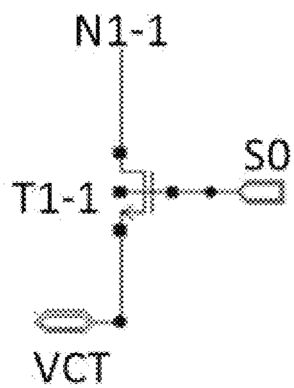
FIG. 6 is a circuit diagram of a first gating circuit in a driving circuit according to an embodiment of the present disclosure.

As shown in FIG. 6, the first gating circuit may include a first first transistor T1-1;

- The gate electrode of the first first transistor T1-1 is electrically connected to the gating control terminal S0, the source electrode of the first first transistor T1-1 is electrically connected to the first first node N1-1, and the drain electrode of the first first transistor T1-1 is electrically connected to the gating input terminal VCT;
- T1-1 is an n-type transistor.

Optionally, the gating control terminal includes a first gating control terminal and a second gating control terminal; the first gating circuit includes a first first transistor and a first second transistor;

- a gate electrode of the first first transistor is electrically connected to the first gating control terminal, a first electrode of the first first transistor is electrically connected to the first first node, and a second electrode of the first first transistor is electrically connected to a first electrode of the first second transistor;
- a gate electrode of the first second transistor is electrically connected to the second gating control terminal, and a second electrode of the first second transistor is electrically connected to the gating input terminal;
- The first gating control terminal is the Nth stage of driving signal output terminal, the second gating control terminal is the (N−1)th stage of first third node, and the first first transistor and the first second transistor are both p-type transistors; or,
- The first gating control terminal is the (N−1)th stage of first third node, the second gating control terminal is the Nth stage of driving signal output terminal, and the first first transistor and the first second transistor are both p-type transistors; or,
- the first gating control terminal is the (N−1)th stage of driving signal output terminal, the second gating control terminal is the Nth stage of driving signal output terminal, the first first transistor is an n-type transistor, and the first second transistor is a p-type transistor; or,
- the first gating control terminal is the Nth stage of driving signal output terminal, the second gating control terminal is the (N−1)th stage of driving signal output terminal, the first first transistor is a p-type transistor, and the first second transistor is an n-type transistor; or,
- the first gating control terminal is connected to the inverted signal of the (N−1)th stage of driving signal, the second gating control terminal is the Nth stage of driving signal output terminal, and the first first transistor and the first second transistor are both p-type transistors; or, the first gating control terminal is the Nth stage of driving signal output terminal, and the second gating control terminal is connected to the inverted signal of the (N−1)th stage of driving signal; the first first transistor and the first second transistor are both p-type transistors; or, the first gating control terminal is the (N−1)th stage of driving signal terminal, the second gating control terminal is connected to the inverted signal of the Nth stage of driving signal, and the first first transistor and the first second transistor are both n-type transistors; or, the first gating control terminal is connected to the inverted signal of the Nth stage of driving signal, the second gating control terminal is the (N−1)th stage of driving signal terminal, and the first first transistor and the first second transistor are both n-type transistors.

Figure 7:
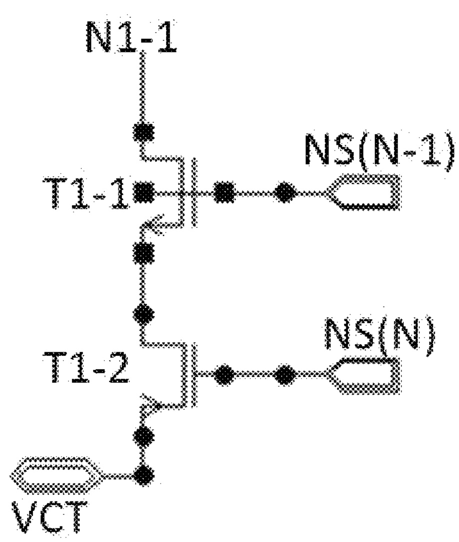
FIG. 7 is a circuit diagram of a first gating circuit in a driving circuit according to an embodiment of the present disclosure.

As shown in FIG. 7, the first gating circuit may include a first first transistor T1-1 and a first second transistor T1-2;

The gate electrode of the first first transistor T1-1 is electrically connected to the (N−1) th stage of driving signal output terminal NS (N−1), the source electrode of the first first transistor T1-1 is electrically connected to the first first node N1-1, and the drain electrode of the first first transistor T1-1 is electrically connected to the drain electrode of the first second transistor T1-2;

The gate electrode of the first second transistor T1-2 is electrically connected to the Nth stage of driving signal output terminal NS (N), and the source electrode of the first second transistor T1-2 is electrically connected to the gating input terminal VCT;

T1-1 is an n-type transistor, and T1-2 is a p-type transistor.

Figure 8:
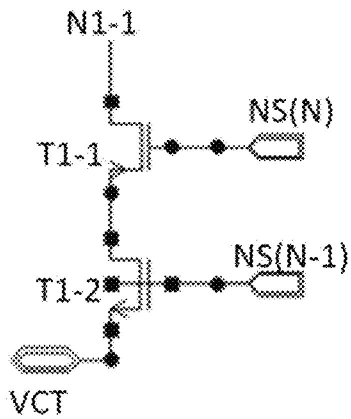
FIG. 8 is a circuit diagram of a first gating circuit in a driving circuit according to an embodiment of the present disclosure.

As shown in FIG. 8, the first gating circuit may include a first first transistor T1-1 and a first second transistor T1-2;

The gate electrode of the first first transistor T1-1 is electrically connected to the Nth stage of driving signal output terminal NS (N), the drain electrode of the first first transistor T1-1 is electrically connected to the first first node N1-1, and the source electrode of the first first transistor T1-1 is electrically connected to the source electrode of the first second transistor T1-2;

The gate electrode of the first second transistor T1-2 is electrically connected to the (N−1)th stage of driving signal output terminal NS (N−1), and the drain electrode of the first second transistor T1-2 is electrically connected to the gating input terminal VCT;

T1-1 is a p-type transistor, and T1-2 is an n-type transistor.

Figure 9:
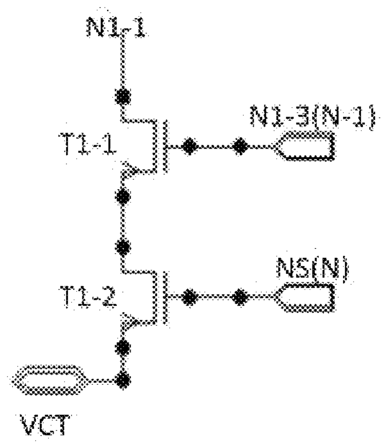
FIG. 9 is a circuit diagram of a first gating circuit in a driving circuit according to an embodiment of the present disclosure.

As shown in FIG. 9, the first gating circuit may include a first first transistor T1-1 and a first second transistor T1-2;

The gate electrode of the first first transistor T1-1 is electrically connected to the (N−1) th stage of first third node N1-3 (N−1), the drain electrode of the first first transistor T1-1 is electrically connected to the first first node N1-1, and the source electrode of the first first transistor T1-1 is electrically connected to the drain electrode of the first second transistor T1-2;

The gate electrode of the first second transistor T1-2 is electrically connected to the Nth stage of driving signal output terminal NS (N), and the source electrode of the first second transistor T1-2 is electrically connected to the gating input terminal VCT;

T1-1 is a p-type transistor, and T1-2 is a p-type transistor.

In at least one embodiment of the present disclosure, the (N−1)th stage of first third node N1-3 (N−1) may be the first third node in the (N−1)th stage of driving circuit.

Figure 10:
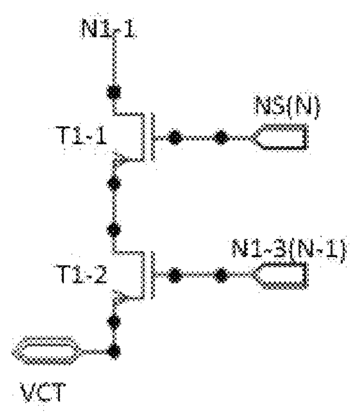
FIG. 10 is a circuit diagram of a first gating circuit in a driving circuit according to an embodiment of the present disclosure.

As shown in FIG. 10, the first gating circuit may include a first first transistor T1-1 and a first second transistor T1-2;

The gate electrode of the first first transistor T1-1 is electrically connected to the Nth stage of driving signal output terminal NS (N), the drain electrode of the first first transistor T1-1 is electrically connected to the first first node N1-1, and the source electrode of the first first transistor T1-1 is electrically connected to the drain electrode of the first second transistor T1-2;

The gate electrode of the first second transistor T1-2 is electrically connected to the (N−1)th stage of first third node N1-3 (N−1), and the source electrode of the first second transistor T1-2 is electrically connected to the gating input terminal VCT;

T1-1 is a p-type transistor, and T1-2 is a p-type transistor.

Figure 11:
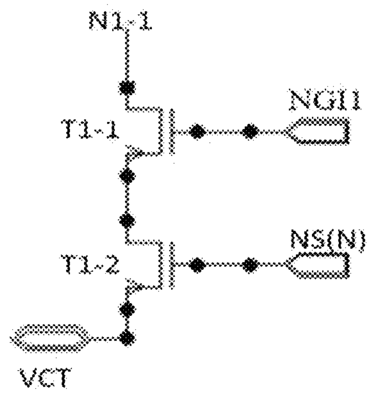
FIG. 11 is a circuit diagram of a first gating circuit in a driving circuit according to an embodiment of the present disclosure.

As shown in FIG. 11, the first gating circuit may include a first first transistor T1-1 and a first second transistor T1-2;

The gate electrode of the first first transistor T1-1 is electrically connected to the first inverted driving signal terminal NGI1, the drain electrode of the first first transistor T1-1 is electrically connected to the first first node N1-1, and the source electrode of the first first transistor T1-1 is electrically connected to the drain electrode of the first second transistor T1-2; the first inverted driving signal provided by the first inverted driving signal terminal NGI1 is inverted in phase to the (N−1)th stage of driving signal provided by the (N−1)th stage of driving signal output terminal NS (N−1);

The gate electrode of the first second transistor T1-2 is electrically connected to the Nth stage of driving signal output terminal NS (N), and the source electrode of the first second transistor T1-2 is electrically connected to the gating input terminal VCT;

T1-1 is a p-type transistor, and T1-2 is a p-type transistor.

Figure 12:
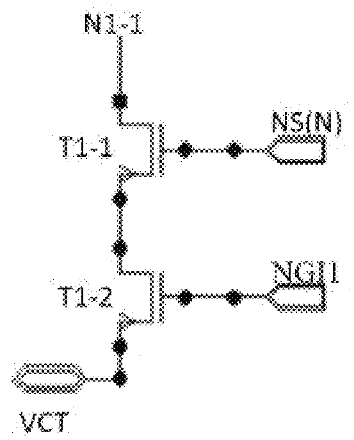
FIG. 12 is a circuit diagram of the first gating circuit in the driving circuit according to the embodiment of the present disclosure.

As shown in FIG. 12, the first gating circuit may include a first first transistor T1-1 and a first second transistor T1-2;

The gate electrode of the first first transistor T1-1 is electrically connected to the Nth stage of driving signal output terminal NS (N), the drain electrode of the first first transistor T1-1 is electrically connected to the first first node N1-1, and the source electrode of the first first transistor T1-1 is electrically connected to the drain electrode of the first second transistor T1-2;

The gate electrode of the first second transistor T1-2 is electrically connected to the first inverted driving signal terminal NGI1, and the source electrode of the first second transistor T1-2 is electrically connected to the gating input terminal VCT; the first inverted driving signal provided by the first inverted driving signal terminal NGI1 is inverted in phase to the (N−1)th stage of driving signal provided by the (N−1)th stage of driving signal output terminal NS (N−1);

T1-1 is a p-type transistor, and T1-2 is a p-type transistor.

Figure 13:
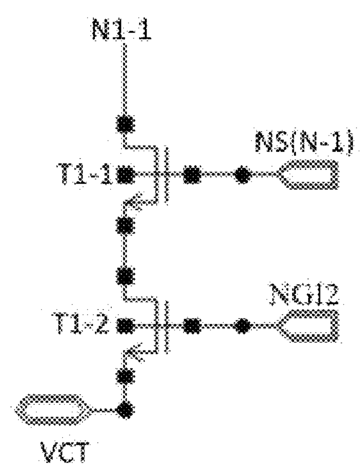
FIG. 13 is a circuit diagram of the first gating circuit in the driving circuit according to the embodiment of the present disclosure.

As shown in FIG. 13, the first gating circuit may include a first first transistor T1-1 and a first second transistor T1-2;

The gate electrode of the first first transistor T1-1 is electrically connected to the (N−1) th stage of driving signal output terminal NS (N−1), the source electrode of the first first transistor T1-1 is electrically connected to the first first node N1-1, and the drain electrode of the first first transistor T1-1 is electrically connected to the source electrode of the first second transistor T1-2;

The gate electrode of the first second transistor T1-2 is electrically connected to the second inverted driving signal terminal NGI2, and the drain electrode of the first second transistor T1-2 is electrically connected to the gating input terminal VCT; the second inverted driving signal provided by the second inverted driving signal terminal NGI2 is inverted in phase to the Nth stage of driving signal provided by the Nth stage of driving signal output terminal NS (N);

T1-1 is an n-type transistor, and T1-2 is an n-type transistor.

Figure 14:
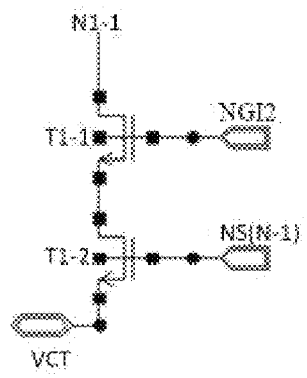
FIG. 14 is a circuit diagram of the first gating circuit in the driving circuit according to the embodiment of the present disclosure.

As shown in FIG. 14, the first gating circuit may include a first first transistor T1-1 and a first second transistor T1-2;

The gate electrode of the first first transistor T1-1 is electrically connected to the second inverted driving signal terminal NGI2, the source electrode of the first first transistor T1-1 is electrically connected to the first first node N1-1, and the drain electrode of the first first transistor T1-1 is electrically connected to the source electrode of the first second transistor T1-2; the second inverted driving signal provided by the second inverted driving signal terminal NGI2 is inverted in phase to the Nth stage of driving signal provided by the Nth stage of driving signal output terminal NS (N);

The gate electrode of the first second transistor T1-2 is electrically connected to the (N−1)th stage of driving signal output terminal NS (N−1), and the drain electrode of the first second transistor T1-2 is electrically connected to the gating input terminal VCT;

T1-1 is an n-type transistor, and T1-2 is an n-type transistor.

Figure 15:
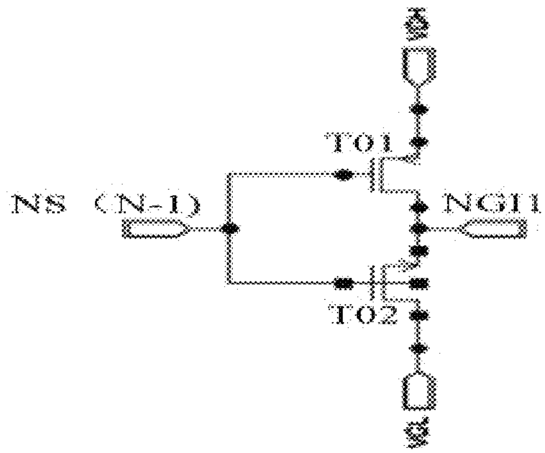
FIG. 15 is a circuit diagram of the first inverter according to at least one embodiment of the present disclosure.

As shown in FIG. 15, the (N−1)th stage of driving signal provided by the (N−1)th stage of driving signal output terminal NS (N−1) can be inverted by the first inverter to obtain the first inverted driving signal provided by the first inverted driving signal terminal NGI1;

The first inverter includes a first inverting control transistor T01 and a second inverting control transistor T02;

T01 is a p-type transistor, and T02 is an n-type transistor.

Figure 16:
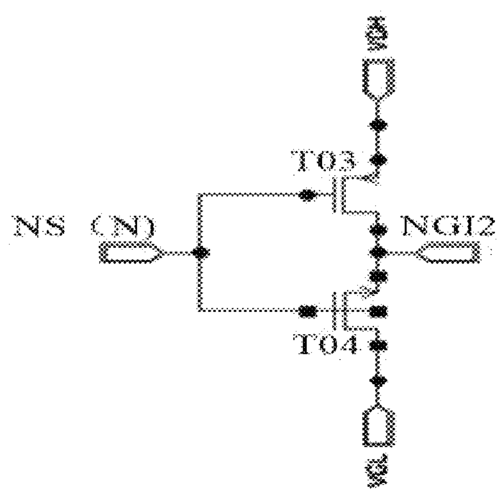
FIG. 16 is a circuit diagram of the second inverter according to at least one embodiment of the present disclosure.

As shown in FIG. 16, the Nth stage of driving signal provided by the Nth stage of driving signal output terminal NS (N) can be inverted by the second inverter to obtain the second inverted driving signal provided by the second inverted driving signal terminal NGI2;

The second inverter includes a third inverting control transistor T03 and a fourth inverting control transistor T04;

T03 is a p-type transistor, and T04 is an n-type transistor.

In at least one embodiment of the present disclosure, the first first energy storage circuit includes a first first capacitor, and the first second energy storage circuit includes a first second capacitor;

a first terminal of the first first capacitor is electrically connected to the first first node, and a second terminal of the first first capacitor is electrically connected to the first second node;

a first terminal of the first second capacitor is electrically connected to the first third control node, and a second terminal of the first second capacitor is electrically connected to the Nth stage of output driving terminal.

Optionally, the first output control circuit includes a first third transistor;

a gate electrode of the first third transistor is electrically connected to the first first node, a first electrode of the first third transistor is electrically connected to the first first control node, and a second electrode of the first third transistor is electrically connected to the first second node.

The driving circuit according to at least one embodiment of the present disclosure may also include a first second node control circuit;

The first second node control circuit is electrically connected to the first third control node, the first second node and the first voltage terminal, respectively, and is configured to control the connection between the first second node and the first voltage terminal under the control of the potential of the first third control node.

In a specific implementation, the driving circuit may further include a first second node control circuit;

The first second node control circuit controls the connection between the first second node and the first voltage terminal under the control of the potential of the first third control node.

Figure 17A:
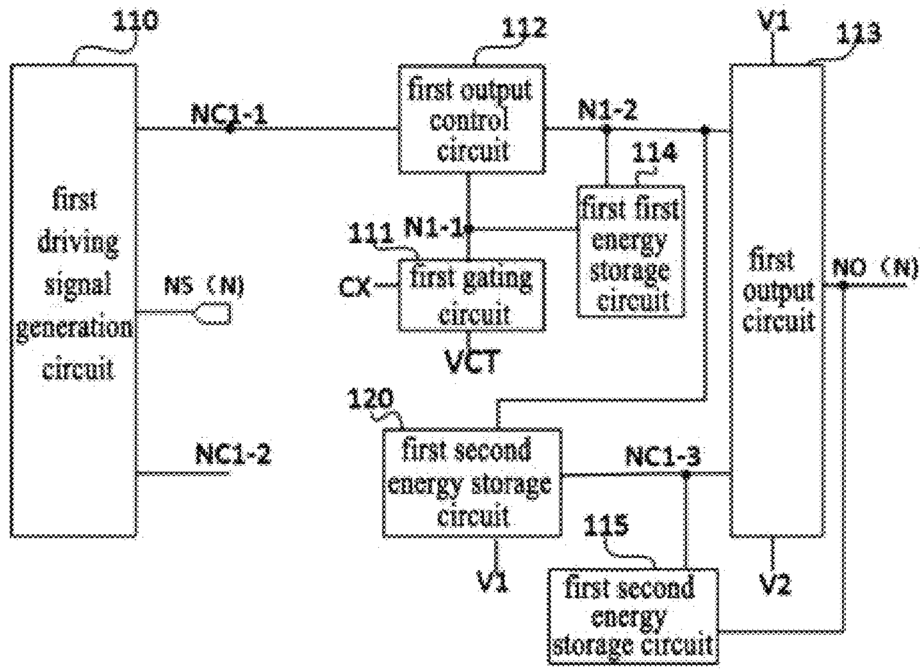
FIG. 17A is a structural diagram of the driving circuit according to at least one embodiment of the present disclosure.

As shown in FIG. 17A, based on the embodiment of the driving circuit shown in FIG. 1, the driving circuit further includes a first second node control circuit 120;

The first second node control circuit 120 is electrically connected to the first third control node NC1-3, the first second node N1-2 and the first voltage terminal V1, respectively, and is configured to control the connection between the first second node N1-2 and the first voltage terminal V1 under the control of the potential of the first third control node NC1-3.

When at least one embodiment of the driving circuit shown in FIG. 17A is in operation, when the potential of the first third control node NC1-3 is an effective voltage, the potential of the first second node N1-2 may be a first voltage.

Optionally, the first second node control circuit includes a first fourth transistor;

a gate electrode of the first fourth transistor is electrically connected to the first third control node, a first electrode of the first fourth transistor is electrically connected to the first second node, and a second electrode of the first fourth transistor is electrically connected to the first voltage terminal.

The driving circuit according to at least one embodiment of the present disclosure may also include a first second node control circuit;

The first second node control circuit is electrically connected to the first third control node, the Nth stage of output driving terminal, the first second node and the first voltage terminal, respectively, and is configured to control the connection between the first second node and the first voltage terminal under the control of the potential of the first third control node and the Nth stage of driving output signal provided by the Nth stage of output driving terminal.

In specific implementation, the driving circuit may also include a first second node control circuit;

The first second node control circuit controls the connection between the first second node and the first voltage terminal under the control of the potential of the first third control node and the Nth stage of driving output signal provided by the Nth stage of output driving terminal.

Figure 17B:
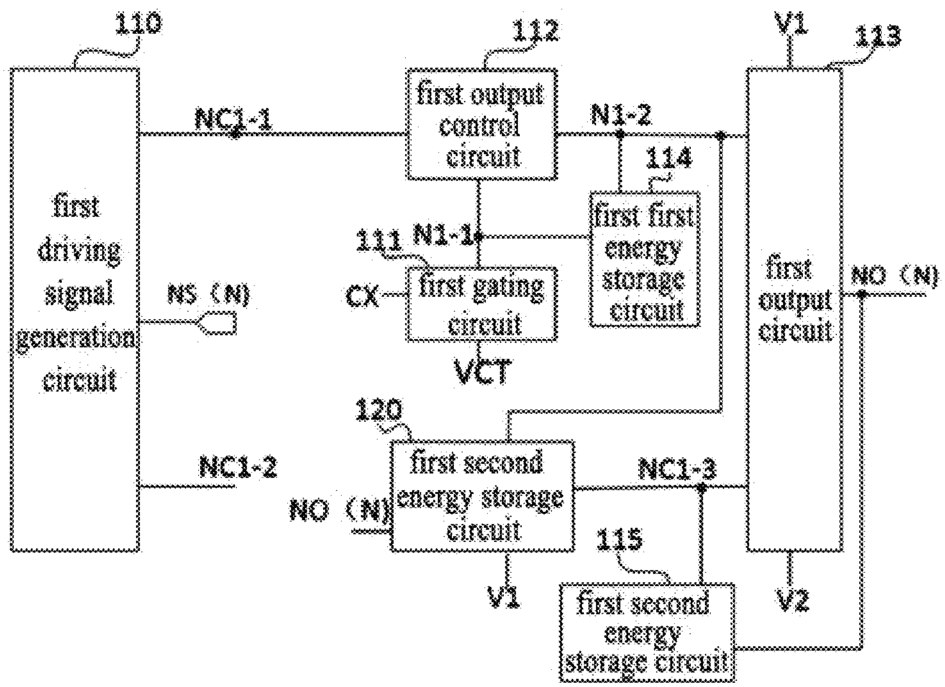
FIG. 17B is a structural diagram of the driving circuit according to at least one embodiment of the present disclosure.

As shown in FIG. 17B, based on the embodiment of the driving circuit shown in FIG. 1, the driving circuit further includes a first second node control circuit 120;

The first second node control circuit 120 is electrically connected to the first third control node NC1-3, the Nth stage of output driving terminal NO (N), the first second node N1-2 and the first voltage terminal V1 respectively, and is configured to control the connection between the first second node N1-2 and the first voltage terminal V1 under the control of the potential of the first third control node NC1-3 and the Nth stage of driving output signal provided by the Nth stage of output driving terminal NO (N).

When at least one embodiment of the driving circuit shown in FIG. 17B is in operation, when the potential of the first third control node NC1-3 is an effective voltage and the potential of the Nth stage of driving output signal is an effective voltage, the potential of the first second node N1-2 can be the first voltage.

Optionally, the first second node control circuit includes a first fourth transistor and a first control transistor;

a gate electrode of the first fourth transistor is electrically connected to the first third control node, a first electrode of the first fourth transistor is electrically connected to a second electrode of the first control transistor, and a second electrode of the first fourth transistor is electrically connected to the first voltage terminal;

a gate electrode of the first control transistor is electrically connected to the Nth stage of output driving terminal, and a first electrode of the first control transistor is electrically connected to the first second node.

Optionally, the first output circuit includes a first fifth transistor, a first sixth transistor and a first third capacitor;

a gate electrode of the first fifth transistor is electrically connected to the first second node, a first electrode of the first fifth transistor is electrically connected to the first voltage terminal, and a second electrode of the first fifth transistor is electrically connected to the Nth stage of output driving terminal;

a gate electrode of the first sixth transistor is electrically connected to the first third control node, a first electrode of the first sixth transistor is electrically connected to the Nth stage of output driving terminal, and a second electrode of the first sixth transistor is electrically connected to the second voltage terminal;

a first terminal of the first third capacitor is electrically connected to the first second node, and a second terminal of the first third capacitor is electrically connected to the first voltage terminal.

The driving circuit according to at least one embodiment of the present disclosure also includes a first initialization circuit;

The first initialization circuit is electrically connected to the initial control terminal, the second voltage terminal and the first first node respectively, and is configured to control the connection between the first first node and the second voltage terminal under the control of the initial control signal provided by the initial control terminal.

In a specific implementation, the driving circuit may further include a first initialization circuit. When the display device is turned on, the first initialization circuit controls the connection between the first first node and the second voltage terminal under the control of the initial control signal to control the potential of the first first node to be the second voltage. The first output control circuit controls the connection between the first first control node and the first second node under the control of the potential of the first first node.

The driving circuit according to at least one embodiment of the present disclosure also includes a first first node control circuit;

The first first node control circuit is electrically connected to the first fourth node, the second voltage terminal and the first first node respectively, and is configured to control the connection between the first first node and the second voltage terminal under the control of the potential of the first fourth node.

In a specific implementation, the driving circuit may further include a first first node control circuit, which controls the connection between the first first node and the second voltage terminal under the control of the potential of the first fourth node; after the Nth stage of driving signal providing phase, when the potential of the first fourth node is an effective voltage, the first first node control circuit controls the connection between the first first node and the second voltage terminal so that the potential of the first first node is the second voltage, and the first output control circuit controls the connection between the first first control node and the first second node under the control of the potential of the first first node.

In at least one embodiment of the present disclosure, when the transistor included in the first first node control circuit is a p-type transistor, the effective voltage may be a low voltage, and when the transistor included in the first first node control circuit is an n-type transistor, the effective voltage may be a high voltage.

Figure 18A:
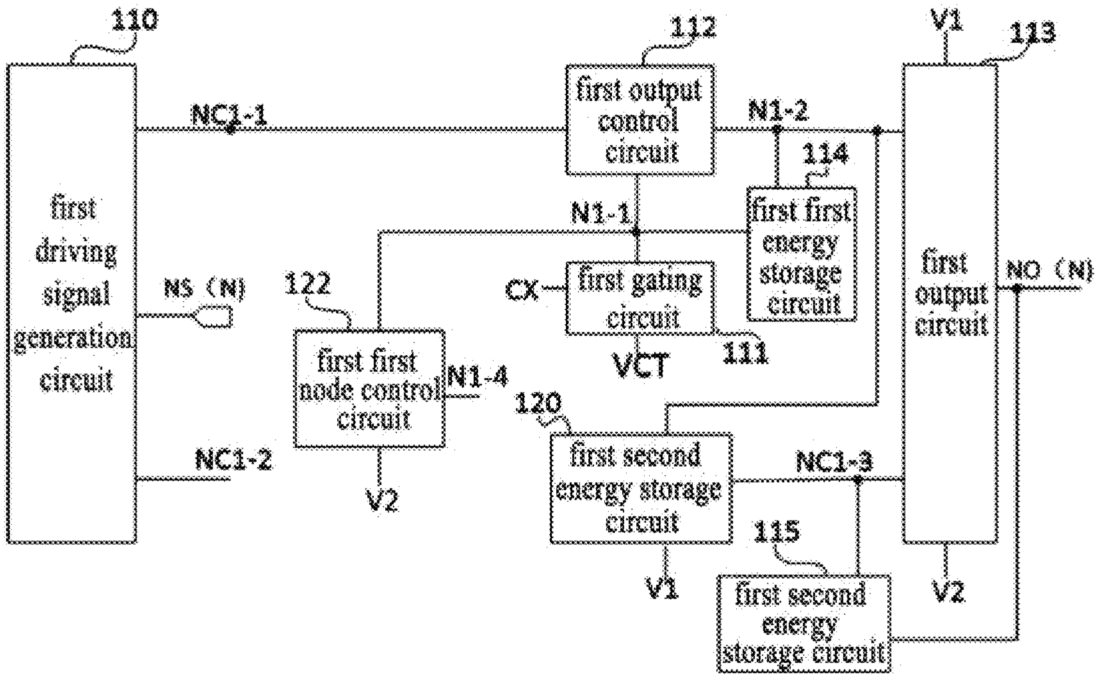
FIG. 18A is a structural diagram of the driving circuit according to at least one embodiment of the present disclosure.

As shown in FIG. 18A, based on at least one embodiment of the driving circuit shown in FIG. 17A, the driving circuit may further include a first first node control circuit 122;

The first first node control circuit 122 is electrically connected to the first fourth node N1-4, the first first node N1-1 and the second voltage terminal V2, respectively, and is configured to control the connection between the first first node N1-1 and the second voltage terminal V2 under the control of the potential of the first fourth node N1-4.

Figure 18B:
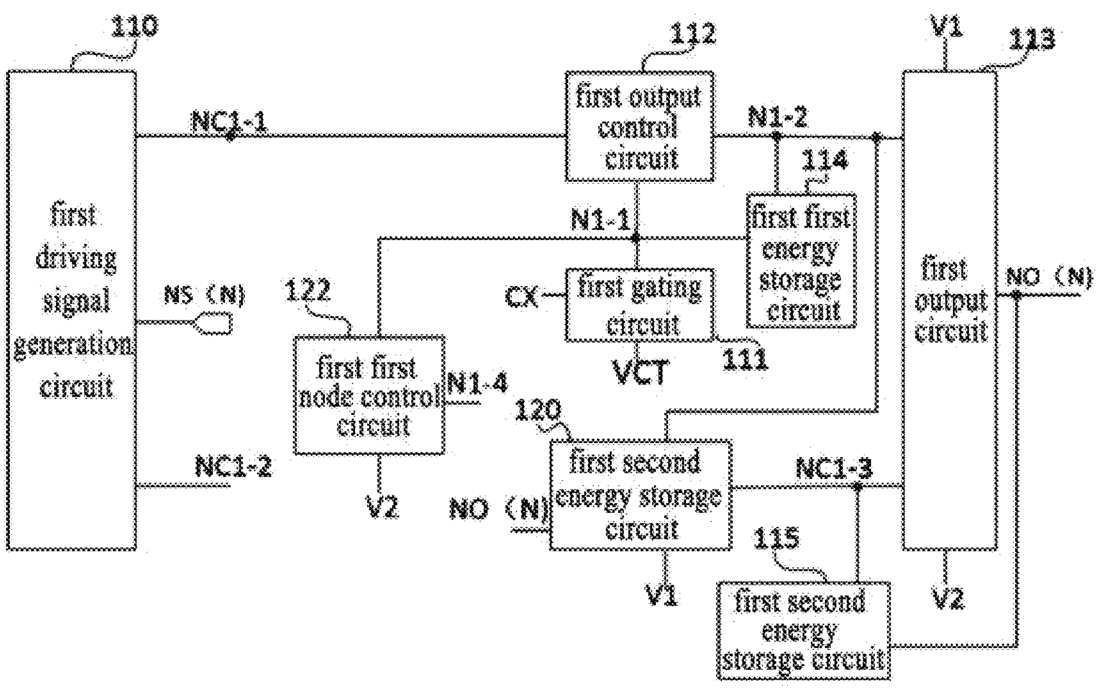
FIG. 18B is a structural diagram of the driving circuit according to at least one embodiment of the present disclosure.

As shown in FIG. 18B, based on at least one embodiment of the driving circuit shown in FIG. 17B, the driving circuit may further include a first first node control circuit 122;

The first first node control circuit 122 is electrically connected to the first fourth node N1-4, the first first node N1-1 and the second voltage terminal V2, respectively, and is configured to control the connection between the first first node N1-1 and the second voltage terminal V2 under the control of the potential of the first fourth node N1-4.

Figure 18C:
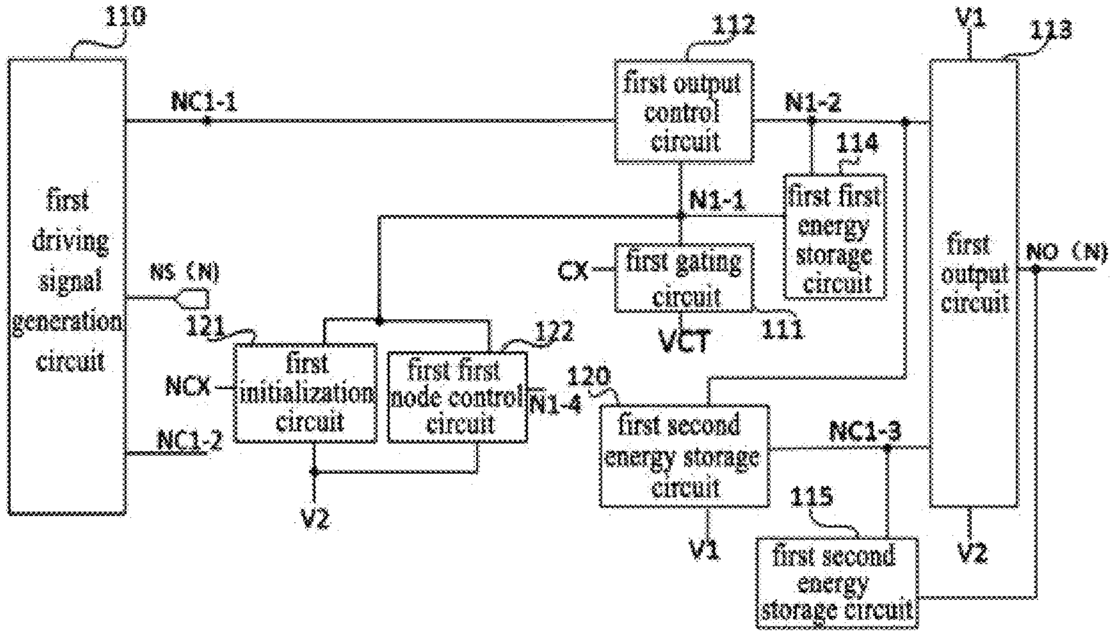
FIG. 18C is a structural diagram of the driving circuit according to at least one embodiment of the present disclosure.

As shown in FIG. 18C, based on at least one embodiment of the driving circuit shown in FIG. 17A, the driving circuit may further include a first initialization circuit 121 and a first first node control circuit 122;

The first initialization circuit 121 is electrically connected to the initial control terminal NCX, the first first node N1-1 and the second voltage terminal V2, respectively, and is configured to control the connection between the first first node N1-1 and the second voltage terminal V2 under the control of the initial control signal provided by the initial control terminal NCX;

The first first node control circuit 122 is electrically connected to the first fourth node N1-4, the first first node N1-1 and the second voltage terminal V2, respectively, and is configured to control the connection between the first first node N1-1 and the second voltage terminal V2 under the control of the potential of the first fourth node N1-4.

Figure 18D:
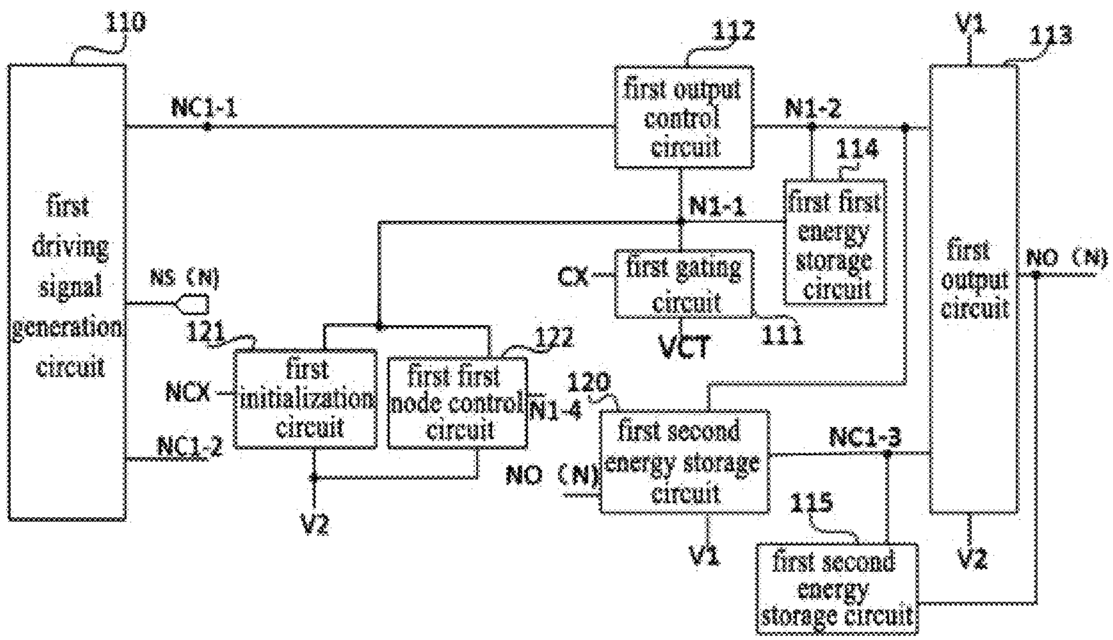
FIG. 18D is a structural diagram of the driving circuit according to at least one embodiment of the present disclosure.

As shown in FIG. 18D, based on at least one embodiment of the driving circuit shown in FIG. 17B, the driving circuit may further include a first initialization circuit 121 and a first first node control circuit 122;

The first initialization circuit 121 is electrically connected to the initial control terminal NCX, the first first node N1-1 and the second voltage terminal V2 respectively, and is configured to control the connection between the first first node N1-1 and the second voltage terminal V2 under the control of the initial control signal provided by the initial control terminal NCX;

The first first node control circuit 122 is electrically connected to the first fourth node N1-4, the first first node N1-1 and the second voltage terminal V2 respectively, and is configured to control the connection between the first first node N1-1 and the second voltage terminal V2 under the control of the potential of the first fourth node N1-4.

Optionally, the first initialization circuit includes a first seventh transistor;

a gate electrode of the first seventh transistor is electrically connected to the initial control terminal, a first electrode of the first seventh transistor is electrically connected to the first first node, and a second electrode of the first seventh transistor is electrically connected to the second voltage terminal.

Optionally, the first first node control circuit includes a first eighth transistor;

a gate electrode of the first eighth transistor is electrically connected to the first fourth node, a first electrode of the first eighth transistor is electrically connected to the first first node, and a second electrode of the first eighth transistor is electrically connected to the second voltage terminal.

The driving circuit according to at least one embodiment of the present disclosure also includes a first third control node control circuit;

The first third control node control circuit is electrically connected to the first first node, the first fifth node, the first second control node, the first third control node and the first sixth node, respectively, and is configured to control the connection between the first fifth node and the first third control node under the control of the potential of the first first node, control the connection between the first second control node and the first sixth node under the control of the potential of the first sixth node, and control the connection between the first sixth node and the first third control node.

In specific implementation, the driving circuit may include a first third control node control circuit, and the first third control node control circuit controls the potential of the first third control node under the control of the potential of the first first node and the potential of the first sixth node.

Figure 19A:
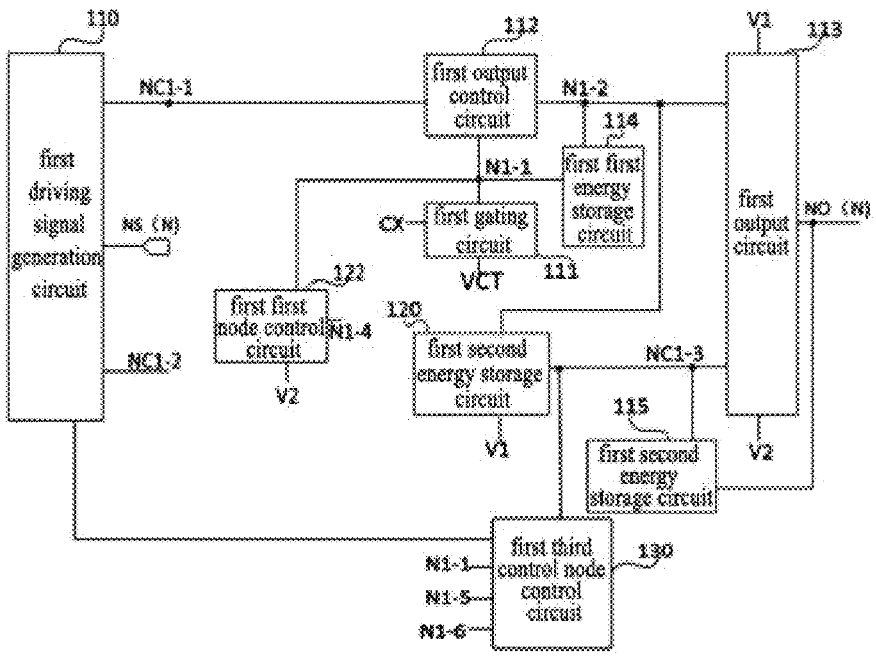
FIG. 19A is a structural diagram of a driving circuit according to at least one embodiment of the present disclosure.

As shown in FIG. 19A, based on at least one embodiment of the driving circuit shown in FIG. 18A, the driving circuit further includes a first third control node control circuit 130;

The first third control node control circuit 130 is electrically connected to the first first node N1-1, the first fifth node N1-5, the first second control node NC1-2, the first third control node NC1-3 and the first sixth node N1-6 respectively, and is configured to control the connection between the first fifth node N1-5 and the first third control node NC1-3 under the control of the potential of the first first node N1-1, control the connection between the first second control node NC1-2 and the first sixth node N1-6 under the control of the potential of the first sixth node N1-6, and control the connection between the first sixth node N1-6 and the first third control node NC1-3.

Figure 19B:
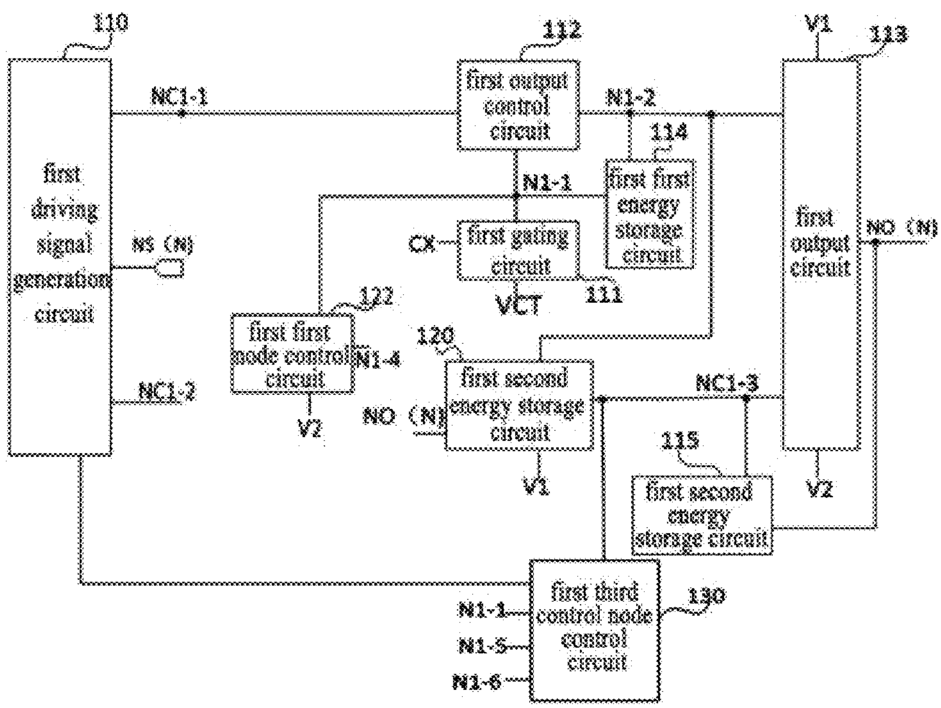
FIG. 19B is a structural diagram of a driving circuit according to at least one embodiment of the present disclosure.

As shown in FIG. 19B, based on at least one embodiment of the driving circuit shown in FIG. 18B, the driving circuit further includes a first third control node control circuit 130;

The first third control node control circuit 130 is electrically connected to the first first node N1-1, the first fifth node N1-5, the first second control node NC1-2, the first third control node NC1-3 and the first sixth node N1-6 respectively, and is configured to control the connection between the first fifth node N1-5 and the first third control node NC1-3 under the control of the potential of the first first node N1-1, control the connection between the first second control node NC1-2 and the first sixth node N1-6 under the control of the potential of the first sixth node N1-6, and control the connection between the first sixth node N1-6 and the first third control node NC1-3.

Figure 19C:
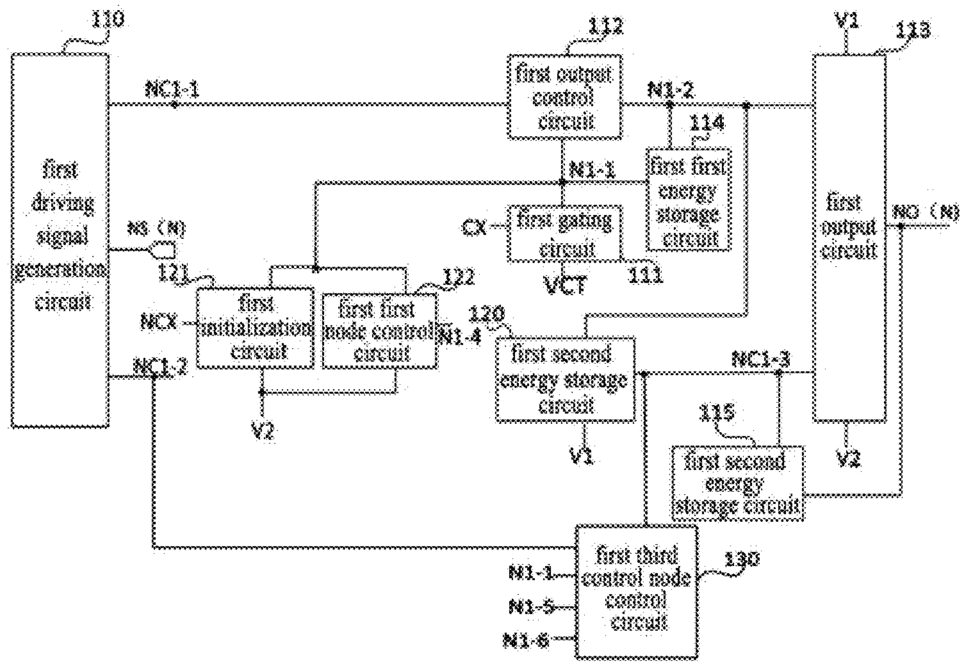
FIG. 19C is a structural diagram of a driving circuit according to at least one embodiment of the present disclosure.

As shown in FIG. 19C, based on at least one embodiment of the driving circuit shown in FIG. 18C, the driving circuit further includes a first third control node control circuit 130;

The first third control node control circuit 130 is electrically connected to the first first node N1-1, the first fifth node N1-5, the first second control node NC1-2, the first third control node NC1-3 and the first sixth node N1-6 respectively, and is configured to control the connection between the first fifth node N1-5 and the first third control node NC1-3 under the control of the potential of the first first node N1-1, control the connection between the first second control node NC1-2 and the first sixth node N1-6 under the control of the potential of the first sixth node N1-6, and control the connection between the first sixth node N1-6 and the first third control node NC1-3.

Figure 19D:
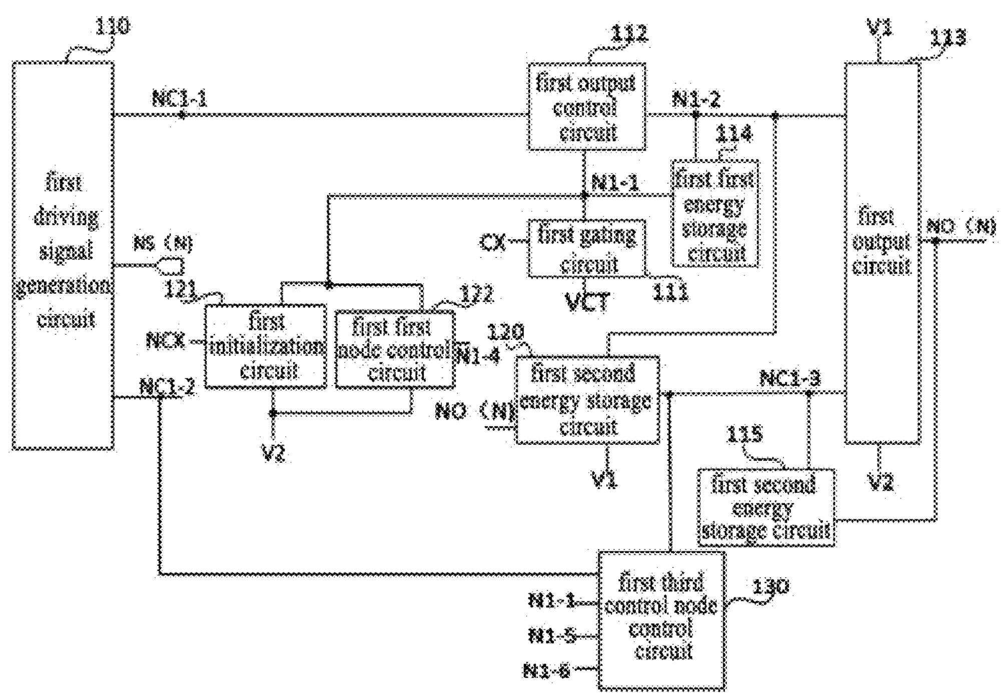
FIG. 19D is a structural diagram of a driving circuit according to at least one embodiment of the present disclosure.

As shown in FIG. 19D, based on at least one embodiment of the driving circuit shown in FIG. 18D, the driving circuit further includes a first third control node control circuit 130;

The first third control node control circuit 130 is electrically connected to the first first node N1-1, the first fifth node N1-5, the first second control node NC1-2, the first third control node NC1-3 and the first sixth node N1-6 respectively, and is configured to control the connection between the first fifth node N1-5 and the first third control node NC1-3 under the control of the potential of the first first node N1-1, control the connection between the first second control node NC1-2 and the first sixth node N1-6 under the control of the potential of the first sixth node N1-6, and control the connection between the first sixth node N1-6 and the first third control node NC1-3.

Optionally, the first third control node control circuit includes a first ninth transistor, a first tenth transistor and a first eleventh transistor;

a gate electrode of the first ninth transistor is electrically connected to the first first node, a first electrode of the first ninth transistor is electrically connected to the first fifth node, and a second electrode of the first ninth transistor is electrically connected to the first third control node;

a gate electrode of the first tenth transistor and a second electrode of the first tenth transistor are both electrically connected to a first sixth node, and a first electrode of the first tenth transistor is electrically connected to the first second control node;

a gate electrode of the first eleventh transistor and a first electrode of the first eleventh transistor are both electrically connected to the first sixth node, and a second electrode of the first eleventh transistor is electrically connected to the first third control node.

In at least one embodiment of the present disclosure, the first driving signal generation circuit includes a first first driving output circuit, a first second driving output circuit, a first first control node control circuit and a first second control node control circuit;

The first first control node control circuit is configured to control the potential of the first control node;

The first second control node control circuit is configured to control the potential of the second control node;

The first first driving output circuit is electrically connected to the first first control node, the first voltage terminal and the Nth stage of driving signal output terminal respectively, and is configured to control the connection between the Nth stage of driving signal output terminal and the first voltage terminal under the control of the potential of the first first control node;

The first second driving output circuit is electrically connected to the first second control node, the second voltage terminal and the Nth stage of driving signal output terminal respectively, and is configured to control the connection between the Nth stage of driving signal output terminal and the second voltage terminal under the control of the potential of the first second control node.

Figure 20A:
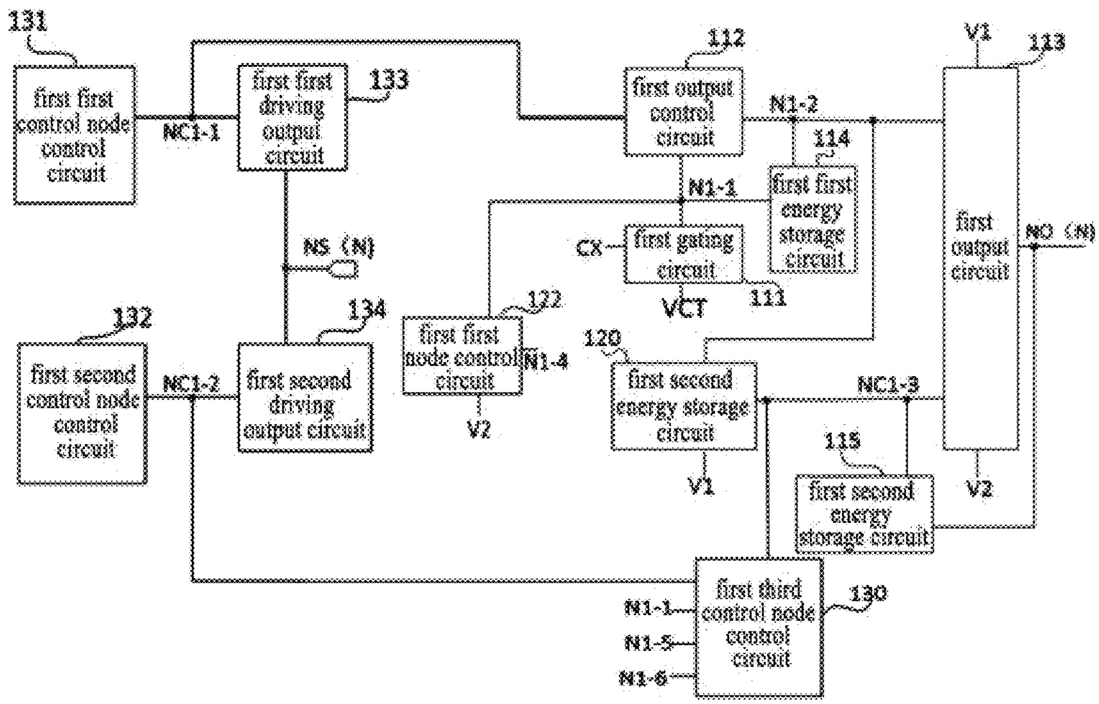
FIG. 20A is a structural diagram of a driving circuit according to at least one embodiment of the present disclosure.

As shown in FIG. 20A, based on at least one embodiment of the driving circuit shown in FIG. 19A, the driving circuit further includes a first first control node control circuit 131, a first second control node control circuit 132, a first first driving output circuit 133 and a first second driving output circuit 134;

The first first control node control circuit 131 is electrically connected to the first first control node NC1-1, and is configured to control the potential of the first first control node NC1-1;

The first second control node control circuit 132 is electrically connected to the first second control node NC1-2, and is configured to control the potential of the first second control node NC1-2;

The first first driving output circuit 133 is electrically connected to the first first control node NC1-1, the first voltage terminal V1 and the Nth stage of driving signal output terminal NS (N) respectively, and is configured to control the connection between the Nth stage of driving signal output terminal NS (N) and the first voltage terminal V1 under the control of the potential of the first first control node NC1-1;

The first second driving output circuit 134 is electrically connected to the first second control node NC1-2, the Nth stage of driving signal output terminal NS (N) and the second voltage terminal V2 respectively, and is configured to control the connection between the Nth stage of driving signal output terminal NS (N) and the second voltage terminal V2 under the control of the potential of the first second control node NC1-2.

Figure 20B:
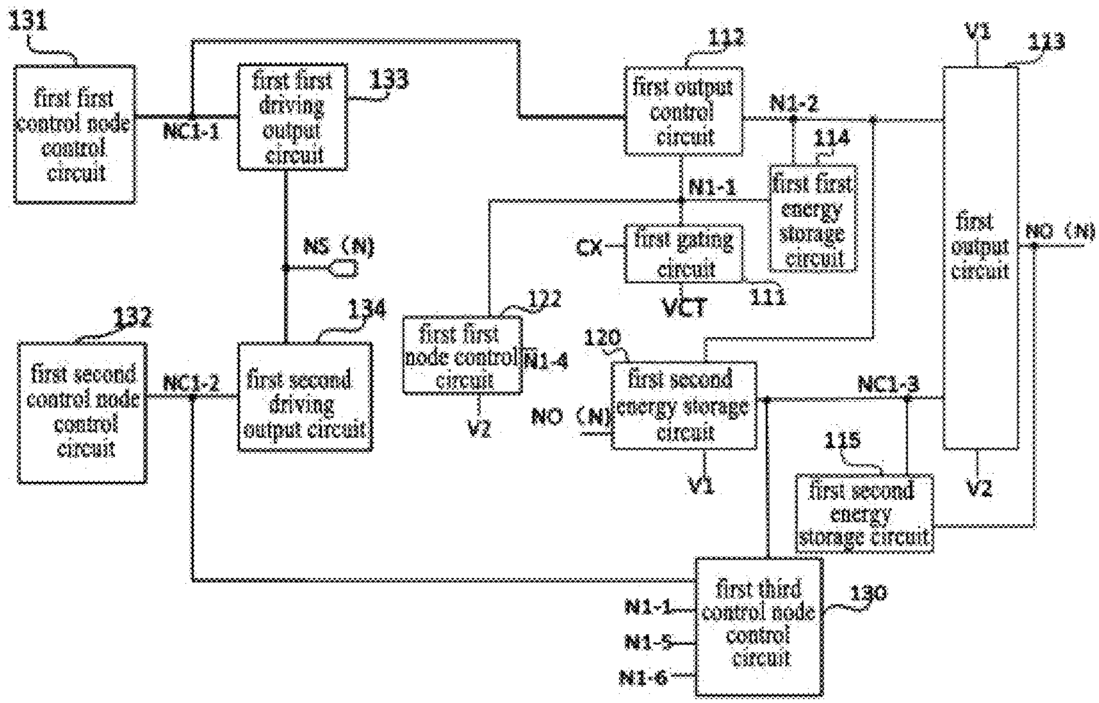
FIG. 20B is a structural diagram of a driving circuit according to at least one embodiment of the present disclosure.

As shown in FIG. 20B, based on at least one embodiment of the driving circuit shown in FIG. 19B, the driving circuit further includes a first first control node control circuit 131, a first second control node control circuit 132, a first first driving output circuit 133 and a first second driving output circuit 134;

The first first control node control circuit 131 is electrically connected to the first first control node NC1-1, and is configured to control the potential of the first first control node NC1-1;

The first second control node control circuit 132 is electrically connected to the first second control node NC1-2, and is configured to control the potential of the first second control node NC1-2;

The first first driving output circuit 133 is electrically connected to the first first control node NC1-1, the first voltage terminal V1 and the Nth stage of driving signal output terminal NS (N) respectively, and is configured to control the connection between the Nth stage of driving signal output terminal NS (N) and the first voltage terminal V1 under the control of the potential of the first first control node NC1-1;

The first second driving output circuit 134 is electrically connected to the first second control node NC1-2, the Nth stage of driving signal output terminal NS (N) and the second voltage terminal V2 respectively, and is configured to control the connection between the Nth stage of driving signal output terminal NS (N) and the second voltage terminal V2 under the control of the potential of the first second control node NC1-2.

Figure 20C:
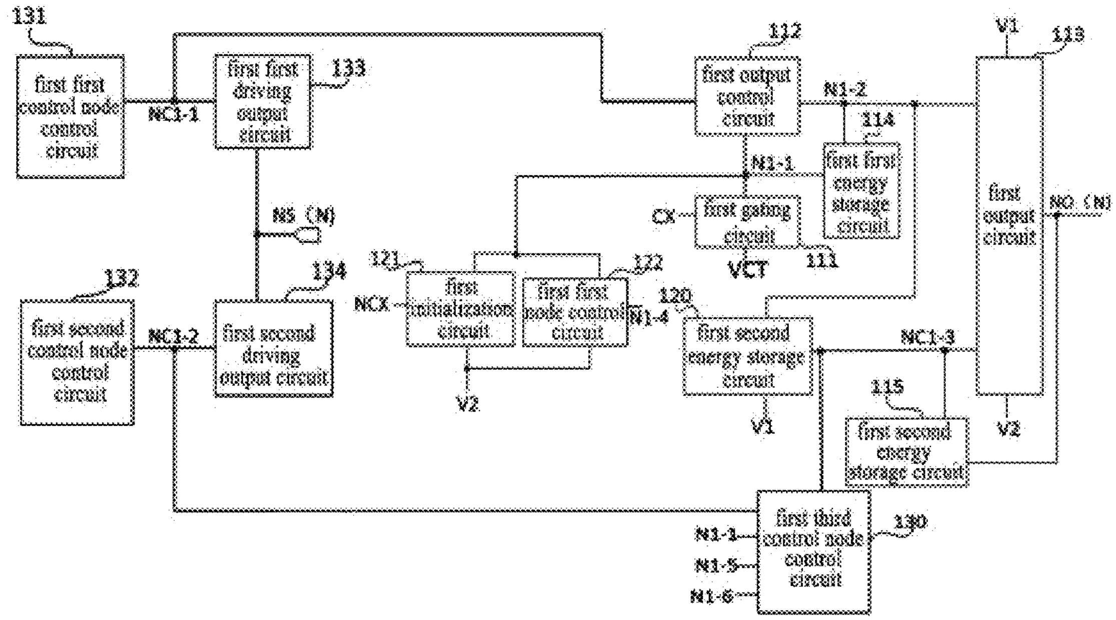
FIG. 20C is a structural diagram of a driving circuit according to at least one embodiment of the present disclosure.

As shown in FIG. 20C, based on at least one embodiment of the driving circuit shown in FIG. 19C, the driving circuit further includes a first first control node control circuit 131, a first second control node control circuit 132, a first first driving output circuit 133 and a first second driving output circuit 134;

The first first control node control circuit 131 is electrically connected to the first first control node NC1-1, and is configured to control the potential of the first first control node NC1-1;

The first second control node control circuit 132 is electrically connected to the first second control node NC1-2, and is configured to control the potential of the first second control node NC1-2;

The first first driving output circuit 133 is electrically connected to the first first control node NC1-1, the first voltage terminal V1 and the Nth stage of driving signal output terminal NS (N) respectively, and is configured to control the connection between the Nth stage of driving signal output terminal NS (N) and the first voltage terminal V1 under the control of the potential of the first first control node NC1-1;

The first second driving output circuit 134 is electrically connected to the first second control node NC1-2, the Nth stage of driving signal output terminal NS (N) and the second voltage terminal V2 respectively, and is configured to control the connection between the Nth stage of driving signal output terminal NS (N) and the second voltage terminal V2 under the control of the potential of the first second control node NC1-2.

Figure 20D:
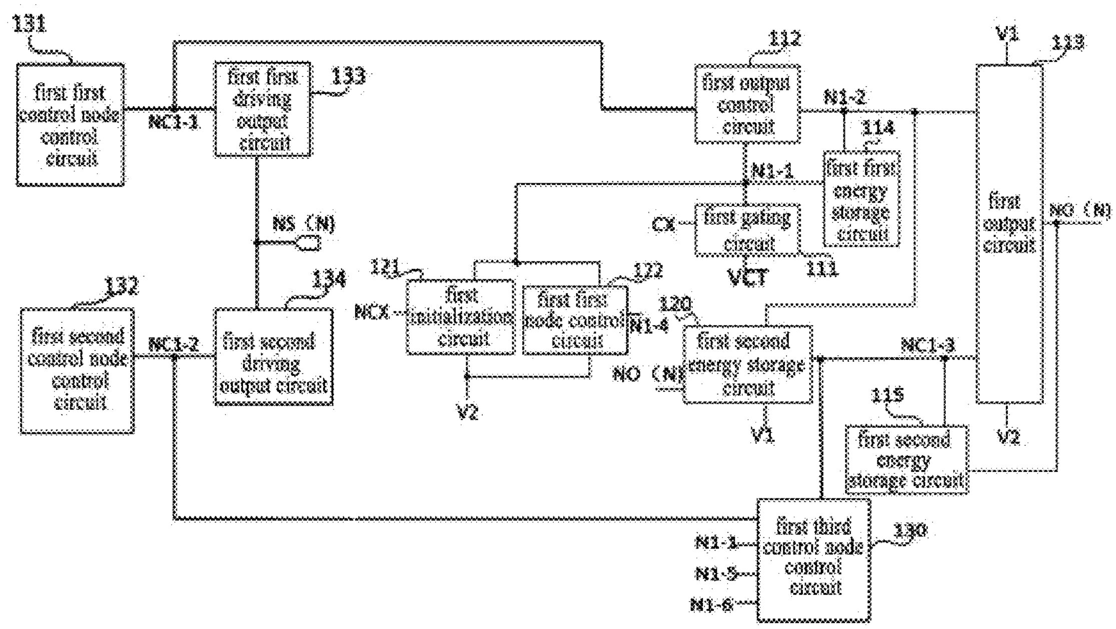
FIG. 20D is a structural diagram of a driving circuit according to at least one embodiment of the present disclosure.

As shown in FIG. 20D, based on at least one embodiment of the driving circuit shown in FIG. 19D, the driving circuit further includes a first first control node control circuit 131, a first second control node control circuit 132, a first first driving output circuit 133 and a first second driving output circuit 134;

The first first control node control circuit 131 is electrically connected to the first first control node NC1-1, and is configured to control the potential of the first first control node NC1-1;

The first second control node control circuit 132 is electrically connected to the first second control node NC1-2, and is configured to control the potential of the first second control node NC1-2;

The first first driving output circuit 133 is electrically connected to the first first control node NC1-1, the first voltage terminal V1 and the Nth stage of driving signal output terminal NS (N) respectively, and is configured to control the connection between the Nth stage of driving signal output terminal NS (N) and the first voltage terminal V1 under the control of the potential of the first first control node NC1-1;

The first second driving output circuit 134 is electrically connected to the first second control node NC1-2, the Nth stage of driving signal output terminal NS (N) and the second voltage terminal V2 respectively, and is configured to control the connection between the Nth stage of driving signal output terminal NS (N) and the second voltage terminal V2 under the control of the potential of the first second control node NC1-2.

In at least one embodiment of the present disclosure, the first first control node control circuit includes a first seventh node control circuit, a first eighth node control circuit, a first third node control circuit and a first first control circuit;

The first seventh node control circuit is electrically connected to the first seventh node, the second voltage terminal, the first clock signal terminal and the first fifth node respectively, and is configured to control the connection between the first seventh node and the second voltage terminal under the control of the first clock signal provided by the first clock signal terminal, and to control the connection between the first seventh node and the first clock signal terminal under the control of the potential of the first fifth node;

The first eighth node control circuit is electrically connected to the second voltage terminal, the first seventh node and the first eighth node respectively, and is configured to control the connection between the first seventh node and the first eighth node under the control of the second voltage signal provided by the second voltage terminal.

The first third node control circuit is electrically connected to the first eighth node, the second clock signal terminal and the first third node respectively, and is configured to control the first third node to be electrically connected to the second clock signal terminal under the control of the potential of the first eighth node, and control the potential of the first third node according to the potential of the first eighth node;

The first first control circuit is electrically connected to the second clock signal terminal, the first third node, the first first control node, the first fifth node and the first voltage terminal respectively, and is configured to control the first third node to be connected to the first first control node under the control of the second clock signal provided by the second clock signal terminal, and control the first first control node to be connected to the first voltage terminal under the control of the potential of the first fifth node.

In specific implementation, the first first control node control circuit may include a first seventh node control circuit, a first eighth node control circuit, a first third node control circuit and a first first control circuit; the first seventh node control circuit controls the potential of the first seventh node under the control of the first clock signal and the potential of the first fifth node; the first eighth node control circuit controls the connection between the first seventh node and the first eighth node under the control of the second voltage signal; the first third node control circuit controls the first third node to be electrically connected to the second clock signal terminal under the control of the potential of the first eighth node, and controls the potential of the first third node according to the potential of the first eighth node; the first first control circuit controls the connection between the first third node and the first first control node under the control of the second clock signal, and controls the connection between the first first control node and the first voltage terminal under the control of the potential of the first fifth node.

In at least one embodiment of the present disclosure, the first second control node control circuit includes a first sixth node control circuit, a first fifth node control circuit, a first ninth node control circuit, a first fourth node control circuit and a first second control circuit;

The first sixth node control circuit is electrically connected to the second voltage terminal, the first ninth node, the first sixth node and the first fourth node respectively, and is configured to control the connection between the first ninth node and the first sixth node under the control of the second voltage signal provided by the second voltage terminal, and control the potential of the first sixth node according to the potential of the first fourth node;

The first fifth node control circuit is electrically connected to the (N−1)th stage of driving signal output terminal, the first clock signal terminal, the first fifth node, the initial control terminal and the first voltage terminal respectively, and is configured to control the connection between the first fifth node and the (N−1)th stage of driving signal output terminal under the control of the first clock signal provided by the first clock signal terminal, and control the first fifth node to be connected to the first voltage terminal;

The first ninth node control circuit is electrically connected to the first clock signal terminal, the (N−1)th stage of driving signal output terminal and the first ninth node respectively, and is configured to control the connection between the first ninth node and the (N−1)th stage of driving signal output terminal under the control of the first clock signal provided by the first clock signal terminal;

The first fourth node control circuit is electrically connected to the first seventh node, the first voltage terminal, the first fourth node, the second clock signal terminal and the first sixth node respectively, and is configured to control the connection between the first fourth node and the first voltage terminal under the control of the potential of the first seventh node, and control the connection between the first fourth node and the second clock signal terminal under the control of the potential of the first sixth node;

The first second control circuit is electrically connected to the second voltage terminal, the first fifth node and the first second control node respectively, and is configured to control the connection between the first fifth node and the first second control node under the control of the second voltage signal provided by the second voltage terminal.

In a specific implementation, the first second control node control circuit may include a first sixth node control circuit, a first fifth node control circuit, a first ninth node control circuit, a first fourth node control circuit and a first second control circuit; the first fourth node control circuit controls the potential of the first fourth node under the control of the potential of the first seventh node and the potential of the first sixth node; the first sixth node control circuit controls the connection between the first ninth node and the first sixth node under the control of the second voltage signal, and controls the potential of the first sixth node according to the potential of the first fourth node; the first fifth node control circuit controls the first fifth node to be connected to the (N−1)th stage of driving signal output terminal under the control of the first clock signal, and control the first fifth node to be connected to the first voltage terminal under the control of the initial control signal; the first ninth node control circuit controls to connect the first ninth node and the (N−1)th stage of driving signal output terminal under the control of the first clock signal; the first fourth node control circuit controls to connect the first fourth node and the first voltage terminal under the control of the potential of the first seventh node, and controls to connect the first fourth node and the second clock signal terminal under the control of the potential of the first sixth node; the first second control circuit controls to connect the first fifth node and the first second control node under the control of the second voltage signal.

Figure 21A:
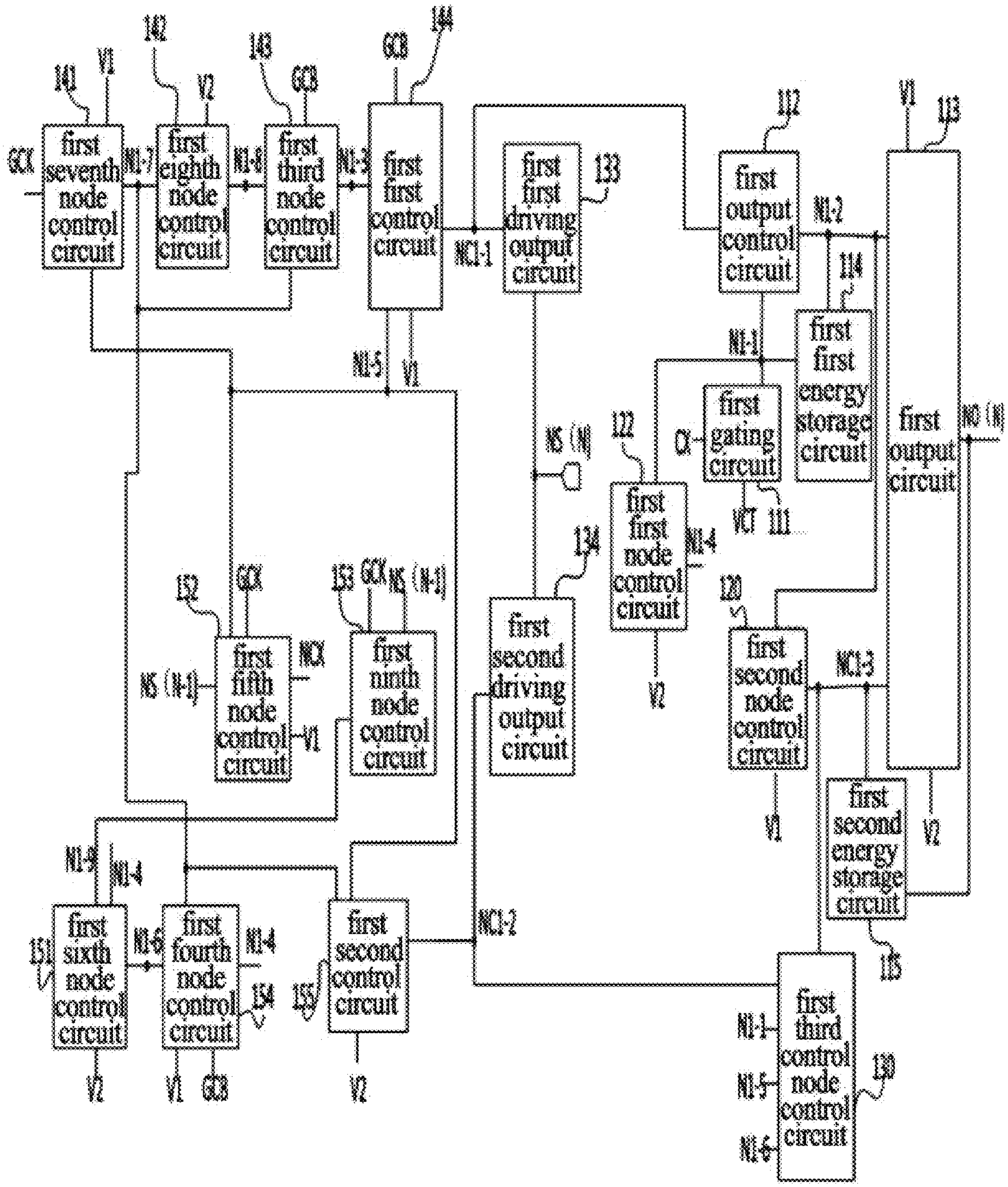
FIG. 21A is a structural diagram of a driving circuit according to at least one embodiment of the present disclosure.

As shown in FIG. 21A, based on at least one embodiment of the driving circuit shown in FIG. 20A, the first first control node control circuit includes a first seventh node control circuit 141, a first eighth node control circuit 142, a first third node control circuit 143 and a first first control circuit 144;

The first seventh node control circuit 141 is electrically connected to the first seventh node N1-7, the second voltage terminal V2, the first clock signal terminal GCK and the first fifth node N1-5, respectively, and is configured to control the connection between the first seventh node N1-7 and the second voltage terminal V2 under the control of the first clock signal provided by the first clock signal terminal GCK, and control the connection between the first seventh node N1-7 and the first clock signal terminal GCK under the control of the potential of the first fifth node N1-5;

The first eighth node control circuit 142 is electrically connected to the second voltage terminal V2, the seventh node N1-7 and the first eighth node N1-8 respectively, and is configured to control to connect the first seventh node N1-7 and the first eighth node N1-8 under the control of the second voltage signal provided by the second voltage terminal V2;

The first third node control circuit 143 is electrically connected to the first eighth node N1-8, the second clock signal terminal GCB and the first third node N1-3 respectively, and is configured to control the first third node N1-3 to be electrically connected to the second clock signal terminal GCB under the control of the potential of the first eighth node N1-8, and control the potential of the first third node N1-3 according to the potential of the first eighth node N1-8;

The first first control circuit 144 is electrically connected to the second clock signal terminal GCB, the first third node N1-3, the first first control node NC1-1, the first fifth node N1-5 and the first voltage terminal V1, and is configured to control the connection between the first third node N1-3 and the first first control node NC1-1 under the control of the second clock signal provided by the second clock signal terminal GCB, and control the connection between the first first control node NC1-1 and the first voltage terminal V1 under the control of the potential of the first fifth node N1-5;

The first second control node control circuit includes a first sixth node control circuit 151, a first fifth node control circuit 152, a first ninth node control circuit 153, a first fourth node control circuit 154 and a first second control circuit 155;

The first sixth node control circuit 151 is electrically connected to the second voltage terminal V2, the first ninth node N1-9, the first sixth node N1-6 and the first fourth node N1-4 respectively, and is configured to control to connect the first ninth node N1-9 and the first sixth node N1-6 under the control of the second voltage signal provided by the second voltage terminal V2, and control the potential of the first sixth node N1-6 according to the potential of the first fourth node N1-4;

The first fifth node control circuit 152 is electrically connected to the (N−1)th stage of driving signal output terminal NS (N−1), the first clock signal terminal GCK, the first fifth node N1-5, the initial control terminal NCX and the first voltage terminal V1, respectively, and is configured to control the first fifth node N1-5 to be connected to the (N−1)th stage of driving signal output terminal NS (N−1) under the control of the first clock signal provided by the first clock signal terminal GCK, and to control the first fifth node N1-5 to be connected to the first voltage terminal V1 under the control of the initial control signal provided by the initial control terminal NCX;

The first ninth node control circuit 153 is electrically connected to the first clock signal terminal GCK, the (N−1)th stage of driving signal output terminal NS (N−1) and the first ninth node N1-9, respectively, and is configured to control the first ninth node N1-9 to be connected to the (N−1)th stage of driving signal output terminal NS (N−1) under the control of the first clock signal provided by the first clock signal terminal GCK.

The first fourth node control circuit 154 is electrically connected to the first seventh node N1-7, the first voltage terminal V1, the first sixth node N1-6, the first fourth node N1-4 and the second clock signal terminal GCB respectively, and is configured to control the first fourth node N1-4 to be electrically connected to the first voltage terminal V1 under the control of the potential of the first seventh node N1-7, and to control the first fourth node N1-4 to be connected to the second clock signal terminal GCB under the control of the potential of the first sixth node N1-6;

The first second control circuit 155 is electrically connected to the second voltage terminal V2, the first fifth node N1-5 and the first second control node NC1-2 respectively, and is configured to control the first fifth node N1-5 to be connected to the first second control node NC1-2 under the control of the second voltage signal provided by the second voltage terminal V2.

Figure 21B:
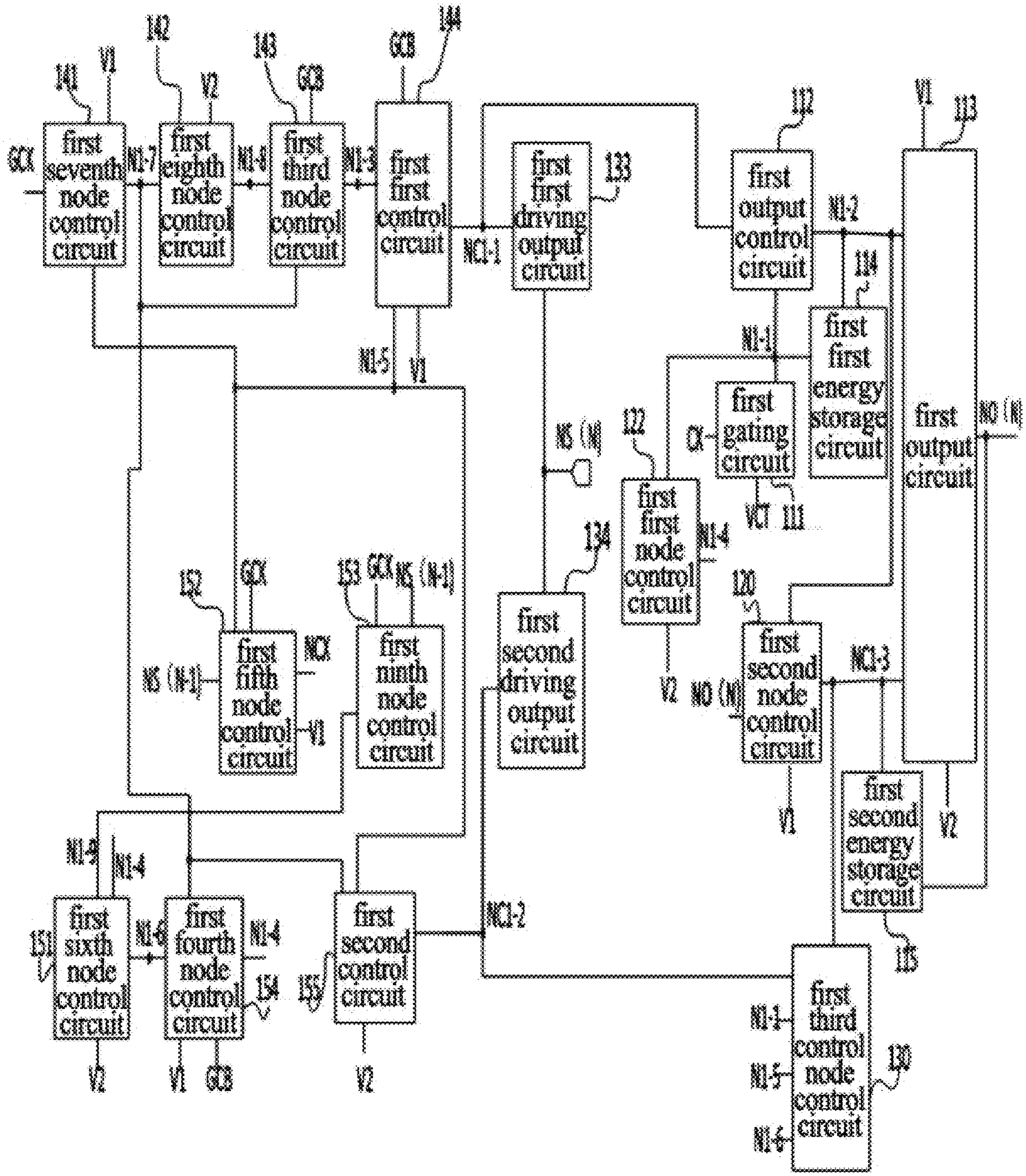
FIG. 21B is a structural diagram of a driving circuit according to at least one embodiment of the present disclosure.

As shown in FIG. 21B, based on at least one embodiment of the driving circuit shown in FIG. 20B, the first first control node control circuit includes a first seventh node control circuit 141, a first eighth node control circuit 142, a first third node control circuit 143 and a first first control circuit 144;

the first seventh node control circuit 141 is electrically connected to the first seventh node N1-7, the second voltage terminal V2, the first clock signal terminal GCK and the first fifth node N1-5 respectively, and is configured to control the first seventh node N1-7 to be connected to the second voltage terminal V2 under the control of the first clock signal provided by the first clock signal terminal GCK and control to connect the first seventh node N1-7 and the first clock signal terminal GCK under the control of the potential of the first fifth node N1-5;

The first eighth node control circuit 142 is electrically connected to the second voltage terminal V2, the first seventh node N1-7 and the first eighth node N1-8 respectively, and is configured to control the first seventh node N1-7 to be connected to the first eighth node N1-8 under the control of the second voltage signal provided by the second voltage terminal V2;

The first third node control circuit 143 is electrically connected to the first eighth node N1-8, the second clock signal terminal GCB and the first third node N1-3 respectively, and is configured to control the first third node N1-3 to be electrically connected to the second clock signal terminal GCB under the control of the potential of the first eighth node N1-8, and control the potential of the first third node N1-3 according to the potential of the first eighth node N1-8;

The first first control circuit 144 is electrically connected to the second clock signal terminal GCB, the first third node N1-3, the first first control node NC1-1, the first fifth node N1-5 and the first voltage terminal V1, and is configured to control the connection between the first third node N1-3 and the first first control node NC1-1 under the control of the second clock signal provided by the second clock signal terminal GCB, and to control the connection between the first first control node NC1-1 and the first voltage terminal V1 under the control of the potential of the first fifth node N1-5;

The first second control node control circuit includes a first sixth node control circuit 151, a first fifth node control circuit 152, a first ninth node control circuit 153, and a first fourth node control circuit 154 and the first second control circuit 155;

The first sixth node control circuit 151 is electrically connected to the second voltage terminal V2, the first ninth node N1-9, the first sixth node N1-6 and the first fourth node N1-4, respectively, and is configured to control the connection between the first ninth node N1-9 and the first sixth node N1-6 under the control of the second voltage signal provided by the second voltage terminal V2, and control the potential of the first sixth node N1-6 according to the potential of the first fourth node N1-4;

The first fifth node control circuit 152 is electrically connected to the (N−1)th stage of driving signal output terminal NS (N−1), the first clock signal terminal GCK, the first fifth node N1-5, the initial control terminal NCX and the first voltage end V1 respectively, is configured to control to connect the first fifth node N1-5 and the (N−1)th stage of driving signal output terminal NS (N−1) under the control of the first clock signal provided by the first clock signal end GCK, control to connect the first fifth node N1-5 and the first voltage terminal V1 under the control of the initial control signal provided by the initial control terminal NCX;

The first ninth node control circuit 153 is respectively connected to the first clock signal terminal GCK, the (N−1)th stage of driving signal output terminal NS (N−1) and the first ninth node N1-9, is configured to control the connection between the first ninth node N1-9 and the (N−1)th stage of driving signal output terminal NS (N−1) under the control of the first clock signal provided by the first clock signal terminal GCK;

The first fourth node control circuit 154 is electrically connected to the first seventh node N1-7, the first voltage terminal V1, the first sixth node N1-6, the first fourth node N1-4 and the second clock signal terminal GCB, and is configured to control to connect the first fourth node N1-4 and the first voltage terminal V1 under the control of the potential of the first seventh node N1-7, and control to connect the first fourth node N1-4 and the second clock signal terminal GCB under the control of the potential of the first sixth node N1-6;

The first second control circuit 155 is electrically connected to the second voltage terminal V2, the first fifth node N1-5 and the first second control node NC1-2 respectively, and is configured to control the first fifth node N1-5 to be connected to the first second control node NC1-2 under the control of the second voltage signal provided by the second voltage terminal V2.

Figure 21C:
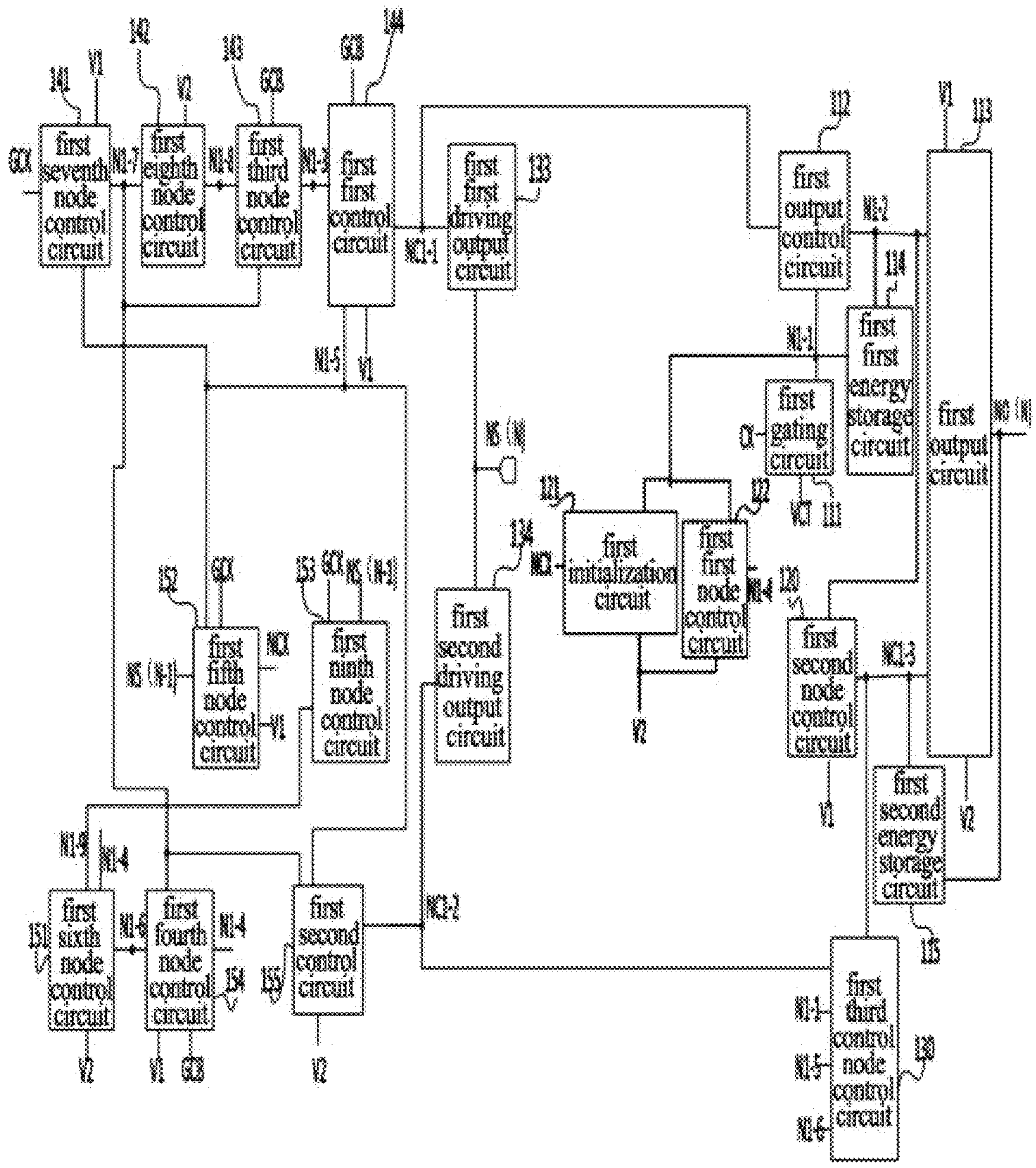
FIG. 21C is a structural diagram of a driving circuit according to at least one embodiment of the present disclosure.

As shown in FIG. 21C, based on at least one embodiment of the driving circuit shown in FIG. 20C, the first first control node control circuit includes a first seventh node control circuit 141, a first eighth node control circuit 142, a first third node control circuit 143 and a first first control circuit 144;

the first seventh node control circuit 141 is electrically connected to the first seventh node N1-7, the second voltage terminal V2, the first clock signal terminal GCK and the first fifth node N1-5, respectively, and is configured to control to connect the first seventh node N1-7 and the second voltage terminal V2 under the control of the first clock signal provided by the first clock signal terminal GCK, and control to connect the first seventh node N1-7 and the first clock signal terminal GCK under the control of the potential of the first fifth node N1-5;

The first eighth node control circuit 142 is electrically connected to the second voltage terminal V2, the first seventh node N1-7 and the first eighth node N1-8 respectively, and is configured to control the first seventh node N1-7 to be connected to the first eighth node N1-8 under the control of the second voltage signal provided by the second voltage terminal V2;

The first third node control circuit 143 is electrically connected to the first eighth node N1-8, the second clock signal terminal GCB and the first third node N1-3 respectively, and is configured to control the first third node N1-3 to be electrically connected to the second clock signal terminal GCB under the control of the potential of the first eighth node N1-8, and control the potential of the first third node N1-3 according to the potential of the first eighth node N1-8;

The first first control circuit 144 is electrically connected to the second clock signal terminal GCB, the first third node N1-3, the first first control node NC1-1, the first fifth node N1-5 and the first voltage terminal V1, and is configured to control the connection between the first third node N1-3 and the first first control node NC1-1 under the control of the second clock signal provided by the second clock signal terminal GCB, and to control the connection between the first first control node NC1-1 and the first voltage terminal V1 under the control of the potential of the first fifth node N1-5;

The first second control node control circuit includes a first sixth node control circuit 151, a first fifth node control circuit 152, a first ninth node control circuit 153, and a first fourth node control circuit 154 and the first second control circuit 155;

The first sixth node control circuit 151 is electrically connected to the second voltage terminal V2, the first ninth node N1-9, the first sixth node N1-6 and the first fourth node N1-4, respectively, and is configured to control the connection between the first ninth node N1-9 and the first sixth node N1-6 under the control of the second voltage signal provided by the second voltage terminal V2, and control the potential of the first sixth node N1-6 according to the potential of the first fourth node N1-4;

The first fifth node control circuit 152 is electrically connected to the (N−1)th stage of driving signal output terminal NS (N−1), the first clock signal terminal GCK, the first fifth node N1-5, the initial control terminal NCX and the first voltage terminal V1 respectively, is configured to control to connect the first fifth node N1-5 and the (N−1)th stage of driving signal output terminal NS (N−1) under the control of the first clock signal provided by the first clock signal terminal GCK, and control to connect the first fifth node N1-5 and the first voltage terminal V1 under the control of the initial control signal provided by the initial control terminal NCX;

The first ninth node control circuit 153 is respectively connected to the first clock signal terminal GCK, the (N−1)th stage of driving signal output terminal NS (N−1) and the first ninth node N1-9, is configured to control to connect the first ninth node N1-9 and the (N−1)th stage of driving signal output terminal NS (N−1) under the control of the first clock signal provided by the first clock signal terminal GCK;

The first fourth node control circuit 154 is electrically connected to the first seventh node N1-7, the first voltage terminal V1, the first sixth node N1-6, the first fourth node N1-4 and the second clock signal terminal GCB, and is configured to control to connect the first fourth node N1-4 and the first voltage terminal V1 under the control of the potential of the first seventh node N1-7, and control to connect the first fourth node N1-4 and the second clock signal terminal GCB under the control of the potential of the first sixth node N1-6;

The first second control circuit 155 is electrically connected to the second voltage terminal V2, the first fifth node N1-5 and the first second control node NC1-2 respectively, and is configured to control the first fifth node N1-5 to be connected to the first second control node NC1-2 under the control of the second voltage signal provided by the second voltage terminal V2.

Figure 21D:
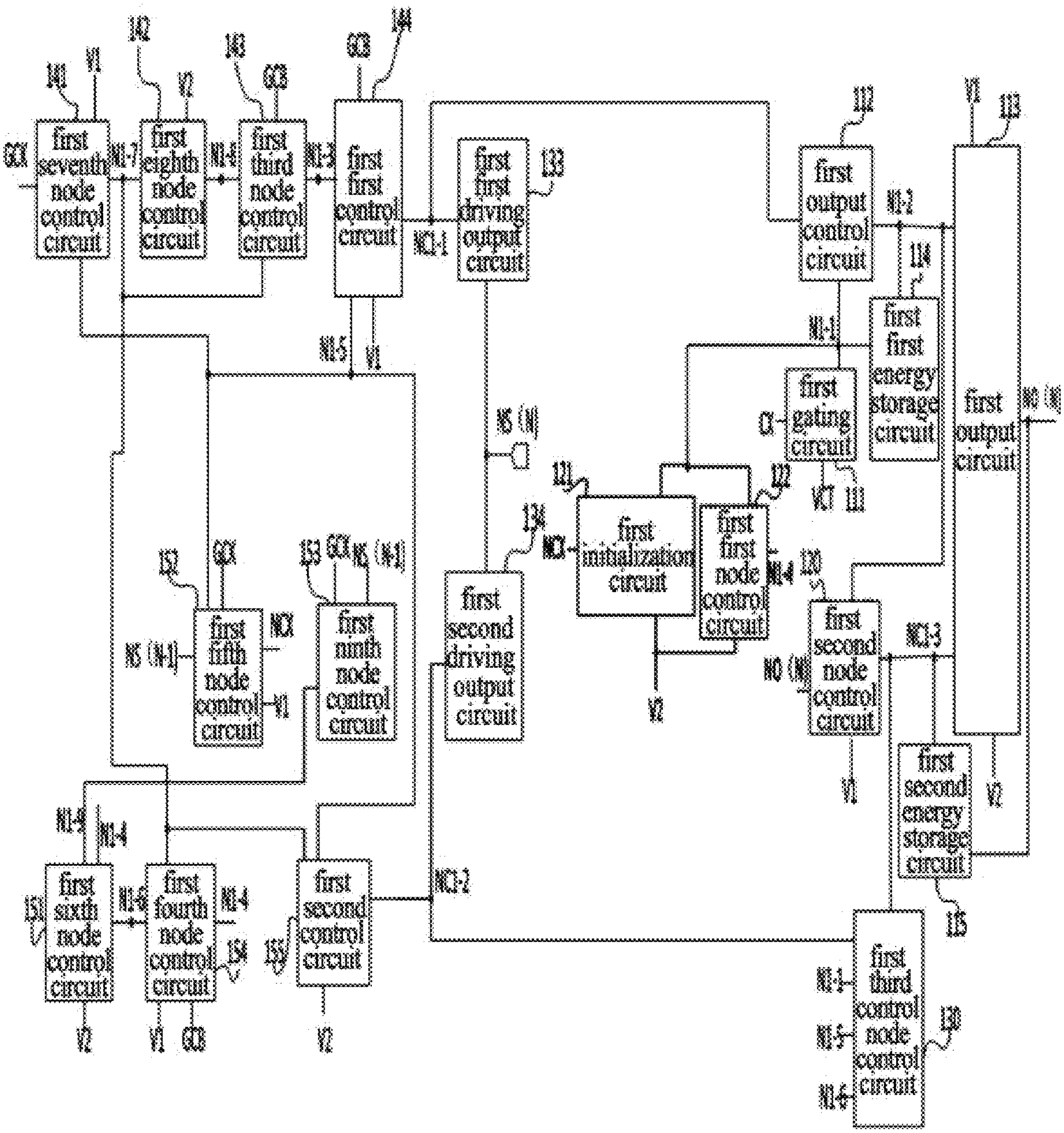
FIG. 21D is a structural diagram of a driving circuit according to at least one embodiment of the present disclosure.

As shown in FIG. 21D, based on at least one embodiment of the driving circuit shown in FIG. 20D, the first first control node control circuit includes a first seventh node control circuit 141, a first eighth node control circuit 142, a first third node control circuit 143 and a first first control circuit 144;

the first seventh node control circuit 141 is electrically connected to the first seventh node N1-7, the second voltage terminal V2, the first clock signal terminal GCK and the first fifth node N1-5 respectively, and is configured to control the connection between the first seventh node N1-7 and the second voltage terminal V2 under the control of the first clock signal provided by the first clock signal terminal GCK, and to control the first seventh node N1-7 to be connected to the first clock signal terminal GCK under the control of the potential of the first fifth node N1-5;

The first eighth node control circuit 142 is electrically connected to the second voltage terminal V2, the first seventh node N1-7 and the first eighth node N1-8, respectively, and is configured to control the connection between the first seventh node N1-7 and the first eighth node N1-8 under the control of the second voltage signal provided by the second voltage terminal V2;

The first third node control circuit 143 is electrically connected to the first eighth node N1-8, the second clock signal terminal GCB and the first third node N1-3, respectively, and is configured to control the electrical connection between the first third node N1-3 and the second clock signal terminal GCB under the control of the potential of the first eighth node N1-8, and controls the potential of the first third node N1-3 according to the potential of the first eighth node N1-8;

The first first control circuit 144 is electrically connected to the second clock signal terminal GCB, the first third node N1-3, the first first control node NC1-1, the first fifth node N1-5 and the first voltage terminal V1 respectively, and is configured to control the connection between the first third node N1-3 and the first first control node NC1-1 under the control of the second clock signal provided by the second clock signal terminal GCB, and control the connection between the first first control node NC1-1 and the first voltage terminal V1 under the control of the potential of the first fifth node N1-5;

The first second control node control circuit includes a first sixth node control circuit 151, the first fifth node control circuit 152, the first ninth node control circuit 153, the first fourth node control circuit 154 and the first second control circuit 155;

The first sixth node control circuit 151 is electrically connected to the second voltage terminal V2, the first ninth node N1-9, the first sixth node N1-6 and the first fourth node N1-4 respectively, and is configured to control the connection between the first ninth node N1-9 and the first sixth node N1-6 under the control of the second voltage signal provided by the second voltage terminal V2, and control the potential of the first sixth node N1-6 according to the potential of the first fourth node N1-4;

The first fifth node control circuit 152 is electrically connected to the (N−1)th stage of driving signal output terminal NS (N−1), the first clock signal terminal GCK, the first fifth node N5, the initial control terminal NCX and the first voltage terminal V1, respectively, and is configured to control the connection between the first fifth node N1-5 and the (N−1)th stage of driving signal output terminal NS (N−1) under the control of the first clock signal provided by the first clock signal terminal GCK, and to control the connection between the first fifth node N1-5 and the first voltage terminal V1 under the control of the initial control signal provided by the initial control terminal NCX;

The first ninth node control circuit 153 is electrically connected to the first clock signal terminal GCK, the (N−1)th stage of driving signal output terminal NS (N−1) and the first ninth node N1-9, respectively, and is configured to control the connection between the first ninth node N1-9 and the (N−1)th stage of driving signal under the control of the first clock signal provided by the first clock signal terminal GCK.

The first fourth node control circuit 154 is electrically connected to the first seventh node N1-7, the first voltage terminal V1, the first sixth node N1-6, the first fourth node N1-4 and the second clock signal terminal GCB respectively, and is configured to control the first fourth node N1-4 to be electrically connected to the first voltage terminal V1 under the control of the potential of the first seventh node N1-7, and to control the first fourth node N1-4 to be connected to the second clock signal terminal GCB under the control of the potential of the first sixth node N1-6;

The first second control circuit 155 is electrically connected to the second voltage terminal V2, the first fifth node N1-5 and the first second control node NC1-2 respectively, and is configured to control the first fifth node N1-5 to be connected to the first second control node NC1-2 under the control of the second voltage signal provided by the second voltage terminal V2.

Optionally, the first seventh node control circuit includes a first twelfth transistor and a first thirteenth transistor, the first eighth node control circuit includes a first fourteenth transistor, the first third node control circuit includes a first fifteenth transistor and a first fourth capacitor, and the first first control circuit includes a first sixteenth transistor and a first seventeenth transistor;

a gate electrode of the first twelfth transistor is electrically connected to the first clock signal terminal, a first electrode of the first twelfth transistor is electrically connected to the second voltage terminal, and a second electrode of the first twelfth transistor is electrically connected to the first seventh node;

a gate electrode of the first thirteenth transistor is electrically connected to the first fifth node, a first electrode of the first thirteenth transistor is electrically connected to the first seventh node, and a second electrode of the first thirteenth transistor is electrically connected to the first clock signal terminal;

a gate electrode of the first fourteenth transistor is electrically connected to the second voltage terminal, a first electrode of the first fourteenth transistor is electrically connected to the first seventh node, and a second electrode of the first fourteenth transistor is electrically connected to the first eighth node;

a gate electrode of the first fifteenth transistor is electrically connected to the first eighth node, a first electrode of the first fifteenth transistor is electrically connected to the second clock signal terminal, and a second electrode of the first fifteenth transistor is electrically connected to the first third node;

a first terminal of the first fourth capacitor is electrically connected to the first eighth node, and a second terminal of the first fourth capacitor is electrically connected to the first third node;

a gate electrode of the first sixteenth transistor is electrically connected to the second clock signal terminal, a first electrode of the first sixteenth transistor is electrically connected to the first third node, and a second electrode of the first sixteenth transistor is electrically connected to the first first control node;

a gate electrode of the first seventeenth transistor is electrically connected to the first fifth node, a first electrode of the first seventeenth transistor is electrically connected to the first first control node, and a second electrode of the first seventeenth transistor is electrically connected to the first voltage terminal.

Optionally, the first sixth node control circuit includes a first eighteenth transistor and a first fifth capacitor, the first fifth node control circuit includes a first nineteenth transistor and a first twentieth transistor, the first ninth node control circuit includes a first twenty-first transistor, the first fourth node control circuit includes a first twenty-second transistor and a first twenty-third transistor, and the first second control circuit includes a first twenty-fourth transistor;

a gate electrode of the first eighteenth transistor is electrically connected to the second voltage terminal, a first electrode of the first eighteenth transistor is electrically connected to the first ninth node, and a second electrode of the first eighteenth transistor is electrically connected to the first sixth node;

a first terminal of the first fifth capacitor is electrically connected to the first fourth node, and a second terminal of the first fifth capacitor is electrically connected to the first sixth node;

a gate electrode of the first nineteenth transistor is electrically connected to the first clock signal terminal, a first electrode of the first nineteenth transistor is electrically connected to the (N−1)th stage of driving signal output terminal, and a second electrode of the first nineteenth transistor is electrically connected to the first fifth node;

a gate electrode of the first twentieth transistor is electrically connected to the initial control terminal; a first electrode of the first twentieth transistor is electrically connected to the first voltage terminal, and a second electrode of the first twentieth transistor is electrically connected to the first fifth node;

a gate electrode of the first twenty-first transistor is electrically connected to the first clock signal terminal, a first electrode of the first twenty-first transistor is electrically connected to the (N−1)th stage of driving signal output terminal, and a second electrode of the first twenty-first transistor is electrically connected to the first ninth node;

a gate electrode of the first twenty-second transistor is electrically connected to the first seventh node, a first electrode of the first twenty-second transistor is electrically connected to the first voltage terminal, and a second electrode of the first twenty-second transistor is electrically connected to the first fourth node;

a gate electrode of the first twenty-third transistor is electrically connected to the first sixth node, a first electrode of the first twenty-third transistor is electrically connected to the first fourth node, and a second electrode of the first twenty-third transistor is electrically connected to the second clock signal terminal;

a gate electrode of the first twenty-fourth transistor is electrically connected to the second voltage terminal, a first electrode of the first twenty-fourth transistor is electrically connected to the first ninth node, and a second electrode of the first twenty-fourth transistor is electrically connected to the first second control node.

Optionally, the first first driving output circuit includes a first twenty-fifth transistor and a first sixth capacitor, and the first second driving output circuit includes a first twenty-sixth transistor and a first seventh capacitor;

a gate electrode of the first twenty-fifth transistor is electrically connected to the first first control node, a first electrode of the first twenty-fifth transistor is electrically connected to the first voltage terminal, and a second electrode of the first twenty-fifth transistor is electrically connected to the Nth stage of driving signal output terminal;

a first terminal of the first sixth capacitor is electrically connected to the first first control node, and a second terminal of the first sixth capacitor is electrically connected to the first voltage terminal;

a gate electrode of the first twenty-sixth transistor is electrically connected to the first second control node, a first electrode of the first twenty-sixth transistor is electrically connected to the Nth stage of driving signal output terminal, and a second electrode of the first twenty-sixth transistor is electrically connected to the second voltage terminal;

a first terminal of the first seventh capacitor is electrically connected to the Nth stage of driving signal output terminal, and a second terminal of the first seventh capacitor is electrically connected to the second voltage terminal.

The driving circuit according to at least one embodiment of the present disclosure further includes a first output pull-down circuit;

The first output pull-down circuit is electrically connected to the first first control node, the Nth stage of driving signal output terminal and the second voltage terminal respectively, and is configured to control the connection between the Nth stage of driving signal output terminal and the second voltage terminal under the control of the potential of the first first control node.

In a specific implementation, the driving circuit may further include a first output pull-down circuit, which may control the connection between the Nth stage of driving signal output terminal and the second voltage terminal under the control of the potential of the first first control node, so as to enhance the output capability of the second voltage signal of the Nth stage of driving signal output terminal.

Figure 22A:
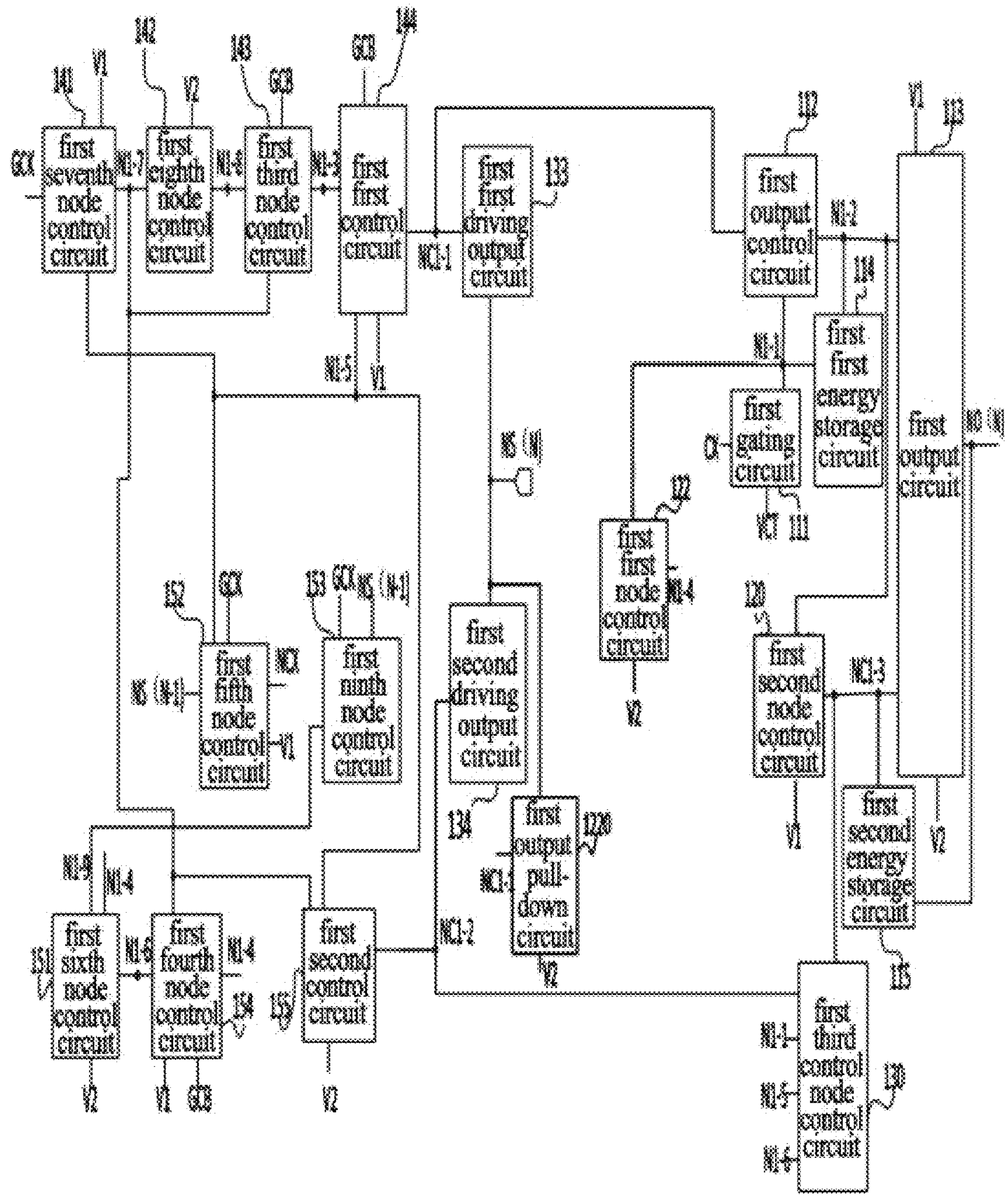
FIG. 22A is a structural diagram of a driving circuit according to at least one embodiment of the present disclosure.

As shown in FIG. 22A, based on at least one embodiment of the driving circuit shown in FIG. 21A, the driving circuit according to at least one embodiment of the present disclosure further includes a first output pull-down circuit 1220;

The first output pull-down circuit 1220 is electrically connected to the first first control node NC1-1, the Nth stage of driving signal output terminal NS (N) and the second voltage terminal V2, respectively, and is configured to control the connection between the Nth stage of driving signal output terminal NS (N) and the second voltage terminal V2 under the control of the potential of the first first control node NC1-1.

Figure 22B:
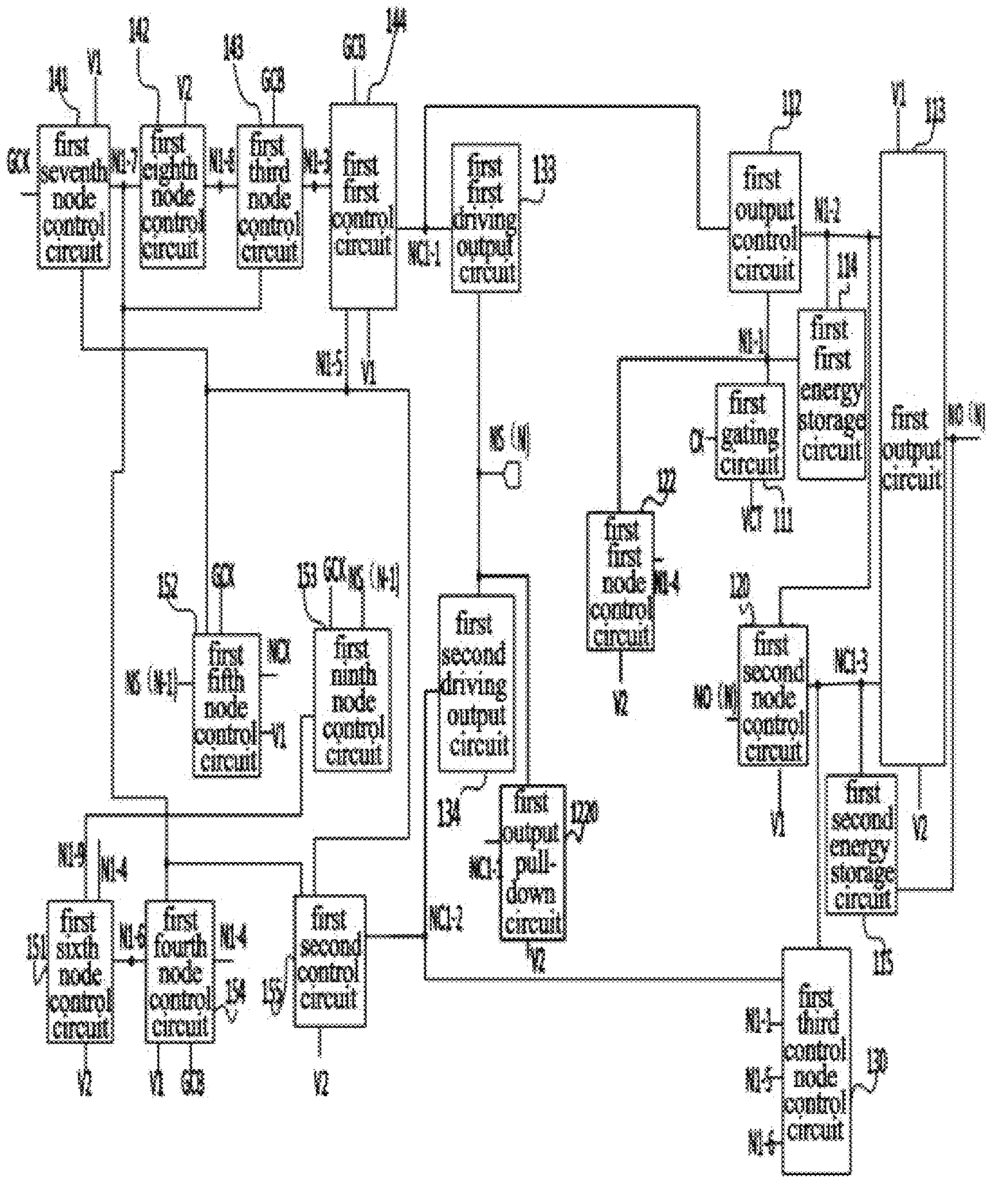
FIG. 22B is a structural diagram of the driving circuit according to at least one embodiment of the present disclosure.

As shown in FIG. 22B, based on at least one embodiment of the driving circuit shown in FIG. 21B, the driving circuit according to at least one embodiment of the present disclosure further includes a first output pull-down circuit 1220;

The first output pull-down circuit 1220 is electrically connected to the first first control node NC1-1, the Nth stage of driving signal output terminal NS (N) and the second voltage terminal V2, respectively, and is configured to control the connection between the Nth stage of driving signal output terminal NS and the second voltage terminal V2 under the control of the potential of the first first control node NC1-1.

Figure 22C:
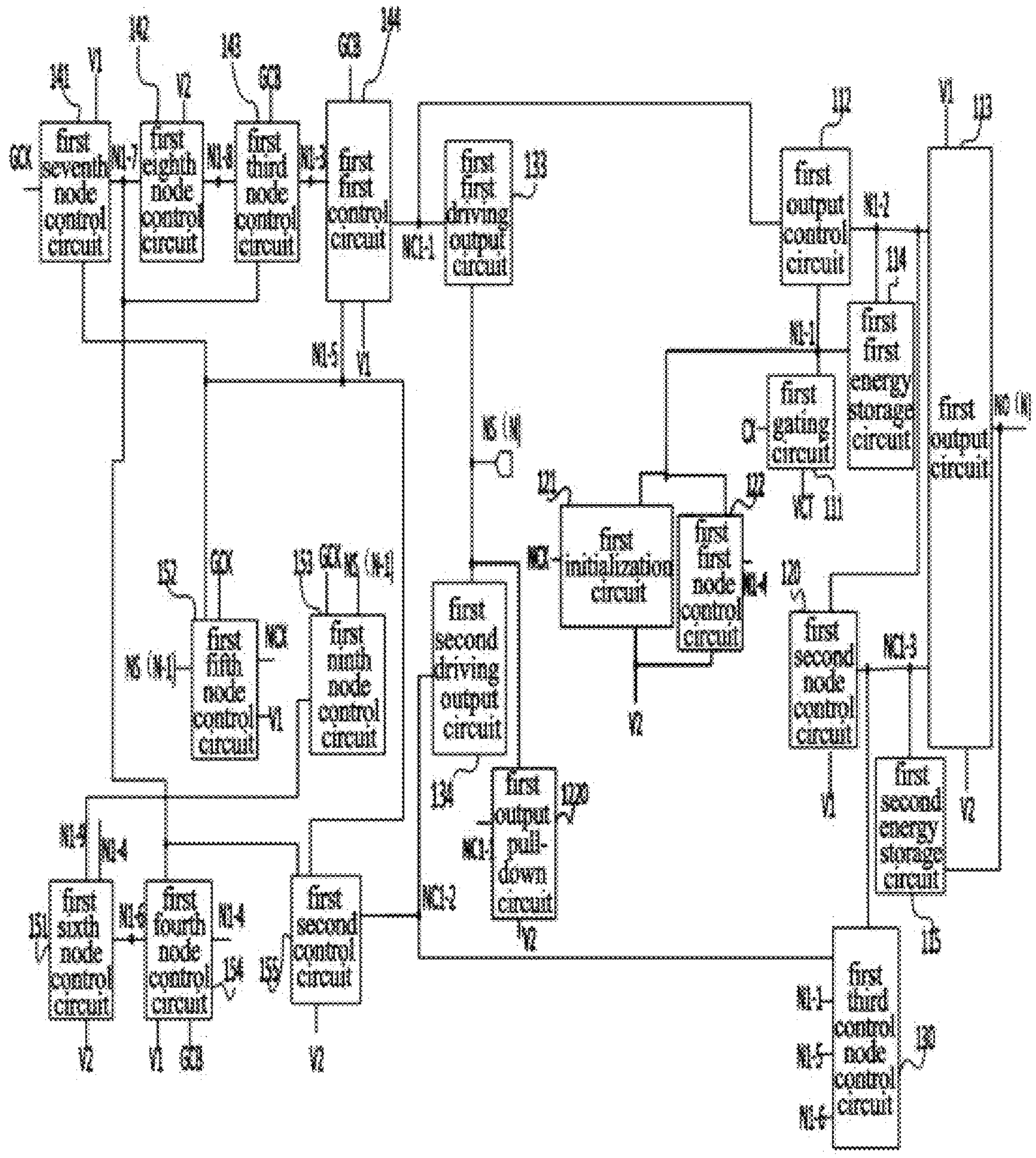
FIG. 22C is a structural diagram of the driving circuit according to at least one embodiment of the present disclosure.

As shown in FIG. 22C, based on at least one embodiment of the driving circuit shown in FIG. 21C, the driving circuit according to at least one embodiment of the present disclosure further includes a first output pull-down circuit 1220;

The first output pull-down circuit 1220 is electrically connected to the first first control node NC1-1, the Nth stage of driving signal output terminal NS (N) and the second voltage terminal V2, respectively, and is configured to control the connection between the Nth stage of driving signal output terminal NS and the second voltage terminal V2 under the control of the potential of the first first control node NC1-1.

Figure 22D:
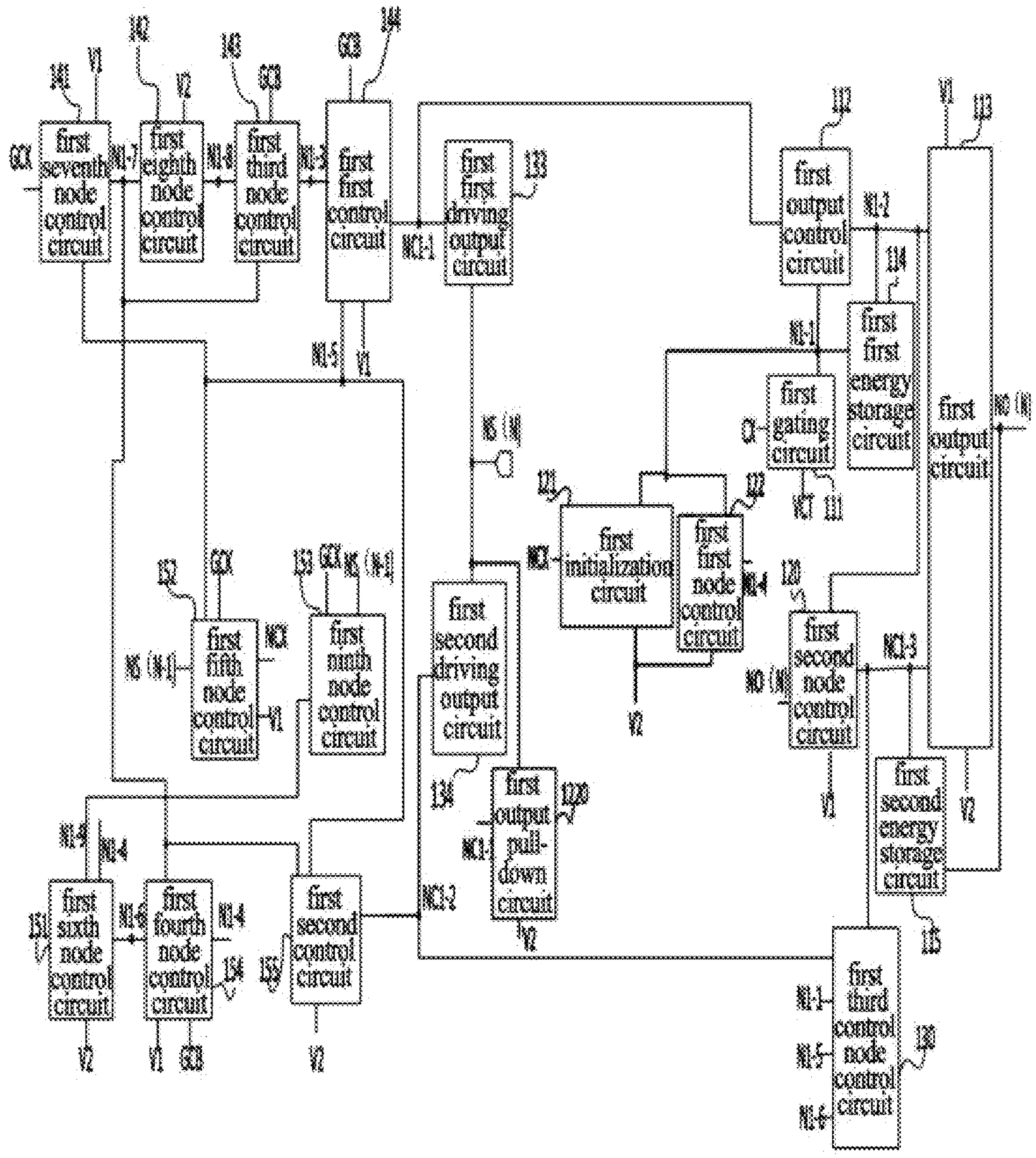
FIG. 22D is a structural diagram of the driving circuit according to at least one embodiment of the present disclosure.

As shown in FIG. 22D, based on at least one embodiment of the driving circuit shown in FIG. 21D, the driving circuit according to at least one embodiment of the present disclosure further includes a first output pull-down circuit 1220;

The first output pull-down circuit 1220 is electrically connected to the first first control node NC1-1, the Nth stage of driving signal output terminal NS (N) and the second voltage terminal V2, respectively, and is configured to control the connection between the Nth stage of driving signal output terminal NS and the second voltage terminal V2 under the control of the potential of the first first control node NC1-1.

Figure 23:
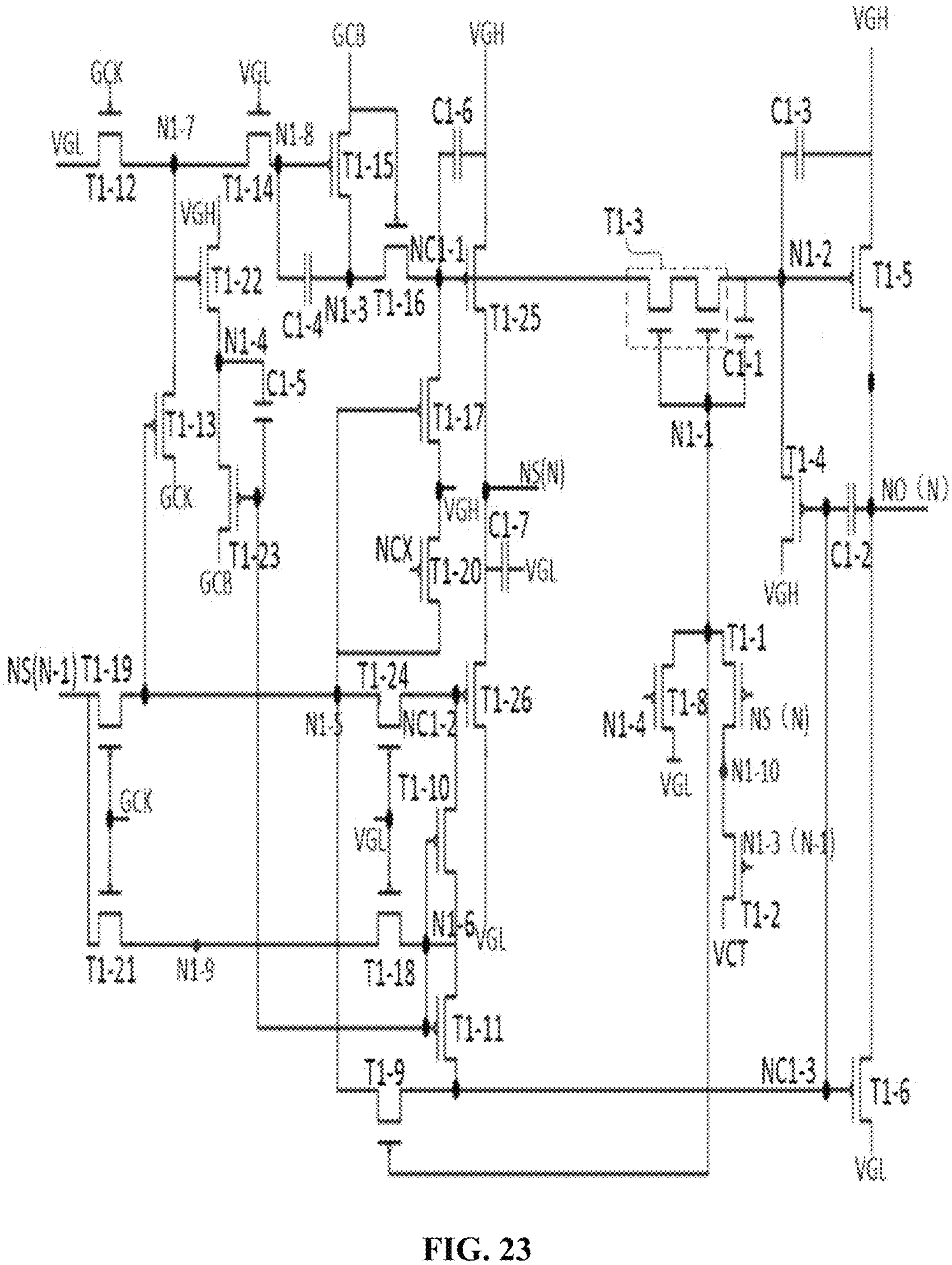
FIG. 23 is a circuit diagram of the driving circuit according to at least one embodiment of the present disclosure.

As shown in FIG. 23, based on at least one embodiment of the driving circuit shown in FIG. 21A, the first gating circuit includes a first first transistor T1-1 and a first second transistor T1-2;

the gate electrode of the first first transistor T1-1 is electrically connected to the Nth stage of driving signal output terminal NS (N), the drain electrode of the first first transistor T1-1 is electrically connected to the first first node N1-1, and the source electrode of the first first transistor T1-1 is electrically connected to the drain electrode of the first second transistor T1-2;

the gate electrode of the first second transistor T1-2 is electrically connected to the (N−1)th stage of first third node N1-3 (N−1), and the source electrode of the first second transistor T1-2 is electrically connected to the gating input terminal VCT;

The first output control circuit includes a first third transistor T1-3;

The gate electrode of the first third transistor T1-3 is electrically connected to the first first node N1-1, the source electrode of the first third transistor T1-3 is electrically connected to the first first control node NC1-1, and the drain electrode of the first third transistor T1-3 is electrically connected to the first second node N1-2;

The first first energy storage circuit includes a first first capacitor C1-1;

The first terminal of the first first capacitor C1-1 is electrically connected to the first first node N1-1, and the second terminal of the first first capacitor C1-1 is electrically connected to the first second node N1-2;

The first second energy storage circuit includes a first second capacitor C1-2;

The first terminal of the first second capacitor C1-2 is electrically connected to the first third control node NC1-3, and the second terminal of the first second capacitor C1-2 is electrically connected to the Nth stage of output driving terminal NO (N);

The first second node control circuit includes a first fourth transistor T1-4;

The gate electrode of the first fourth transistor T1-4 is electrically connected to the first third control node NC1-3, the source electrode of the first fourth transistor T1-4 is electrically connected to the first second node N1-2, and the drain electrode of the first fourth transistor T1-4 is electrically connected to the high voltage terminal VGH;

The first output circuit includes a first fifth transistor T1-5, a first sixth transistor and a first third capacitor C1-3;

The gate electrode of the first fifth transistor T1-5 is electrically connected to the first second node N1-2, the source electrode of the first fifth transistor T1-5 is electrically connected to the high voltage terminal VGH, and the drain electrode of the first fifth transistor T1-5 is electrically connected to the output driving terminal NO (N);

the gate electrode of the first sixth transistor T1-6 is electrically connected to the first third control node NC1-3, the source electrode of the first sixth transistor T1-6 is electrically connected to the output driving terminal NO (N), and the drain electrode of the first sixth transistor T1-6 is electrically connected to the low voltage terminal VGL;

The first terminal of the first third capacitor C1-3 is electrically connected to the first second node N1-2, and the second terminal of the first third capacitor C1-3 is electrically connected to the high voltage terminal VGH;

The first first node control circuit includes the first eighth transistor T1-8;

The gate electrode of the first eighth transistor T1-8 is electrically connected to the first fourth node N1-4, the source electrode of the first eighth transistor T1-8 is electrically connected to the first first node N1-1, and the drain electrode of the first eighth transistor T8 is electrically connected to the low voltage terminal VGL;

The first third control node control circuit includes the first ninth transistor T1-9, the first tenth transistor T1-10 and the first eleventh transistor T1-I1;

The gate electrode of the first ninth transistor T1-9 is electrically connected to the first first node N1-1, the drain electrode of the first ninth transistor T1-9 is electrically connected to the first fifth node N1-5, and the source electrode of the first ninth transistor T1-9 is electrically connected to the first third control node NC1-3;

The gate electrode of the first tenth transistor T1-10 and the source electrode of the first tenth transistor T1-10 are both electrically connected to the first sixth node N1-6, and the drain electrode of the first tenth transistor T1-10 is electrically connected to the first second control node NC1-2;

The gate electrode of the first eleventh transistor T1-11 and the source electrode of the first eleventh transistor T1-11 are both electrically connected to the first sixth node N1-6, and the drain electrode of the first eleventh transistor T1-11 is electrically connected to the first third control node NC1-3;

The first seventh node control circuit includes the first twelfth transistor T1-12 and the first thirteenth transistor T1-13, the first eighth node control circuit includes the first fourteenth transistor T1-14, the first third node control circuit includes the first fifteenth transistor T1-15 and the first fourth capacitor C1-4, and the first first control circuit includes the first sixteenth transistor T1-16 and the first seventeenth transistor T1-17;

The gate electrode of the first twelfth transistor T1-12 is electrically connected to the first clock signal terminal GCK, and the first twelfth transistor T1-12 is electrically connected to the low voltage terminal VGL, and the drain electrode of the first twelfth transistor T1-12 is electrically connected to the first seventh node N1-7;

The gate electrode of the first thirteenth transistor T1-13 is electrically connected to the first fifth node N1-5, the source electrode of the first thirteenth transistor T1-13 is electrically connected to the first seventh node N1-7, and the drain electrode of the first thirteenth transistor T1-13 is electrically connected to the first clock signal terminal GCK;

The gate electrode of the first fourteenth transistor T1-14 is electrically connected to the low voltage terminal VGL, the source electrode of the first fourteenth transistor T1-14 is electrically connected to the first seventh node N1-7, and the drain electrode of the first fourteenth transistor T1-14 is electrically connected to the first eighth node N1-8;

The gate electrode of the first fifteenth transistor T1-15 is electrically connected to the first eighth node N1-8, the source electrode of the first fifteenth transistor T1-15 is electrically connected to the second clock signal terminal GCB, and the drain electrode of the first fifteenth transistor T1-15 is electrically connected to the first third node N1-3;

The first terminal of the first fourth capacitor C1-4 is electrically connected to the first eighth node N1-8, and the second terminal of the first fourth capacitor C1-4 is electrically connected to the first third node N1-3;

The gate electrode of the first sixteenth transistor T1-16 is electrically connected to the second clock signal terminal GCB, the source electrode of the first sixteenth transistor T1-16 is electrically connected to the first third node N1-3, and the drain electrode of the first sixteenth transistor T1-16 is electrically connected to the first first control node NC1-1;

The gate electrode of the first seventeenth transistor T1-17 is electrically connected to the first fifth Node N1-5, the source electrode of the first seventeenth transistor T1-17 is electrically connected to the first first control node NC1-1, and the drain electrode of the first seventeenth transistor T1-17 is electrically connected to the high voltage terminal VGH;

The first sixth node control circuit includes the first eighteenth transistor T1-18 and the first fifth capacitor C1-5, the first fifth node control circuit includes the first nineteenth transistor T1-19 and the first twentieth transistor T1-20, the first ninth node control circuit includes the first twenty-first transistor T1-21, the first fourth node control circuit includes the first twenty-second transistor T1-22 and the first twenty-third transistor T1-23, and the first second control circuit includes the first twenty-fourth transistor T1-24;

The gate electrode of the first eighteenth transistor T1-18 is electrically connected to the low voltage terminal VGL, the source electrode of the first eighteenth transistor T1-18 is electrically connected to the first ninth node N1-9, and the drain electrode of the first eighteenth transistor T1-18 is electrically connected to the first sixth node N1-6;

The first terminal of the first fifth capacitor C1-5 is electrically connected to the first fourth node N1-4, and the second terminal of the first fifth capacitor C1-5 is electrically connected to the first sixth node N1-6;

The gate electrode of the first nineteenth transistor T1-19 is electrically connected to the first clock signal terminal GCK, the source electrode of the first nineteenth transistor T1-19 is electrically connected to the (N−1)th stage of driving signal output terminal NS (N−1), and the drain electrode of the first nineteenth transistor T1-19 is electrically connected to the first fifth node N1-5;

The gate electrode of the first twentieth transistor T1-20 is electrically connected to the initial control terminal NCX, the source electrode of the first twentieth transistor T1-20 is electrically connected to the high voltage terminal VGH, and the drain electrode of the first twentieth transistor T1-20 is electrically connected to the first fifth node N1-5;

The gate electrode of the first twenty-first transistor T1-21 is electrically connected to the first clock signal terminal GCK, the source electrode of the first twenty-first transistor T1-21 is electrically connected to the (N−1)th stage of driving signal output terminal NS (N−1), the drain electrode of the first twenty-first transistor T1-21 is electrically connected to the first ninth node N1-9;

The gate electrode of the first twenty-second transistor T1-22 is electrically connected to the first seventh node N1-7, the source electrode of the first twenty-second transistor T1-22 is electrically connected to the high voltage terminal VGH, and the drain electrode of the first twenty-second transistor T1-22 is electrically connected to the first fourth node N1-4;

The gate electrode of the first twenty-third transistor T1-23 is electrically connected to the first sixth node N1-6, the source electrode of the first twenty-third transistor T1-23 is electrically connected to the first fourth node N1-4, and the drain electrode of the first twenty-third transistor T1-23 is electrically connected to the second clock signal terminal GCB;

The gate electrode of the first twenty-fourth transistor T1-24 is electrically connected to the low voltage terminal VGL, the source electrode of the first twenty-fourth transistor T1-24 is electrically connected to the first ninth node N1-9, and the drain electrode of the first twenty-fourth transistor T1-24 is electrically connected to the first second control node NC1-2;

The first first driving output circuit includes the first twenty-fifth transistor T1-25 and the first sixth capacitor C1-6, and the first second driving output circuit includes the first twenty-sixth transistor T1-26 and a first seventh capacitor C1-7;

The gate electrode of the first twenty-fifth transistor T1-25 is electrically connected to the first first control node NC1-1, the source electrode of the first twenty-fifth transistor T1-25 is electrically connected to the high voltage terminal VGH, and the drain electrode of the first twenty-fifth transistor T1-25 is electrically connected to the Nth stage of driving signal output terminal NS (N);

The first terminal of the first sixth capacitor C1-6 is electrically connected to the first first control node NC1-1, and the second terminal of the first sixth capacitor C1-6 is electrically connected to the high voltage terminal VGH;

The gate electrode of the first twenty-sixth transistor T1-26 is electrically connected to the first second control node NC1-2, the source electrode of the first twenty-sixth transistor T1-26 is electrically connected to the Nth stage of driving signal output terminal NS (N), and the drain electrode of the first twenty-sixth transistor T1-26 is electrically connected to the low voltage terminal VGL;

The first terminal of the first seventh capacitor C1-7 is electrically connected to the Nth stage of driving signal output terminal NS (N), and the second terminal of the first seventh capacitor C1-7 is electrically connected to the low voltage terminal VGL.

In at least one embodiment of the driving circuit shown in FIG. 23, T1-3 is a dual-gate transistor, but not limited to this; in specific implementation, T1-3 can also be replaced by a single-gate transistor.

In FIG. 23, the first tenth node is labeled N1-10.

In at least one embodiment of the driving circuit shown in FIG. 23, all transistors are p-type transistors, but not limited to this.

In at least one embodiment of the driving circuit shown in FIG. 23, the first voltage terminal is a high voltage terminal, and the second voltage terminal is a low voltage terminal, but not limited thereto.

In at least one embodiment of the driving circuit shown in FIG. 23, all transistors are p-type transistors, but not limited thereto.

In at least one embodiment of the driving circuit shown in FIG. 23, N1-10 is the first tenth node.

In at least one embodiment of the present disclosure, the structure of the first driving signal generation circuit is not limited to that shown in FIG. 22, and the first driving signal generation circuit can be, for example, a 16T3C circuit, a 13T3C circuit, a 12T3C circuit, a 10T3C circuit, etc., but not limited thereto.

In at least one embodiment of the driving circuit shown in FIG. 23 of the present disclosure, when the potential of the Nth stage of driving output signal provided by NO (N) is reduced from a high voltage to a low voltage, the potential of the first third control node NC1-3 can be pulled down, so that T1-6 can be better turned on, and the potential of the Nth stage of driving output signal is maintained at a low voltage.

At least one embodiment of the driving circuit shown in FIG. 23 of the present disclosure is in operation.

In the first phase, when NS (N−1) outputs a low voltage signal, GCK outputs a low voltage signal, and GCB outputs a high voltage signal, T1-19 and T1-21 are turned on to pull down the potential of N1-5 and the potential of N1-9, T1-24 and T1-18 are turned on to pull down the potential of NC1-2 and N1-6, and T1-26 is turned on; the potential of N1-6 is a low voltage, ensuring that T1-23 is turned on, the potential of N1-5 is a low voltage, and the T1-13 is turned on, GCK provides a low voltage signal, T1-12, T1-14 are turned on, the potential of N1-7 and the potential of N1-8 are low voltage, T1-15 is turned on to control the potential of N1-3 to be high voltage, the potential of N1-5 is low voltage, to turn on T1-17, the potential of NC1-1 is high voltage; T1-10 and T1-11 are turned on, the potential of NC1-2 and the potential of NC1-3 are both low voltage;

In the second phase, NS (N−1) outputs a low voltage signal, and the potential of the first clock signal outputted by GCK jumps from low voltage to high voltage, GCB outputs a low voltage signal, T1-19 and T1-21 are turned off, the potential of N1-5 is low voltage, T1-12 is turned off, the potential of N1-5 is maintained at a low voltage, T1-13 is turned on, T1-14 is turned on, the potential of N1-7 and the potential of N1-8 are high voltage, T1-15 is turned off, the potential of N1-3 maintains the high voltage of the previous phase, T1-16 is turned on to maintain the potential of NC1-1 at a high voltage, and T1-25 is turned off; at the same time, the potential of N1-6 is low voltage, to turn on T1-23, GCB writes the low voltage signal to N1-4, and pulls the potential of N1-6 to a lower voltage through C1-4 (5V~10V lower than the voltage value of the low voltage signal provided by GCB), T1-10 and T1-11 are turned on, and the low voltage signal is written to NC1-2 and N1-6 (the potential of NC1-2 is 3~8V lower than the voltage value of the low voltage signal provided by GCB), T1-26 is fully turned on, NS (N) outputs a low voltage signal; the potential of NC1-3 is low voltage, T1-6 is turned on, NO (N) outputs a low voltage signal; the potential of N1-4 is low voltage, T1-8 is turned on to pull down the potential of N1-1; T1-9 is turned on to control the potential of NC1-3 to be low voltage, T1-6 is turned on, NO (N) outputs a low voltage signal; since the potential of N1-4 is low voltage, T1-8 is turned on to control the potential of N1-1 to be low voltage, T1-3 is turned on to control the connection between NC1-1 and N1-2, the potential of N1-2 is high voltage, and T1-5 is turned off;

In the third phase, NS (N−1) outputs a high voltage signal, GCK outputs a low voltage signal, GCB outputs a high voltage signal, T1-19 and T1-21 are turned on to pull up the potential of N1-5 and the potential of N1-9, T1-24 and T1-18 are turned on, the potential of NC1-2 and the potential of N1-6 are high voltage, T1-26 is turned off; the potential of N1-6 is high voltage, T1-23 is turned off, the potential of N1-5 is high voltage, T1-13 is turned off, GCK outputs a low voltage signal to turn on T1-12, T1-14 is turned on to pull down the potential of N1-7 and the potential of N1-8, T1-15 is turned on, GCB writes a high voltage signal to N1-3, T1-16 is turned off, the potential of N1-5 is high voltage to turn off T1-17, and the potential of NC1-1 is high voltage; ensure that T1-25 is turned off; T1-22 is turned on, the potential of N1-4 is high voltage, and T1-8 is turned off; the potential of NC1-1 and the potential of NC1-2 are both high voltage, and NS (N) continues to output a low voltage signal; T1-10 and T1-11 are turned off, In the third phase, N1-3 (N−1) and NS (N) output low voltage signals, T1-1 and T1-2 are turned on, and VCT is connected to N1-1;

In the third phase, when VCT provides a high voltage signal, the potential of N1-1 is high voltage, T1-9 is turned off, T1-3 is turned off, and the potential of N1-2 is maintained at a high voltage; T1-9 is turned off, NC1-3 is disconnected from N1-5, the potential of N1-6 is high voltage, T1-10 and T1-11 are turned off, the potential of NC1-3 is maintained at a low voltage, T1-6 is turned on, and NO (N) outputs a low voltage signal;

In the third phase, when VCT provides a low voltage signal, the potential of N1-1 is low voltage, T1-9 is turned on, T1-3 is turned on, NC1-1 is connected to N1-2, the potential of N1-2 is high voltage, T1-5 is turned off, T1-9 is turned on to control the connection between NC1-3 and N1-5, the potential of NC1-3 is high voltage, and NO (N) continues to output a low voltage signal;

In the fourth phase, NS (N−1) outputs a high voltage signal, and the potential of the first output clock signal outputted by GCK jumps from low voltage to high voltage, GCB outputs a low voltage signal, T1-19 and T1-21 are turned off, the potential of N1-7 is maintained at a low voltage, T1-14 is turned on, the potential of N1-8 is a low voltage, T1-15 is turned on, T1-16 is turned on to write the low voltage signal to N1-3 and NC1-1, T1-25 is turned on, and NS (N) outputs a high voltage signal; at the same time, the potential of N1-6 is a high voltage, T1-2 3 is turned off, the potential of N1-4 is maintained at a high voltage, the potential of N1-6 is maintained at a high voltage; T1-10 and T1-11 are turned off;

In the fourth phase, N1-3 (N−1) outputs a high voltage signal, T1-2 is turned off, and T1-8 is turned off;

When the potential of N1-1 is a low voltage, T1-9 is turned on to control the connection between N1-5 and NC1-3, the potential of N1-5 is a high voltage, the potential of NC1-3 is a high voltage, and T1-6 is turned off; T1-3 is turned on to control the connection between NC1-1 and N1-2, the potential of N1-2 is low voltage, T1-5 is turned on, T1-6 is turned off, and NO (N) outputs a high voltage signal;

When the potential of N1-1 is high voltage, T1-9 is turned off to control the disconnection between N1-5 and NC1-3, the potential of NC1-3 is maintained at a high voltage, the potential of NC1-3 maintains a low voltage in the third phase, and T1-6 remains on; T1-3 is turned off to control the disconnection between NC1-1 and N1-2, the potential of N1-2 is maintained at a high voltage, T1-5 is turned off, and NO (N) continues to output a low voltage signal;

In the fifth phase, the potential of the (N−1)th stage of driving signal output by NS (N−1) jumps from high voltage to low voltage, GCK outputs a high voltage signal, GCB outputs a low voltage signal, T1-19 and T1-21 are turned off, the potential of N1-5 and the potential of N1-9 are maintained at high voltage, the potential of the remaining nodes remains unchanged, ensuring that NS (N) outputs a high voltage signal;

In the sixth phase, NS (N−1) outputs a low voltage signal, the potential of the first clock signal output by GCK jumps from high voltage to low voltage, GCB outputs a high voltage signal, T1-19 and T1-21 are turned on, controlling the potential of N1-5 and the potential of N1-9 to be low voltage, T1-24 and T1-18 are turned on, the potential of NC1-2 and N1-6 is low voltage, T1-26 is turned on, the potential of N1-6 is low voltage, ensuring that T1-23 is turned on, the potential of N1-5 is low voltage to turn on T1-13, T1-12 is turned on to pull down the potential of N1-7 and the potential of N1-8, to turn on T1-15, GCB writes a high voltage signal to N1-3, the potential of N1-5 is low voltage to turn on T1-17, and the potential of NC1-1 is pulled up to a high voltage to ensure that T1-25 is turned off.

Figure 24A:
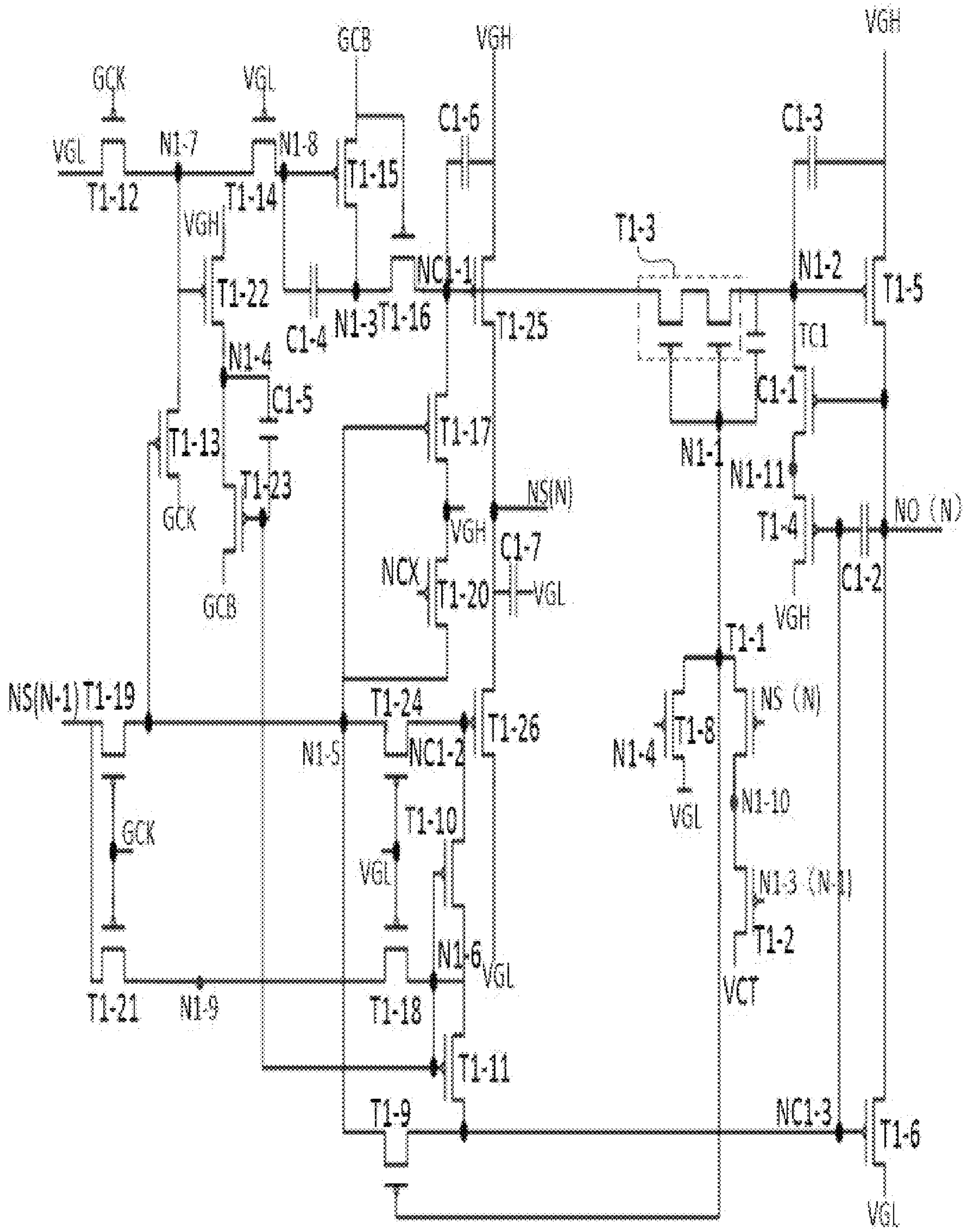
FIG. 24A is a circuit diagram of the driving circuit according to at least one embodiment of the present disclosure.

The difference between at least one embodiment of the driving circuit shown in FIG. 24A and at least one embodiment of the driving circuit shown in FIG. 23 is that:

The first second node control circuit includes a first fourth transistor T1-4 and a first control transistor TC1;

The gate electrode of the first fourth transistor T1-4 is electrically connected to the first third control node NC1-3, the source electrode of the first fourth transistor T1-4 is electrically connected to the drain electrode of the first control transistor TC1, and the drain electrode of the first fourth transistor T1-4 is electrically connected to the high voltage terminal VGH;

The gate electrode of the first control transistor TC1 is electrically connected to the Nth stage of output driving terminal NO (N), and the source electrode of the first control transistor TC1 is electrically connected to the first second node N1-2.

When at least one embodiment of the driving circuit shown in FIG. 24A of the present disclosure is working, when NO (N) outputs a low voltage signal and the potential of NC1-3 is a low voltage, T1-4 and TC1 are turned on to connect N1-2 to VGH, so that the potential of N1-2 is a high voltage, ensuring that T1-5 is turned off, and ensuring that NO (N) outputs a low voltage signal.

In FIG. 24A, the node labeled N1-11 is the first eleventh node.

Figure 24B:
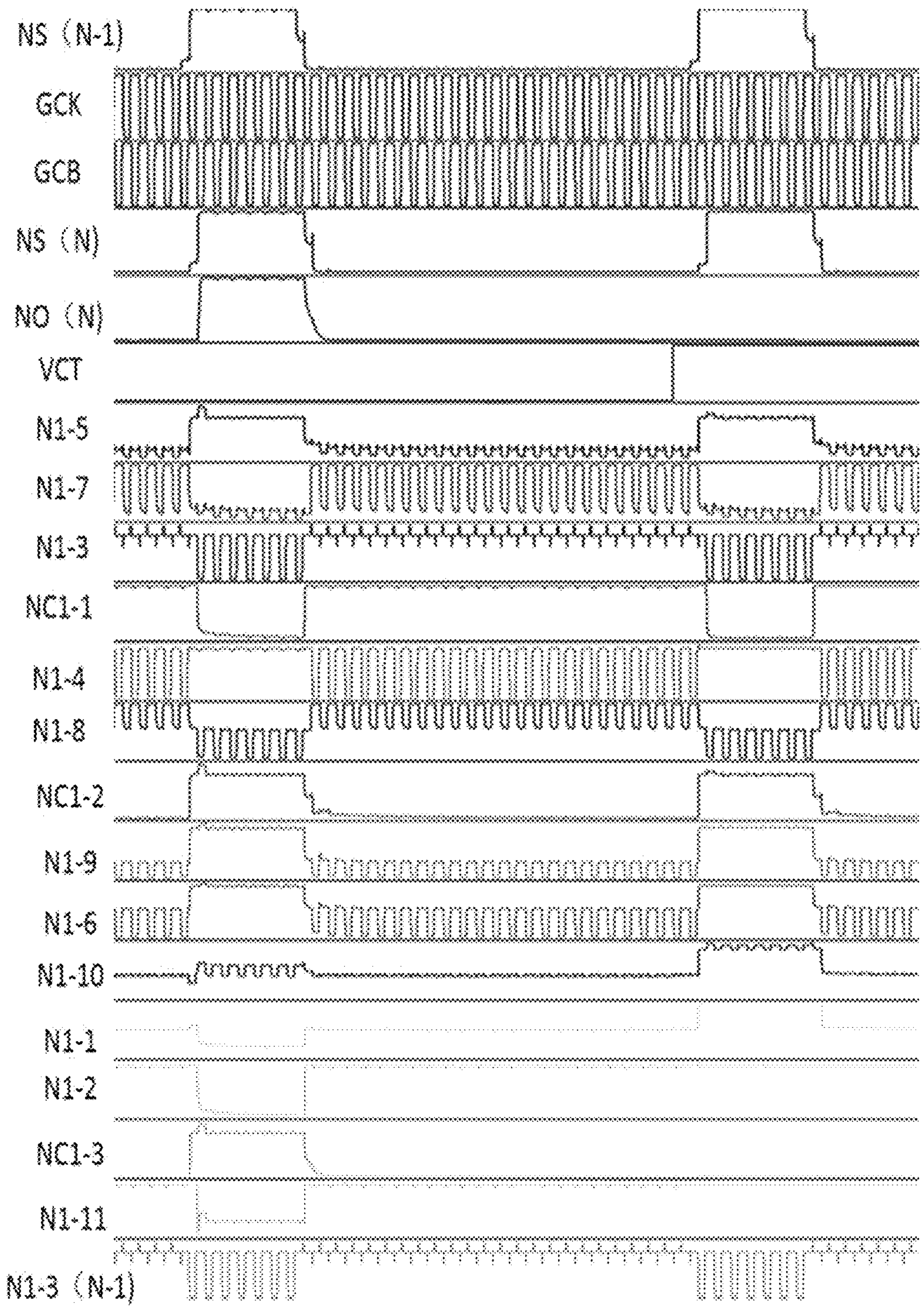
FIG. 24B is a simulation timing diagram of the driving circuit shown in FIG. 24.

FIG. 24B is a simulation operation timing diagram of the driving circuit shown in FIG. 24A of the present disclosure.

Figure 25:
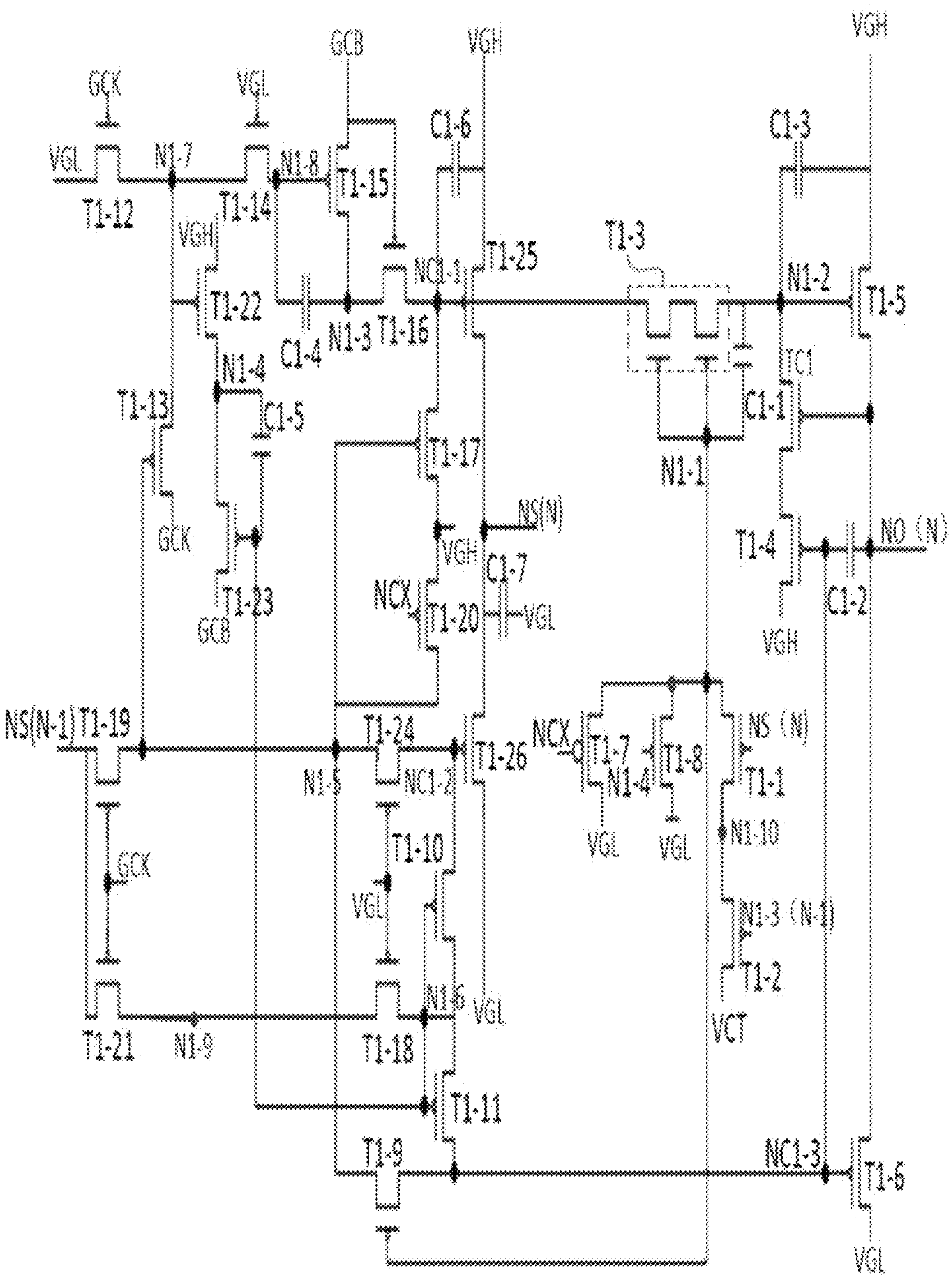
FIG. 25 is a circuit diagram of the driving circuit according to at least one embodiment of the present disclosure.

The difference between at least one embodiment of the driving circuit shown in FIG. 25 and at least one embodiment of the driving circuit shown in FIG. 24 is that:

At least one embodiment of the driving circuit shown in FIG. 25 of the present disclosure further includes a first initialization circuit;

The first initialization circuit includes a first seventh transistor T1-7;

The gate electrode of the first seventh transistor T1-7 is electrically connected to the initial control terminal NCX, the source electrode of the first seventh transistor T1-7 is electrically connected to the first first node N1-1, and the drain electrode of the first seventh transistor T1-7 is electrically connected to the low voltage terminal VGL.

In at least one embodiment of the driving circuit shown in FIG. 25, T1-7 is a p-type transistor.

At least one embodiment of the driving circuit shown in FIG. 25 of the present disclosure is in operation.

When the display starts (that is, when the display device is turned on), in the reset phase before the first phase, NCX outputs a low voltage signal, T1-7 is turned on to control the potential of N1-1 to be low voltage, T1-3 is turned on to control the connection between NC1-1 and N1-2; T1-9 is turned on to control the connection between NC1-3 and N1-5; T1-20 is turned on to control the potential of N1-5 and NC1-3 to be high voltage; at this time, NC1-1 and N1-2 are low potential, T1-25 is turned on, T1-5 is turned on, NS (N) and NO (N) both output high voltage signals, and the second display control transistor M2 included in all pixel circuits in the effective display area can be turned on to clear the residual charge in the storage capacitor Cst and improve the screen flickering problem when the screen is turned on;

Afterwards, when NS (N) and N1-3 (N−1) both output low voltage signals, T1-1 and T1-2 are turned on to control the connection between VCT and N1-1;

When VCT provides a low voltage signal, the potential of N1-1 is low voltage, and C1-1 maintains the potential of N1-1; T1-3 is turned on to control the connection between NC1-1 and N1-2. At this time, the potential of NC1-1 is high voltage, the potential of N1-2 is high voltage, T1-5 is turned off, T1-9 is turned on to control the connection between NC1-3 and N1-5, the potential of NC1-3 is high voltage, and NO (N) continues to output low voltage signals;

When VCT provides a high voltage signal, the potential of N1-1 is high voltage, T1-3 is turned off, NC1-1 is disconnected from N1-2, C1-1 controls the potential of N1-2 to be high voltage, T1-9 is turned off, NC1-3 is disconnected from N1-5, and the potential of N1-6 is high voltage, T1-10 and T1-11 are turned off, the potential of NC1-3 is maintained at a low voltage, T1-6 is turned on, and NO (N) outputs a low voltage signal;

Afterwards, in the Nth stage of driving signal providing phase, NS (N) outputs a high voltage signal. At this time, the potential of NC1-1 is low voltage, and the potential of NC1-2 is high voltage; when the potential of N1-1 is low voltage, T1-3 is turned on, NC1-1 is connected to N1-2, the potential of N1-2 is low voltage, T1-9 is turned on to control the connection between N1-5 and NC1-3, the potential of N1-5 is high voltage, the potential of NC1-3 is high voltage, and T1-6 is turned off; T1-5 is turned on, T1-6 is turned off, and NO (N) outputs a high voltage signal;

When the potential of N1-1 is high voltage, T1-3 is turned off, NC1-1 is disconnected from N1-2, and the potential of N1-2 is maintained at high voltage, T1-9 is turned off to control the disconnection between N1-5 and NC1-3, the potential of NC1-3 is maintained at a low voltage, and T1-6 is turned on; T1-5 is turned off, and NO (N) continues to output a low voltage signal;

After the Nth stage of driving signal supply phase, when the potential of N1-4 is a low voltage, T1-8 is turned on to control the connection between N1-1 and VGL, the potential of N1-1 is a low voltage, T1-3 is turned on to control the connection between NC1-1 and N1-2, at this time, the potential of NC1-1 is a high voltage, the potential of NC1-2 is a low voltage, the potential of N1-2 is a high voltage, T1-9 is turned on to control the connection between NC1-3 and N1-5, when the potential of N1-5 and the potential of N1-6 are both low voltages, T1-10 and T1-11 are turned on, the potential of NC1-3 is a low voltage, and NO (N) outputs a low voltage signal.

At least one embodiment of the driving circuit shown in FIG. 25 of the present disclosure is in operation. When N1-3 (N−1) outputs a low voltage signal and NS (N) outputs a low voltage signal, T1-1 and T1-2 are turned on. By simultaneously gating the above two signals, the gating input signal state within a high-low frequency switching cycle can be obtained and written into N1-1. T1-1 and T1-2 will not be turned on at the same time at other times to prevent the potential of N1-1 from being affected by the gating input signal provided by VCT.

At least one embodiment of the driving circuit shown in FIG. 25 of the present disclosure is in operation. When NS (N) and N3 (N−1) both output low voltage signals, VCT outputs a low voltage signal, the potential of N1-1 is low voltage, T1-3 is turned on, the potential of N1-2 is the same as the potential of NC1-1, NC1-3 turns off T1-6, and N1-2 turns on T1-5, NO (N) can be guaranteed to output normally;

When NS (N) and N1-3 (N−1) both output low voltage signals, VCT outputs a high voltage signal, the potential of N1-1 is high voltage, T1-3 is turned off, T1-9 is turned off, the potential of N1-2 is high voltage, T1-5 is turned off, the potential of N1-6 is high voltage, T1-11 is in a reversed cutoff state, the potential of NC1-3 is maintained at low voltage, T1-6 is turned on, which can ensure that NO (N) always outputs low voltage signals; the potential of NC1-3 is low voltage to turn on T1-4, maintain the potential of N1-2 at high voltage, and prevent T1-5 from leaking. After NO (N) completes the output, the potential of N1-4 is low voltage, and T1-8 is turned on to pull the potential of N1-1 down to low voltage.

Figure 26:
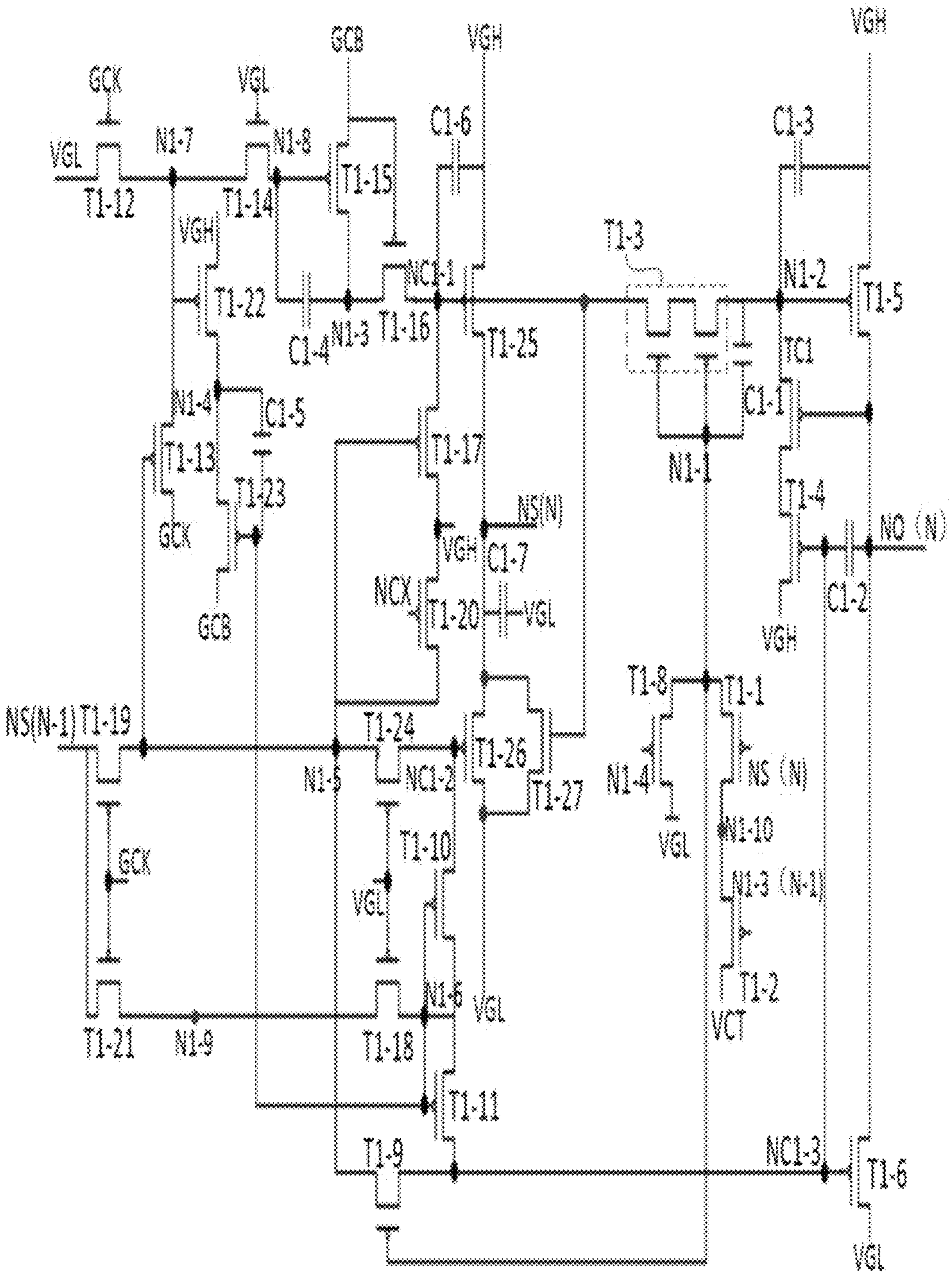
FIG. 26 is a circuit diagram of the driving circuit according to at least one embodiment of the present disclosure.

The difference between at least one embodiment of the driving circuit shown in FIG. 26 of the present disclosure and at least one embodiment of the driving circuit shown in FIG. 24 is that:

At least one embodiment of the driving circuit shown in FIG. 26 of the present disclosure also includes a first output pull-down circuit;

The first output pull-down circuit includes a first twenty-seventh transistor T1-27;

The gate electrode of the first twenty-seventh transistor T1-27 is electrically connected to the first first control node NC1-1, the source electrode of the first twenty-seventh transistor T1-27 is electrically connected to the Nth stage of driving signal output terminal NS (N), and the drain electrode of the first twenty-seventh transistor T1-27 is electrically connected to the low voltage terminal VGL.

In at least one embodiment of the driving circuit shown in FIG. 26, T1-27 is an n-type transistor.

When at least one embodiment of the driving circuit shown in FIG. 26 is working, when the potential of NC1-1 is a high voltage, T1-27 is turned on, NS (N) is connected to VGL, and NS (N) outputs a low voltage signal.

Figure 27:
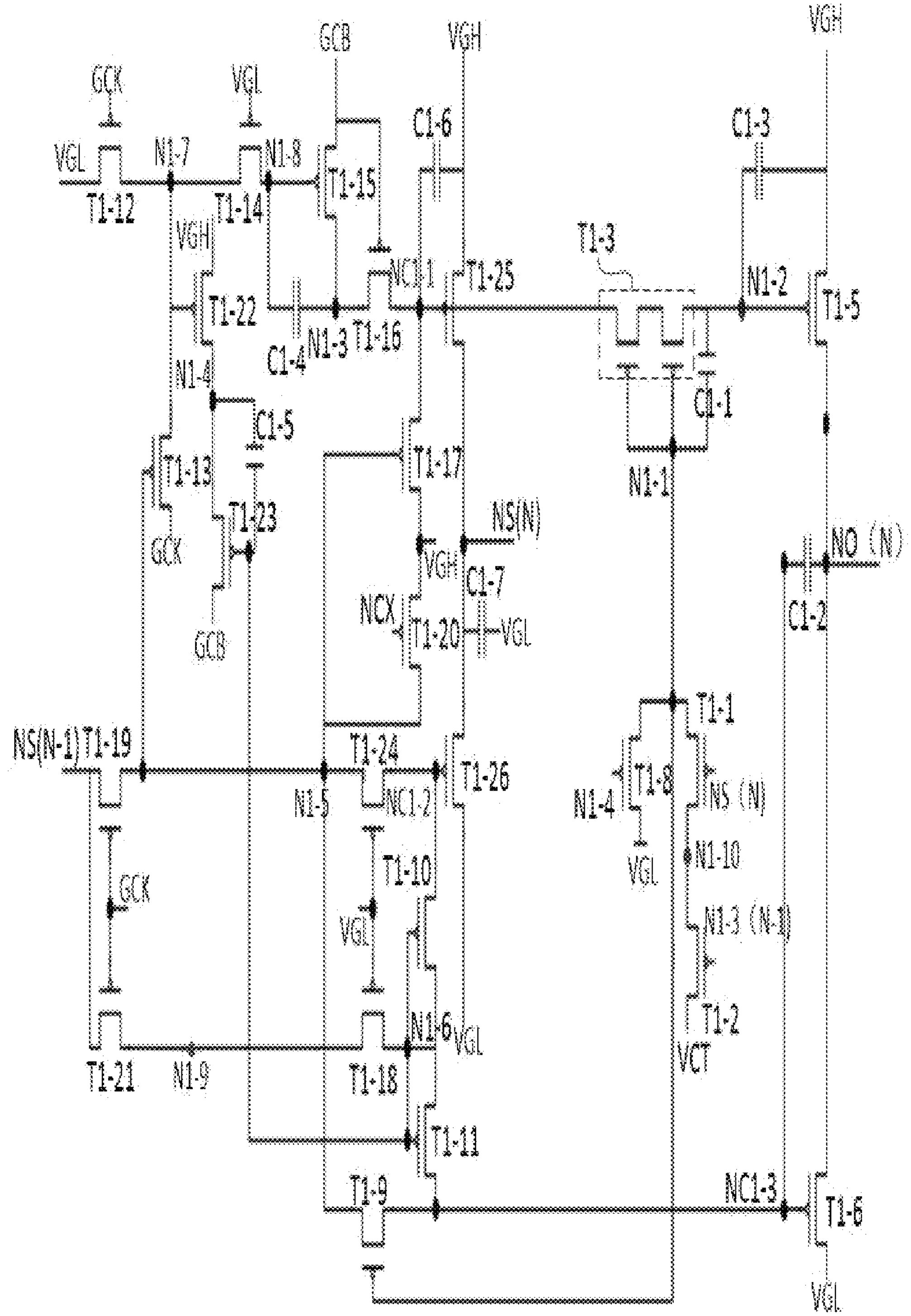
FIG. 27 is a circuit diagram of the driving circuit according to at least one embodiment of the present disclosure.

The difference between at least one embodiment of the driving circuit shown in FIG. 27 and at least one embodiment of the driving circuit shown in FIG. 23 is that the first fourth transistor T1-4 is not included.

Figure 28:
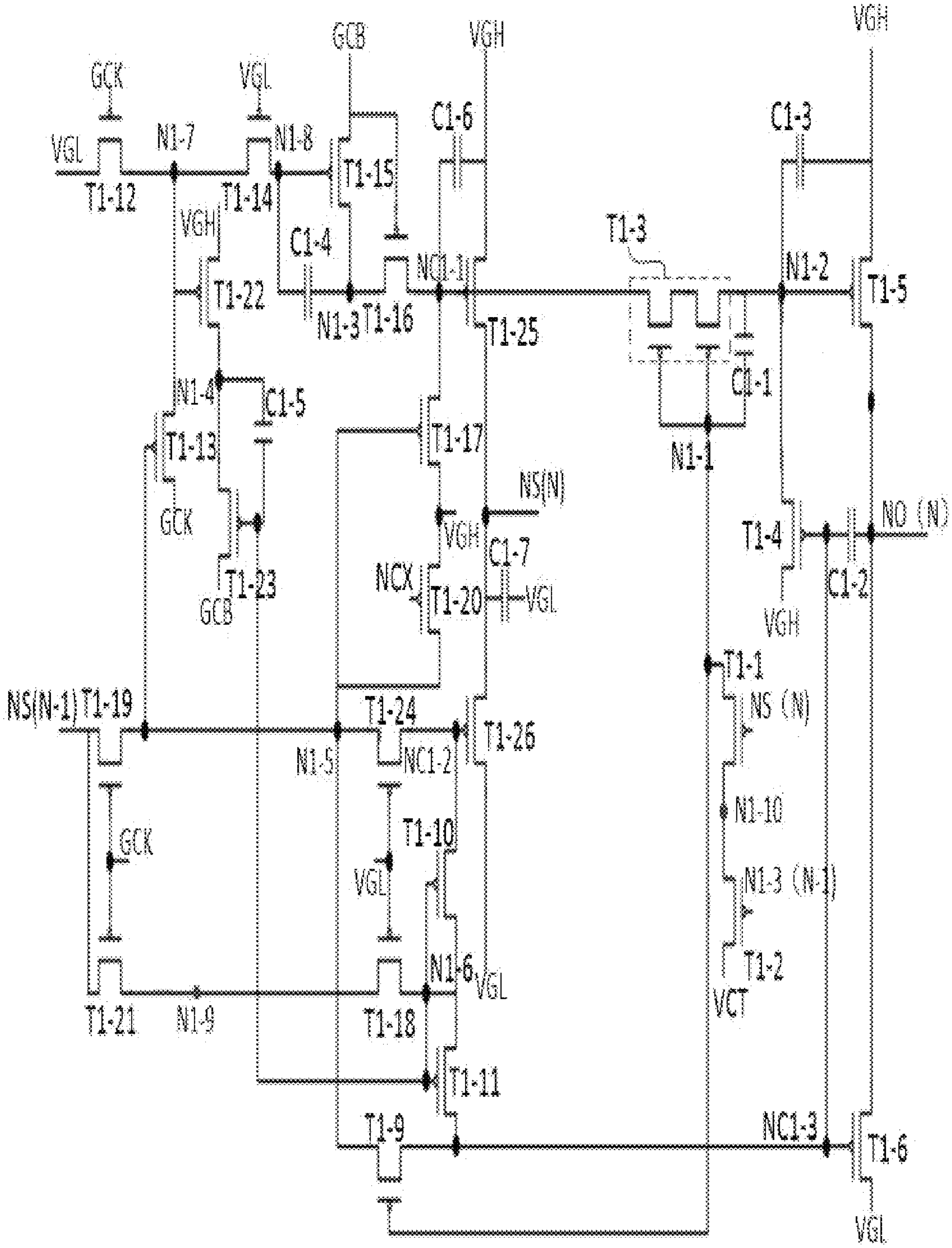
FIG. 28 is a circuit diagram of the driving circuit according to at least one embodiment of the present disclosure.

The difference between at least one embodiment of the driving circuit shown in FIG. 28 and at least one embodiment of the driving circuit shown in FIG. 23 is that the first eighth transistor T1-8 is not included.

Figure 29:
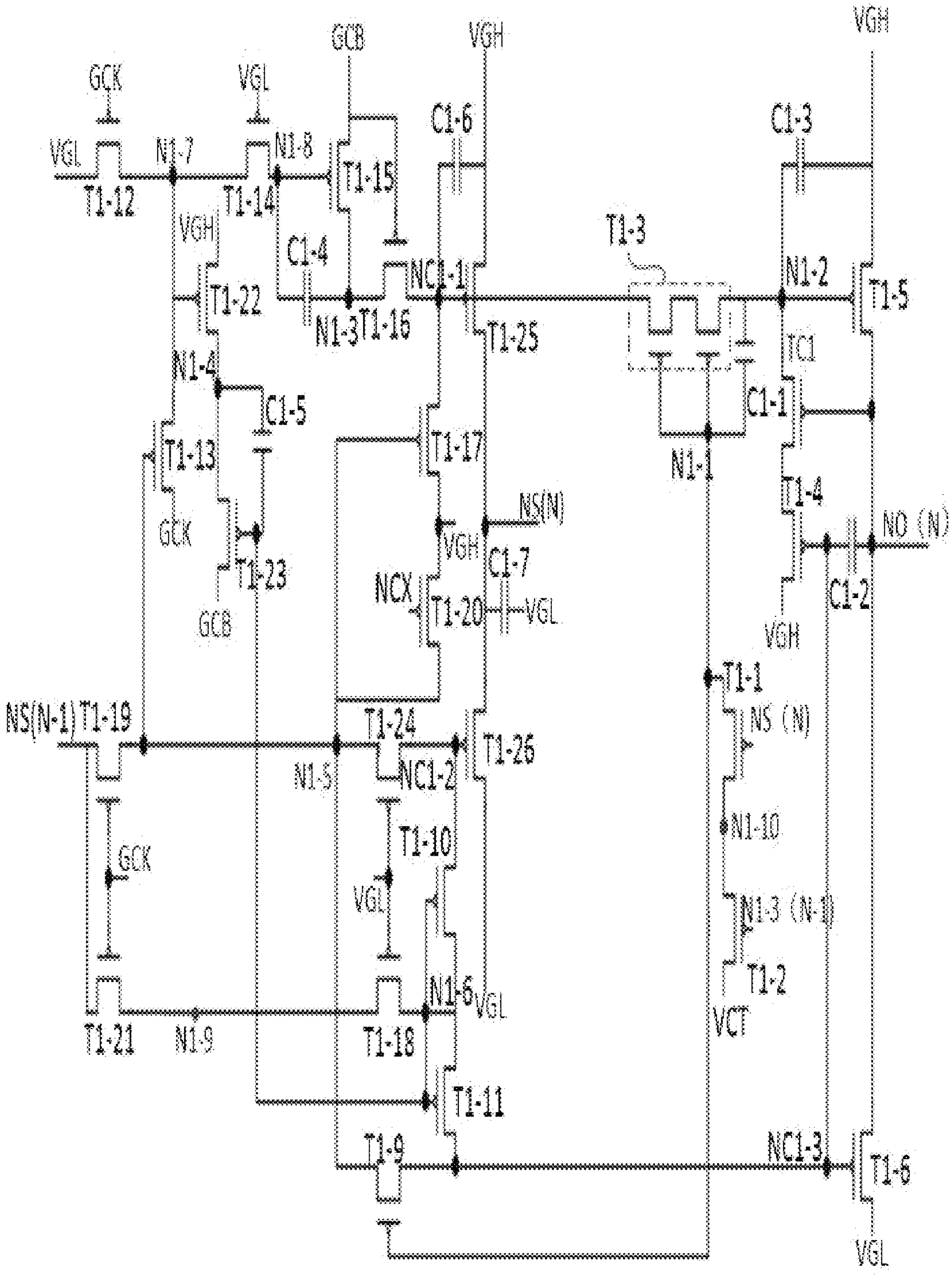
FIG. 29 is a circuit diagram of the driving circuit according to at least one embodiment of the present disclosure.

The difference between at least one embodiment of the driving circuit shown in FIG. 29 and at least one embodiment of the driving circuit shown in FIG. 24 is that the first eighth transistor T1-8 is not included.

Figure 30:
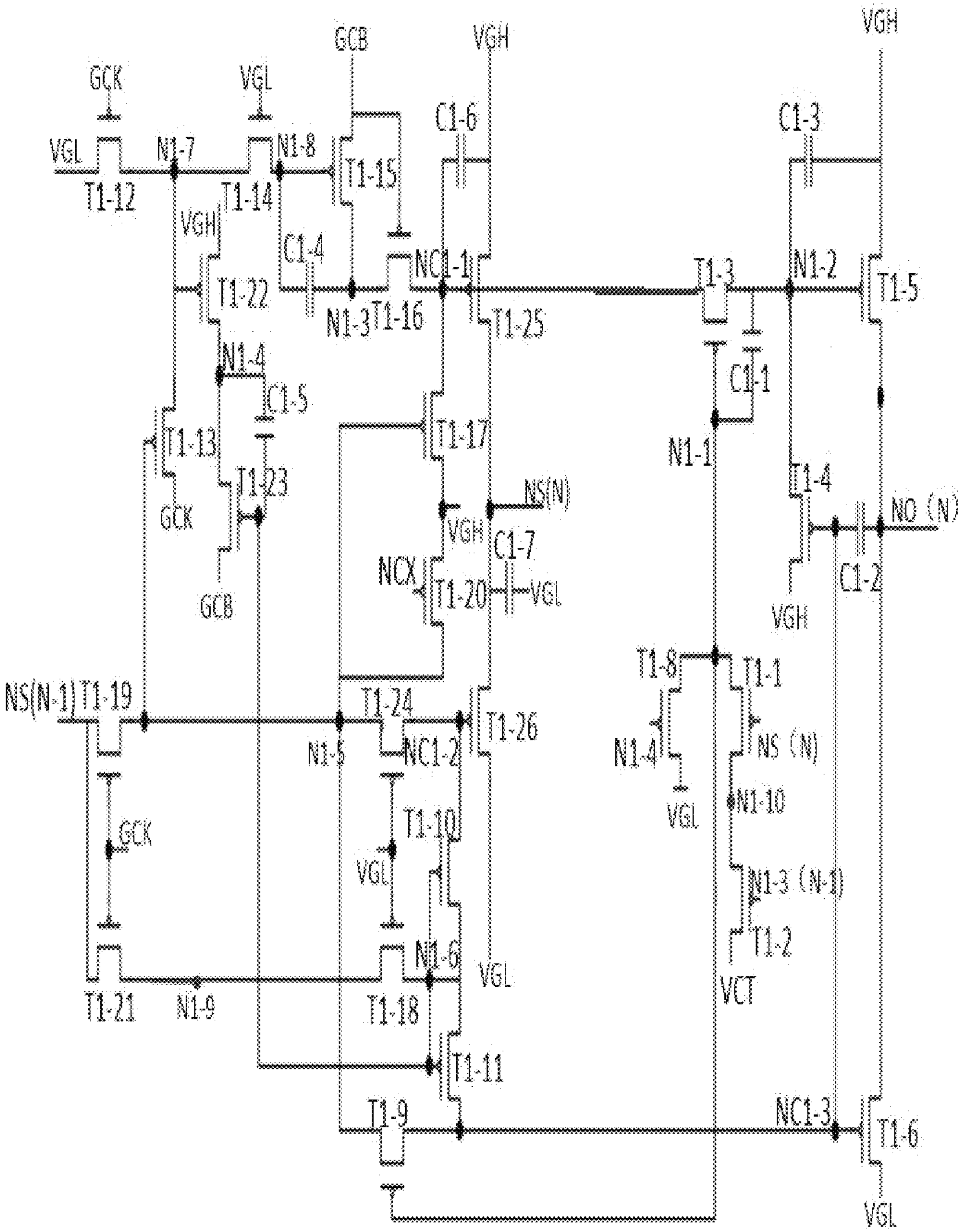
FIG. 30 is a circuit diagram of the driving circuit according to at least one embodiment of the present disclosure.

The difference between at least one embodiment of the driving circuit shown in FIG. 30 and at least one embodiment of the driving circuit shown in FIG. 23 is that T1-3 is a single-gate transistor.

Figure 31:
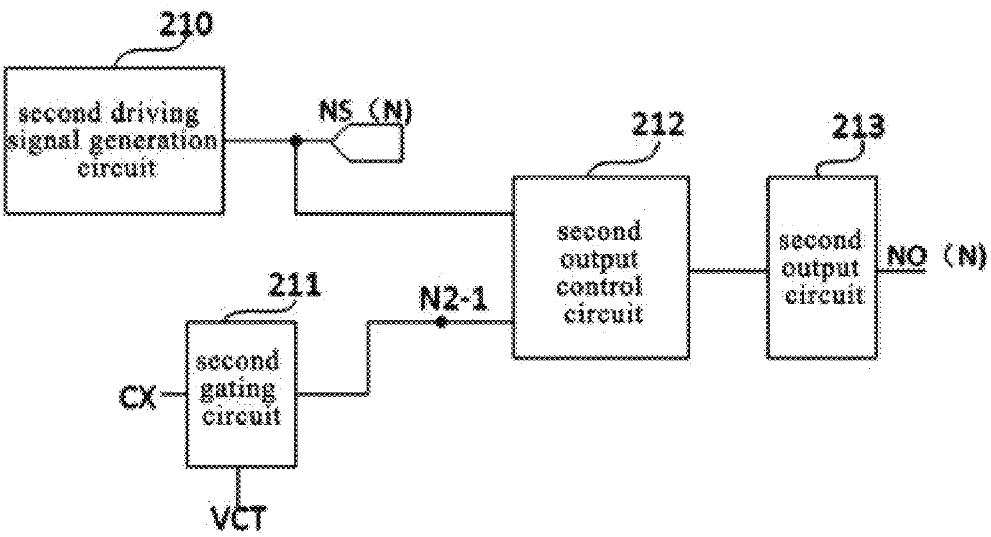
FIG. 31 is a structural diagram of the driving circuit according to at least one embodiment of the present disclosure.

As shown in FIG. 31, the driving circuit according to the embodiment of the present disclosure includes a second driving signal generation circuit 210, a second gating circuit 211, a second output control circuit 212 and a second output circuit 213;

The second driving signal generation circuit 210 is electrically connected to the Nth stage of driving signal output terminal NS (N), and is configured to generate and output the Nth stage of driving signal through the Nth stage of driving signal output terminal NS (N);

The second gating circuit 211 is electrically connected to the second first node N2-1, the gating input terminal VCT and the gating control terminal CX, respectively, and is configured to control to write the gating input signal provided by the gating input terminal VCT into the second first node N2-1 under the control of the gating control signal provided by the gating control terminal CX;

The first terminal of the second output control circuit 212 is electrically connected to the Nth stage of driving signal output terminal NS (N), and the second terminal of the second output control circuit 212 is electrically connected to the second first node N2-1, which is configured to perform a non-AND operation on the Nth stage of driving signal and the potential of the second terminal of the second output control circuit 212 to obtain a first output signal;

The second output circuit 213 is electrically connected to the second output control circuit 212 and the output driving terminal NO (N) respectively, which is configured to invert the first output signal, obtain and provide an output driving signal through the output driving terminal NO (N);

N is a positive integer.

When the embodiment of the driving circuit shown in FIG. 31 of the present disclosure is working, the second driving signal generation circuit 210 generates and outputs the Nth stage of driving signal through the Nth stage of driving signal output terminal NS (N), and the second gating circuit 211 writes the gating input signal into the second first node N2-1 under the control of the gating control signal; the second output control circuit 212 performs an NAND operation on the Nth stage of driving signal and the potential of the second terminal of the second output control circuit 212 to obtain the first output signal, and the second output circuit 213 inverts the first output signal to obtain and provide the output driving signal through the output driving terminal NO (N).

The embodiment of the driving circuit shown in FIG. 31 of the present disclosure can be the Nth stage of driving circuit.

When the embodiment of the driving circuit shown in FIG. 31 of the present disclosure is working, within one frame time, before the Nth stage of driving signal providing phase, the second gating circuit 211 writes the gating input signal provided by the gating input terminal VCT into the second first node N2-1 under the control of the gating control signal;

when the gating input signal is a high voltage signal, in the Nth stage of driving signal providing phase, the Nth stage of driving signal output terminal NS (N) outputs a high voltage signal, then the first output signal output by the second output control circuit 212 is a low voltage signal, and the second output circuit 213 provides a high voltage signal through the output driving terminal NO (N), which can control the corresponding row pixel circuit to update the pixel voltage;

when the gating input signal is a low voltage signal, in the Nth stage of driving signal providing phase, the Nth stage of driving signal output terminal NS (N) outputs a high voltage signal, then the first output signal output by the second output control circuit 212 is a high voltage signal, and the second output circuit 213 provides a low voltage signal through the output driving terminal NO (N), which can control the corresponding row pixel circuit not to update the pixel voltage.

The embodiment of the present disclosure can realize the update of the partial screen of the display screen by controlling the gating input signal provided by the gating input terminal VCT, thereby reducing power consumption, or realize ultra-low power consumption of OLED display products such as wearable products, mobile terminals, NB (laptop computers) by partial display screen update.

The driving circuit according to at least one embodiment of the present disclosure may also include a second initialization circuit and a second first voltage maintenance circuit;

The second initialization circuit is electrically connected to the initial control terminal, the first voltage terminal and the second first node respectively, and is configured to control the connection between the second first node and the first voltage terminal under the control of the initial control signal provided by the initial control terminal;

The first terminal of the second first voltage maintenance circuit is electrically connected to the second first node, and the second terminal of the second first voltage maintenance circuit is electrically connected to the DC voltage terminal or the second third node, and the second first voltage maintenance circuit is configured to maintain the potential of the second first node.

In specific implementation, the driving circuit may also include a second initialization circuit and a second first voltage maintenance circuit; the second initialization circuit controls the connection between the second first node and the first voltage terminal under the control of the initial control signal, and the first potential maintenance circuit maintains the potential of the second first node.

Figure 32:
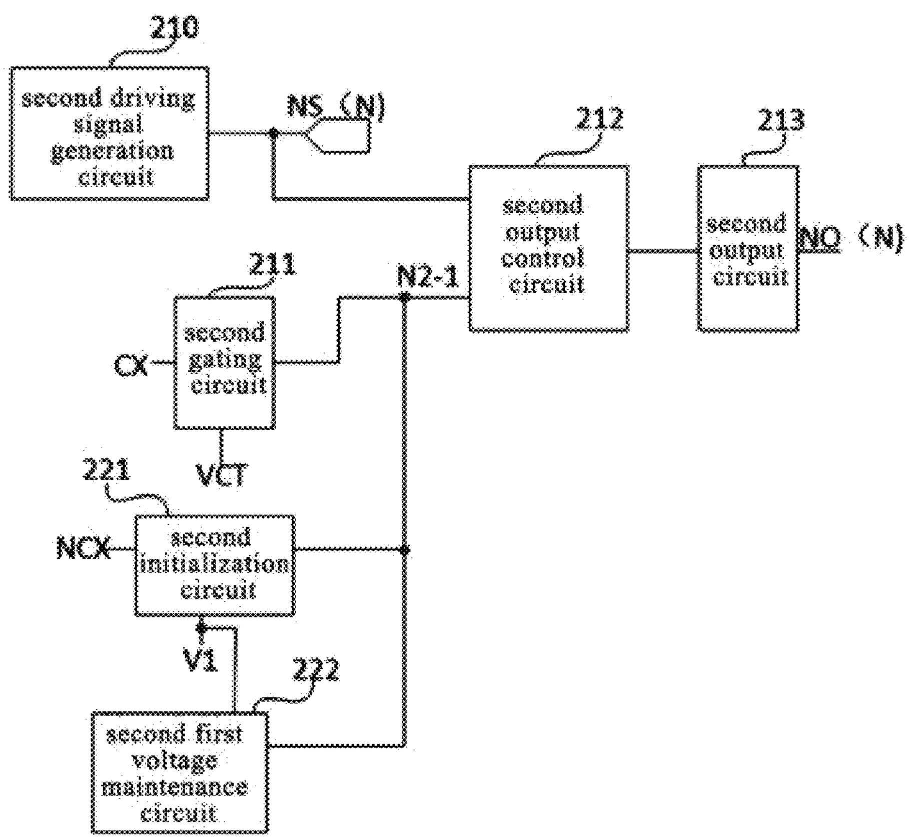
FIG. 32 is a structural diagram of the driving circuit according to at least one embodiment of the present disclosure.

As shown in FIG. 32, based on at least one embodiment of the driving circuit shown in FIG. 31, the driving circuit according to at least one embodiment of the present disclosure may further include a second initialization circuit 221 and a second first voltage maintenance circuit 222;

The second initialization circuit 221 is electrically connected to the initial control terminal NCX, the first voltage terminal V1 and the second first node N2-1 respectively, and is configured to control the connection between the second first node N2-1 and the first voltage terminal V1 under the control of the initial control signal provided by the initial control terminal NCX;

The first terminal of the second first voltage maintenance circuit 222 is electrically connected to the second first node N2-1, and the second terminal of the second first voltage maintenance circuit 222 is electrically connected to the first voltage terminal V1, and the second first voltage maintenance circuit 222 is configured to maintain the potential of the second first node N2-1.

When at least one embodiment of the driving circuit shown in FIG. 32 is working, at the beginning of a frame time, NCX provides a valid voltage signal, and the second initialization circuit 221 controls the connection between the second first node N2-1 and the first voltage terminal V1.

In at least one embodiment of the present disclosure, the first voltage terminal may be a high voltage terminal, but is not limited thereto.

The driving circuit according to at least one embodiment of the present disclosure may also include a second second voltage maintenance circuit, which includes a second first inverter, a second second inverter and a second maintenance control circuit;

an input terminal of the second first inverter is electrically connected to the second first node, an output terminal of the second first inverter is electrically connected to the second third node, an input terminal of the second second inverter is electrically connected to the second third node, and an output terminal of the second second inverter is electrically connected to the second fourth node;

The second first inverter is configured to invert the potential of the second first node and output the inverted potential of the second first node through the output terminal of the second first inverter;

The second second inverter is configured to invert the potential of the input terminal and output the inverted potential through the output terminal of the second second inverter;

The second maintenance control circuit is electrically connected to the maintenance control terminal, the second fourth node and the second first node respectively, and is configured to control the connection or disconnection between the second fourth node and the second first node under the control of the maintenance control signal provided by the maintenance control terminal.

In a specific implementation, the driving circuit may further include a second second voltage maintenance circuit, the second second voltage maintenance circuit includes a second first inverter, a second second inverter and a second maintenance control circuit, the second first inverter inverts the potential of the second first node, the second second inverter inverts the potential of its input terminal, and the second maintenance control circuit controls the connection or disconnection between the second fourth node and the second first node under the control of the maintenance control signal;

The second maintenance control circuit may control the disconnection between the second fourth node and the second first node when the second gating circuit controls the gating input signal to be written into the second first node, so as not to affect the potential of the second first node.

When the driving circuit according to at least one embodiment of the present disclosure is working, by adding a second second voltage maintenance circuit, the second first inverter and the second second inverter included in the second second voltage maintenance circuit can control the output terminal of the second second inverter to be connected to the high voltage terminal when the potential of the second first node is a high voltage, so that the potential of the output terminal of the second second inverter can be higher than the potential of the second first node, and when the potential of the second first node is a low voltage, the output terminal of the second second inverter can be controlled to be connected to the low voltage terminal, so that the potential of the output terminal of the second second inverter can be lower than the potential of the second first node, and the second maintenance control circuit included in the second second voltage maintenance circuit can control the output terminal of the second second inverter to be connected to the second first node in the Nth stage of driving signal output phase, thereby increasing the absolute value of the potential of the second first node, so that the second first node can better control the transistor whose gate electrode is electrically connected to the second first node included in the second output control circuit.

Figure 33:
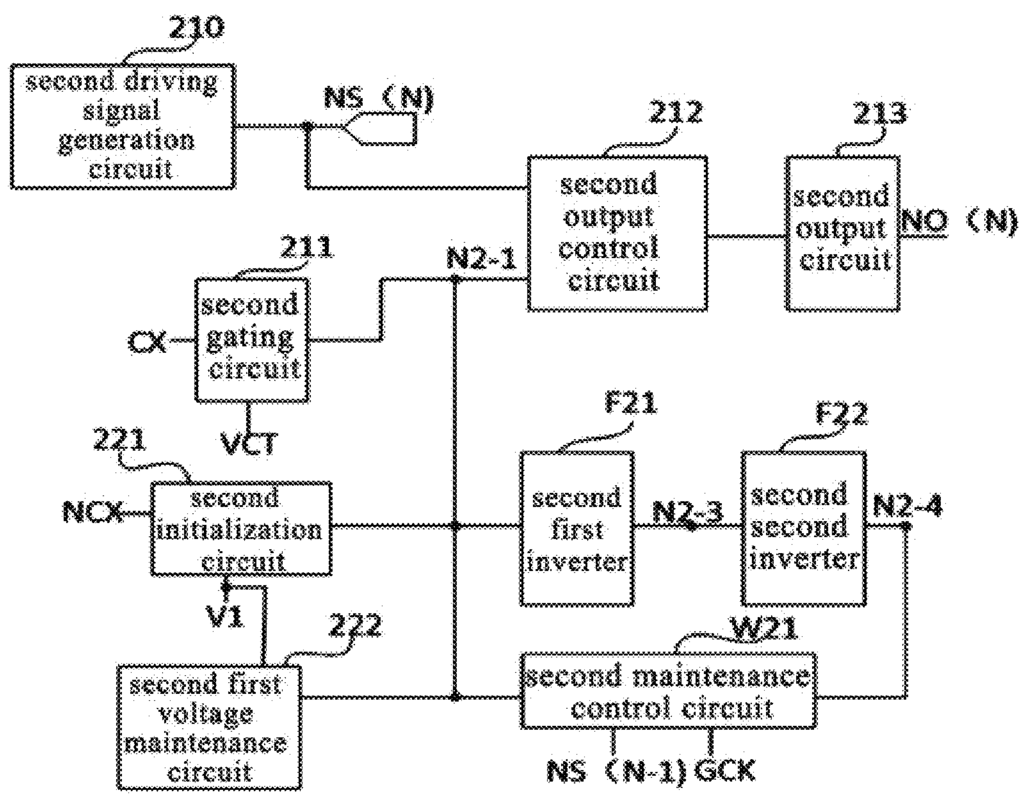
FIG. 33 is a structural diagram of the driving circuit according to at least one embodiment of the present disclosure.

As shown in FIG. 33, based on at least one embodiment of the driving circuit shown in FIG. 32, the driving circuit according to at least one embodiment of the present disclosure may further include a second second voltage maintenance circuit, the second second voltage maintenance circuit includes a second first inverter F21, a second second inverter F22 and a second maintenance control circuit W21; the maintenance control terminal includes the (N−1)th stage of driving signal output terminal NS (N−1) and the first clock signal terminal GCK;

The input terminal of the second first inverter F21 is electrically connected to the second first node N2-1, and the output terminal of the second first inverter F21 is electrically connected to the second third node N2-3;

The input terminal of the second second inverter F22 is electrically connected to the second third node N2-3, and the output terminal of the second second inverter F22 is electrically connected to the second fourth node N2-4;

The second first inverter F21 is configured to invert the potential of the second first node N2-1, and output the inverted potential of the second first node through the output terminal of the second first inverter F21;

The second second inverter F22 is configured to invert the potential of its input terminal, and output the inverted potential through the output terminal of the second second inverter F22;

The second maintenance control circuit W21 is electrically connected to the (N−1)th stage of driving signal output terminal NS (N−1), the first clock signal terminal GCK, the second fourth node N2-4 and the second first node N2-1, respectively, and is configured to control the connection or disconnection between the second fourth node N2-4 and the second first node N2-1 under the control of the (N−1)th stage of driving signal provided by the (N−1)th stage of driving signal output terminal NS (N−1), and control the connection or disconnection between the second fourth node N2-4 and the second first node N2-1 under the control of the first clock signal provided by the first clock signal terminal GCK.

In at least one embodiment shown in FIG. 33, the (N−1)th stage of driving signal output terminal can be replaced by the second clock signal terminal, but is not limited to this.

In at least one embodiment of the present disclosure, the driving circuit may also include a second second voltage maintenance circuit;

The second first node is electrically connected to the second terminal of the second output control circuit through the second second voltage maintenance circuit;

The second second voltage maintenance circuit includes a second first inverter, a second second inverter and a second maintenance control circuit;

an input terminal of the second first inverter is electrically connected to the second first node, an output terminal of the second first inverter is electrically connected to the second third node, an input terminal of the second second inverter is electrically connected to the second third node, an output terminal of the second second inverter is electrically connected to the second fourth node and the second terminal of the second output control circuit;

The second first inverter is configured to invert the potential of the second first node, and output the inverted potential of the second first node through the output terminal of the second first inverter, and the second second inverter is configured to invert the potential of its input terminal, and output the inverted potential through the output terminal of the second second inverter;

The second maintenance control circuit is electrically connected to the maintenance control terminal, the second fourth node and the second first node respectively, and is configured to control the connection or disconnection between the second fourth node and the second first node under the control of the maintenance control signal provided by the maintenance control terminal.

In a specific implementation, the driving circuit may further include a second second voltage maintenance circuit, the second first node may be electrically connected to the second terminal of the second output control circuit through the second second voltage maintenance circuit, and the second second voltage maintenance circuit may include a second first inverter, a second second inverter, and a second maintenance control circuit; the second first inverter inverts the potential of the second first node, and the second second inverter inverts the potential of its input terminal; the second maintenance control circuit controls the connection or disconnection between the second fourth node and the second first node under the control of the maintenance control signal provided by the maintenance control terminal;

The second maintenance control circuit may control the disconnection between the second fourth node and the second first node when the second gating circuit controls to write the gating input signal into the second first node.

When the driving circuit according to at least one embodiment of the present disclosure is working, by adding a second second voltage maintenance circuit, the second first inverter and the second second inverter included in the second second voltage maintenance circuit can control the second fourth node to be connected to the high voltage terminal when the potential of the second first node is a high voltage, so that the potential of the second fourth node can be higher than the potential of the second first node, and can control the second fourth node to be connected to the low voltage terminal when the potential of the second first node is a low voltage, so that the potential of the second fourth node can be lower than the potential of the second first node, so that the second fourth node can better control the transistor whose gate electrode is electrically connected to the second fourth node included in the second output control circuit.

Figure 34:
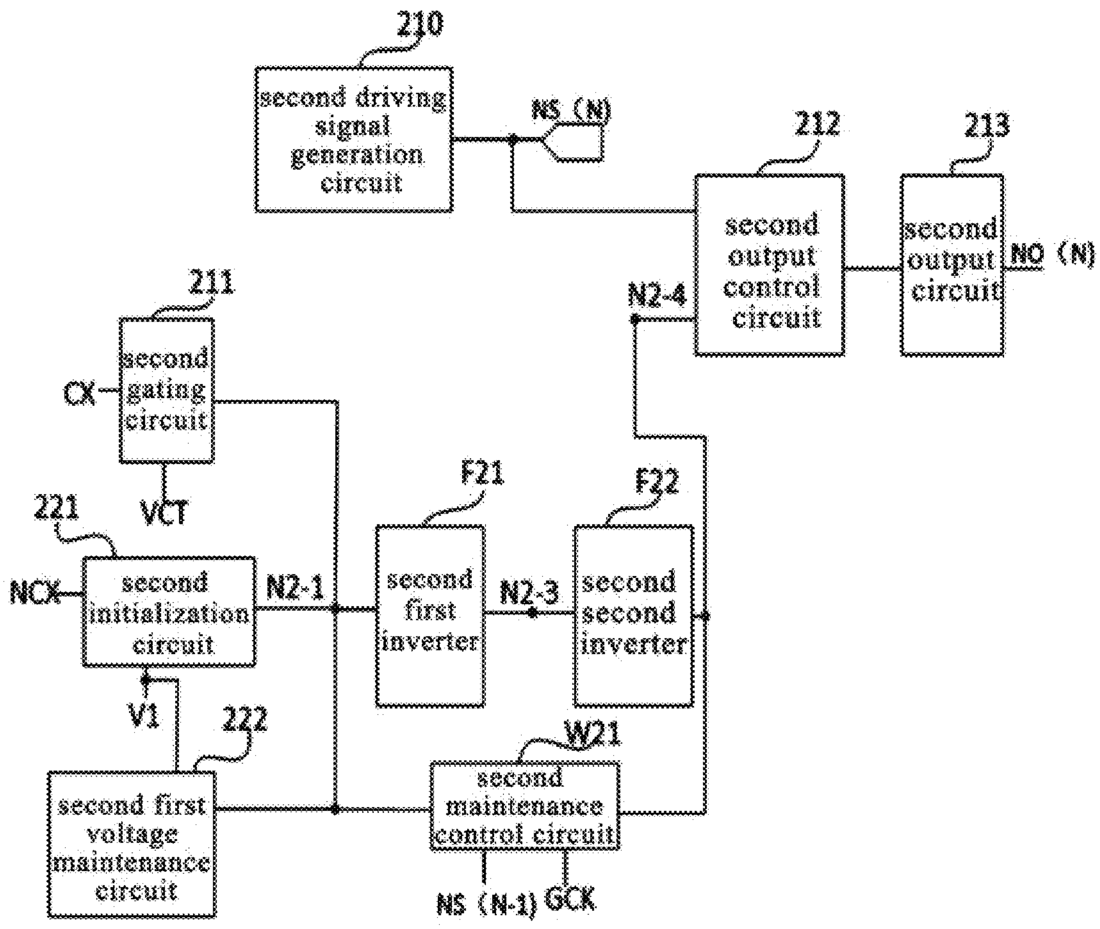
FIG. 34 is a structural diagram of the driving circuit according to at least one embodiment of the present disclosure.

As shown in FIG. 34, based on at least one embodiment of the driving circuit shown in FIG. 32, the driving circuit may further include a second second voltage maintenance circuit; the maintenance control terminal includes the (N−1)th stage of driving signal output terminal NS (N−1) and the first clock signal terminal GCK;

The second first node N2-1 is electrically connected to the second terminal of the second output control circuit 212 through the second second voltage maintenance circuit;

The second second voltage maintenance circuit includes a second first inverter F21, a second second inverter F22 and a second maintenance control circuit W21;

The input terminal of the second first inverter F21 is electrically connected to the second first node N2-1, and the output terminal of the second first inverter F21 is electrically connected to the second third node N2-3;

The input terminal of the second second inverter F22 is electrically connected to the second third node N2-3, and the output terminal of the second second inverter F22 is electrically connected to the second fourth node N2-4 and the second terminal of the second output control circuit 12;

The second first inverter F21 is configured to invert the potential of the second first node N2-1, and output the inverted potential of the second first node through the output terminal of the second first inverter F21;

The second second inverter F22 is configured to invert the potential of its input terminal, and output the inverted potential through the output terminal of the second second inverter F22;

The second maintenance control circuit W21 is electrically connected to the (N−1)th stage of driving signal output terminal NS (N−1), the first clock signal terminal GCK, the second fourth node N2-4 and the second first node N2-1 respectively, and is configured to control the connection or disconnection between the second fourth node N2-4 and the second first node N2-1 under the control of the (N−1)th stage of driving signal provided by the (N−1)th stage of driving signal output terminal NS (N−1), and control the connection or disconnection between the second fourth node N2-4 and the second first node N2-1 under the control of the first clock signal provided by the first clock signal terminal GCK.

In at least one embodiment shown in FIG. 34, the (N−1)th stage of driving signal output terminal can be replaced by the second clock signal terminal, but is not limited thereto.

Optionally, the maintenance control terminal includes a first maintenance control terminal and a second maintenance control terminal;

The second maintenance control circuit includes a second third transistor and a second fourth transistor;

a gate electrode of the second third transistor is electrically connected to the first maintenance control terminal, a first electrode of the second third transistor is electrically connected to the second first node, and a second electrode of the second third transistor is electrically connected to the second fourth node;

a gate electrode of the second fourth transistor is electrically connected to the second maintenance control terminal, a first electrode of the second fourth transistor is electrically connected to the second fourth node, and a second electrode of the second fourth transistor is electrically connected to the second first node;

The second third transistor is a p-type transistor, and the second fourth transistor is an n-type transistor;

The first maintenance control terminal is the (N−1)th stage of driving signal terminal, and the second maintenance control terminal is the first clock signal terminal; or, The first maintenance control terminal is the second clock signal terminal, and the second maintenance control terminal is the first clock signal terminal.

Optionally, the second first inverter includes a second fifth transistor and a second sixth transistor, and the second second inverter includes a second seventh transistor and a second eighth transistor;

a gate electrode of the second fifth transistor is electrically connected to the second first node, a first electrode of the second fifth transistor is electrically connected to the first voltage terminal, and a second electrode of the second fifth transistor is electrically connected to the second third node;

a gate electrode of the second sixth transistor is electrically connected to the second first node, a first electrode of the second sixth transistor is electrically connected to the second third node, and a second electrode of the second sixth transistor is electrically connected to the second voltage terminal;

The second fifth transistor is a p-type transistor, and the second sixth transistor is an n-type transistor;

a gate electrode of the second seventh transistor is electrically connected to the second third node, a first electrode of the second seventh transistor is electrically connected to the first voltage terminal, and a second electrode of the second seventh transistor is electrically connected to the second fourth node;

a gate electrode of the second eighth transistor is electrically connected to the second third node, a first electrode of the second eighth transistor is electrically connected to the second fourth node, and a second electrode of the second eighth transistor is electrically connected to the second voltage terminal;

The second seventh transistor is a p-type transistor, and the second eighth transistor is an n-type transistor.

Optionally, the second initialization circuit includes a second ninth transistor, and the second first voltage maintenance circuit includes a second first capacitor;

a gate electrode of the second ninth transistor is electrically connected to the initial control terminal, a first electrode of the second ninth transistor is electrically connected to the first voltage terminal, and a second electrode of the second ninth transistor is electrically connected to the second first node;

a first terminal of the second first capacitor is electrically connected to the second first node, and a second terminal of the second first capacitor is electrically connected to the DC voltage terminal or the second third node.

Optionally, the second output control circuit includes a second tenth transistor, a second eleventh transistor, a second twelfth transistor and a second thirteenth transistor;

a gate electrode of the second tenth transistor is electrically connected to the Nth stage of driving signal output terminal, a first electrode of the second tenth transistor is electrically connected to the first voltage terminal, and a second electrode of the second tenth transistor is electrically connected to the second fifth node;

a gate electrode of the second eleventh transistor is electrically connected to the second first node, a first electrode of the second eleventh transistor is electrically connected to the first voltage terminal, and a second electrode of the second eleventh transistor is electrically connected to the second fifth node;

a gate electrode of the second twelfth transistor is electrically connected to the Nth stage of driving signal output terminal, a first electrode of the second twelfth transistor is electrically connected to the second fifth node, and a second electrode of the second twelfth transistor is electrically connected to the second sixth node;

a gate electrode of the second thirteenth transistor is electrically connected to the second first node, a first electrode of the second thirteenth transistor is electrically connected to the second sixth node, and a second electrode of the second thirteenth transistor is electrically connected to the second voltage terminal;

The second tenth transistor and the second eleventh transistor are p-type transistors, and the second twelfth transistor and the second thirteenth transistor are n-type transistors.

Optionally, the second output control circuit includes a second tenth transistor, a second eleventh transistor, a second twelfth transistor and a second thirteenth transistor;

a gate electrode of the second tenth transistor is electrically connected to the Nth stage of driving signal output terminal, a first electrode of the second tenth transistor is electrically connected to the first voltage terminal, and a second electrode of the second tenth transistor is electrically connected to the second fifth node;

a gate electrode of the second eleventh transistor is electrically connected to the second fourth node, a first electrode of the second eleventh transistor is electrically connected to the first voltage terminal, and a second electrode of the second eleventh transistor is electrically connected to the second fifth node;

a gate electrode of the second twelfth transistor is electrically connected to the Nth stage of driving signal output terminal, a first electrode of the second twelfth transistor is electrically connected to the second fifth node, and a second electrode of the second twelfth transistor is electrically connected to the second sixth node;

a gate electrode of the second thirteenth transistor is electrically connected to the second fourth node, a first electrode of the second thirteenth transistor is electrically connected to the second sixth node, and a second electrode of the second thirteenth transistor is electrically connected to the second voltage terminal;

The second tenth transistor and the second eleventh transistor are p-type transistors, and the second twelfth transistor and the second thirteenth transistor are n-type transistors.

Optionally, the second output circuit includes a second fourteenth transistor and a second fifteenth transistor;

a gate electrode of the second fourteenth transistor is electrically connected to the second fifth node, a first electrode of the second fourteenth transistor is electrically connected to the first voltage terminal, and a second electrode of the second fourteenth transistor is electrically connected to the output driving terminal;

a gate electrode of the second fifteenth transistor is electrically connected to the second fifth node, a first electrode of the second fifteenth transistor is electrically connected to the output driving terminal, and a second electrode of the second fifteenth transistor is electrically connected to the second voltage terminal.

In at least one embodiment of the present disclosure, the second driving signal generation circuit may include a second first control node control circuit, a second second control node control circuit, a second first driving output circuit and a second second driving output circuit;

The second first control node control circuit is configured to control the potential of the first control node;

The second second control node control circuit is configured to control the potential of the second control node;

The second first driving output circuit is electrically connected to the first control node, the first voltage terminal and the Nth stage of driving signal output terminal respectively, and is configured to control the connection between the Nth stage of driving signal output terminal and the first voltage terminal under the control of the potential of the first control node;

The second second driving output circuit is electrically connected to the second control node, the second voltage terminal and the Nth stage of driving signal output terminal respectively, and is configured to control the connection between the Nth stage of driving signal output terminal and the second voltage terminal under the control of the potential of the second control node.

In a specific implementation, the second driving signal generation circuit may include a second first control node control circuit, a second second control node control circuit, a second first driving output circuit and a second second driving output circuit, wherein the second first control node control circuit is configured to control the potential of the first control node; the second second control node control circuit controls the potential of the second control node; the second first driving output circuit controls the connection between the Nth stage of driving signal output terminal and the first voltage terminal under the control of the potential of the first control node; the second second driving output circuit controls the connection between the Nth stage of driving signal output terminal and the second voltage terminal under the control of the potential of the second control node.

Optionally, the first voltage terminal may be a high voltage terminal, and the second voltage terminal may be a low voltage terminal, but is not limited thereto.

Figure 35:
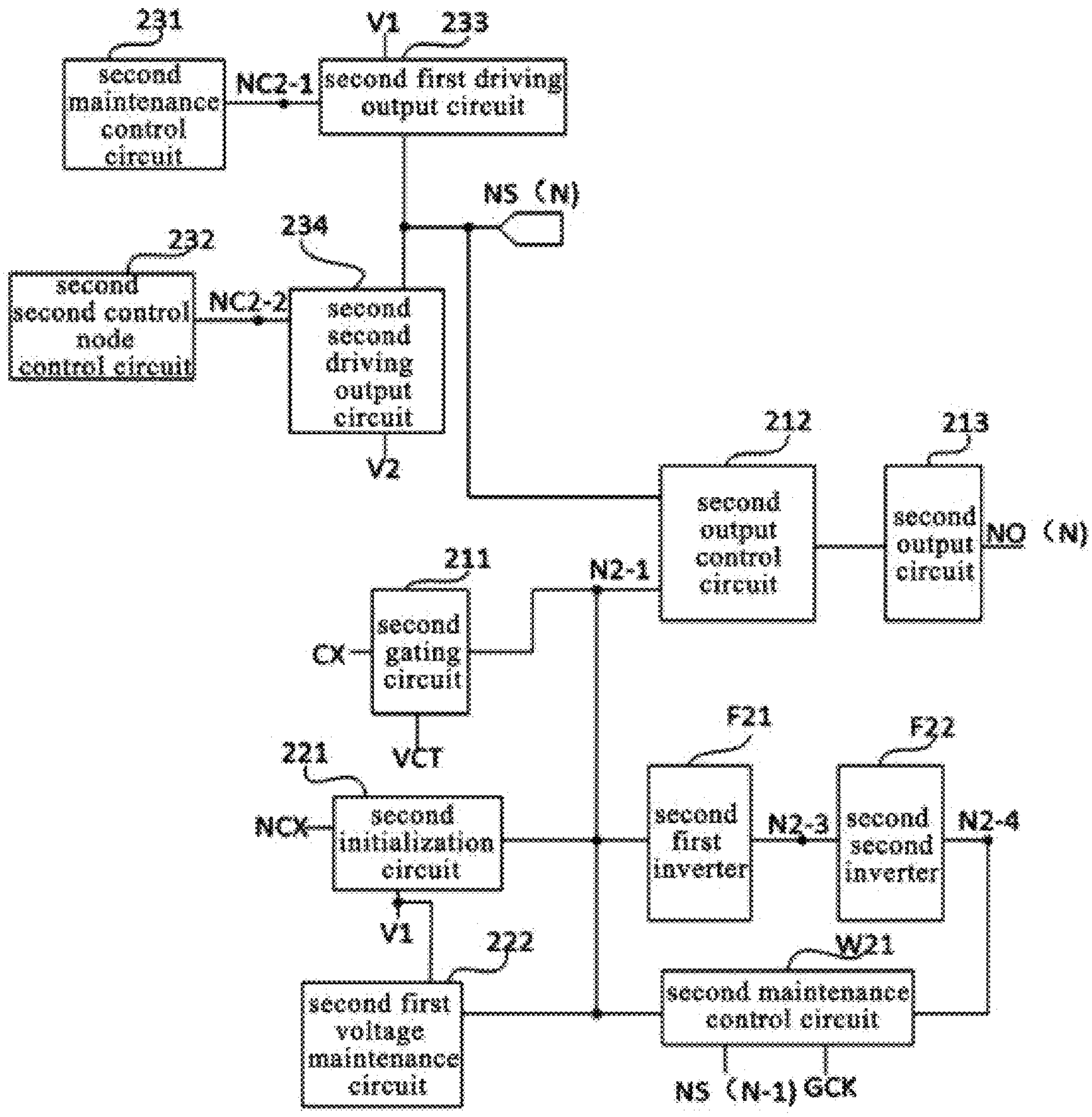
FIG. 35 is a structural diagram of the driving circuit according to at least one embodiment of the present disclosure.

As shown in FIG. 35, based on at least one embodiment of the driving circuit shown in FIG. 33, the second driving signal generation circuit may include a second first control node control circuit 231, a second second control node control circuit 232, a second first driving output circuit 233 and a second second driving output circuit 234;

The second first control node control circuit 231 is electrically connected to the first control node NC2-1, and is configured to control the potential of the first control node NC2-1;

The second second control node control circuit 232 is electrically connected to the second control node NC2-2, and is configured to control the potential of the second control node NC2-2;

The second first driving output circuit 233 is electrically connected to the first control node NC2-1, the first voltage terminal V1 and the Nth stage of driving signal output terminal NS (N) respectively, and is configured to control the connection between the Nth stage of driving signal output terminal NS (N) and the first voltage terminal V12 under the control of the potential of the first control node NC2-1;

The second second driving output circuit 234 is electrically connected to the second control node NC2-2, the second voltage terminal V2 and the Nth stage of driving signal output terminal NS (N) respectively, and is configured to control the connection between the Nth stage of driving signal output terminal NS (N) and the second voltage terminal V2 under the control of the potential of the second control node NC2-2.

Figure 36:
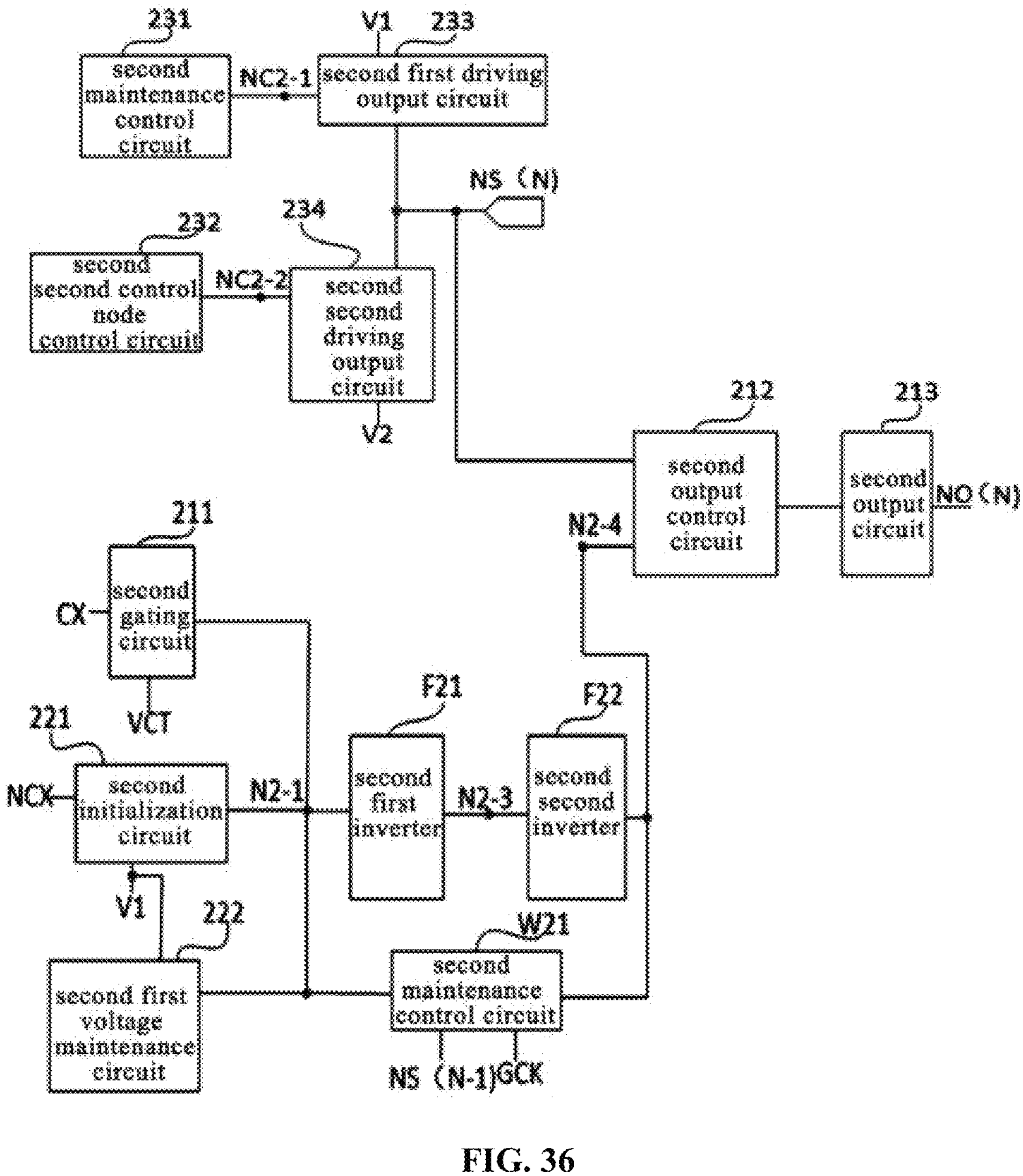
FIG. 36 is a structural diagram of the driving circuit according to at least one embodiment of the present disclosure.

As shown in FIG. 36, based on at least one embodiment of the driving circuit shown in FIG. 34, the second driving signal generation circuit may include a second first control node control circuit 231, a second second control node control circuit 232, a second first driving output circuit 233 and a second second driving output circuit 234;

The second first control node control circuit 231 is electrically connected to the first control node NC2-1, and is configured to control the potential of the first control node NC2-1;

The second second control node control circuit 232 is electrically connected to the second control node NC2-2, and is configured to control the potential of the second control node NC2-2;

The second first driving The output circuit 233 is electrically connected to the first control node NC2-1, the first voltage terminal V1 and the Nth stage of driving signal output terminal NS (N) respectively, and is configured to control the connection between the Nth stage of driving signal output terminal NS (N) and the first voltage terminal V12 under the control of the potential of the first control node NC2-1;

The second second driving output circuit 234 is electrically connected to the second control node NC2-2, the second voltage terminal V2 and the Nth stage of driving signal output terminal NS (N) respectively, and is configured to control the connection between the Nth stage of driving signal output terminal NS (N) and the second voltage terminal V2 under the control of the potential of the second control node NC2-2.

In at least one embodiment of the present disclosure, the second first control node control circuit includes a second seventh node control circuit, a second eighth node control circuit and a second first control circuit;

The second seventh node control circuit is electrically connected to the first clock signal terminal, the first voltage terminal, the second seventh node and the second ninth node respectively, and is configured to control the connection between the second seventh node and the first voltage terminal under the control of the first clock signal provided by the first clock signal terminal, and to control the connection between the second seventh node and the first clock signal terminal under the control of the potential of the second ninth node;

The second eighth node control circuit is electrically connected to the second voltage terminal, the second seventh node and the second eighth node respectively, and is configured to control the connection between the second seventh node and the second eighth node under the control of the second voltage signal provided by the second voltage terminal;

The second first control circuit is electrically connected to the second eighth node, the second second node, the second clock signal terminal, the second ninth node, the first voltage terminal and the first control node respectively, and is configured to control the connection between the second second node and the second clock signal terminal under the control of the potential of the second eighth node, control the potential of the second second node according to the potential of the second eighth node, control the connection between the second second node and the first control node under the control of the second clock signal provided by the second clock signal terminal, and control the connection between the first control node and the first voltage terminal under the control of the potential of the second ninth node.

In specific implementation, the second first control node control circuit may include a second seventh node control circuit, a second eighth node control circuit and a second first control circuit, the second seventh node control circuit controls the potential of the second seventh node, the second eighth node control circuit controls the potential of the second eighth node, and the second first control circuit controls the potential of the first control node.

In at least one embodiment of the present disclosure, the second second control node control circuit includes a second ninth node control circuit, a second tenth node control circuit, a second eleventh node control circuit and a second second control circuit;

The second ninth node control circuit is electrically connected to the first clock signal terminal, the (N−1)th stage of driving signal output terminal, the initial control terminal, the first voltage terminal and the second ninth node respectively, and is configured to control the connection between the (N−1)th stage of driving signal output terminal and the second ninth node under the control of the first clock signal provided by the first clock signal terminal, and to control the connection between the second ninth node and the first voltage terminal under the control of the initial control signal provided by the initial control terminal;

The second tenth node control circuit is electrically connected to the first clock signal terminal, the (N−1)th stage of driving signal output terminal and the second tenth node respectively, and is configured to control the connection between the (N−1)th stage of driving signal output terminal and the second tenth node under the control of the first clock signal;

The second eleventh node control circuit is electrically connected to the second voltage terminal, the second tenth node, the second eleventh node, the second seventh node, the first voltage terminal, the second twelfth node and the second clock signal terminal, and is configured to control to connect the second tenth node and the second eleventh node under the control of the second voltage signal provided by the second voltage terminal, control the second twelfth node to be electrically connected to the first voltage terminal under the control of the potential of the second seventh node, control the second twelfth node to be connected to the second clock signal terminal under the control of the potential of the second eleventh node, and control the potential of the second eleventh node according to the potential of the second twelfth node;

The second second control circuit is electrically connected to the second control node, the second eleventh node, the second voltage terminal and the second ninth node respectively, and is configured to control the potential of the second control node under the control of the potential of the second eleventh node, and control the second ninth node to be connected to the second control node under the control of the second voltage signal provided by the second voltage terminal.

In a specific implementation, the second second control node control circuit may include a second ninth node control circuit, a second tenth node control circuit, a second eleventh node control circuit and a second second control circuit, the second ninth node control circuit controls the potential of the second ninth node, the second tenth node control circuit controls the potential of the second tenth node, the second eleventh node control circuit controls the potential of the second eleventh node, and the second second control circuit controls the potential of the second control node.

Figure 37:
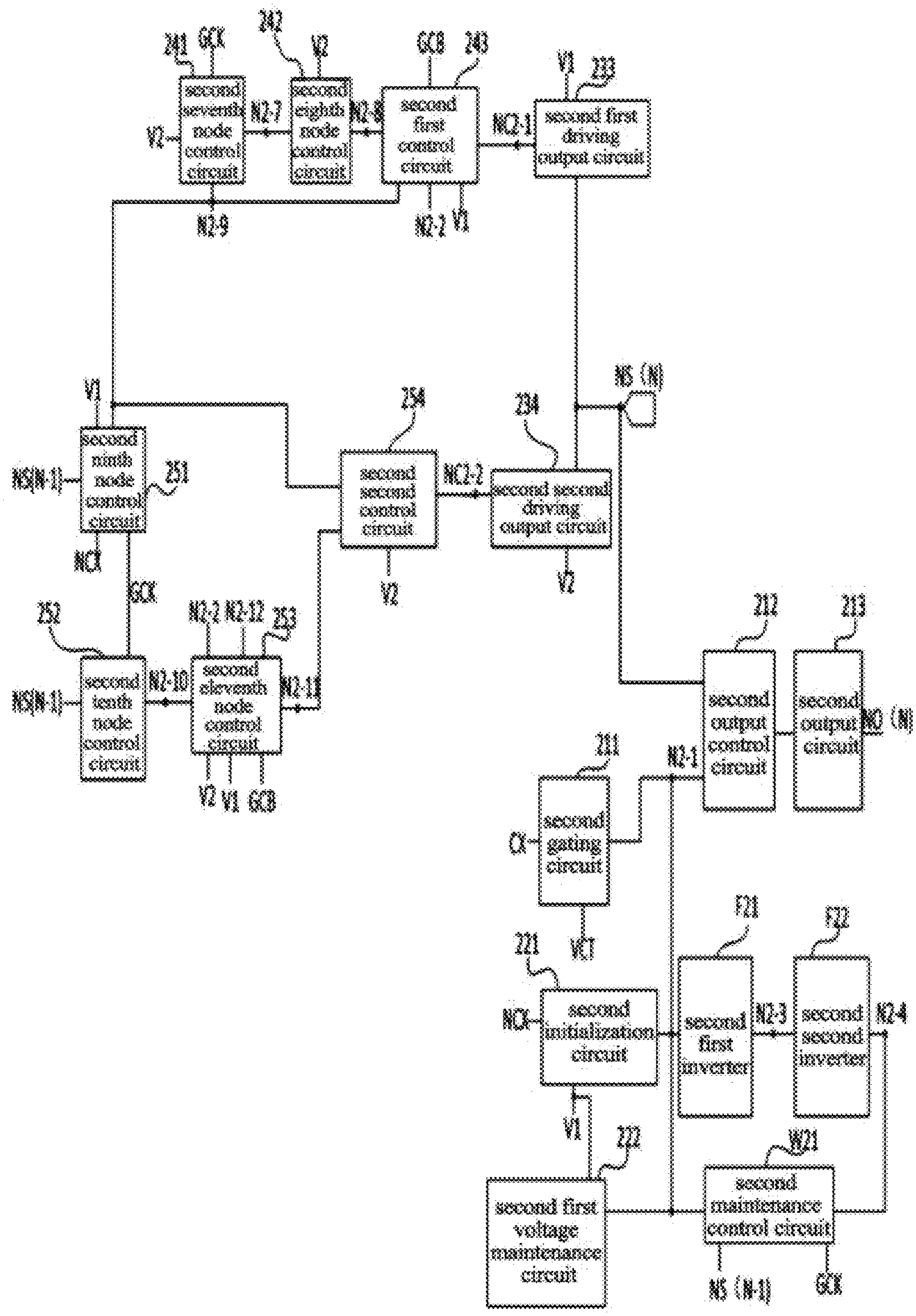
FIG. 37 is a structural diagram of the driving circuit according to at least one embodiment of the present disclosure.

As shown in FIG. 37, based on at least one embodiment of the driving circuit shown in FIG. 35, the second first control node control circuit includes a second seventh node control circuit 241, a second eighth node control circuit 242 and a second first control circuit 243;

The second seventh node control circuit 241 is electrically connected to the first clock signal terminal GCK, the second voltage terminal V2, the second seventh node N2-7 and the second ninth node N2-9, respectively, and is configured to control the connection between the second seventh node N2-7 and the second voltage terminal V2 under the control of the first clock signal provided by the first clock signal terminal GCK, and to control the connection between the second seventh node N2-7 and the first clock signal terminal GCK under the control of the potential of the second ninth node N2-9;

The second eighth node control circuit 242 is electrically connected to the second voltage terminal V2, the second seventh node N2-7 and the second eighth node N2-8, respectively, and is configured to control the connection between the second seventh node N2-7 and the second eighth node N2-8 under the control of the second voltage signal provided by the second voltage terminal V2;

The second first control circuit 243 is electrically connected to the second eighth node N2-8, the second second node N2-2, the second clock signal terminal GCB, the second ninth node N2-9, the first voltage terminal V1 and the first control node NC2-1 respectively, and is configured to control the connection between the second second node N2-2 and the second clock signal terminal GCB under the control of the potential of the second eighth node N2-8, control the potential of the second second node N2-2 according to the potential of the second eighth node N2-8, control the connection between the second second node N2-2 and the first control node NC2-1 under the control of the second clock signal provided by the second clock signal terminal GCB, and control the connection between the first control node NC2-1 and the first voltage terminal V1 under the control of the potential of the second ninth node N2-9;

The second second control node control circuit includes a second ninth node control circuit 251, a second tenth node control circuit 252, a second eleventh node control circuit 253 and a second second control circuit 254;

The second ninth node control circuit 251 is electrically connected to the first clock signal terminal GCK, the (N−1)th stage of driving signal output terminal NS (N−1), initial control terminal NCX, first voltage terminal V1 and the second ninth node N2-9, and is configured to control the connection between the (N−1) th stage of driving signal output terminal NS (N−1) and the second ninth node N2-9 under the control of the first clock signal provided by the first clock signal terminal GCK, and control the connection between the second ninth node N2-9 and the first voltage terminal V1 under the control of the initial control signal provided by the initial control terminal NCX;

The second tenth node control circuit 252 is respectively connected to the first clock signal terminal GCK, the (N−1)th stage of driving signal output terminal NS (N−1) and the second tenth node N2-10, and is configured to control the connection between the (N−1)th stage of driving signal output terminal NS (N−1) and the second tenth node N2-10 under the control of the first clock signal;

the second eleventh node control circuit 253 is respectively connected to the second voltage terminal V2, the second tenth node N2-10, the second eleventh node N2-11, the second seventh node N2-7, the first voltage terminal V1, the second twelfth node N2-12 and the second clock signal terminal GCB, is configured to control to connect the second tenth node N2-10 and the second eleventh node N2-11 under the control of the second voltage signal provided by the second voltage terminal V2, and to control the second twelfth node N2-12 to be electrically connected to the first voltage terminal V1 under the control of the potential of the second seventh node N2-7, and to control the second twelfth node N2-12 to be connected to the second clock signal terminal GCB under the control of the potential of the second eleventh node N2-11, and to control the potential of second eleventh node N2-11 according to the potential of the second twelfth node N2-12;

The second second control circuit 254 is electrically connected to the second control node NC2-2, the second eleventh node N2-11, the second voltage terminal V2 and the second ninth node N2-9 respectively, and is configured to control the potential of the second control node NC2-2 under the control of the potential of the second eleventh node N2-11, and control the connection between the second ninth node N2-9 and the second control node NC2-2 under the control of the second voltage signal provided by the second voltage terminal V2.

Figure 38:
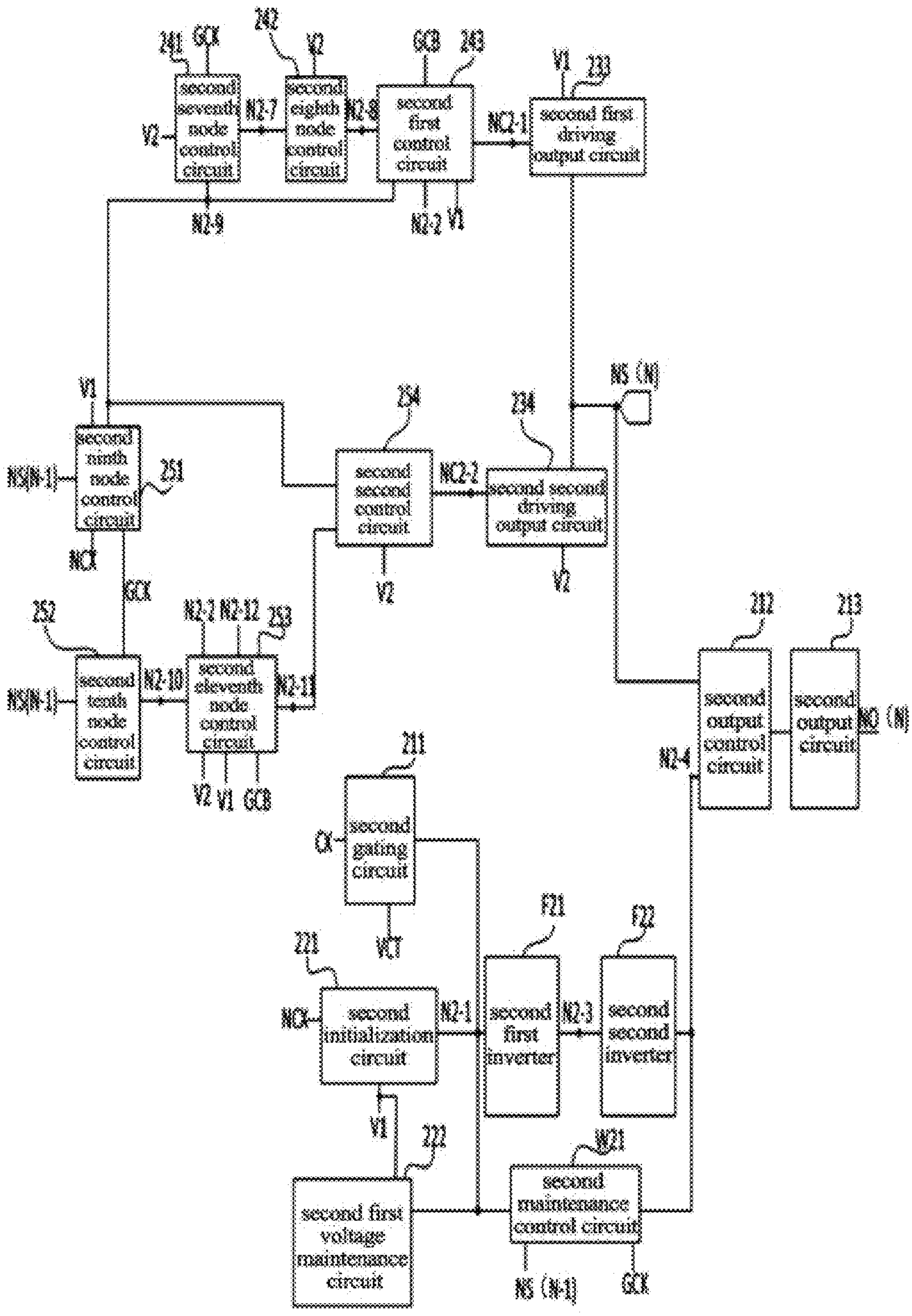
FIG. 38 is a structural diagram of the driving circuit according to at least one embodiment of the present disclosure.

As shown in FIG. 38, based on at least one embodiment of the driving circuit shown in FIG. 36, the second first control node control circuit includes a second seventh node control circuit 241, a second eighth node control circuit 242 and a second first control circuit 243;

The second seventh node control circuit 241 is electrically connected to the first clock signal terminal GCK, the second voltage terminal V2, the second seventh node N2-7 and the second ninth node N2-9, respectively, and is configured to control the connection between the second seventh node N2-7 and the second voltage terminal V2 under the control of the first clock signal provided by the first clock signal terminal GCK, and to control the connection between the second seventh node N2-7 and the first clock signal terminal GCK under the control of the potential of the second ninth node N2-9;

The second eighth node control circuit 242 is electrically connected to the second voltage terminal V2, the second seventh node N2-7 and the second eighth node N2-8, respectively, and is configured to control the connection between the second seventh node N2-7 and the second eighth node N2-8 under the control of the second voltage signal provided by the second voltage terminal V2;

The second first The control circuit 243 is electrically connected to the second eighth node N2-8, the second second node N2-2, the second clock signal terminal GCB, the second ninth node N2-9, the first voltage terminal V1 and the first control node NC2-1 respectively, and is configured to control the connection between the second second node N2-2 and the second clock signal terminal GCB under the control of the potential of the second eighth node N2-8, control the potential of the second second node N2-2 according to the potential of the second eighth node N2-8, control the connection between the second second node N2-2 and the first control node NC2-1 under the control of the second clock signal provided by the second clock signal terminal GCB, and control the connection between the first control node NC2-1 and the first voltage terminal V1 under the control of the potential of the second ninth node N2-9;

The second second control node control circuit includes a second ninth node control circuit 251, a second tenth node control circuit 252, a second eleventh node control circuit 253 and a second second control circuit 254;

The second ninth node control circuit 251 is electrically connected to the first clock signal terminal GCK, the (N−1)th stage of driving signal output terminal NS (N−1), the initial control terminal NCX, the first voltage terminal V1 and the second ninth node N2-9, and is configured to control the connection between the (N−1)th stage of driving signal output terminal NS (N−1) and the second ninth node N2-9 under the control of the first clock signal provided by the first clock signal terminal GCK, and control the connection between the second ninth node N2-9 and the first voltage terminal V1 under the control of the initial control signal provided by the initial control terminal NCX;

The second tenth node control circuit 252 is respectively connected to the first clock signal terminal GCK, the (N−1)th stage of driving signal output terminal NS (N−1) and the second tenth node N2-10, and is configured to control the connection between the (N−1)th stage of driving signal output terminal NS (N−1) and the second tenth node N2-10 under the control of the first clock signal;

the second eleventh node control circuit 253 is respectively connected to the second voltage terminal V2, the second tenth node N2-10, the second eleventh node N2-11, the second seventh node N2-7, the first voltage terminal V1, the second twelfth node N2-12 and the second clock signal terminal GCB, is configured to control to connect the second tenth node N2-10 and the second eleventh node N2-11 under the control of the second voltage signal provided by the second voltage terminal V2, and to control the second twelfth node N2-12 to be electrically connected to the first voltage terminal V1 under the control of the potential of the second seventh node N2-7, and to control the second twelfth node N2-12 to be connected to the second clock signal terminal GCB under the control of the potential of the second eleventh node N2-11, and to control the potential of the second eleventh node N2-11 according to the potential of the second twelfth node N2-12;

The second second control circuit 254 is electrically connected to the second control node NC2-2, the second eleventh node N2-11, the second voltage terminal V2 and the second ninth node N2-9 respectively, and is configured to control the potential of the second control node NC2-2 under the control of the potential of the second eleventh node N2-11, and control the connection between the second ninth node N2-9 and the second control node NC2-2 under the control of the second voltage signal provided by the second voltage terminal V2.

Optionally, the second first driving output circuit includes a second sixteenth transistor and a second second capacitor;

a gate electrode of the second sixteenth transistor is electrically connected to the first control node, a first electrode of the second sixteenth transistor is electrically connected to the first voltage terminal, and a second electrode of the second sixteenth transistor is electrically connected to the Nth stage of driving signal output terminal;

a first terminal of the second second capacitor is electrically connected to the first control node, and a second terminal of the second second capacitor is electrically connected to the first voltage terminal;

The second second driving output circuit includes a second seventeenth transistor and a second third capacitor;

a gate electrode of the second seventeenth transistor is electrically connected to the second control node, a first electrode of the second seventeenth transistor is electrically connected to the Nth stage of driving signal output terminal, and a second electrode of the second seventeenth transistor is electrically connected to the second voltage terminal;

a first terminal of the second third capacitor is electrically connected to the Nth stage of driving signal output terminal, and a second terminal of the second third capacitor is electrically connected to the second voltage terminal.

Optionally, the second seventh node control circuit includes a second eighteenth transistor and a second nineteenth transistor;

a gate electrode of the second eighteenth transistor is electrically connected to the first clock signal terminal, a first electrode of the second eighteenth transistor is electrically connected to the second voltage terminal, and a second electrode of the second eighteenth transistor is electrically connected to the second seventh node;

a gate electrode of the second nineteenth transistor is electrically connected to the second ninth node, a first electrode of the second nineteenth transistor is electrically connected to the second seventh node, and a second electrode of the second nineteenth transistor is electrically connected to the first clock signal terminal;

The second eighth node control circuit includes a second twentieth transistor;

a gate electrode of the second twentieth transistor is electrically connected to the second voltage terminal, a first electrode of the second twentieth transistor is electrically connected to the second seventh node, and a second electrode of the second twentieth transistor is electrically connected to the second eighth node;

The second first control circuit includes a second twenty-first transistor, a second fourth capacitor, a second twenty-second transistor and a second twenty-third transistor;

a gate electrode of the second twenty-first transistor is electrically connected to the second eighth node, a first electrode of the second twenty-first transistor is electrically connected to the second clock signal terminal, and a second electrode of the second twenty-first transistor is electrically connected to the second second node;

a first terminal of the second fourth capacitor is electrically connected to the second eighth node, and a second terminal of the second fourth capacitor is electrically connected to the second second node;

a gate electrode of the second twenty-second transistor is electrically connected to the second clock signal terminal, a first electrode of the second twenty-second transistor is electrically connected to the second second node, and a second electrode of the second twenty-second transistor is electrically connected to the first control node;

a gate electrode of the second twenty-third transistor is electrically connected to the second ninth node, a first electrode of the second twenty-third transistor is electrically connected to the first control node, and a second electrode of the second twenty-third transistor is electrically connected to the first voltage terminal.

Optionally, the second ninth node control circuit includes a second twenty-fourth transistor and a second twenty-fifth transistor;

a gate electrode of the second twenty-fourth transistor is electrically connected to the first clock signal terminal, a first electrode of the second twenty-fourth transistor is electrically connected to the (N−1)th stage of driving signal output terminal, and a second electrode of the second twenty-fourth transistor is electrically connected to the second ninth node;

a gate electrode of the second twenty-fifth transistor is electrically connected to the initial control terminal, a first electrode of the second twenty-fifth transistor is electrically connected to the first voltage terminal, and a second electrode of the second twenty-fifth transistor is electrically connected to the second ninth node;

The second tenth node control circuit includes a second twenty-sixth transistor;

a gate electrode of the second twenty-sixth transistor is electrically connected to the first clock signal terminal, a first electrode of the second twenty-sixth transistor is electrically connected to the (N−1)th stage of driving signal output terminal, and a second electrode of the second twenty-sixth transistor is electrically connected to the second tenth node;

The second eleventh node control circuit includes a second twenty-seventh transistor, a second twenty-eighth transistor, a second twenty-ninth transistor and a second fifth capacitor;

a gate electrode of the second twenty-seventh transistor is electrically connected to the second voltage terminal, a first electrode of the second twenty-seventh transistor is electrically connected to the second tenth node, a second electrode of the second twenty-seventh transistor is electrically connected to the second eleventh node;

a gate electrode of the second twenty-eighth transistor is electrically connected to the second seventh node, a first electrode of the second twenty-eighth transistor is electrically connected to the first voltage terminal, and a second electrode of the second twenty-eighth transistor is electrically connected to the second twelfth node;

a gate electrode of the second twenty-ninth transistor is electrically connected to the second eleventh node, a first electrode of the second twenty-ninth transistor is electrically connected to the second twelfth node, and a second electrode of the second twenty-ninth transistor is electrically connected to the second clock signal terminal;

a first terminal of the second fifth capacitor is electrically connected to the second twelfth node, and a second terminal of the second fifth capacitor is electrically connected to the second eleventh node;

The second second control circuit includes a second thirtieth transistor and a second thirty-first transistor;

a gate electrode of the second thirtieth transistor and a first electrode of the second thirtieth transistor are both electrically connected to the second eleventh node, and a second electrode of the second thirtieth transistor is electrically connected to the second control node;

a gate electrode of the second thirty-first transistor is electrically connected to the second voltage terminal, a first electrode of the second thirty-first transistor is electrically connected to the second ninth node, and a second electrode of the second thirty-first transistor is electrically connected to the second control node.

Figure 39:
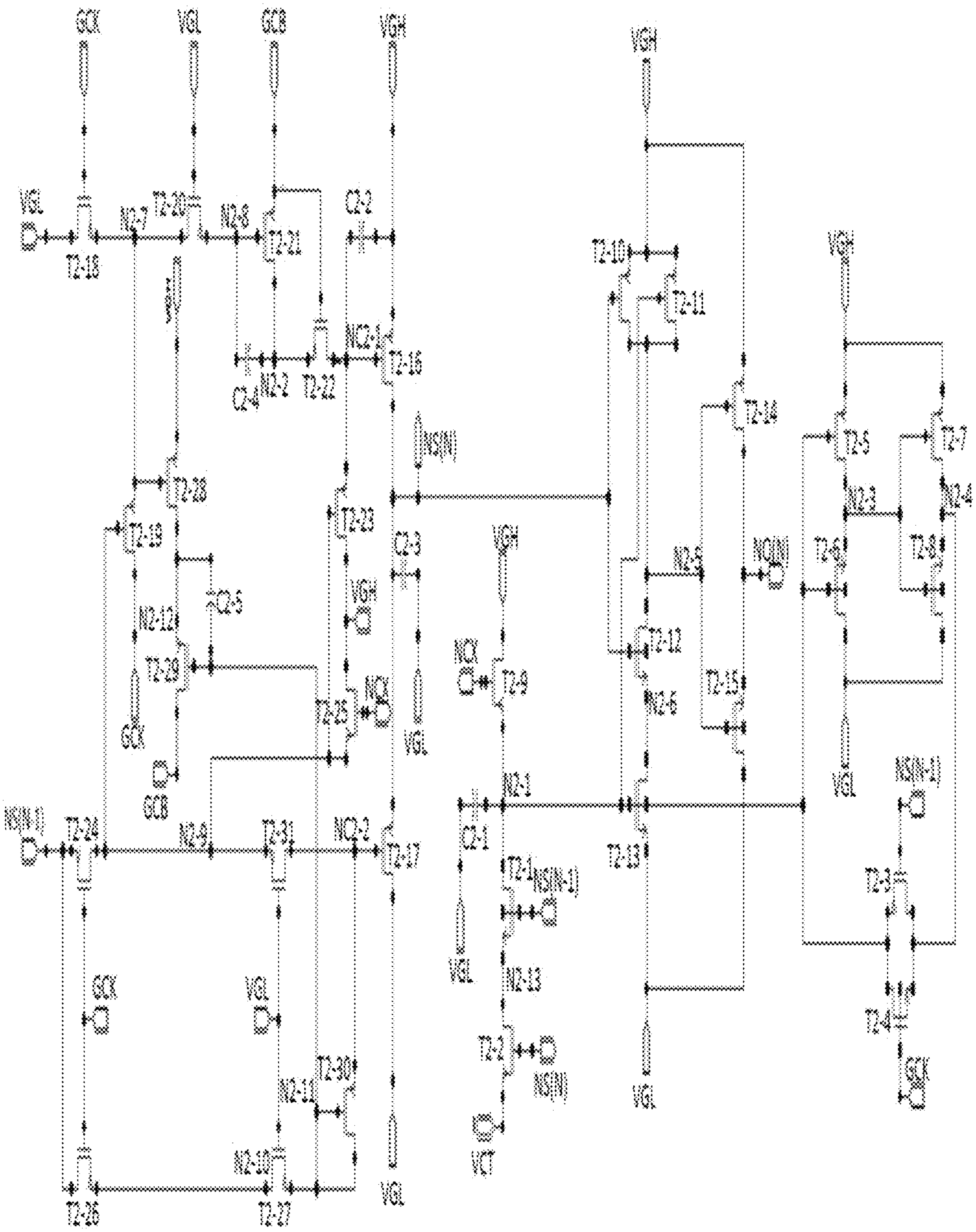
FIG. 39 is a circuit diagram of the driving circuit according to at least one embodiment of the present disclosure.

As shown in FIG. 39, based on at least one embodiment of the driving circuit shown in FIG. 37, the second gating circuit includes a second first transistor T2-1 and a second second transistor T2-2;

the gate electrode of the second first transistor T2-1 is electrically connected to the (N−1)th stage of driving signal output terminal NS (N−1), the source electrode of the second first transistor T2-1 is electrically connected to the second first node N2-1, and the drain electrode of the second first transistor T2-1 is electrically connected to the drain electrode of the second second transistor T2-2;

the gate electrode of the second second transistor T2-2 is electrically connected to the Nth stage of driving signal output terminal NS (N), and the source electrode of the second transistor T2-2 is electrically connected to the gating input terminal VCT;

The second maintenance control circuit includes a second third transistor T2-3 and a second fourth transistor T2-4;

The gate electrode of the second third transistor T2-3 is electrically connected to the (N−1)th stage of driving signal output terminal NS (N−1), the source electrode of the second third transistor T2-3 is electrically connected to the second first node N2-1, and the drain electrode of the second third transistor T2-3 is electrically connected to the second fourth node N2-4;

The gate electrode of the second fourth transistor T2-4 is electrically connected to the first clock signal terminal GCK, and the source electrode of the second fourth transistor T2-4 is electrically connected to the second fourth node N2-4, the drain electrode of the second fourth transistor T2-4 is electrically connected to the second first node N2-1;

The second first inverter includes a second fifth transistor T2-5 and a second sixth transistor T2-6, and the second second inverter includes a second seventh transistor T2-7 and a second eighth transistor T2-8;

The gate electrode of the second fifth transistor T2-5 is electrically connected to the second first node N2-1, the source electrode of the second fifth transistor T2-5 is electrically connected to the high voltage terminal VGH, and the drain electrode of the second fifth transistor T2-5 is electrically connected to the second third node N2-3;

The gate electrode of the second sixth transistor T2-6 is electrically connected to the second first node N2-1, the source electrode of the second sixth transistor T2-6 is electrically connected to the second third node N2-3, and the drain electrode of the second sixth transistor T2-6 is electrically connected to the low voltage terminal VGL;

The gate electrode of the second seventh transistor T2-7 is electrically connected to the second third node N2-3, the source electrode of the second seventh transistor T2-7 is electrically connected to the high voltage terminal VGH, and the drain electrode of the second seventh transistor T2-7 is electrically connected to the second fourth node N2-4;

The gate electrode of the second eighth transistor T2-8 is electrically connected to the second third node N2-3, the source electrode of the second eighth transistor T2-8 is electrically connected to the second fourth node N2-4; the drain electrode of the second eighth transistor T2-8 is electrically connected to the low voltage terminal VGL;

The second initialization circuit includes a second ninth transistor T2-9, and the second first voltage maintenance circuit includes a second first capacitor C2-1;

The gate electrode of the second ninth transistor T2-9 is electrically connected to the initial control terminal NCX, the source electrode of the second ninth transistor T2-9 is electrically connected to the high voltage terminal VGH, and the drain electrode of the second ninth transistor T2-9 is electrically connected to the second first node N2-1;

The first terminal of the second first capacitor C2-1 is electrically connected to the second first node N2-1, and the second terminal of the second first capacitor C2-1 is electrically connected to the low voltage terminal VGL;

The second output control circuit includes a second tenth transistor T2-10, a second eleventh transistor T2-11, a second twelfth transistor T2-12 and a second thirteenth transistor T2-13;

The gate electrode of the second tenth transistor T2-10 is electrically connected to the Nth stage of driving signal output terminal NS (N), the source electrode of the second tenth transistor T2-10 is electrically connected to the high voltage terminal VGH, and the drain electrode of the second tenth transistor T2-10 is electrically connected to the second fifth node N2-5;

The gate electrode of the second eleventh transistor T2-11 is electrically connected to the second first node N2-1, the source electrode of the second eleventh transistor T2-11 is electrically connected to the high voltage terminal VGH, and the drain electrode of the second eleventh transistor T2-11 is electrically connected to the second fifth node N2-5;

The gate electrode of the second twelfth transistor T2-12 is electrically connected to the Nth stage of driving signal output terminal NS (N), the source electrode of the second twelfth transistor T2-12 is electrically connected to the second fifth node N2-5, and the drain electrode of the second twelfth transistor T2-12 is electrically connected to the second sixth node N2-6;

The gate electrode of the second thirteenth transistor T2-13 is electrically connected to the second first node N2-1, the source electrode of the second transistor T2-13 is electrically connected to the second sixth node N2-6, and the drain electrode of the second transistor T2-13 is electrically connected to the low voltage terminal VGL;

The second output circuit includes a second transistor T2-14 and a second transistor T2-15;

The gate electrode of the second transistor T2-14 is electrically connected to the second fifth node N2-5, the source electrode of the second transistor T2-14 is electrically connected to the high voltage terminal VGH, and the drain electrode of the second transistor T2-14 is electrically connected to the output driving terminal NO (N);

The gate electrode of the second transistor T2-15 is electrically connected to the second fifth node N2-5, the source electrode of the second fifteenth transistor T2-15 is electrically connected to the output driving terminal NO (N), and the drain electrode of the second fifteenth transistor T2-15 is electrically connected to the low voltage terminal VGL;

The second first driving output circuit includes a second sixteenth transistor T2-16 and a second second capacitor C2-2;

The gate electrode of the second sixteenth transistor T2-16 is electrically connected to the first control node NC2-1, the source electrode of the second sixteenth transistor T2-16 is electrically connected to the high voltage terminal VGH, and the drain electrode of the second sixteenth transistor T2-16 is electrically connected to the Nth stage of driving signal output terminal NS (N);

The first terminal of the second second capacitor C2-2 is electrically connected to the first control node NC2-1, and the second terminal of the second second capacitor C2-2 is electrically connected to the high voltage terminal VGH;

The second second driving output circuit includes a second seventeenth transistor T2-17 and a second third capacitor C2-3;

The gate electrode of the second seventeenth transistor T2-17 is electrically connected to the second control node NC2-2, the source electrode of the second seventeenth transistor T2-17 is electrically connected to the Nth stage of driving signal output terminal NS (N), and the drain electrode of the second seventeenth transistor T2-17 is electrically connected to the low voltage terminal VGL;

The first terminal of the second third capacitor C2-3 is electrically connected to the Nth stage of driving signal output terminal, the second terminal of the second third capacitor C2-3 is electrically connected to the low voltage terminal VGL;

The second seventh node control circuit includes a second eighteenth transistor T2-18 and a second nineteenth transistor T2-19;

The gate electrode of the second eighteenth transistor T2-18 is electrically connected to the first clock signal terminal GCK, the source electrode of the second eighteenth transistor T2-18 is electrically connected to the low voltage terminal VGL, and the drain electrode of the second eighteenth transistor T2-18 is electrically connected to the second seventh node N2-7;

The gate electrode of the second nineteenth transistor T2-19 is electrically connected to the second ninth node N2-9, the source electrode of the second nineteenth transistor T2-19 is electrically connected to the second seventh node N2-7, and the drain electrode of the second nineteenth transistor T2-19 is electrically connected to the first clock signal terminal GCK;

The second eighth node control circuit includes a second twentieth transistor T2-20;

The gate electrode of the second twentieth transistor T2-20 is electrically connected to the low voltage terminal VGL, the source electrode of the second twentieth transistor T2-20 is electrically connected to the second seventh node N2-7, and the drain electrode of the second twentieth transistor T2-20 is electrically connected to the second eighth node N2-8;

The second first control circuit includes a second twenty-first transistor T2-21, the second fourth capacitor C2-4, a second twenty-second transistor T2-22 and a second twenty-third transistor T2-23;

The gate electrode of the second twenty-first transistor T2-21 is electrically connected to the second eighth node N2-8, the source electrode of the second twenty-first transistor T2-21 is electrically connected to the second clock signal terminal GCB, and the drain electrode of the second twenty-first transistor T2-21 is electrically connected to the second second node N2-2;

The first terminal of the second fourth capacitor C2-4 is electrically connected to the second eighth node N2-8, and the second terminal of the second fourth capacitor C2-4 is electrically connected to the second second node N2-2;

The gate electrode of the second twenty-second transistor T2-22 is electrically connected to the second clock signal terminal GCB, the source electrode of the second twenty-second transistor T2-22 is electrically connected to the second second node N2-2, and the drain electrode of the second twenty-second transistor T2-22 is electrically connected to the first control node NC2-1;

The gate electrode of the second twenty-third transistor T2-23 is electrically connected to the second ninth node N2-9, the source electrode of the second twenty-third transistor T2-23 is electrically connected to the first control node NC2-1, and the drain electrode of the second twenty-third transistor T2-23 is electrically connected to the high voltage terminal VGH;

The second ninth node control circuit includes a second twenty-fourth transistor T2-24 and the second twenty-fifth transistor T2-25;

The gate electrode of the second twenty-fourth transistor T2-24 is electrically connected to the first clock signal terminal GCK, the source electrode of the second twenty-fourth transistor T2-24 is electrically connected to the (N−1)th stage of driving signal output terminal NS (N−1), and the drain electrode of the second twenty-fourth transistor T2-24 is electrically connected to the second ninth node N2-9;

The gate electrode of the second twenty-fifth transistor T2-25 is electrically connected to the initial control terminal NCX, the source electrode of the second twenty-fifth transistor T2-25 is electrically connected to the high voltage terminal VGH, and the drain electrode of the second twenty-fifth transistor T2-25 is electrically connected to the second ninth node N2-9;

The second tenth node control circuit includes a second twenty-sixth transistor T2-26;

The gate electrode of the second twenty-sixth transistor T2-26 is electrically connected to the first clock signal terminal GCK, the source electrode of the second twenty-sixth transistor T2-26 is electrically connected to the (N−1)th stage of driving signal output terminal NS (N−1), and the drain electrode of the second twenty-sixth transistor T2-26 is electrically connected to the second tenth node N2-10;

The second eleventh node control circuit includes a second twenty-seventh transistor T2-27, a second twenty-eighth transistor T2-28, a second twenty-ninth transistor T2-29 and a second fifth capacitor C2-5;

The gate electrode of the second twenty-seventh transistor T2-27 is electrically connected to the low voltage terminal VGL, the source electrode of the second twenty-seventh transistor T2-27 is electrically connected to the second tenth node N2-10, and the drain electrode of the second twenty-seventh transistor T2-27 is electrically connected to the second eleventh node N2-11;

The gate electrode of the second twenty-eighth transistor T2-28 is electrically connected to the second seventh node N2-7, the source electrode of the second twenty-eighth transistor T2-28 is electrically connected to the high voltage terminal VGH, and the drain electrode of the second twenty-eighth transistor T2-28 is electrically connected to the second twelfth node N2-12;

The gate electrode of the second twenty-ninth transistor T2-29 is electrically connected to the second eleventh node N2-11, the source electrode of the second twenty-ninth transistor T2-29 is electrically connected to the second twelfth node N2-12, and the drain electrode of the second twenty-ninth transistor T2-29 is electrically connected to the second clock signal terminal GCB;

The first terminal of the second fifth capacitor C2-5 is electrically connected to the second twelfth node N2-12, and the second terminal of the second fifth capacitor C2-5 is electrically connected to the second eleventh node N2-11;

The second second control circuit includes a second thirtieth transistor and a second thirty-first transistor;

The gate electrode of the second thirtieth transistor T2-30 and the source electrode of the second thirtieth transistor T2-31 are both electrically connected to the second eleventh node N2-11, and the drain electrode of the second thirtieth transistor T2-31 is electrically connected to the second control node NC2-2;

The gate electrode of the second thirty-first transistor T2-31 is electrically connected to the low voltage terminal VGL, the source electrode of the second thirty-first transistor T2-31 is electrically connected to the second ninth node N2-9, and the drain electrode of the second thirty-first transistor T2-31 is electrically connected to the second control node NC2-2.

In FIG. 39, the second thirteenth node is labeled N2-13.

In at least one embodiment of the driving circuit shown in FIG. 39, T2-1 is an n-type transistor, T2-2 is a p-type transistor, T2-3 is a p-type transistor, T2-4 is an n-type transistor, T2-5 is a p-type transistor, T2-6 is an n-type transistor, T2-7 is a p-type transistor, T2-8 is an n-type transistor, T2-9 is a p-type transistor, T2-10 and T2-11 are n-type transistors, T2-12 and T2-13 are n-type transistors, T2-14 is a p-type transistor, T2-15 is an n-type transistor, and T2-16-T2-31 are all p-type transistors.

In at least one embodiment of the present disclosure, the structure of the second driving signal generation circuit is not limited to that shown in FIG. 39, and the second driving signal generation circuit can be, for example, a 16T3C circuit, a 13T3C circuit, a 12T3C circuit, a 10T3C circuit, etc., but is not limited thereto.

At least one embodiment of the driving circuit shown in FIG. 39 of the present disclosure is in operation.

In the first phase, NS (N−1) outputs a low voltage signal, GCK outputs a low voltage signal, and GCB provides a high voltage signal. T2-24 and T2-26 are turned on, the potential of N2-9 and the potential of N2-10 are low voltages, T2-27 and T2-31 are turned on, ensuring that the potential of NC2-2 and the potential of N2-11 are low voltages, T2-17 is turned on, NS (N) outputs a low voltage signal; the potential of N2-11 is low voltage to ensure that T2-29 is turned on, the potential of N2-9 is low voltage to turn on T2-19, T2-18 is turned on, the potential of N2-7 and N2-8 are pulled down, T2-21 is turned on, GCB writes a high voltage signal to N2-2, the potential of N2-9 is low voltage to turn on T2-23, and the potential of NC2-1 is pulled up to a high voltage to ensure that T2-16 is turned off;

In the second phase, NS (N−1) outputs a low voltage signal, the potential of the first clock signal output by GCK jumps from a low voltage to a high voltage, T2-24 and T2-26 are turned off, the potential of N2-9 is a low voltage, T2-19 is turned on, T2-18 is turned off, T2-20 is turned on, the potential of N2-7 and the potential of N2-8 are high voltages, T2-21 is turned off, the potential of N2-2 is maintained at a high voltage, GCB outputs a low voltage signal, T2-22 is turned on, the potential of NC2-1 is maintained at a high voltage, and T2-16 is turned off; at the same time, the potential of N2-11 is maintained at a low voltage, T2-29 is turned on, GCB writes the low voltage signal to N2-12, and pulls down the potential of N2-11 to a lower voltage through C2-5 (5V~10V lower than the voltage value of the low voltage signal provided by GCB), T2-30 is turned on, and the low voltage signal is written to NC2-2 (the potential of NC2-2 is 3~8V lower than the voltage value of the low voltage signal provided by GCB), and T2-17 is fully turned on to ensure that NS (N) outputs a low voltage signal;

In the third phase, NS (N−1) outputs a high voltage signal, GCK outputs a low voltage signal, GCB outputs a high voltage signal, T2-24 and T2-26 are turned on, the potential of N2-9 and the potential of N2-10 are controlled to be high voltage, T2-27 and T2-31 are turned on, the potential of NC2-2 and the potential of N2-11 are high voltage, and T2-17 is turned off; the potential of N2-11 is high voltage, T2-29 is turned off, the potential of N2-9 is high voltage, T2-19 is turned off, T2-18 is turned on, T2-20 is turned on, the potential of N2-7 and the potential of N2-8 are pulled down, T2-21 is turned on, GCB writes a high voltage signal to N2-2, T2-22 is turned off, the potential of N2-9 is high voltage, T2-23 is turned off, the potential of NC2-1 is maintained at a high voltage, and T2-16 is turned off;

In the fourth phase, NS (N−1) outputs a high voltage signal, the potential of the first clock signal output by GCK jumps from low voltage to high voltage, GCB outputs a low voltage signal, T2-24 and T2-26 are turned off, the potential of N2-9 is high voltage, T2-19 is turned off, T2-18 is turned off, T2-20 is turned on, the potential of N2-7 and the potential of N2-8 are maintained at low voltage, T2-21 is turned on, T2-22 is turned on, the potential of N2-2 and the potential of NC2-1 are low voltage, T2-16 is turned on, and NS (N) outputs a high voltage signal; at the same time, the potential of N2-11 is high voltage, T2-29 is turned off, and the potential of N2-12 remains unchanged, ensuring that the potential of N2-11 is high voltage;

In the fifth phase, the potential of the (N−1)th stage of driving signal output by NS (N−1) jumps from high voltage to low voltage, GCK outputs a high voltage signal, GCB outputs a low voltage signal, T2-24 and T2-26 are turned off, the potential of N2-9 and the potential of N2-10 are maintained at a high voltage, and the potential of the remaining nodes remains unchanged, ensuring that NS (N) outputs a high voltage signal;

In the sixth phase, NS (N−1) outputs a low voltage signal, the potential of the first clock signal output by GCK jumps from high voltage to low voltage, GCB outputs a high voltage signal, T2-24 and T2-26 are turned on, the potential of N2-9 and the potential of N2-10 are low voltage, T2-27 and T2-31 are turned on, ensuring that the potential of NC2-2 and the potential of N2-11 are low voltage, to turn on T2-17, NS (N) outputs a low voltage signal; the potential of N2-11 is low voltage, ensuring that T2-29 is turned on, the potential of N2-9 is low voltage, to turn on T2-19, T2-18, turn on T2-20, pull down the potential of N2-7 and the potential of N2-8, turn on T2-21, GCB writes a high voltage signal to N2-2, the potential of N2-9 is low voltage, to turn on T2-23, pull up the potential of NC2-1 to high voltage, and ensure that T2-16 is turned off.

Optionally, when the display starts (that is, when the display device is turned on), in the power-on phase before the first phase, NCX outputs a low voltage signal, T2-9 is turned on to control the potential of N2-1 to be a high voltage, T2-25 is turned on, the potential of N2-9 is a high voltage, and T2-19 is turned off. When GCK provides a low voltage signal, the potential of N2-7 is a low voltage, T2-20 is turned on, the potential of N2-8 is a low voltage, and T2-21 is turned on to control the connection between N2-2 and GCB; when GCB provides a low voltage signal, T2-22 is turned on, the potential of NC2-1 is a low voltage, T2-16 is turned on, and NS (N) outputs a high voltage signal; T2-12 is turned on, T2-13 is turned on, the potential of N2-5 is low voltage, T2-14 is turned on, NO (N) outputs a high voltage signal, which can turn on the second display control transistor M2 included in all pixel circuits in the effective display area, clear the residual charge in the storage capacitor Cst, and improve the poor screen flicker when the power is turned on;

Afterwards, when NS (N−1) outputs a high voltage signal and NS (N) outputs a low voltage signal, T2-1 and T2-2 are turned on, When VCT provides a low voltage signal, the potential of N2-1 is a low voltage signal, and C2-1 maintains the potential of N2-1; T2-11 is turned on, T2-10 is turned on, the potential of N2-5 is high voltage, T2-15 is turned on, and NO (N) outputs a low voltage signal;

When VCT provides a high voltage signal, the potential of N2-1 is a high voltage signal, C2-1 maintains the potential of N2-1, T2-11 is turned off, T2-10 is turned on, the potential of N2-5 is high voltage, T2-15 is turned on, and NO (N) outputs a low voltage signal;

Afterwards, in the Nth stage of driving signal providing phase, NS (N) outputs a high voltage signal, When the potential of N2-1 is low voltage, T2-10 is turned off, T2-11 is turned on, the potential of N2-5 is high voltage, T2-15 is turned on, and NO (N) outputs a low voltage signal;

When the potential of N2-1 is a high voltage, T2-10 is turned off, T2-11 is turned off, T2-12 and T2-13 are turned on, the potential of N2-5 is a low voltage, T2-14 is turned on, and NO (N) outputs a high voltage signal;

After the Nth stage of driving signal is provided, NS (N) outputs a low voltage signal, When the potential of N2-1 is a low voltage signal, T2-10 is turned on, T2-11 is turned on, the potential of N2-5 is a high voltage, and NO (N) outputs a low voltage signal;

When the potential of N2-1 is a high voltage signal, T2-10 is turned on, T2-11 is turned off, the potential of N2-5 is a high voltage, and NO (N) outputs a low voltage signal.

At least one embodiment of the driving circuit shown in FIG. 39 of the present disclosure is in operation. When NS (N−1) outputs a high voltage signal and NS (N) outputs a low voltage signal, T2-1 and T2-2 are turned on. By simultaneously gating the above two signals, the gating input signal state within a high-low frequency switching cycle can be obtained.

In at least one embodiment of the driving circuit shown in FIG. 39 of the present disclosure, since the p-type transistor has a threshold voltage loss when transmitting a low voltage and the n-type transistor has a threshold voltage loss when transmitting a high voltage, the absolute value of the potential of N2-1 will be lower. The absolute value of the potential of N2-1 can be controlled to increase by the second first inverter and the second second inverter, so as to better control the corresponding transistor in the second output circuit to turn on or off. The second maintenance control circuit controls the disconnection between N2-1 and N2-4 when T2-1 and T2-2 are turned on, so as not to affect the writing of the potential of N2-1.

Figure 40:
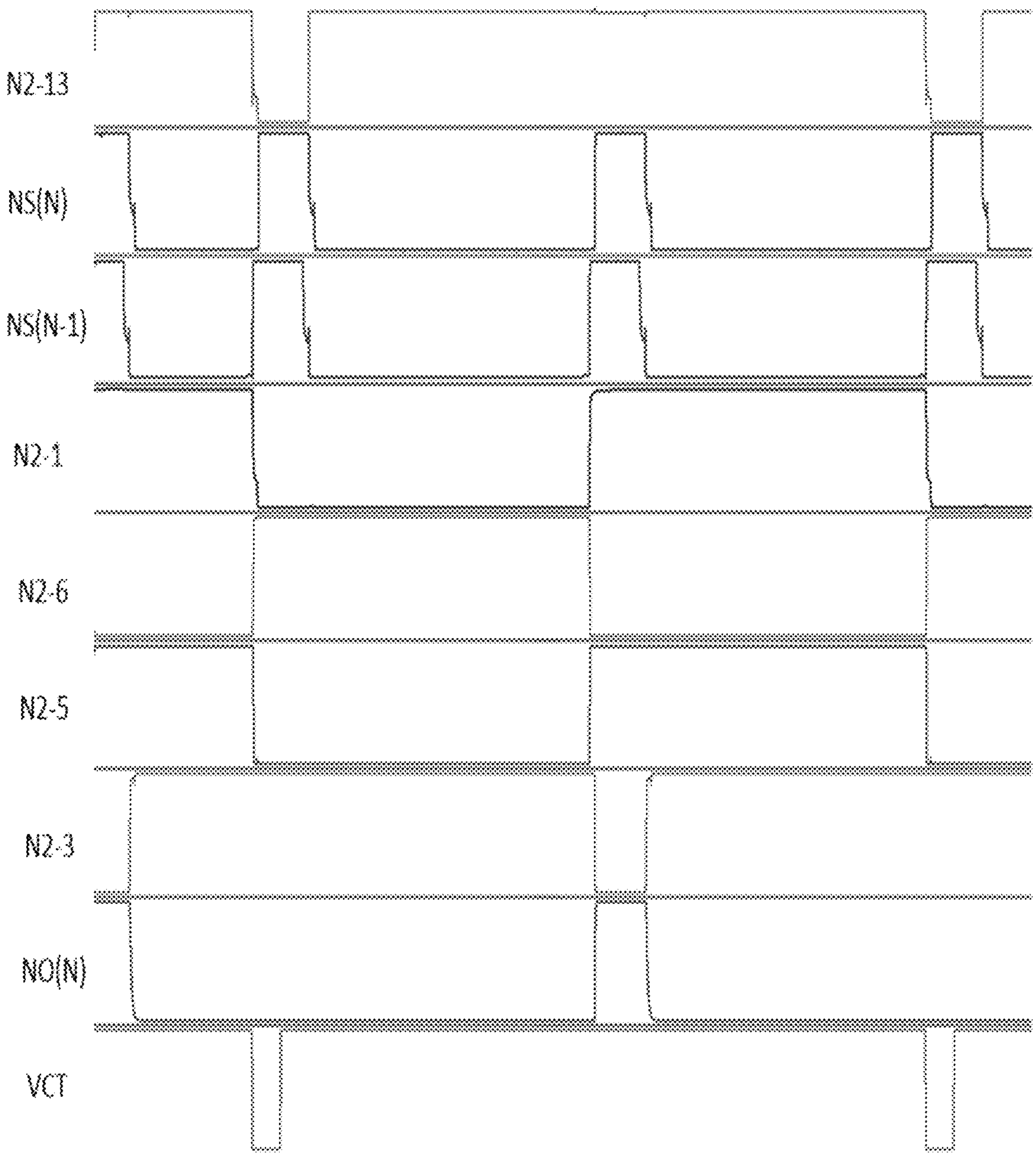
FIG. 40 is a working timing diagram of the driving circuit shown in FIG. 39.
Figure 41:
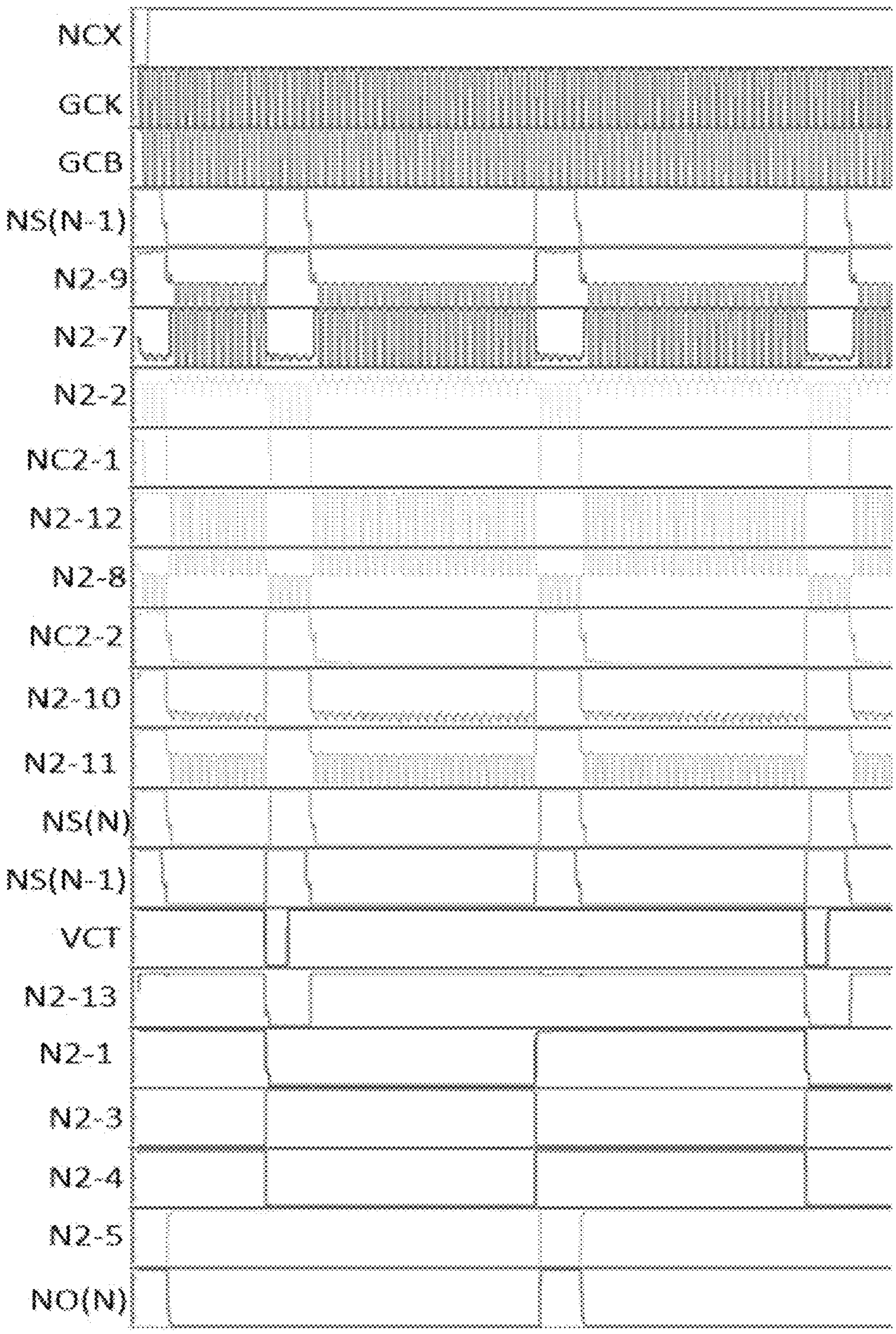
FIG. 41 is a simulation working timing diagram of the driving circuit shown in FIG. 39.

FIG. 40 is a working timing diagram of the driving circuit shown in FIG. 39;

FIG. 41 is a simulation working timing diagram of the driving circuit shown in FIG. 39.

Figure 42:
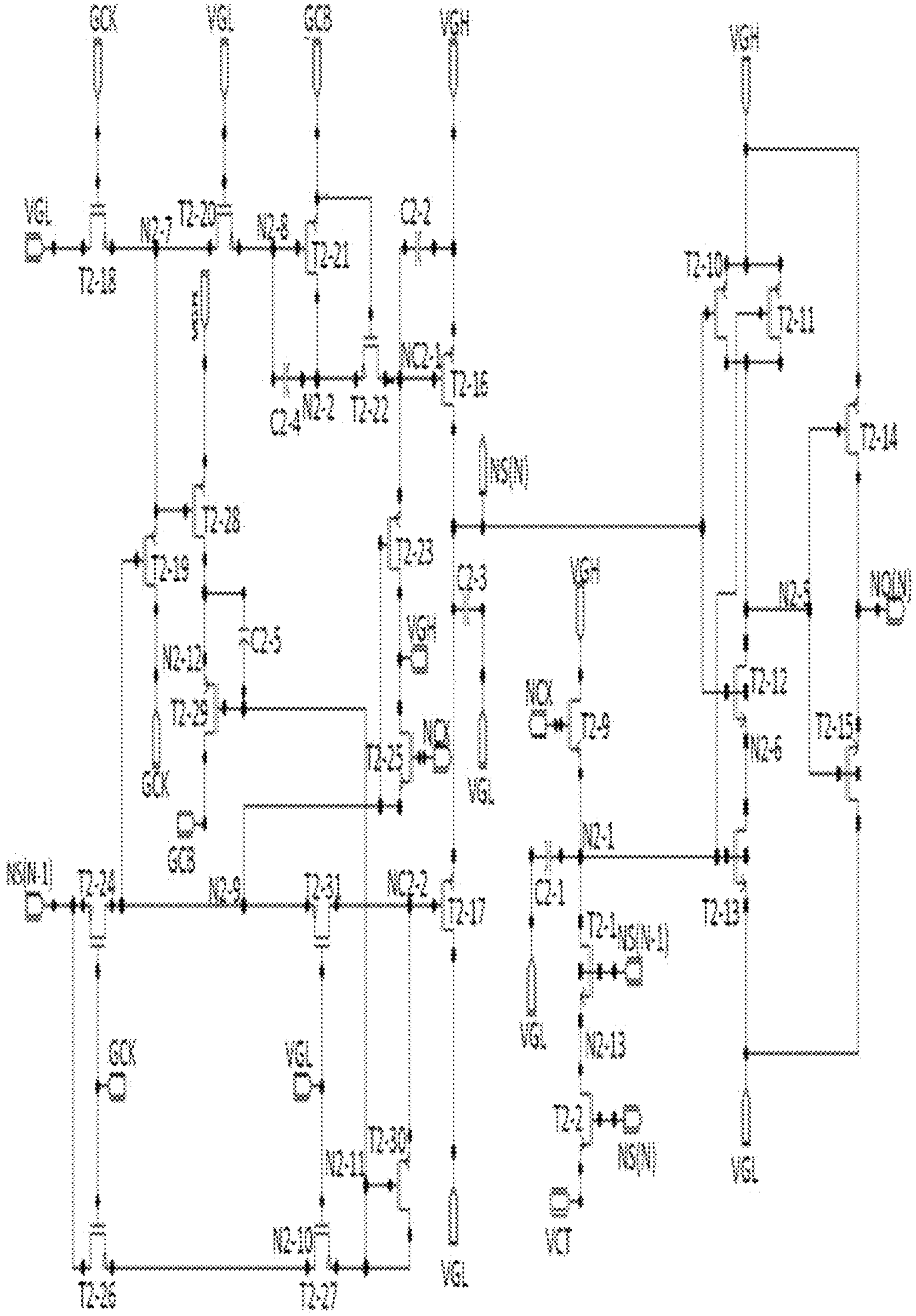
FIG. 42 is a structural diagram of the driving circuit according to at least one embodiment of the present disclosure.

The difference between at least one embodiment of the driving circuit shown in FIG. 42 of the present disclosure and at least one embodiment of the driving circuit shown in FIG. 39 of the present disclosure is as follows: the second second voltage maintenance circuit is not provided (that is, T2-3-T2-8 is not provided).

The difference between at least one embodiment of the driving circuit shown in FIG. 43 of the present disclosure and at least one embodiment of the driving circuit shown in FIG. 39 of the present disclosure is as follows: N2-4 is electrically connected to the gate electrode of T2-11 and the gate electrode of T2-13.

Figure 43:
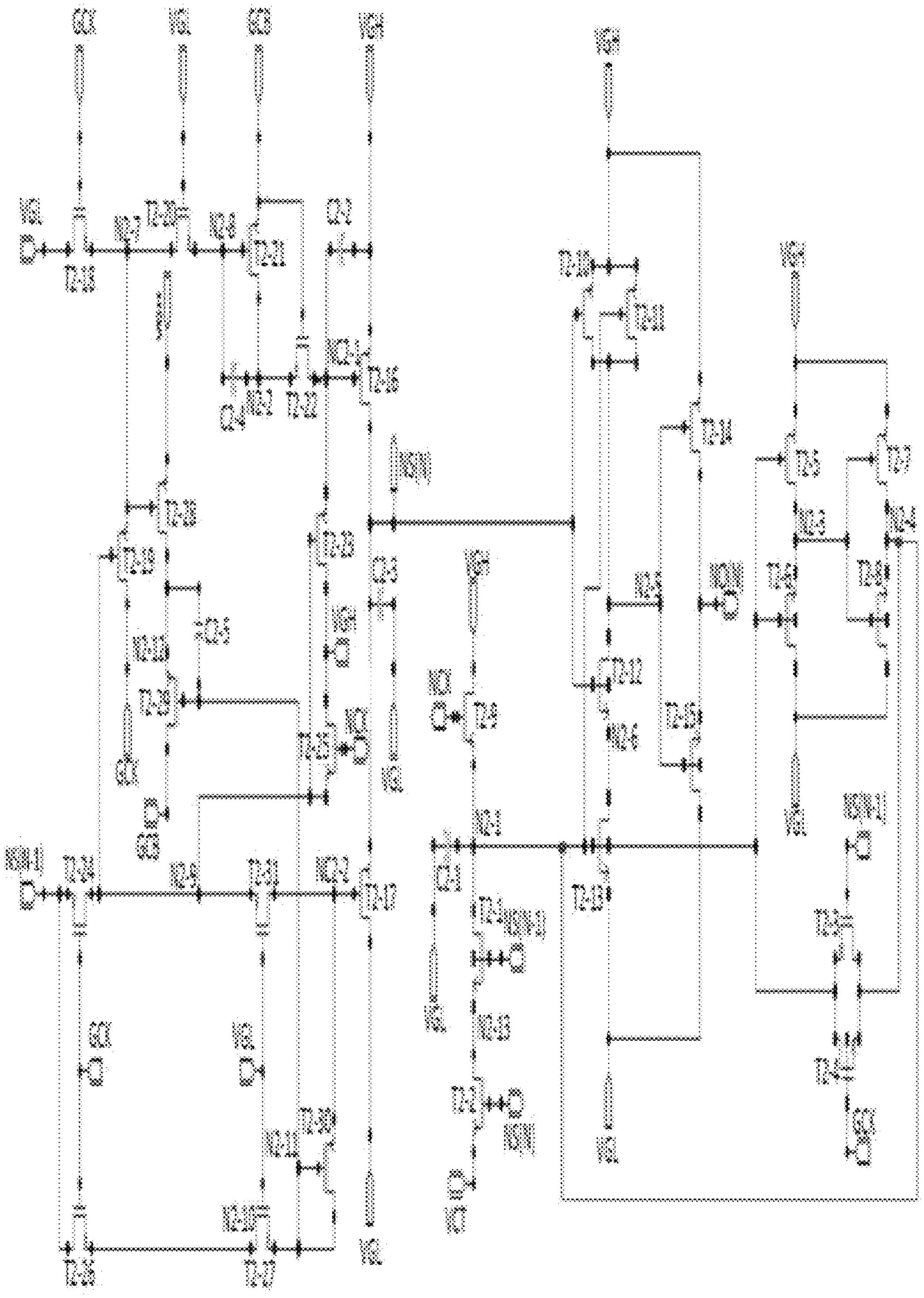
FIG. 43 is a structural diagram of the driving circuit according to at least one embodiment of the present disclosure.

When at least one embodiment of the driving circuit shown in FIG. 43 of the present disclosure is working, since the p-type transistor has a threshold voltage loss when transmitting a low voltage, and the n-type transistor has a threshold voltage loss when transmitting a high voltage, the absolute value of the potential of N2-1 will be lower, and the absolute value of the potential of N2-4 can be controlled to increase through the second first inverter and the second second inverter, so as to better control the corresponding transistor in the second output circuit to turn on or off, and the second maintenance control circuit controls the disconnection between N2-1 and N2-4 when T2-1 and T2-2 are turned on, so as not to affect the writing of the potential of N2-1.

Figure 44:
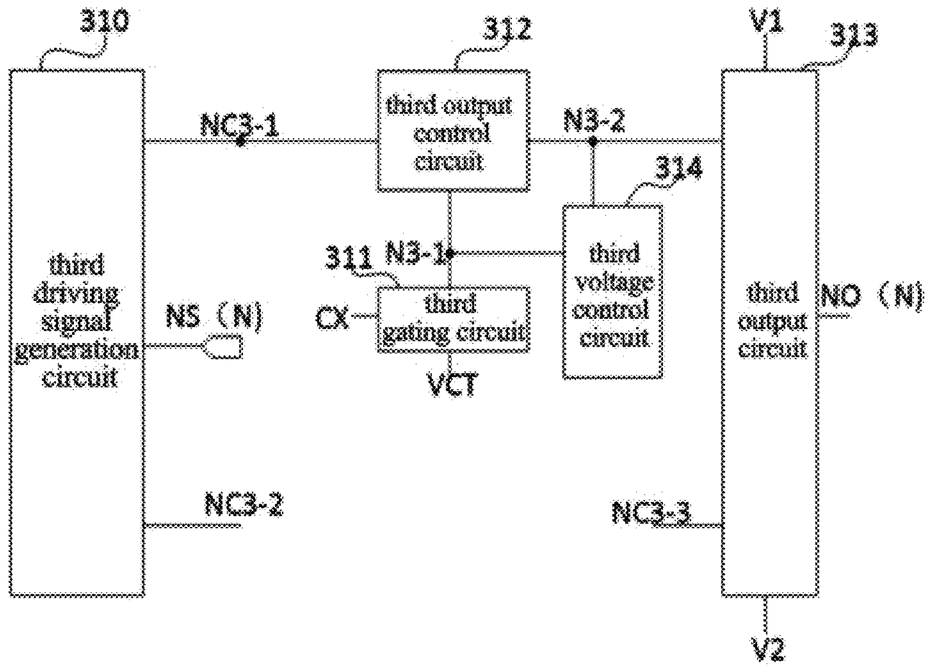
FIG. 44 is a structural diagram of a driving circuit according to at least one embodiment of the present disclosure.

As shown in FIG. 44, the driving circuit according to the embodiment of the present disclosure includes a third driving signal generation circuit 310, a third gating circuit 311, a third output control circuit 312, a third output circuit 313 and a third voltage control circuit 314;

the third driving signal generation circuit 310 is electrically connected to the third first control node NC3-1, the third second control node NC3-2 and the Nth stage of driving signal output terminal NS (N) respectively, and is configured to generate and output the Nth stage of driving signal through the Nth stage of driving signal output terminal NS (N) under the control of the potential of the third first control node NC3-1 and the potential of the third second control node NC3-2;

The third gating circuit 311 is electrically connected to the third first node N3-1, the gating input terminal VCT and the gating control terminal CX respectively, and is configured to control the gating input signal provided by the gating input terminal VCT to be written into the third first node N3-1 under the control of the gating control signal provided by the gating control terminal CX;

The third output control circuit 312 is electrically connected to the third first node N3-1, the third first control node NC3-1 and the third second node N3-2, and is configured to control the connection between the third first control node NC3-1 and the third second node N3-2 under the control of the potential of the third first node N3-1;

The third voltage control circuit 314 is electrically connected to the third first node N3-1 and the third second node N3-2 respectively, and is configured to control the potential of the third second node N3-2 according to the potential of the third first node N3-1;

The third output circuit 313 is electrically connected to the third second node N3-2, the third third control node NC3-3, the first voltage terminal V1, the second voltage terminal V2 and the output driving terminal NO (N) respectively, and is configured to control the connection between the output driving terminal NO (N) and the first voltage terminal V1 under the control of the potential of the third second node N3-2, and control the connection between the output driving terminal NO (N)

and the second voltage terminal V2 under the control of the potential of the third third control node NC3-3;

The third second control node NC3-2 and the third third control node NC3-3 are different nodes; N is a positive integer.

When the embodiment of the driving circuit shown in FIG. 44 of the present disclosure is working, the third driving signal generation circuit 310 generates and outputs the Nth stage of driving signal through the Nth stage of driving signal output terminal NS (N), and the third gating circuit 311 writes the gating input signal into the third first node N3-1 under the control of the gating control signal; the third output control circuit 312 controls the connection between the third first control node NC3-1 and the third second node N3-2 under the control of the potential of the third first node N3-1; the third voltage control circuit 314 controls the potential of the third second node N3-2 according to the potential of the third first node N3-1; the third output circuit 313 controls the connection between the output driving terminal NO (N) and the first voltage terminal V1 under the control of the potential of the third second node N3-2, and controls the connection between the output driving terminal NO (N) and the second voltage terminal V2 under the control of the potential of the third third control node NC3-3.

Optionally, the first voltage terminal may be a high voltage terminal, but is not limited thereto.

The embodiment of the driving circuit shown in FIG. 44 of the present disclosure can be an Nth stage of driving circuit.

When the embodiment of the driving circuit shown in FIG. 44 of the present disclosure is working, within one frame time, before the Nth stage of driving signal providing phase, the third gating circuit 311 writes the gating input signal provided by the gating input terminal VCT to the third first node N3-1 under the control of the gating control signal;

when the gating input signal is a high voltage signal, in the Nth stage of driving signal providing phase, the Nth stage of driving signal output terminal NS (N) outputs a high voltage signal, the potential of the third first node N3-1 is a high voltage, the third output control circuit 312 controls the third first control node NC3-1 to be disconnected from the third second node N3-2 under the control of the potential of the third first node N3-1, the third voltage control circuit 314 controls the potential of the third second node N3-2 to be a high voltage according to the potential of the third first node N3-1, and the third output circuit controls the output driving terminal NO (N) to maintain to output the low voltage signal, which can control the corresponding row pixel circuit not to update the pixel voltage;

When the gating input signal is a low voltage signal, in the Nth stage of driving signal providing phase, the Nth stage of driving signal output terminal NS (N) outputs a high voltage signal, and the potential of the third first node N3-1 is a low voltage. The third output control circuit 312 controls the third first control node NC3-1 to be connected to the third second node N3-2 under the control of the potential of the third first node N3-1, so that the potential of the third second node N3-2 is a low voltage. The third output circuit 313 controls the output driving terminal NO (N) to be connected with the first voltage terminal V1 under the control of the potential of the third second node N3-2, so that NO (N) outputs a high voltage signal, which can control the corresponding row of pixel circuits to update the pixel voltage.

The embodiment of the present disclosure can realize the update of the partial screen of the display screen by controlling the gating input signal provided by the gating input terminal VCT, thereby reducing power consumption, or realize ultra-low power consumption of OLED display products such as wearable products, mobile terminals, NB (laptop computers) by partial updating of the display screen.

Optionally, the third output control circuit includes a third third transistor;

a gate electrode of the third third transistor is electrically connected to the third first node, a first electrode of the third third transistor is electrically connected to the third first control node, and a second electrode of the third third transistor is electrically connected to the third second node.

Optionally, the third voltage control circuit includes a third first capacitor;

a first terminal of the third first capacitor is electrically connected to the third first node, and a second terminal of the third first capacitor is electrically connected to the third second node.

The driving circuit according to at least one embodiment of the present disclosure also includes a third second node control circuit;

The third second node control circuit is electrically connected to the third third control node, the third second node and the first voltage terminal respectively, and is configured to control the connection between the third second node and the first voltage terminal under the control of the potential of the third third control node.

In a specific implementation, the driving circuit may further include a third second node control circuit;

The third second node control circuit controls the connection between the third second node and the first voltage terminal under the control of the potential of the third third control node.

Figure 45:
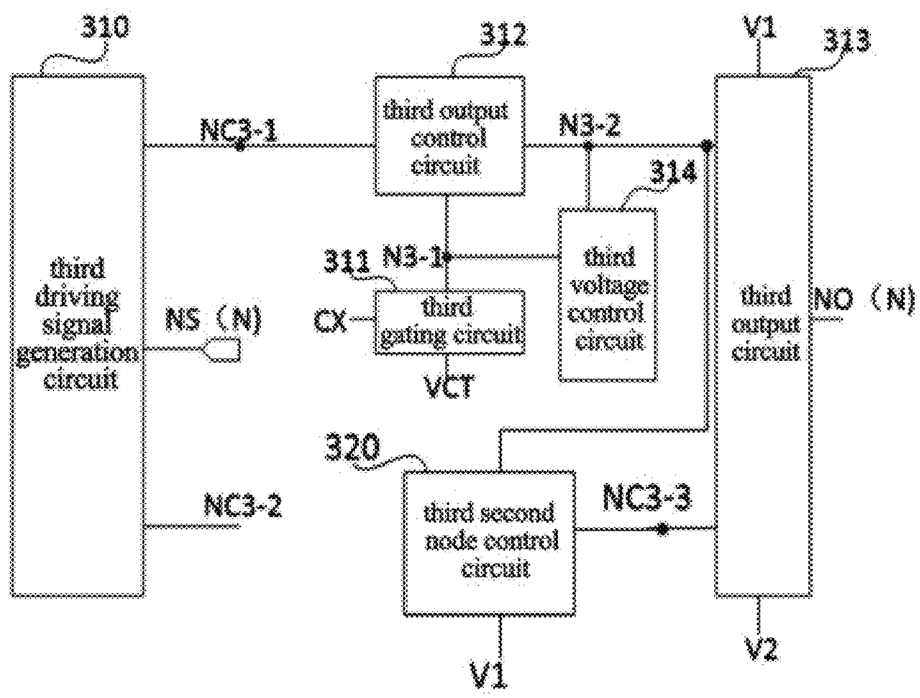
FIG. 45 is a structural diagram of a driving circuit according to at least one embodiment of the present disclosure.

As shown in FIG. 45, based on the embodiment of the driving circuit shown in FIG. 44, the driving circuit further includes a third second node control circuit 320;

The third second node control circuit 320 is electrically connected to the third third control node NC3-3, the third second node N3-2 and the first voltage terminal V1 respectively, and is configured to control the connection between the third second node N3-2 and the first voltage terminal V1 under the control of the potential of the third third control node NC3-3.

When at least one embodiment of the driving circuit shown in FIG. 45 is in operation, when the potential of the third third control node NC3-3 is an effective voltage, the potential of the third second node N3-2 may be a first voltage.

Optionally, the third second node control circuit includes a third fourth transistor;

a gate electrode of the third fourth transistor is electrically connected to the third third control node, a first electrode of the third fourth transistor is electrically connected to the third second node, and a second electrode of the third fourth transistor is electrically connected to the first voltage terminal.

Optionally, the third output circuit includes a third fifth transistor, a third sixth transistor and a third second capacitor;

a gate electrode of the third fifth transistor is electrically connected to the third second node, a first electrode of the third fifth transistor is electrically connected to the first voltage terminal, and a second electrode of the third fifth transistor is electrically connected to the output driving terminal;

a gate electrode of the third sixth transistor is electrically connected to the third third control node, a first electrode of the third sixth transistor is electrically connected to the output driving terminal, and a second electrode of the third sixth transistor is electrically connected to the second voltage terminal;

a first terminal of the third second capacitor is electrically connected to the third second node, and a second terminal of the third second capacitor is electrically connected to the first voltage terminal.

The driving circuit according to at least one embodiment of the present disclosure further includes a third initialization circuit;

The third initialization circuit is electrically connected to the initial control terminal, the second voltage terminal and the third first node respectively, and is configured to control the connection between the third first node and the second voltage terminal under the control of the initial control signal provided by the initial control terminal.

In specific implementation, the driving circuit may also include a third initialization circuit. When the display device is turned on, the third initialization circuit controls the connection between the third first node and the second voltage terminal under the control of the initial control signal to control the potential of the third first node to be the second voltage, and the third output control circuit controls the connection between the third first control node and the third second node under the control of the potential of the third first node.

In at least one embodiment of the present disclosure, the driving circuit further includes a third first node control circuit;

The third first node control circuit is electrically connected to the third fourth node, the second voltage terminal and the third first node respectively, and is configured to control the connection between the third first node and the second voltage terminal under the control of the potential of the third fourth node.

In a specific implementation, the driving circuit may further include a third first node control circuit, which controls the third first node to be connected to the second voltage terminal under the control of the potential of the third fourth node; after the Nth stage of driving signal providing phase, when the potential of the third fourth node is an effective voltage, the third first node control circuit controls the third first node to be connected to the second voltage terminal, so that the potential of the third first node is the second voltage, and the third output control circuit controls the third first control node to be connected to the third second node under the control of the potential of the third first node.

In at least one embodiment of the present disclosure, when the transistor included in the third first node control circuit is a p-type transistor, the effective voltage may be a low voltage, and when the transistor included in the third first node control circuit is an n-type transistor, the effective voltage may be a high voltage.

Figure 46:
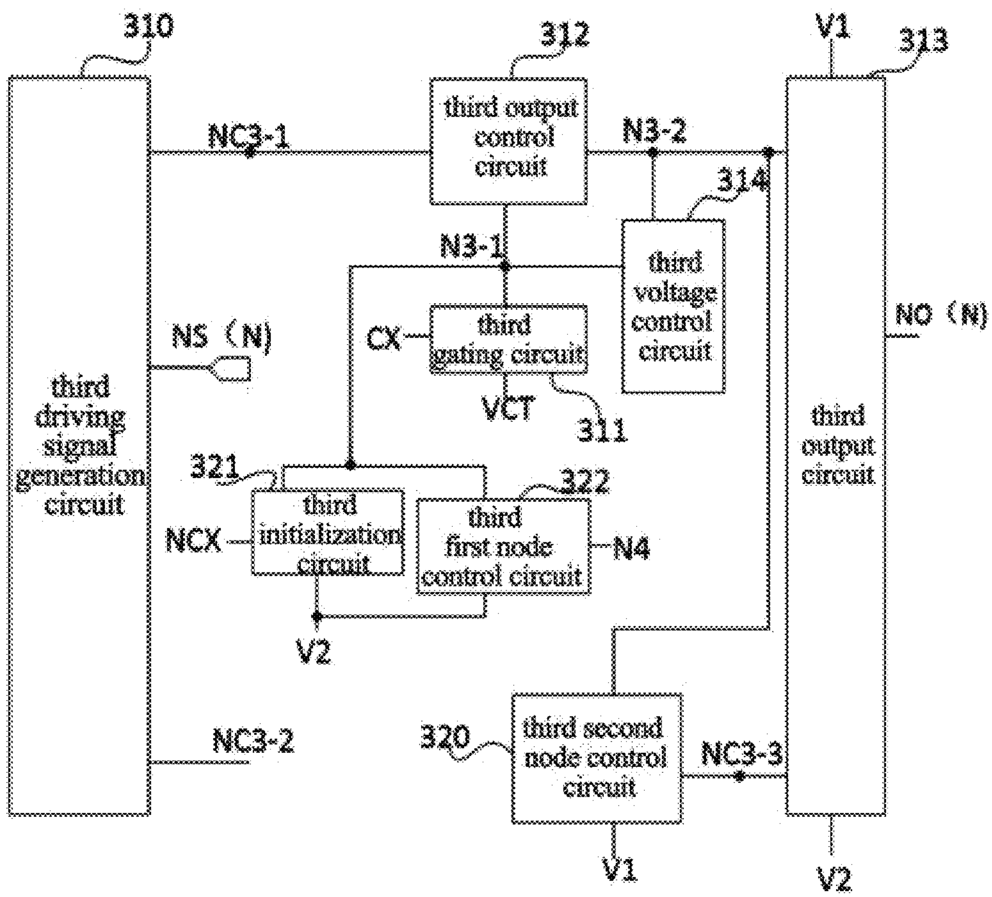
FIG. 46 is a structural diagram of a driving circuit according to at least one embodiment of the present disclosure.

As shown in FIG. 46, based on at least one embodiment of the driving circuit shown in FIG. 45, the driving circuit may further include a third initialization circuit 321 and a third first node control circuit 322;

The third initialization circuit 321 is electrically connected to the initial control terminal NCX, the third first node N3-1 and the second voltage terminal V2 respectively, and is configured to control the connection between the third first node N3-1 and the second voltage terminal V2 under the control of the initial control signal provided by the initial control terminal NCX;

The third first node control circuit 322 is electrically connected to the third fourth node N3-4, the third first node N3-1 and the second voltage terminal V2 respectively, and is configured to control the connection between the third first node N3-1 and the second voltage terminal V2 under the control of the potential of the third fourth node N3-4.

Optionally, the third initialization circuit includes a third seventh transistor;

a gate electrode of the third seventh transistor is electrically connected to the initial control terminal, a first electrode of the third seventh transistor is electrically connected to the third first node, and a second electrode of the third seventh transistor is electrically connected to the second voltage terminal.

Optionally, the third first node control circuit includes a third eighth transistor;

a gate electrode of the third eighth transistor is electrically connected to the third fourth node, a first electrode of the third eighth transistor is electrically connected to the third first node, and a second electrode of the third eighth transistor is electrically connected to the second voltage terminal.

The driving circuit according to at least one embodiment of the present disclosure also includes a third third control node control circuit;

The third third control node control circuit is electrically connected to the third first node, the third fifth node, the third second control node, the third third control node and the third sixth node respectively, and is configured to control the connection between the third fifth node and the third third control node under the control of the potential of the third first node, control the connection between the third second control node and the third sixth node under the control of the potential of the third sixth node, and control the connection between the third sixth node and the third third control node.

In specific implementation, the driving circuit may include a third third control node control circuit, and the third third control node control circuit controls the potential of the third third control node under the control of the potential of the third first node and the potential of the third sixth node.

Figure 47:
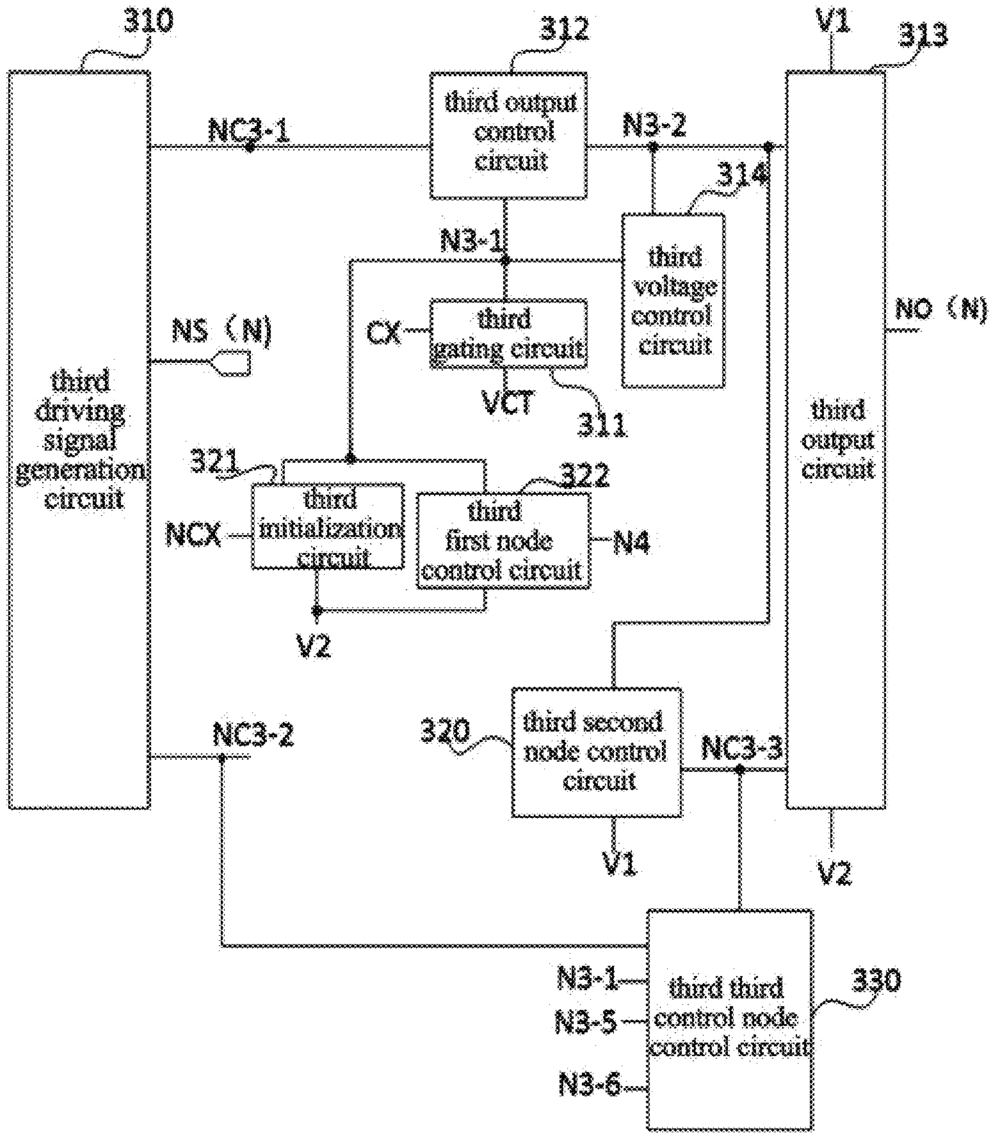
FIG. 47 is a structural diagram of a driving circuit according to at least one embodiment of the present disclosure.

As shown in FIG. 47, based on at least one embodiment of the driving circuit shown in FIG. 46, the driving circuit further includes a third third control node control circuit 330;

The third third control node control circuit 330 is electrically connected to the third first node N3-1, the third fifth node N3-5, the third second control node NC3-2, the third third control node NC3-3 and the third sixth node N3-6 respectively, and is configured to control the connection between the third fifth node N3-5 and the third third control node NC3-3 under the control of the potential of the third first node N3-1, control the connection between the third second control node NC3-2 and the third sixth node N3-6 under the control of the potential of the third sixth node N3-6, and control the connection between the third sixth node N3-6 and the third third control node NC3-3.

Optionally, the third third control node control circuit includes a third ninth transistor, a third tenth transistor and a third eleventh transistor;

a gate electrode of the third ninth transistor is electrically connected to the third first node, the first electrode of the third ninth transistor is electrically connected to the third fifth node, and the second electrode of the third ninth transistor is electrically connected to the third third control node;

a gate electrode of the third tenth transistor and a second electrode of the third tenth transistor are both electrically connected to the third sixth node, and a first electrode of the third tenth transistor is electrically connected to the third second control node;

a gate electrode of the third eleventh transistor and a first electrode of the third eleventh transistor are both electrically connected to the third sixth node, and a second electrode of the third eleventh transistor is electrically connected to the third third control node.

In at least one embodiment of the present disclosure, the third driving signal generation circuit includes a third first driving output circuit, a third second driving output circuit, a third first control node control circuit and a third second control node control circuit;

The third first control node control circuit is configured to control the potential of the third first control node;

The third second control node control circuit is configured to control the potential of the third second control node;

The third first driving output circuit is electrically connected to the third first control node, the first voltage terminal and the Nth stage of driving signal output terminal respectively, and is configured to control the connection between the Nth stage of driving signal output terminal and the first voltage terminal under the control of the potential of the third first control node;

The third second driving output circuit is electrically connected to the third second control node, the second voltage terminal and the Nth stage of driving signal output terminal respectively, and is configured to control the connection between the Nth stage of driving signal output terminal and the second voltage terminal under the control of the potential of the third second control node.

Figure 48:
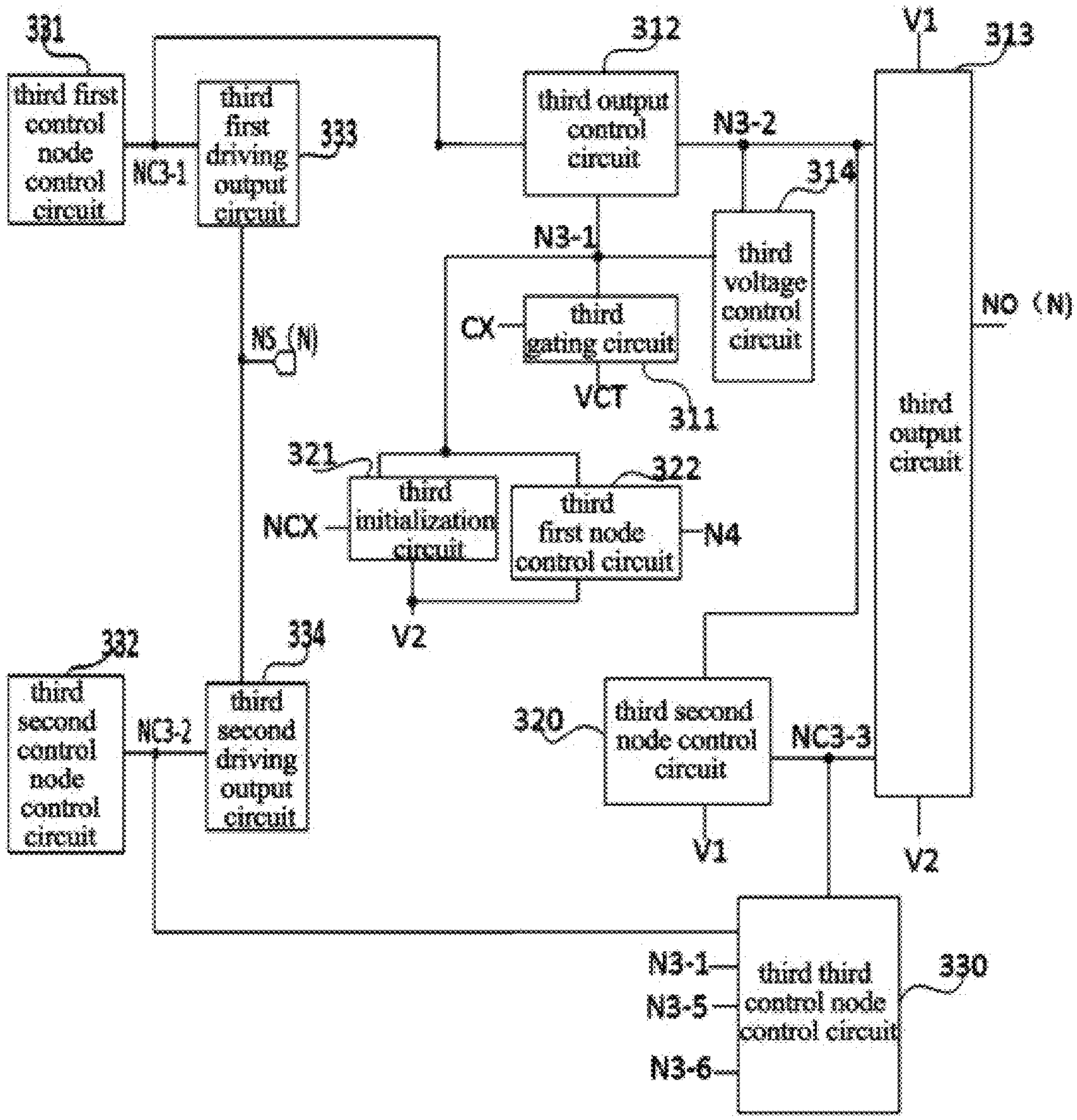
FIG. 48 is a structural diagram of a driving circuit according to at least one embodiment of the present disclosure.

As shown in FIG. 48, based on at least one embodiment of the driving circuit shown in FIG. 47, the driving circuit further includes a third first control node control circuit 331, a third second control node control circuit 332, a third first driving output circuit 333 and a third second driving output circuit 334;

The third first control node control circuit 331 is electrically connected to the third first control node NC3-1, and is configured to control the potential of the third first control node NC3-1;

The third second control node control circuit 332 is electrically connected to the third second control node NC3-2, and is configured to control the potential of the third second control node NC3-2;

The third first driving output circuit 333 is electrically connected to the third first control node NC3-1, the first voltage terminal V1 and the Nth stage of driving signal output terminal NS (N) respectively, and is configured to control the connection between the Nth stage of driving signal output terminal NS (N) and the first voltage terminal V1 under the control of the potential of the third first control node NC3-1;

the third second driving output circuit 334 is electrically connected to the third second control node NC3-2, the Nth stage of driving signal output terminal NS (N) and the second voltage terminal V2 respectively, and is configured to control the connection between the Nth stage of driving signal output terminal NS (N) and the second voltage terminal V2 under the control of the potential of the third second control node NC3-2.

In at least one embodiment of the present disclosure, the third first control node control circuit includes a third seventh node control circuit, a third eighth node control circuit, a third third node control circuit and a third first control circuit;

The third seventh node control circuit is electrically connected to the third seventh node, the second voltage terminal, the first clock signal terminal and the third fifth node respectively, and is configured to control the connection between the third seventh node and the second voltage terminal under the control of the first clock signal provided by the first clock signal terminal, and to control the connection between the third seventh node and the first clock signal terminal under the control of the potential of the third fifth node;

The third eighth node control circuit is electrically connected to the second voltage terminal, the third seventh node and the third eighth node respectively, and is configured to control the connection between the third seventh node and the third eighth node under the control of the second voltage signal provided by the second voltage terminal;

The third third node control circuit is electrically connected to the third eighth node, the second clock signal terminal and the third third node respectively, and is configured to control the third node to be electrically connected to the second clock signal terminal under the control of the potential of the third eighth node, and control the potential of the third third node according to the potential of the third eighth node;

The third first control circuit is electrically connected to the second clock signal terminal, the third third node, the third first control node, the third fifth node and the first voltage terminal respectively, and is configured to control the third third node to be connected to the third first control node under the control of the second clock signal provided by the second clock signal terminal, and control the third first control node to be connected to the first voltage terminal under the control of the potential of the third fifth node.

In specific implementation, the third first control node control circuit may include a third seventh node control circuit, a third eighth node control circuit, a third third node control circuit and a third first control circuit; the third seventh node control circuit controls the potential of the third seventh node under the control of the first clock signal and the potential of the third fifth node; the third eighth node control circuit controls the connection between the third seventh node and the third eighth node under the control of the second voltage signal; the third third node control circuit controls the third third node to be electrically connected to the second clock signal terminal under the control of the potential of the third eighth node, and controls the potential of the third third node according to the potential of the third eighth node; the third first control circuit controls the connection between the third third node and the third first control node under the control of the second clock signal, and controls the connection between the third first control node and the first voltage terminal under the control of the potential of the third fifth node.

In at least one embodiment of the present disclosure, the third second control node control circuit includes a third sixth node control circuit, a third fifth node control circuit, a third ninth node control circuit, a third fourth node control circuit and a third second control circuit;

The third sixth node control circuit is electrically connected to the second voltage terminal, the third ninth node, the third sixth node and the third fourth node respectively, and is configured to control the connection between the third ninth node and the third sixth node under the control of the second voltage signal provided by the second voltage terminal, and control the potential of the third sixth node according to the potential of the third fourth node;

The third fifth node control circuit is electrically connected to the (N−1)th stage of driving signal output terminal, the first clock signal terminal, the third fifth node, the initial control terminal and the first voltage terminal respectively, and is configured to control the connection between the third fifth node and the (N−1)th stage of driving signal output terminal under the control of the first clock signal provided by the first clock signal terminal, and control the third fifth node to be connected to the first voltage terminal under the control of the initial control signal provided by the initial control terminal;

The third ninth node control circuit is electrically connected to the first clock signal terminal, the (N−1)th stage of driving signal output terminal and the third ninth node respectively, and is configured to control the connection between the third ninth node and the (N−1) th stage of driving signal output terminal under the control of the first clock signal provided by the first clock signal terminal;

The third fourth node control circuit is electrically connected to the third seventh node, the first voltage terminal, the third fourth node, the second clock signal terminal and the third sixth node respectively, and is configured to control the connection between the third fourth node and the first voltage terminal under the control of the potential of the third seventh node, and control the connection between the third fourth node and the second clock signal terminal under the control of the potential of the third sixth node;

The third second control circuit is electrically connected to the second voltage terminal, the third fifth node and the third second control node respectively, and is configured to control the connection between the third fifth node and the third second control node under the control of the second voltage signal provided by the second voltage terminal.

In a specific implementation, the third second control node control circuit may include a third sixth node control circuit, a third fifth node control circuit, a third ninth node control circuit, a third fourth node control circuit and a third second control circuit; the third fourth node control circuit controls the potential of the third fourth node under the control of the potential of the third seventh node and the potential of the third sixth node; the third sixth node control circuit controls the connection between the third ninth node and the third sixth node under the control of the second voltage signal, and controls the potential of the third sixth node according to the potential of the third fourth node; the third fifth node control circuit controls the third fifth node to be connected to the (N−1)th stage of driving signal output terminal under the control of the first clock signal, and the third fifth node is controlled to be connected to the first voltage terminal under the control of the initial control signal; the third ninth node control circuit is controlled to be connected to the (N−1)th stage of driving signal output terminal under the control of the first clock signal; the third fourth node control circuit is controlled to be connected to the first voltage terminal under the control of the potential of the third seventh node, and is controlled to connect to the second clock signal terminal under the control of the potential of the third sixth node; the third second control circuit controls to connect the third fifth node and the third second control node under the control of the second voltage signal.

Figure 49:
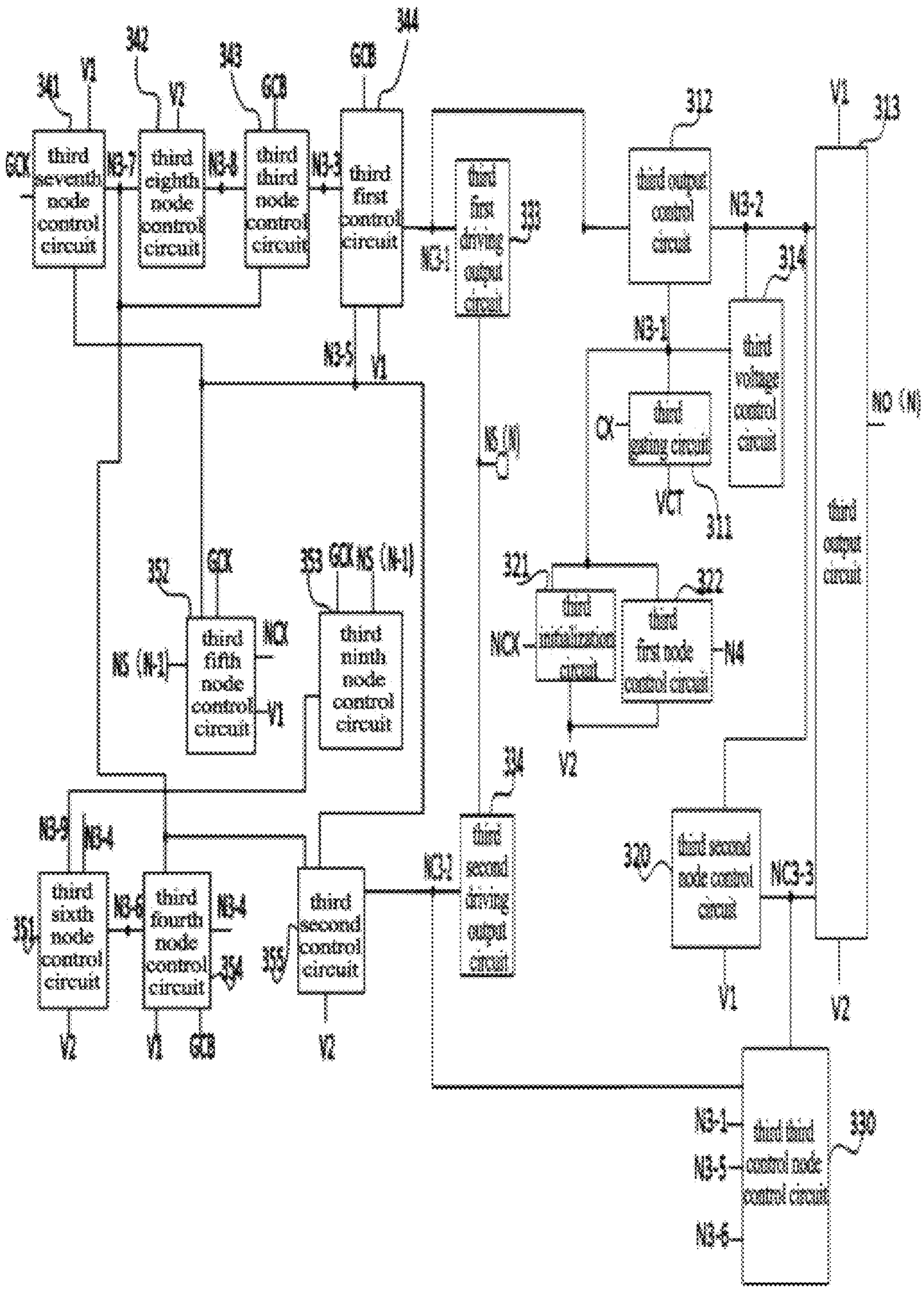
FIG. 49 is a structural diagram of a driving circuit according to at least one embodiment of the present disclosure.

As shown in FIG. 49, based on at least one embodiment of the driving circuit shown in FIG. 48, the third first control node control circuit includes a third seventh node control circuit 341, a third eighth node control circuit 342, a third third node control circuit 343 and a third first control circuit 344;

the third seventh node control circuit 341 is electrically connected to the third seventh node N3-7, the second voltage terminal V2, the first clock signal terminal GCK and the third fifth node N3-5 respectively, and is configured to control the third seventh node N3-7 and the second voltage terminal V2 under the control of the first clock signal provided by the first clock signal terminal GCK, and the third seventh node N3-7 is controlled to be connected to the first clock signal terminal GCK under the control of the potential of the third fifth node N3-5;

The third eighth node control circuit 342 is electrically connected to the second voltage terminal V2, the third seventh node N3-7 and the third eighth node N3-8 respectively, and is configured to control to connect the third seventh node N3-7 and the third eighth node N3-8 under the control of the second voltage signal provided by the second voltage terminal V2;

The third third node control circuit 343 is electrically connected to the third eighth node N3-8, the second clock signal terminal GCB and the third third node N3-3 respectively, and is configured to control the third third node N3-3 to be electrically connected to the second clock signal terminal GCB under the control of the potential of the third eighth node N3-8, and control the potential of the third third node N3-3 according to the potential of the third eighth node N3-8;

The third first control circuit 344 is electrically connected to the second clock signal terminal GCB, the third third node N3-3, the third first control node NC3-1, the third fifth node N3-5 and the first voltage terminal V1, is configured to control the connection between the third third node N3-3 and the third first control node NC3-1 under the control of the second clock signal provided by the second clock signal terminal GCB, and control the connection between the third first control node NC3-1 and the first voltage terminal V1 under the control of the potential of the third fifth node N3-5;

the third second control node control circuit includes a third sixth node control circuit 351, a third fifth node control circuit 352, a third ninth node control circuit 353, a third fourth node control circuit 354 and a third second control circuit 355;

The third sixth node control circuit 351 is electrically connected to the second voltage terminal V2, the third ninth node N3-9, the third sixth node N3-6 and the third fourth node N3-4, respectively, and is configured to control the connection between the third ninth node N3-9 and the third sixth node N3-6 under the control of the second voltage signal provided by the second voltage terminal V2, and control the potential of the third sixth node N3-6 according to the potential of the third fourth node N3-4;

The third fifth node control circuit 352 is electrically connected to the (N−1)th stage of driving signal output terminal NS (N−1), the first clock signal terminal GCK, the third fifth node N3-5, the initial control terminal NCX and the first voltage terminal V1, and is configured to control the third fifth node N3-5 to be connected to the (N−1)th stage of driving signal output terminal NS (N−1) under the control of the first clock signal provided by the first clock signal terminal GCK, and to control the third fifth node N3-5 to be connected to the first voltage terminal V1 under the control of the initial control signal provided by the initial control terminal NCX;

The third ninth node control circuit 353 is respectively connected to the first clock signal terminal GCK, the (N−1)th stage of driving signal output terminal NS (N−1) and the third ninth node N3-9, and is configured to control the connection between the third ninth node N3-9 and the (N−1)th stage of driving signal output terminal NS (N−1) under the control of the first clock signal provided by the first clock signal terminal GCK;

The third fourth node control circuit 354 is electrically connected to the third seventh node N3-7, the first voltage terminal V1, the third sixth node N3-6, the third fourth node N3-4 and the second clock signal terminal GCB, and is configured to control to connect the third fourth node N3-4 and the first voltage terminal V1 under the control of the potential of the third seventh node N3-7, and control to connect the third fourth node N3-4 and the second clock signal terminal GCB under the control of the potential of the third sixth node N3-6;

The third second control circuit 355 is electrically connected to the second voltage terminal V2, the third fifth node N3-5 and the third second control node NC3-2 respectively, and is configured to control the third fifth node N3-5 to be connected to the third second control node NC3-2 under the control of the second voltage signal provided by the second voltage terminal V2.

Optionally, the third seventh node control circuit includes a third twelfth transistor and a third thirteenth transistor, the third eighth node control circuit includes a third fourteenth transistor, the third third node control circuit includes a third fifteenth transistor and a third third capacitor, and the third first control circuit includes a third sixteenth transistor and a third seventeenth transistor;

a gate electrode of the third twelfth transistor is electrically connected to the first clock signal terminal, a first electrode of the third twelfth transistor is electrically connected to the second voltage terminal, and a second electrode of the third twelfth transistor is electrically connected to the third seventh node;

a gate electrode of the third thirteenth transistor is electrically connected to the third fifth node, a first electrode of the third thirteenth transistor is electrically connected to the third seventh node, and a second electrode of the third thirteenth transistor is electrically connected to the first clock signal terminal;

a gate electrode of the third fourteenth transistor is electrically connected to the second voltage terminal, a first electrode of the third fourteenth transistor is electrically connected to the third seventh node, and a second electrode of the third fourteenth transistor is electrically connected to the third eighth node;

a gate electrode of the third fifteenth transistor is electrically connected to the third eighth node, a first electrode of the third fifteenth transistor is electrically connected to the second clock signal terminal, and a second electrode of the third fifteenth transistor is electrically connected to the third third node;

a gate electrode of the third sixteenth transistor is electrically connected to the second clock signal terminal, a first electrode of the third sixteenth transistor is electrically connected to the third third node, and a second electrode of the third sixteenth transistor is electrically connected to the third first control node;

a gate electrode of the third seventeenth transistor is electrically connected to the third fifth node, a first electrode of the third seventeenth transistor is electrically connected to the third first control node, and a second electrode of the third seventeenth transistor is electrically connected to the first voltage terminal.

Optionally, the third sixth node control circuit includes a third eighteenth transistor and a third fourth capacitor, the third fifth node control circuit includes a third nineteenth transistor and a twentieth transistor, the third ninth node control circuit includes a third twenty-first transistor, the third fourth node control circuit includes a third twenty-second transistor and a third twenty-third transistor, and the third second control circuit includes a third twenty-fourth transistor;

a gate electrode of the third eighteenth transistor is electrically connected to the second voltage terminal, a first electrode of the third eighteenth transistor is electrically connected to the third ninth node, and a second electrode of the third eighteenth transistor is electrically connected to the third sixth node;

a first terminal of the third fourth capacitor is electrically connected to the third fourth node, and a second terminal of the third fourth capacitor is electrically connected to the third sixth node;

a gate electrode of the third nineteenth transistor is electrically connected to the first clock signal terminal, a first electrode of the third nineteenth transistor is electrically connected to the (N−1)th stage of driving signal output terminal, and a second electrode of the third nineteenth transistor is electrically connected to the third fifth node;

a gate electrode of the twentieth transistor is electrically connected to the initial control terminal, a first electrode of the twentieth transistor is electrically connected to the first voltage terminal, and a second electrode of the twentieth transistor is electrically connected to the third fifth node;

a gate electrode of the third twenty-first transistor is electrically connected to the first clock signal terminal, a first electrode of the third twenty-first transistor is electrically connected to the (N−1)th stage of driving signal output terminal, and a second electrode of the third twenty-first transistor is electrically connected to the third ninth node;

a gate electrode of the third twenty-second transistor is electrically connected to the third seventh node, a first electrode of the third twenty-second transistor is electrically connected to the first voltage terminal, and a second electrode of the third twenty-second transistor is electrically connected to the third fourth node;

a gate electrode of the third twenty-third transistor is electrically connected to the third sixth node, a first electrode of the third twenty-third transistor is electrically connected to the third fourth node, and a second electrode of the third twenty-third transistor is electrically connected to the second clock signal terminal;

a gate electrode of the third twenty-fourth transistor is electrically connected to the second voltage terminal, a first electrode of the third twenty-fourth transistor is electrically connected to the third ninth node, and a second electrode of the third twenty-fourth transistor is electrically connected to the third second control node.

Optionally, the third first driving output circuit includes a twenty-fifth transistor and a third fifth capacitor, and the third second driving output circuit includes a third twenty-sixth transistor and a third sixth capacitor;

a gate electrode of the twenty-fifth transistor is electrically connected to the third first control node, a first electrode of the twenty-fifth transistor is electrically connected to the first voltage terminal, and a second electrode of the twenty-fifth transistor is electrically connected to the Nth stage of driving signal output terminal;

a first terminal of the third fifth capacitor is electrically connected to the third first control node, and a second terminal of the third fifth capacitor is electrically connected to the first voltage terminal;

a gate electrode of the third twenty-sixth transistor is electrically connected to the third second control node, a first electrode of the third twenty-sixth transistor is electrically connected to the Nth stage of driving signal output terminal, and a second electrode of the third twenty-sixth transistor is electrically connected to the second voltage terminal;

a first terminal of the third sixth capacitor is electrically connected to the Nth stage of driving signal output terminal, and a second terminal of the third sixth capacitor is electrically connected to the second voltage terminal.

Figure 50:
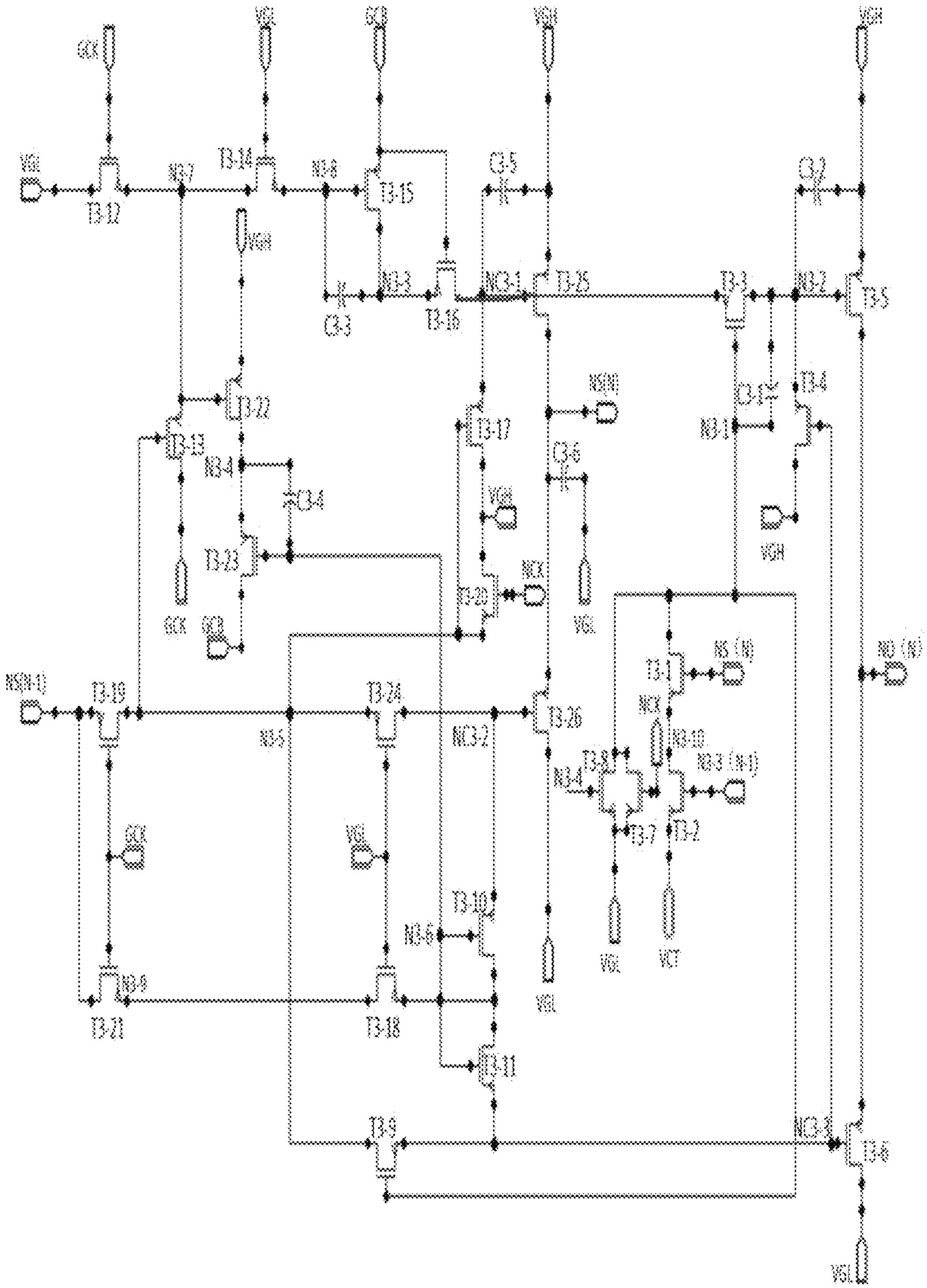
FIG. 50 is a circuit diagram of a driving circuit according to at least one embodiment of the present disclosure.

As shown in FIG. 50, based on at least one embodiment of the driving circuit shown in FIG. 49, the third gating circuit includes a third first transistor T3-1 and a third second transistor T3-2;

the gate electrode of the third first transistor T3-1 is electrically connected to the Nth stage of driving signal output terminal NS (N), the drain electrode of the third first transistor T3-1 is electrically connected to the third first node N3-1, and the source electrode of the third first transistor T3-1 is electrically connected to the drain electrode of the third second transistor T3-2;

the gate electrode of the third second transistor T3-2 is electrically connected to the (N−1)th stage of the third third node N3 (N−1), and the source electrode of the third second transistor T3-2 is electrically connected to the gating input terminal VCT.

The gate electrode of the third third transistor T3-3 is electrically connected to the third first node N3-1, the source electrode of the third third transistor T3-3 is electrically connected to the third first control node NC3-1, and the drain electrode of the third third transistor T3-3 is electrically connected to the third second node N3-2;

The third voltage control circuit includes a third first capacitor C3-1;

The first terminal of the third first capacitor C3-1 is electrically connected to the third first node N3-1, and the second terminal of the third first capacitor C3-1 is electrically connected to the third second node N3-2.

The third second node control circuit includes a third fourth transistor T3-4;

The gate electrode of the third fourth transistor T3-4 is electrically connected to the third third control node NC3-3, the source electrode of the third fourth transistor T3-4 is electrically connected to the third second node N3-2, and the drain electrode of the third fourth transistor T3-4 is electrically connected to the high voltage terminal VGH;

The third output circuit includes a third fifth transistor T3-5, a third sixth transistor and a third second capacitor C3-2;

The gate electrode of the third fifth transistor T3-5 is electrically connected to the third second node N2, the source electrode of the third fifth transistor T3-5 is electrically connected to the high voltage terminal VGH, the drain electrode of the third fifth transistor T3-5 is electrically connected to the output driving terminal NO (N);

The gate electrode of the third sixth transistor T3-6 is electrically connected to the third third control node NC3-3, the source electrode of the third sixth transistor T3-6 is electrically connected to the output driving terminal NO (N), and the drain electrode of the third sixth transistor T3-6 is electrically connected to the low voltage terminal VGL;

The first terminal of the third second capacitor C3-2 is electrically connected to the third second node N3-2, and the second terminal of the third second capacitor C3-2 is electrically connected to the high voltage terminal VGH;

The third initialization circuit includes a third seventh transistor T3-7;

The gate electrode of the third seventh transistor T3-7 is electrically connected to the initial control terminal NCX, the source electrode of the third seventh transistor T3-7 is electrically connected to the third first node N3-1, and the drain electrode of the third seventh transistor T3-7 is electrically connected to the low voltage terminal VGL;

The third first node control circuit includes a third eighth transistor T3-8;

The gate electrode of the third eighth transistor T3-8 is electrically connected to the third fourth node N3-4, the source electrode of the third eighth transistor T3-8 is electrically connected to the third first node N3-1, and the drain electrode of the third eighth transistor T3-8 is electrically connected to the low voltage terminal VGL;

The third third control node control circuit includes a third ninth transistor T3-9, a third tenth transistor T3-10 and a third eleventh transistor T3-11;

The gate electrode of the third ninth transistor T3-9 is electrically connected to the third first node N3-1, the drain electrode of the third ninth transistor T3-9 is electrically connected to the third fifth node N3-5, and the source electrode of the third ninth transistor T3-9 is electrically connected to the third third control node NC3-3;

The gate electrode of the third tenth transistor T3-10 and the source electrode of the third tenth transistor T3-10 are both electrically connected to the third sixth node N3-6, and the drain electrode of the third tenth transistor T3-10 is electrically connected to the third second control node NC3-2;

The gate electrode of the third eleventh transistor T3-11 and the source electrode of the third eleventh transistor T3-11 are both electrically connected to the third sixth node N3-6, and the drain electrode of the third eleventh transistor T3-11 is electrically connected to the third third control node NC3-3;

The third seventh node control circuit includes the third twelfth transistor T3-12 and the third thirteenth transistor T3-13, the third eighth node control circuit includes the third fourteenth transistor T3-14, the third third node control circuit includes the third fifteenth transistor T3-15 and the third third capacitor C3-3, the third first control circuit includes a third sixteenth transistor T3-16 and a third seventeenth transistor T3-17;

The gate electrode of the third twelfth transistor T3-12 is electrically connected to the first clock signal terminal GCK, the source electrode of the third twelfth transistor T3-12 is electrically connected to the low voltage terminal VGL, and the drain electrode of the third twelfth transistor T3-12 is electrically connected to the third seventh node N3-7;

The gate electrode of the third thirteenth transistor T3-13 is electrically connected to the third fifth node N3-5, the source electrode of the third thirteenth transistor T3-13 is electrically connected to the third seventh node N3-7, and the drain electrode of the third thirteenth transistor T3-13 is electrically connected to the first clock signal terminal GCK;

The gate electrode of the third fourteenth transistor T3-14 is electrically connected to the low voltage terminal VGL, the source electrode of the third fourteenth transistor T3-14 is electrically connected to the third seventh node N3-7, and the drain electrode of the third fourteenth transistor T3-14 is electrically connected to the third eighth node N3-8;

The gate electrode of the third fifteenth transistor T3-15 is electrically connected to the third eighth node N3-8, the source electrode of the third fifteenth transistor T3-15 is electrically connected to the second clock signal terminal GCB, and the drain electrode of the third fifteenth transistor T3-15 is electrically connected to the third third node N3-3;

The gate electrode of the third sixteenth transistor T3-16 is electrically connected to the second clock signal terminal GCB, the source electrode of the third sixteenth transistor T3-16 is electrically connected to the third third node N3-3, and the drain electrode of the third sixteenth transistor T3-16 is electrically connected to the third first control node NC3-1;

The gate electrode of the third seventeenth transistor T3-17 is electrically connected to the third fifth node N5, the source electrode of the third seventeenth transistor T3-17 is electrically connected to the third first control node NC3-1, and the drain electrode of the third seventeenth transistor T3-17 is electrically connected to the high voltage terminal VGH;

The third sixth node control circuit includes a third eighteenth transistor T3-18 and a third fourth capacitor C3-4, the third fifth node control circuit includes the third nineteenth transistor T3-19 and the third twentieth transistor T3-20, the third ninth node control circuit includes the third twenty-first transistor T3-21, the third fourth node control circuit includes the third twenty-second transistor T3-22 and the third twenty-third transistor T3-23, the third second control circuit includes the third twenty-fourth transistor T3-24;

The gate electrode of the third eighteenth transistor T3-18 is electrically connected to the low voltage terminal VGL, the source electrode of the third eighteenth transistor T3-18 is electrically connected to the third ninth node N3-9, the drain electrode of the third eighteenth transistor T3-18 is electrically connected to the third sixth node N3-6;

The first terminal of the third fourth capacitor C3-4 is electrically connected to the third fourth node N3-4, and the second terminal of the third fourth capacitor C3-4 is electrically connected to the third sixth node N3-6;

The gate electrode of the third nineteenth transistor T3-19 is electrically connected to the first clock signal terminal GCK, the source electrode of the third nineteenth transistor T3-19 is electrically connected to the (N−1)th stage of driving signal output terminal NS (N−1), and the drain electrode of the third nineteenth transistor T3-19 is electrically connected to the third fifth node N3-5;

The gate electrode of the third twentieth transistor T3-20 is electrically connected to the initial control terminal NCX, the source electrode of the third twentieth transistor T3-20 is electrically connected to the high voltage terminal VGH, and the drain electrode of the third twentieth transistor T3-20 is electrically connected to the third fifth node N3-5;

The gate electrode of the third twenty-first transistor T3-21 is electrically connected to the first clock signal terminal GCK, the source electrode of the third twenty-first transistor T3-21 is electrically connected to the (N−1)th stage of driving signal output terminal NS (N−1), and the drain electrode of the third twenty-first transistor T3-21 is electrically connected to the third ninth node N3-9;

The gate electrode of the third twenty-second transistor T3-22 is electrically connected to the third seventh node N3-7, and the source electrode of the third twenty-second transistor T3-22 is electrically connected to the high voltage terminal VGH, and the drain electrode of the third twenty-second transistor T3-22 is electrically connected to the third fourth node N3-4;

The gate electrode of the third twenty-third transistor T3-23 is electrically connected to the third sixth node N3-6, the source electrode of the third twenty-third transistor T3-23 is electrically connected to the third fourth node N3-4, and the drain electrode of the third twenty-third transistor T3-23 is electrically connected to the second clock signal terminal GCB;

The gate electrode of the third twenty-fourth transistor T3-24 is electrically connected to the low voltage terminal VGL, the source electrode of the third twenty-fourth transistor T3-24 is electrically connected to the third ninth node N3-9, and the drain electrode of the third twenty-fourth transistor T3-24 is electrically connected to the third second control node NC3-2;

The third first driving output circuit includes the third twenty-fifth transistor T3-25 and the third fifth capacitor C3-5, and the third second driving output circuit includes the third twenty-sixth transistor T3-26 and the third sixth capacitor C3-6;

The gate electrode of the third twenty-fifth transistor T3-25 is electrically connected to the third first control node NC3-1, the source electrode of the third twenty-fifth transistor T3-25 is electrically connected to the high voltage terminal VGH, and the drain electrode of the third twenty-fifth transistor T3-25 is electrically connected to the Nth stage of driving signal output terminal NS (N);

The first terminal of the third fifth capacitor C3-5 is electrically connected to the third first control node NC3-1, and the second terminal of the third fifth capacitor C3-5 is electrically connected to the high voltage terminal VGH;

The gate electrode of the third twenty-sixth transistor T3-26 is electrically connected to the third second control node NC3-2, the source electrode of the third twenty-sixth transistor T3-26 is electrically connected to the Nth stage of driving signal output terminal NS (N), and the drain electrode of the third twenty-sixth transistor T3-26 is electrically connected to the low voltage terminal VGL;

The first terminal of the third sixth capacitor C3-6 is electrically connected to the Nth stage of driving signal output terminal NS (N), and the second terminal of the third sixth capacitor C3-6 is electrically connected to the low voltage terminal VGL.

In at least one embodiment of the driving circuit shown in FIG. 50, all transistors are p-type transistors, but not limited thereto.

In at least one embodiment of the driving circuit shown in FIG. 50, the first voltage terminal is a high voltage terminal, and the second voltage terminal is a low voltage terminal, but not limited thereto.

In at least one embodiment of the driving circuit shown in FIG. 50, all transistors are p-type transistors, but not limited thereto.

In at least one embodiment of the driving circuit shown in FIG. 50, N3-10 is the third tenth node.

In at least one embodiment of the present disclosure, the structure of the third driving signal generation circuit is not limited to that shown in FIG. 22. The third driving signal generation circuit can be, for example, a 16T3C circuit, a 13T3C circuit, a 12T3C circuit, a 10T3C circuit, etc., but is not limited thereto.

At least one embodiment of the driving circuit shown in FIG. 50 of the present disclosure is in operation.

In the first phase, when NS (N−1) outputs a low voltage signal, GCK outputs a low voltage signal, and GCB outputs a high voltage signal, T3-19 and T3-21 are turned on to pull down the potential of N3-5 and the potential of N3-9, T3-24 and T3-18 are turned on to pull down the potential of NC3-2 and N3-6, and T3-26 is turned on; the potential of N3-6 is low voltage, and the T3-23 is turned on, the potential of N3-5 is low voltage, T3-13 is turned on, GCK provides a low voltage signal, T3-12 is turned on, T3-14 is turned on, the potential of N3-7 and the potential of N3-8 are low voltage, T3-15 is turned on to control the potential of N3-3 to be high voltage, the potential of N3-5 is low voltage, to turn on T3-17, the potential of NC3-1 is high voltage; T3-10 and T3-11 are turned on, the potential of NC3-2 and the potential of NC3-3 are low voltage;

In the second phase, NS (N−1) outputs a low voltage signal, the potential of the first clock signal output by GCK jumps from low voltage to high voltage, GCB outputs a low voltage signal, T3-19 and T3-21 are turned off, the potential of N3-5 is low voltage, T3-12 is turned off, the potential of N3-5 is maintained at low voltage, T3-13 is turned on, T3-14 is turned on, the potential of N3-7 and the potential of N3-8 are high voltage, T3-15 is turned off, the potential of N3-3 maintains the high voltage of the previous phase, T3-16 is turned on to maintain the potential of NC3-1 at a high voltage, and T3-25 is turned off; at the same time, the potential of N3-6 is low voltage, T3-23 is turned on, GCB writes the low voltage signal to N3-4, and the potential of N3-6 is pulled down to a lower voltage (5V~10V lower than the voltage value of the low voltage signal provided by GCB) through C3-4, T3-10 and T3-11 are turned on, and the low voltage signal is written into NC3-2 and N3-6 (the potential of NC3-2 is 3~8V lower than the voltage value of the low voltage signal provided by GCB), T3-26 is fully turned on, NS (N) outputs a low voltage signal; the potential of NC3-3 is low voltage, T3-6 is turned on, NO (N) outputs a low voltage signal; the potential of N3-4 is low voltage, T3-8 is turned on to pull down the potential of N3-1; T3-9 is turned on to control the potential of NC3-3 to be low voltage, T3-6 is turned on, NO (N) outputs a low voltage signal; since the potential of N3-4 is a low voltage, T3-8 is turned on to control the potential of N3-1 to be a low voltage, T3-3 is turned on to control the connection between NC3-1 and N3-2, the potential of N3-2 is a high voltage, and T3-5 is turned off;

In the third phase, NS (N−1) outputs a high voltage signal, GCK outputs a low voltage signal, GCB outputs a high voltage signal, T3-19 and T3-21 are turned on, to pull up the potential of N3-5 and N3-9, turned on T3-24 and T3-18, the potential of NC3-2 and the potential of N3-6 are high voltage, and T3-26 is turned off; the potential of N3-6 is high voltage, T3-23 is turned off, the potential of N3-5 is high voltage, T3-13 is turned off, GCK outputs a low voltage signal to turned on T3-12, T3-14 is turned on, to pull down the potential of N3-7 and N3-8, and turned on T3-15, GCB writes a high voltage signal to N3-3, T3-16 is turned off, the potential of N3-5 is high voltage to turn off T3-17, and the potential of NC3-1 is high voltage; ensure that T3-25 is turned off; T3-22 is turned on, the potential of N3-4 is high voltage, and T3-8 is turned off; the potential of NC3-1 and the potential of NC3-2 are both high voltage, and NS (N) continues to output low voltage signals; T3-10 and T3-11 are turned off, In the third phase, N3 (N−1) and NS (N) output low voltage signals, T3-1 and T3-2 are turned on, and VCT is connected to N3-1;

In the third phase, when VCT provides a high voltage signal, the potential of N3-1 is high voltage, T3-9 is turned off, T3-3 is turned off, and the potential of N3-2 is maintained at a high voltage; T3-9 is turned off, NC3-3 is disconnected from N3-5, the potential of N3-6 is high voltage, T3-10 and T3-11 are turned off, and the potential of NC3-3 is maintained at the low voltage, T3-6 is turned on, and NO (N) outputs a low voltage signal;

In the third phase, when VCT provides a low voltage signal, the potential of N3-1 is low voltage, T3-9 is turned on, T3-3 is turned on, NC3-1 is connected to N3-2, the potential of N3-2 is high voltage, T3-5 is turned off, T3-9 is turned on to control the connection between NC3-3 and N3-5, the potential of NC3-3 is high voltage, and NO (N) continues to output a low voltage signal;

In the fourth phase, NS (N−1) outputs a high voltage signal, the potential of the first clock signal output by GCK jumps from a low voltage to a high voltage, GCB outputs a low voltage signal, T3-19 and T3-21 are turned off, the potential of N3-7 is maintained at a low voltage, T3-14 is turned on, the potential of N3-8 is a low voltage, T3-15 is turned on, T3-16 is turned on to write the low voltage signal to N3-3 and NC3-1, T3-25 is turned on, and NS (N) outputs a high voltage signal; at the same time, the potential of N3-6 is high voltage, T3-23 is turned off, the potential of N3-4 is maintained at high voltage, the potential of N3-6 is maintained at high voltage; T3-10 and T3-11 are turned off;

In the fourth phase, N3-3 (N−1) outputs high voltage signal, T3-2 is turned off, T3-7 and T3-8 are turned off;

When the potential of N3-1 is low voltage, T3-9 is turned on to control the connection between N3-5 and NC3-3, the potential of N3-5 is high voltage, the potential of NC3-3 is high voltage, T3-6 is turned off; T3-3 is turned on to control the connection between NC3-1 and N3-2, the potential of N3-2 is low voltage, T3-5 is turned on, T3-6 is turned off, and NO (N) outputs a high voltage signal;

When the potential of N1 is high voltage, T3-9 is turned off to control the disconnection between N5 and NC3-3, the potential of NC3-3 is maintained at a high voltage, and the potential of NC3-3 is maintained at the low voltage at the third phase, T3-6 remains to be turned on; T3-3 is turned off to control the disconnection between NC3-1 and N3-2, the potential of N3-2 is maintained at a high voltage, T3-5 is turned off, and NO (N) continues to output a low voltage signal;

In the fifth phase, the potential of the (N−1)th stage of driving signal output by NS (N−1) jumps from a high voltage to a low voltage, GCK outputs a high voltage signal, GCB outputs a low voltage signal, T3-19 and T3-21 are turned off, the potential of N3-5 and the potential of N3-9 are maintained at a high voltage, and the potential of the remaining nodes remains unchanged to ensure that NS (N) outputs a high voltage signal;

In the sixth phase, NS (N−1) outputs a low voltage signal, the potential of the first clock signal output by GCK jumps from a high voltage to a low voltage, GCB outputs a high voltage signal, T3-19 and T3-21 are turned on, to control the potential of N3-5 and the potential of N3-9 to be a low voltage, T3-24 and T3-18 are turned on, the potential of NC3-2 and N3-6 are low voltage, T3-26 is turned on, the potential of N3-5 is low voltage, T3-13 is turned on, T3-12 is turned on, the potential of N3-7 and the potential of N3-8 are pulled down, T3-15 is turned on, GCB writes a high voltage signal to N3-3, N3-5 is low voltage, T3-17 is turned on, the potential of NC3-1 is pulled up to a high voltage, to ensure T3-25 is turned off.

Optionally, when the display starts (that is, when the display device is turned on), in the reset phase before the first phase, NC3-X outputs a low voltage signal, T3-7 is turned on to control the potential of N3-1 to be low voltage, T3-3 is turned on to control the connection between NC3-1 and N3-2; T3-9 is turned on to control the connection between NC3-3 and N3-5; T3-20 is turned on to control the potential of N3-5 and NC3-3 to be high voltage; at this time, NC3-1 and N3-2 are low potential, T3-25 is turned on, T3-5 is turned on, NS (N) and NO (N) both output high voltage signals, and the second display control transistor M2 included in all pixel circuits in the effective display area can be turned on to clear the residual charge in the storage capacitor Cst and improve the screen flickering problem when the screen is turned on;

Afterwards, when NS (N) and N3 (N−1) both output low voltage signals, T3-1 and T3-2 are turned on to control the connection between VCT and N3-1;

When VCT provides a low voltage signal, the potential of N3-1 is low voltage, and C3-1 maintains the potential of N3-1; T3-3 is turned on to control the connection between NC3-1 and N2. At this time, the potential of NC3-1 is high voltage, the potential of N3-2 is high voltage, T3-5 is turned off, T3-9 is turned on to control the connection between NC3-3 and N3-5, the potential of NC3-3 is high voltage, and NO (N) continues to output low voltage signals;

When VCT provides a high voltage signal, the potential of N3-1 is high voltage, T3-3 is turned off, NC3-1 is disconnected from N3-2, C3-1 controls the potential of N3-2 to be high voltage, T3-9 is turned off, NC3-3 is disconnected from N3-5, the potential of N3-6 is high voltage, T3-10 and T3-11 are turned off, the potential of NC3-3 is maintained at a low voltage, T3-6 is turned on, and NO (N) outputs a low voltage signal;

Afterwards, in the Nth stage of driving signal providing phase, NS (N) outputs a high voltage signal, at this time, the potential of NC3-1 is a low voltage, and the potential of NC3-2 is a high voltage; when the potential of N3-1 is a low voltage, T3-3 is turned on, NC3-1 is connected to N3-2, the potential of N3-2 is a low voltage, T3-9 is turned on to control the connection between N3-5 and NC3-3, the potential of N3-5 is a high voltage, the potential of NC3-3 is a high voltage, and T3-6 is turned off; T3-5 is turned on, T3-6 is turned off, and NO (N) outputs a high voltage signal;

When the potential of N3-1 is a high voltage, T3-3 is turned off, NC3-1 is disconnected from N3-2, the potential of N3-2 is maintained at a high voltage, and T3-9 is turned off to control the disconnection between N3-5 and NC3-3, the potential of NC3-3 is maintained at a low voltage, and T3-6 is turned on; T3-5 is turned off, and NO (N) continues to output a low voltage signal;

After the Nth stage of driving signal providing phase, when the potential of N3-4 is a low voltage, T3-8 is turned on to control the connection between N3-1 and VGL, the potential of N3-1 is a low voltage, T3-3 is turned on to control the connection between NC3-1 and N3-2, at this time, the potential of NC3-1 is a high voltage, the potential of NC3-2 is a low voltage, the potential of N3-2 is a high voltage, T3-9 is turned on to control the connection between NC3-3 and N3-5, when the potential of N3-5 and the potential of N3-6 are both low voltages, T3-10 and T3-11 are turned on, the potential of NC3-3 is a low voltage, and NO (N) outputs a low voltage signal.

When at least one embodiment of the driving circuit shown in FIG. 50 of the present disclosure is working, when N3-3 (N−1) outputs a low voltage signal and NS (N) outputs a low voltage signal, T3-1 and T3-2 are turned on, and the state of the gated input signal within a high-low frequency switching cycle can be obtained by simultaneously gating the above two signals.

Figure 51:
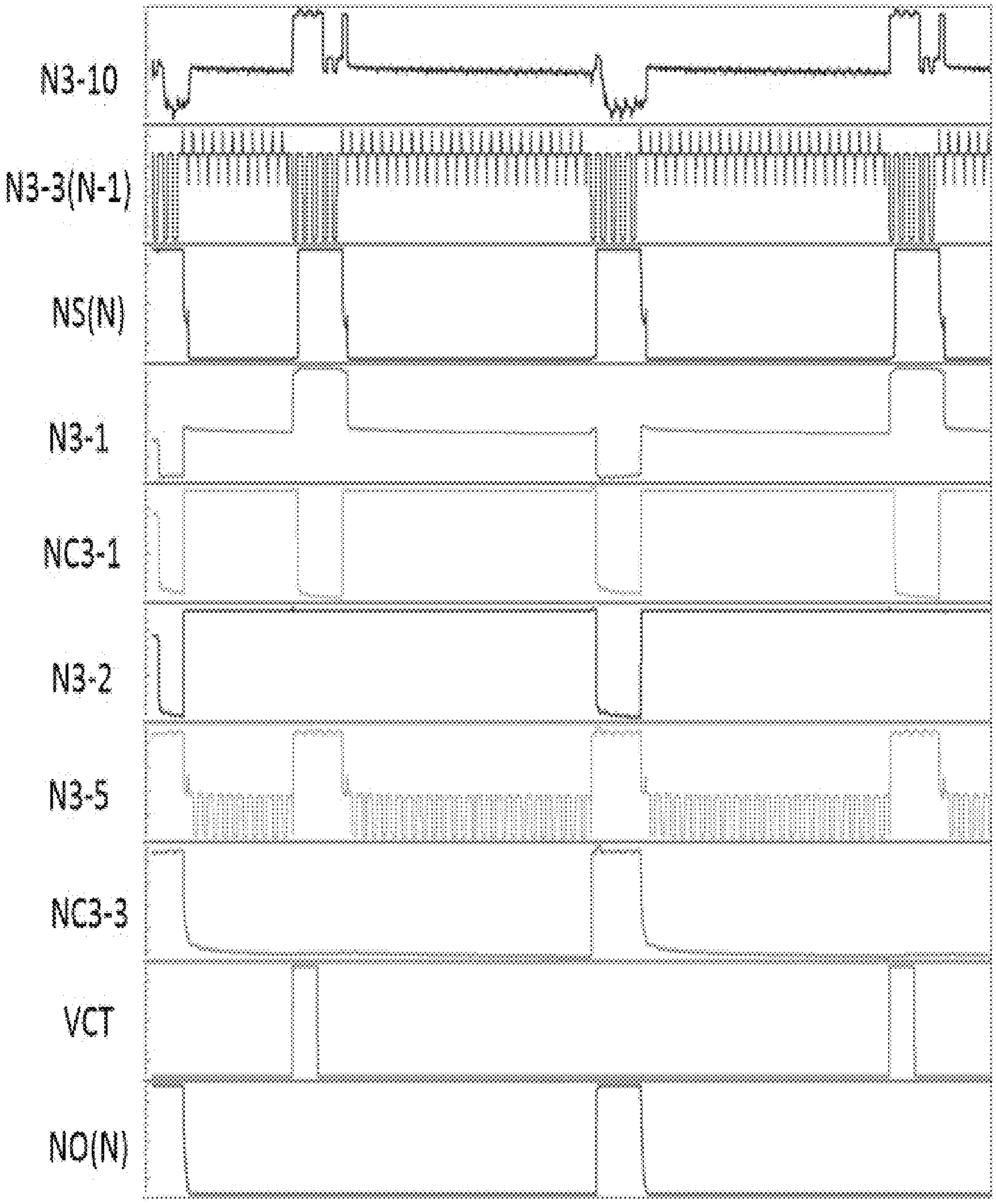
FIG. 51 is a simulation working timing diagram of the driving circuit shown in FIG. 50.
Figure 52:
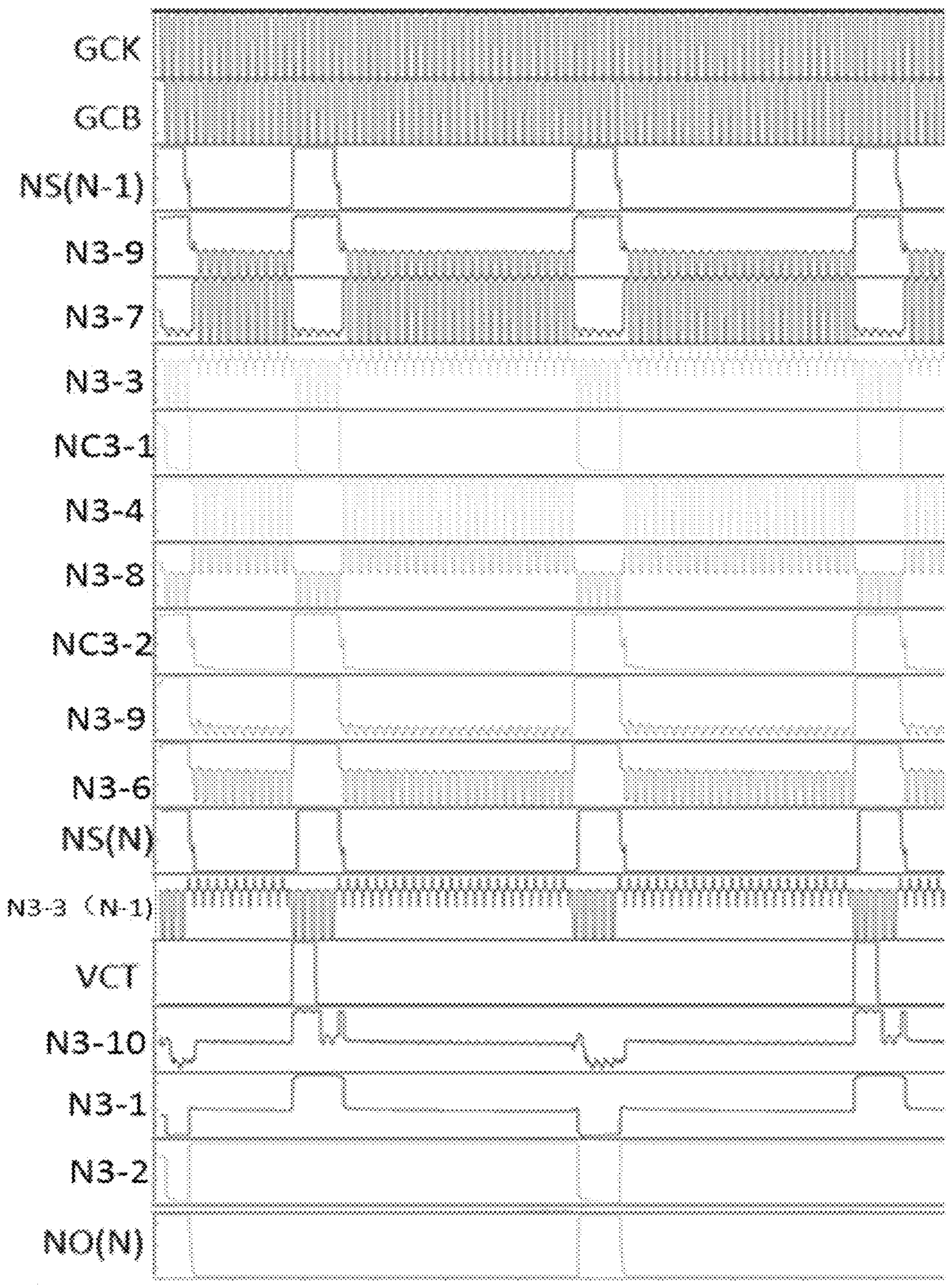
FIG. 52 is a simulation working timing diagram of the driving circuit shown in FIG. 50.

FIG. 51 is a simulation working timing diagram of the driving circuit shown in FIG. 50 of the present disclosure;

FIG. 52 is a simulation working timing diagram of the driving circuit shown in FIG. 50 of the present disclosure.

The difference between at least one embodiment of the driving circuit shown in FIG. 53 of the present disclosure and at least one embodiment of the driving circuit shown in FIG. 50 of the present disclosure is as follows: T3-8 is not provided.

Figure 53:
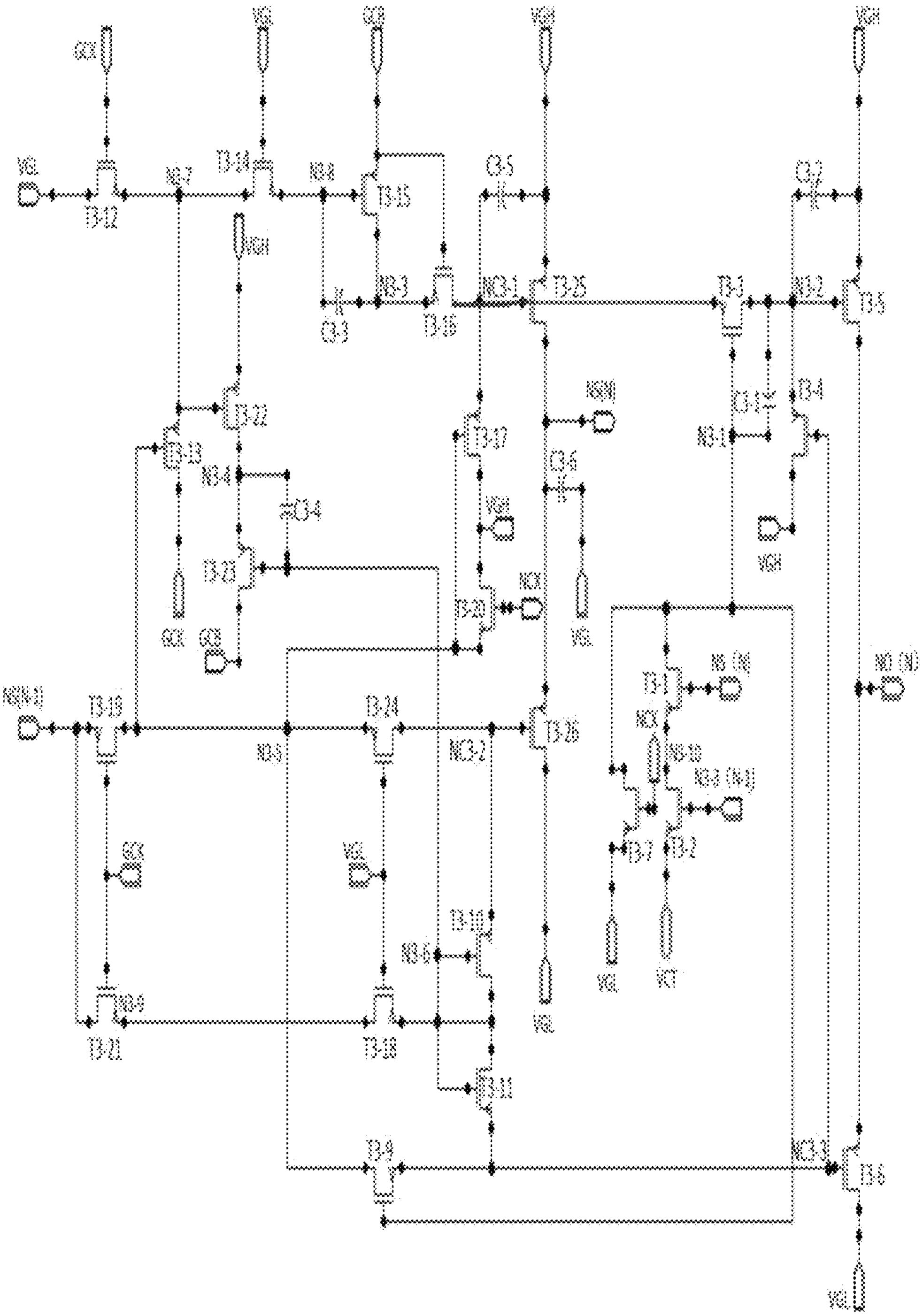
FIG. 53 is a circuit diagram of a driving circuit according to at least one embodiment of the present disclosure.
Figure 54:
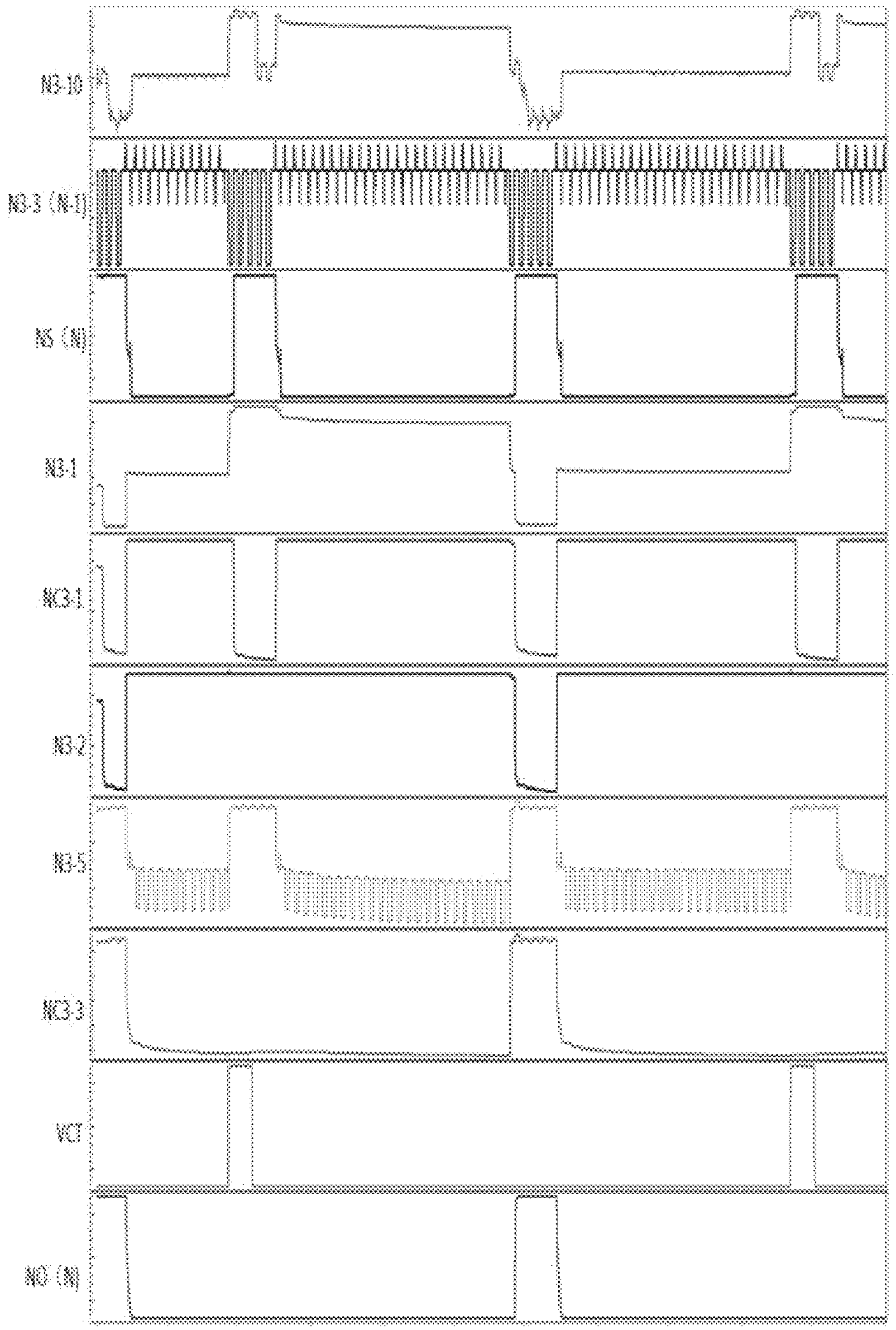
FIG. 54 is a simulation working timing diagram of at least one embodiment of the driving circuit shown in FIG. 53.

FIG. 54 is a simulation working timing diagram of the driving circuit shown in FIG. 53 of the present disclosure.

Figure 55:
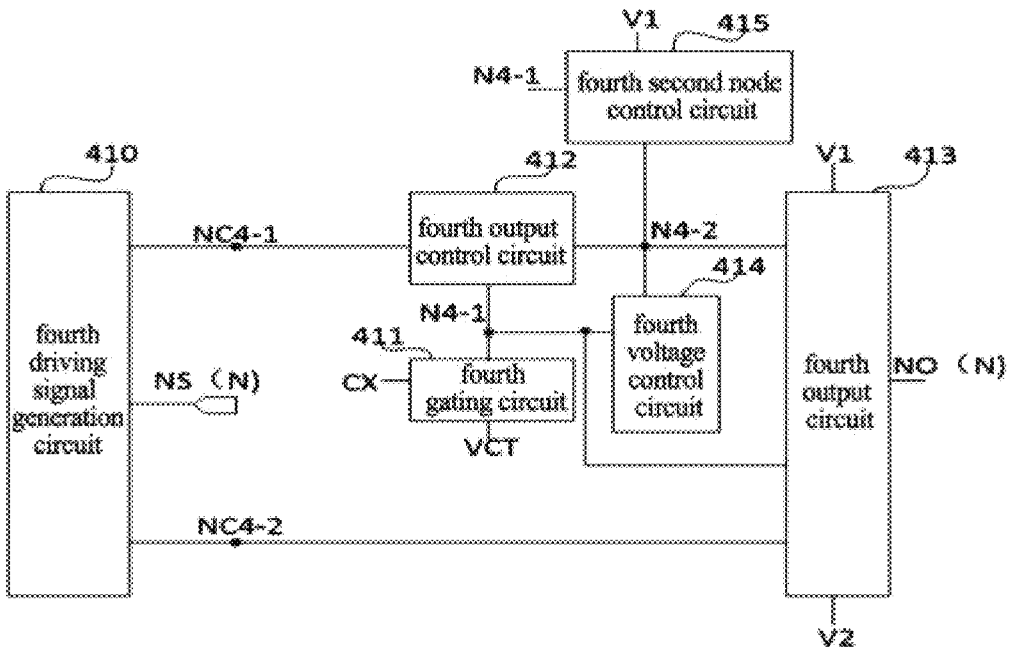
FIG. 55 is a structural diagram of a driving circuit according to an embodiment of the present disclosure.

As shown in FIG. 55, the driving circuit according to the embodiment of the present disclosure includes a fourth driving signal generation circuit 410, a fourth gating circuit 411, a fourth output control circuit 412, a fourth output circuit 413, a fourth voltage control circuit 414 and a fourth second node control circuit 415;

the fourth driving signal generation circuit 410 is electrically connected to the fourth first control node NC4-1, the fourth second control node NC4-2 and the Nth stage of driving signal output terminal NS (N) respectively, and is configured to generate and output the Nth stage of driving signal through the Nth stage of driving signal output terminal NS (N) under the control of the potential of the fourth first control node NC4-1 and the potential of the fourth second control node NC4-2; N is a positive integer;

The fourth gating circuit 411 is electrically connected to the fourth first node N4-1, the gating input terminal VCT and the gating control terminal CX respectively, and is configured to control the gating input signal provided by the gating input terminal VCT to be written into the fourth first node N4-1 under the control of the gating control signal provided by the gating control terminal CX;

The fourth output control circuit 412 is electrically connected to the fourth first node N4-1, the fourth first control node NC4-1 and the fourth second node N4-2 respectively, and is configured to control to connect the fourth first control node N4-1 and the fourth second node N4-2 under the control of the potential of the fourth first node N4-1.

The fourth voltage control circuit 414 is electrically connected to the fourth first node N4-1 and the fourth second node N4-2 respectively, and is configured to control the potential of the fourth second node N4-2 according to the potential of the fourth first node N4-1;

The fourth second node control circuit 415 is electrically connected to the fourth first node N4-1, the fourth second node N4-2 and the first voltage terminal V1 respectively, and is configured to control the fourth second node N4-2 to be connected to the first voltage terminal V1 under the control of the potential of the fourth first node N4-1;

The fourth output circuit 413 is electrically connected to the fourth second node N4-2, the fourth second control node NC4-2, the fourth first node N4-1 and the first voltage terminal V1, the second voltage terminal V2 and the output driving terminal NO (N), and is configured to control the output driving terminal NO (N) to be connected to the first voltage terminal V1 under the control of the potential of the fourth second node N4-2, to control the output driving terminal NO (N) to be connected to the second voltage terminal V2 under the control of the potential of the fourth second control node NC4-2, and to control the output driving terminal NO (N) to be connected to the second voltage terminal V2 under the control of the potential of the fourth first node N4-1.

When the embodiment of the driving circuit shown in FIG. 55 of the present disclosure is working, the fourth driving signal generation circuit 410 generates and outputs the Nth stage of driving signal through the Nth stage of driving signal output terminal NS (N) under the control of the potential of the fourth first control node NC4-1 and the potential of the fourth second control node NC4-2; the fourth gating circuit 411 controls to write the gating input signal into the fourth first node N4-1 under the control of the gating control signal; the fourth output control circuit 412 controls the connection between the fourth first control node NC4-1 and the fourth second node N4-2 under the control of the potential of the fourth first node N4-1; the fourth voltage control circuit 414 controls the potential of the fourth second node N4-2 according to the potential of the fourth first node N4-1; the fourth second node control circuit 415 controls the fourth second node N4-2 to be connected to the first voltage terminal V1 under the control of the potential of the fourth first node N4-1; the fourth output circuit 413 controls the output driving terminal NO (N) to be connected to the first voltage terminal V1 under the control of the potential of the fourth second node N4-2, controls the output driving terminal NO (N) to be connected to the second voltage terminal V2 under the control of the potential of the fourth second control node NC4-2, and controls the output driving terminal NO (N) to be connected to the second voltage terminal V2 under the control of the potential of the fourth first node N4-1.

In at least one embodiment of the present disclosure, the first voltage terminal may be a high voltage terminal, and the second voltage terminal may be a low voltage terminal, but is not limited thereto.

The embodiment of the driving circuit shown in FIG. 55 of the present disclosure may be an Nth stage of driving circuit.

When the embodiment of the driving circuit shown in FIG. 55 of the present disclosure is working, within one frame time, before the Nth stage of driving signal providing phase, the fourth gating circuit 411 writes the gating input signal provided by the gating input terminal VCT into the fourth first node N4-1 under the control of the gating control signal;

when the gating input signal is a high voltage signal, in the Nth stage of driving signal providing phase, the Nth stage of driving signal output terminal NS (N) outputs a high voltage signal, the potential of the fourth first node N4-1 is a high voltage, the fourth output control circuit 412 controls the fourth first control node NC4-1 to be disconnected from the fourth second node N4-2 under the control of the potential of the fourth first node N4-1, the fourth voltage control circuit 414 controls the potential of the fourth second node N4-2 to be a high voltage according to the potential of the fourth first node N4-1, and the fourth output circuit controls the output driving terminal NO (N) to maintain to output the low voltage signal, which can control the corresponding row pixel circuit not to update the pixel voltage;

When the gating input signal is a low voltage signal, in the Nth stage of driving signal providing phase, the Nth stage of driving signal output terminal NS (N) outputs a high voltage signal, the potential of the fourth first node N4-1 is a low voltage, and the fourth output control circuit 412 controls the fourth first control node NC4-1 to be connected with the fourth second node N4-2 under the control of the potential of the fourth first node N4-1, so that the potential of the fourth second node N4-2 is a low voltage, and the fourth output circuit 413 controls the output driving terminal NO (N) to be connected to the first voltage terminal V1 under the control of the potential of the fourth second node N4-2, so that NO (N) outputs a high voltage signal, which can control the corresponding row pixel circuit to update the pixel voltage.

The embodiment can realize the update of the partial screen of the display screen by controlling the gating input signal provided by the gating input terminal VCT, thereby reducing power consumption, or realize ultra-low power consumption of OLED display products such as wearable products, mobile terminals, NB (laptop computers) by partial display screen update.

Optionally, the fourth output control circuit includes a fourth third transistor, and the fourth voltage control circuit includes a fourth first capacitor;

a gate electrode of the fourth third transistor is electrically connected to the fourth first node, a first electrode of the fourth third transistor is electrically connected to the fourth first control node, and a second electrode of the fourth third transistor is electrically connected to the fourth second node;

a first terminal of the fourth first capacitor is electrically connected to the fourth second node, and a second terminal of the fourth first capacitor is electrically connected to the first voltage terminal.

Optionally, the fourth second node control circuit includes a fourth fourth transistor, and the fourth output circuit includes a fourth fifth transistor, a fourth sixth transistor, a fourth seventh transistor and a fourth second capacitor;

a gate electrode of the fourth fourth transistor is electrically connected to the fourth first node, a first electrode of the fourth fourth transistor is electrically connected to the first voltage terminal, and a second electrode of the fourth fourth transistor is electrically connected to the fourth second node;

a gate electrode of the fourth fifth transistor is electrically connected to the fourth second node, a first electrode of the fourth fifth transistor is electrically connected to the first voltage terminal, and a second electrode of the fourth fifth transistor is electrically connected to the fourth second node.

a gate electrode of the fourth sixth transistor is electrically connected to the fourth second control node, a first electrode of the fourth sixth transistor is electrically connected to the output driving terminal, and a second electrode of the fourth sixth transistor is electrically connected to the second voltage terminal;

a gate electrode of the fourth seventh transistor is electrically connected to the fourth first node, a first electrode of the fourth seventh transistor is electrically connected to the output driving terminal, and a second electrode of the fourth seventh transistor is electrically connected to the second voltage terminal;

a first terminal of the fourth second capacitor is electrically connected to the fourth second node, and a second terminal of the fourth second capacitor is electrically connected to the first voltage terminal.

The driving circuit according to at least one embodiment of the present disclosure also includes a fourth initialization circuit;

The fourth initialization circuit is electrically connected to the initial control terminal, the fourth first node and the second voltage terminal respectively, and is configured to control the connection between the fourth first node and the second voltage terminal under the control of the initial control signal provided by the initial control terminal.

In specific implementation, the driving circuit may also include a fourth initialization circuit, and the fourth initialization circuit is configured to control the connection between the fourth first node and the second voltage terminal under the control of the initial control signal.

In at least one embodiment of the present disclosure, the driving circuit further includes a fourth first node control circuit;

The fourth first node control circuit is electrically connected to the fourth fourth node, the fourth first node and the second voltage terminal respectively, and is configured to control the connection between the fourth first node and the second voltage terminal under the control of the potential of the fourth fourth node.

In a specific implementation, the driving circuit may also include a fourth first node control circuit; the fourth first node control circuit controls the connection between the fourth first node and the second voltage terminal under the control of the potential of the fourth fourth node.

Figure 56:
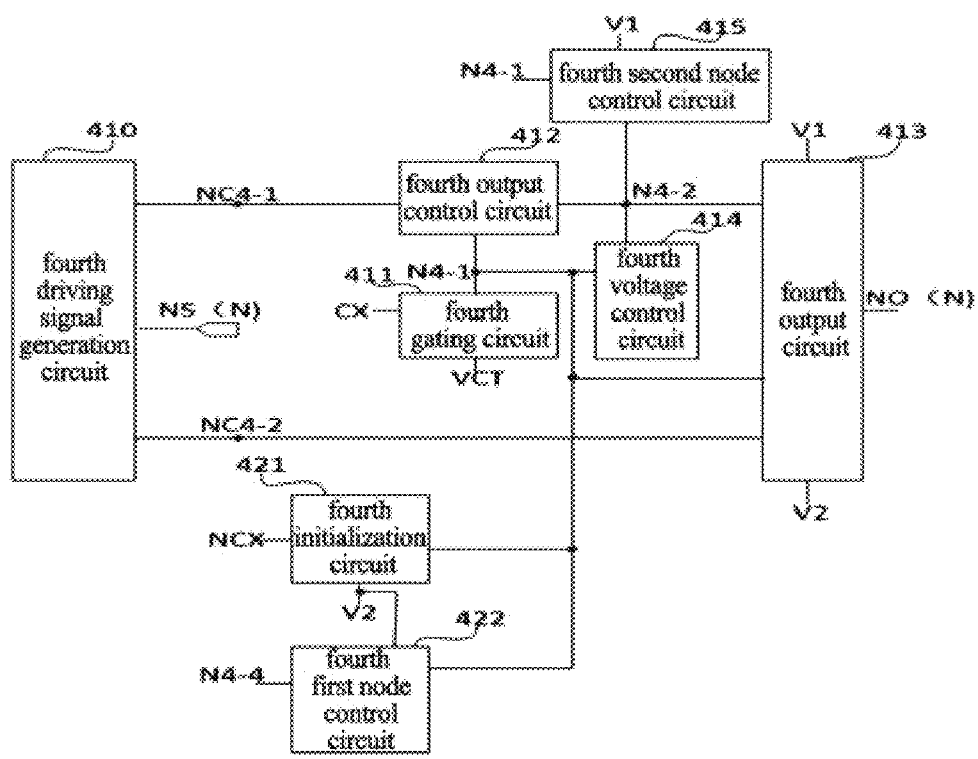
FIG. 56 is a structural diagram of a driving circuit according to at least one embodiment of the present disclosure

As shown in FIG. 56, based on the embodiment of the driving circuit shown in FIG. 55, the driving circuit may further include a fourth initialization circuit 421 and a fourth first node control circuit 422;

The fourth initialization circuit 421 is electrically connected to the initial control terminal NCX, the fourth first node N4-1 and the second voltage terminal V2, respectively, and is configured to control the connection between the fourth first node N4-1 and the second voltage terminal V2 under the control of the initial control signal provided by the initial control terminal NCX;

The fourth first node control circuit 422 is electrically connected to the fourth fourth node N4-4, the fourth first node N4-1 and the second voltage terminal V2, respectively, and is configured to control the connection between the fourth first node N4-1 and the second voltage terminal V2 under the control of the potential of the fourth fourth node N4-4.

Optionally, the fourth initialization circuit includes a fourth eighth transistor;

a gate electrode of the fourth eighth transistor is electrically connected to the initial control terminal, a first electrode of the fourth eighth transistor is electrically connected to the fourth first node, and a second electrode of the fourth eighth transistor is electrically connected to the second voltage terminal.

Optionally, the fourth first node control circuit includes a fourth ninth transistor;

a gate electrode of the fourth ninth transistor is electrically connected to the fourth fourth node, a first electrode of the fourth ninth transistor is electrically connected to the fourth first node, and a second electrode of the fourth ninth transistor is electrically connected to the second voltage terminal.

The driving circuit according to at least one embodiment of the present disclosure further includes a fourth voltage maintenance circuit, which includes a fourth first inverter, a fourth second inverter and a fourth maintenance control circuit;

an input terminal of the fourth first inverter is electrically connected to the fourth first node, an output terminal of the fourth first inverter is electrically connected to the fourth fifth node, an input terminal of the fourth second inverter is electrically connected to the fourth fifth node, and an output terminal of the fourth second inverter is electrically connected to the fourth sixth node;

The fourth first inverter is configured to invert the potential of the fourth first node and output the inverted potential of the fourth first node through the output terminal of the fourth first inverter;

The fourth second inverter is configured to invert the potential of its input terminal and output the inverted potential through the output terminal of the fourth second inverter;

The fourth maintenance control circuit is electrically connected to the maintenance control terminal, the fourth sixth node and the fourth first node respectively, and is configured to control the connection or disconnection between the fourth sixth node and the fourth first node under the control of the maintenance control signal provided by the maintenance control terminal.

In a specific implementation, the driving circuit may further include a fourth voltage maintenance circuit, the fourth voltage maintenance circuit includes a fourth first inverter, a fourth second inverter and a fourth maintenance control circuit; the fourth first inverter inverts the potential of the fourth first node; the fourth second inverter inverts the potential of its input terminal; the fourth maintenance control circuit controls the connection between the fourth sixth node and the fourth first node under the control of the maintenance control signal; the fourth maintenance control circuit controls the connection or disconnection between the fourth sixth node and the fourth first node under the control of the maintenance control signal;

the fourth maintenance control circuit can control the disconnection between the fourth sixth node and the fourth first node when the fourth gating circuit controls the gating input signal to be written into the fourth first node, so as not to affect the potential of the fourth first node.

When the driving circuit according to at least one embodiment of the present disclosure is working, by adding a fourth voltage maintenance circuit, the fourth first inverter and the fourth second inverter included in the fourth voltage maintenance circuit can control the output terminal of the fourth second inverter to be connected with the high voltage terminal when the potential of the fourth first node is a high voltage, so that the potential of the output terminal of the fourth second inverter is higher than the potential of the fourth first node, and when the potential of the fourth first node is a low voltage, the output terminal of the fourth second inverter can be controlled to be connected to the low voltage terminal, so that the potential of the output terminal of the fourth second inverter can be lower than the potential of the fourth first node, and the fourth maintenance control circuit included in the fourth voltage maintenance circuit can control the output terminal of the fourth second inverter to be connected to the fourth first node in the Nth stage of driving signal output phase, thereby increasing the absolute value of the potential of the fourth first node, so that the fourth first node can better control the transistor whose gate electrode is electrically connected to the fourth first node included in the fourth output control circuit.

Figure 57:
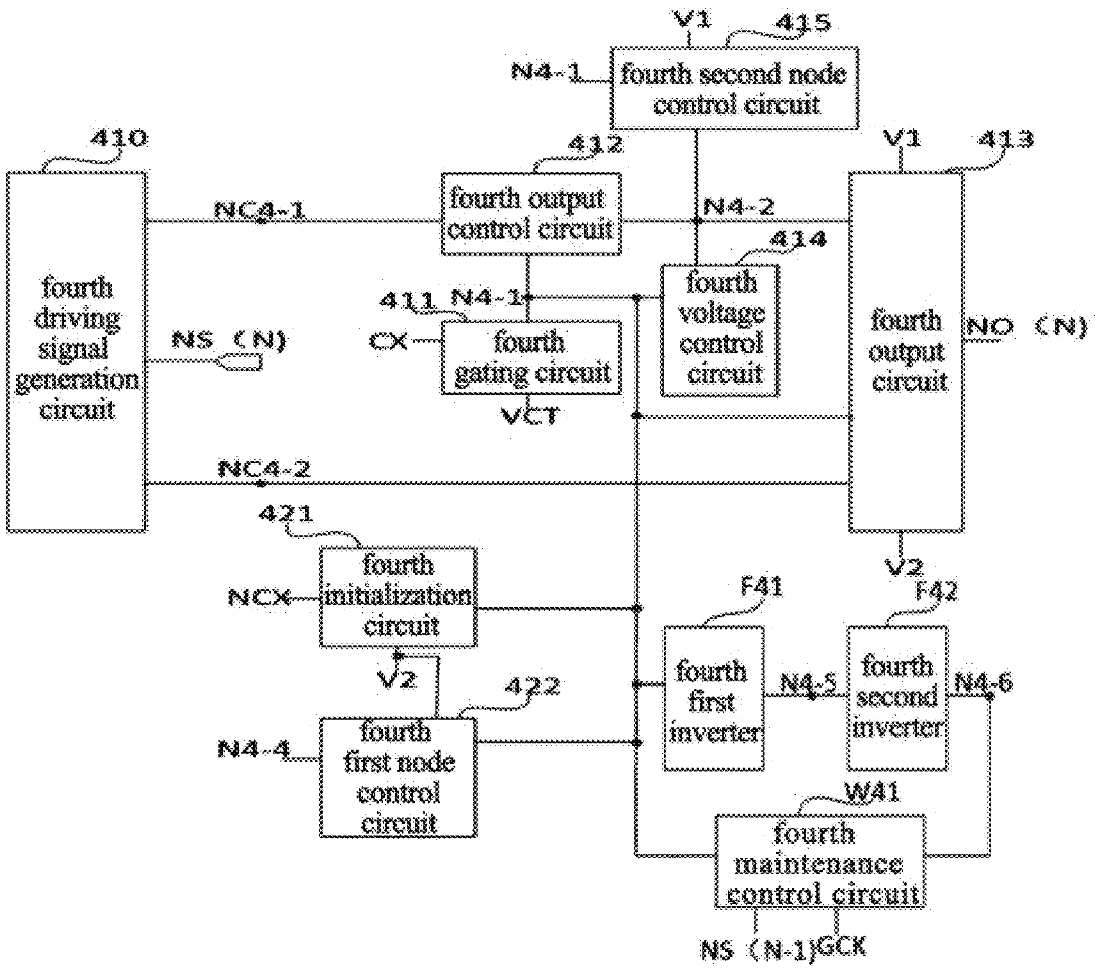
FIG. 57 is a structural diagram of the driving circuit according to at least one embodiment of the present disclosure.

As shown in FIG. 57, based on at least one embodiment of the driving circuit shown in FIG. 56, the driving circuit according to at least one embodiment of the present disclosure may further include a fourth voltage maintenance circuit, the fourth voltage maintenance circuit includes a fourth first inverter F41, a fourth second inverter F42 and a fourth maintenance control circuit W41; the maintenance control terminal includes the (N−1)th stage of driving signal output terminal NS (N−1) and the first clock signal terminal GCK;

The input terminal of the fourth first inverter F41 is electrically connected to the fourth first node N4-1, the output terminal of the fourth first inverter F41 is electrically connected to the fourth fifth node N4-5, the input terminal of the fourth second inverter F42 is electrically connected to the fourth fifth node N4-5, and the output terminal of the fourth second inverter F42 is electrically connected to the fourth sixth node N4-6;

The fourth first inverter F41 is configured to invert the potential of the fourth first node N4-1, and output the inverted potential of the fourth first node N4-1 through the output terminal of the fourth first inverter F41;

The fourth second inverter F42 is configured to invert the potential of its input terminal, and output the inverted potential through the output terminal of the fourth second inverter F42;

The fourth maintenance control circuit W41 is electrically connected to the (N−1)th stage of driving signal output terminal NS (N−1), the first clock signal terminal GCK, the fourth sixth node N4-6 and the fourth first node N4-1 respectively, and is configured to control the connection or disconnection between the fourth sixth node N4-6 and the fourth first node N4-1 under the control of the (N−1)th stage of driving signal provided by the (N−1)th stage of driving signal output terminal NS (N−1), and control the connection or disconnection between the fourth sixth node N4-6 and the fourth first node N4-1 under the control of the first clock signal provided by the first clock signal terminal GCK.

In at least one embodiment shown in FIG. 57, the (N−1)th stage driving signal output terminal may be replaced by a second clock signal terminal, but is not limited thereto.

In at least one embodiment of the present disclosure, the maintenance control terminal includes a first maintenance control terminal and a second maintenance control terminal;

The fourth maintenance control circuit includes a fourth tenth transistor and a fourth eleventh transistor;

a gate electrode of the fourth tenth transistor is electrically connected to the first maintenance control terminal, a first electrode of the fourth tenth transistor is electrically connected to the fourth first node, and a second electrode of the fourth tenth transistor is electrically connected to the fourth sixth node;

a gate electrode of the fourth eleventh transistor is electrically connected to the second maintenance control terminal, a first electrode of the fourth eleventh transistor is electrically connected to the fourth sixth node, and a second electrode of the fourth eleventh transistor is electrically connected to the fourth first node;

The fourth tenth transistor is a p-type transistor, and the fourth eleventh transistor is an n-type transistor;

The first maintenance control terminal is the (N−1)th stage of driving signal terminal, and the second maintenance control terminal is the first clock signal terminal; or, The first maintenance control terminal is the second clock signal terminal, and the second maintenance control terminal is the first clock signal terminal.

Optionally, the fourth first inverter includes a fourth twelfth transistor and a fourth thirteenth transistor, and the fourth second inverter includes a fourth fourteenth transistor and a fourth fifteenth transistor;

a gate electrode of the fourth twelfth transistor is electrically connected to the fourth first node, a first electrode of the fourth twelfth transistor is electrically connected to the first voltage terminal, and a second electrode of the fourth twelfth transistor is electrically connected to the fourth fifth node;

a gate electrode of the fourth thirteenth transistor is electrically connected to the fourth first node, a first electrode of the fourth thirteenth transistor is electrically connected to the fourth fifth node, and a second electrode of the fourth thirteenth transistor is electrically connected to the second voltage terminal;

The four twelfth transistors are p-type transistors, and the fourth thirteenth transistor is an n-type transistor;

a gate electrode of the fourth fourteenth transistor is electrically connected to the fourth fifth node, a first electrode of the fourth fourteenth transistor is electrically connected to the first voltage terminal, and a second electrode of the fourth fourteenth transistor is electrically connected to the fourth sixth node;

a gate electrode of the fourth fifteenth transistor is electrically connected to the fourth fifth node, a first electrode of the fourth fifteenth transistor is electrically connected to the fourth sixth node, and a second electrode of the fourth fifteenth transistor is electrically connected to the second voltage terminal;

The fourth fourteenth transistor is a p-type transistor, and the fourth fifteenth transistor is an n-type transistor.

In at least one embodiment of the present disclosure, the fourth driving signal generation circuit includes a fourth first control node control circuit, a fourth second control node control circuit, a fourth first driving output circuit and a fourth second driving output circuit;

The fourth first control node control circuit is configured to control the potential of the fourth first control node;

The fourth second control node control circuit is configured to control the potential of the fourth second control node;

The fourth first driving output circuit is electrically connected to the fourth first control node, the first voltage terminal and the Nth stage of driving signal output terminal respectively, and is configured to control the connection between the Nth stage of driving signal output terminal and the first voltage terminal under the control of the potential of the fourth first control node;

The fourth second driving output circuit is electrically connected to the fourth second control node, the Nth stage of driving signal output terminal and the second voltage terminal respectively, and is configured to control the connection between the Nth stage of driving signal output terminal and the second voltage terminal under the control of the potential of the fourth second control node.

In specific implementation, the fourth driving signal generation circuit may include a fourth first control node control circuit, a fourth second control node control circuit, a fourth first driving output circuit and a fourth second driving output circuit; the fourth first control node control circuit controls the potential of the fourth first control node; the fourth second control node control circuit controls the potential of the second control node; the fourth first driving output circuit controls the connection between the Nth stage of driving signal output terminal and the first voltage terminal under the control of the potential of the fourth first control node; the fourth second driving output circuit controls the connection between the Nth stage of driving signal output terminal and the second voltage terminal under the control of the potential of the fourth second control node.

Figure 58:
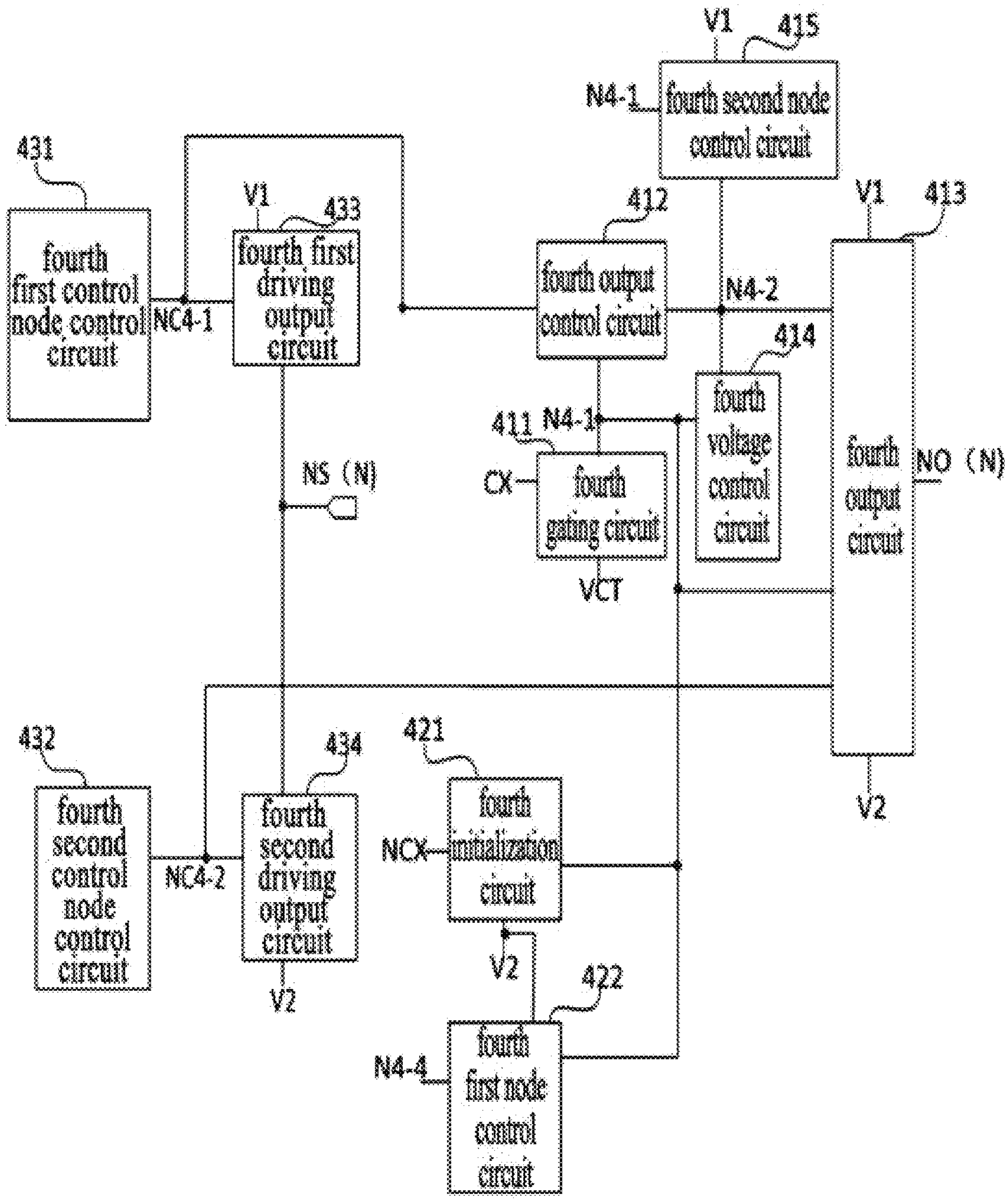
FIG. 58 is a structural diagram of the driving circuit according to at least one embodiment of the present disclosure.

As shown in FIG. 58, based on at least one embodiment of the driving circuit shown in FIG. 56, the fourth driving signal generation circuit includes a fourth first control node control circuit 431, a fourth second control node control circuit 432, a fourth first driving output circuit 433 and a fourth second driving output circuit 434;

The fourth first control node control circuit 431 is electrically connected to the fourth first control node NC4-1, and is configured to control the potential of the fourth first control node NC4-1;

The fourth second control node control circuit 432 is electrically connected to the fourth second control node NC4-2, and is configured to control the potential of the fourth second control node NC4-2;

The fourth first driving output circuit 433 is electrically connected to the fourth first control node NC4-1, the first voltage terminal and the Nth stage of driving signal output terminal NS (N), respectively, and is configured to control the connection between the Nth stage of driving signal output terminal NS (N) and the first voltage terminal V1 under the control of the potential of the fourth first control node NC4-1;

the fourth second driving output circuit 434 is electrically connected to the fourth second control node NC4-2, the Nth stage of driving signal output terminal NS (N) and the second voltage terminal V2, respectively, and is configured to control the connection between the Nth stage of driving signal output terminal NS (N) and the second voltage terminal V2 under the control of the potential of the fourth second control node NC4-2.

Figure 59:
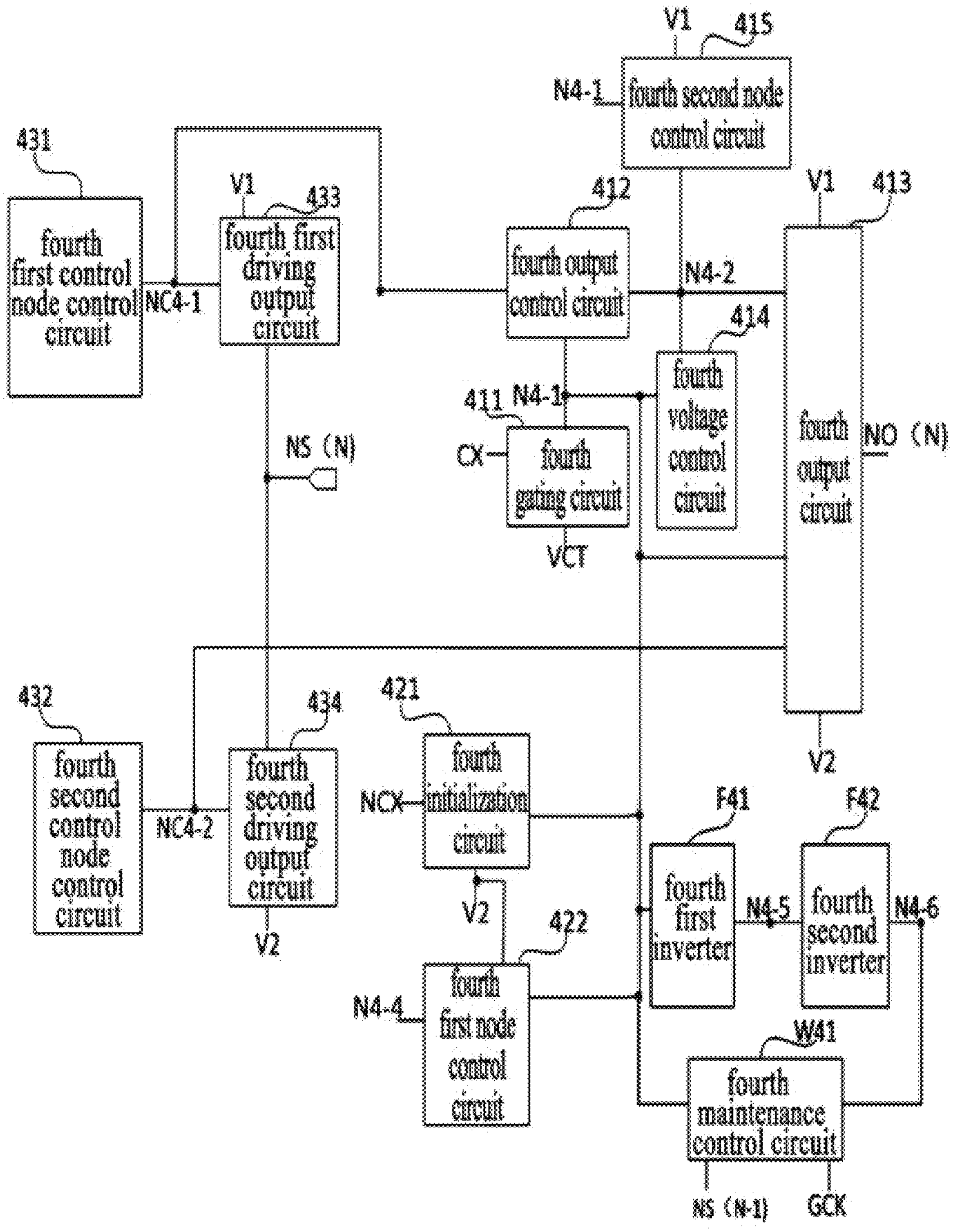
FIG. 59 is a structural diagram of the driving circuit according to at least one embodiment of the present disclosure.

As shown in FIG. 59, based on at least one embodiment of the driving circuit shown in FIG. 57, the fourth driving signal generation circuit includes a fourth first control node control circuit 431, a fourth second control node control circuit 432, a fourth first driving output circuit 433 and a fourth second driving output circuit 434;

The fourth first control node control circuit 431 is electrically connected to the fourth first control node NC4-1, and is configured to control the potential of the fourth first control node NC4-1;

The fourth second control node control circuit 432 is electrically connected to the fourth second control node NC4-2, and is configured to control the potential of the fourth second control node NC4-2;

The fourth first driving output circuit 433 is electrically connected to the fourth first control node NC4-1, the first voltage terminal V1 and the Nth stage of driving signal output terminal NS (N), respectively, and is configured to control the connection between the Nth stage of driving signal output terminal NS (N) and the first voltage terminal V1 under the control of the potential of the fourth first control node NC4-1;

the fourth second driving output circuit 434 is electrically connected to the fourth second control node NC4-2, the Nth stage of driving signal output terminal NS (N) and the second voltage terminal V2, respectively, and is configured to control the connection between the Nth stage of driving signal output terminal NS (N) and the second voltage terminal V2 under the control of the potential of the fourth second control node NC4-2.

In at least one embodiment of the present disclosure, the fourth first control node control circuit includes a fourth seventh node control circuit, a fourth eighth node control circuit, a fourth third node control circuit and a fourth first control circuit;

The fourth seventh node control circuit is electrically connected to the first clock signal terminal, the second voltage terminal, the fourth seventh node and the fourth ninth node respectively, and is configured to control the fourth seventh node to be connected to the second voltage terminal under the control of the first clock signal provided by the first clock signal terminal, and to control the fourth seventh node to be connected to the first clock signal terminal under the control of the potential of the fourth ninth node;

The fourth eighth node control circuit is electrically connected to the second voltage terminal, the fourth seventh node and the fourth eighth node respectively, and is configured to control to connect the fourth seventh node and the fourth eighth node;

The fourth third node control circuit is electrically connected to the fourth eighth node, the second clock signal terminal and the fourth third node respectively, and is configured to control the fourth third node to be connected to the second clock signal terminal under the control of the potential of the fourth eighth node, and control the potential of the fourth third node according to the potential of the fourth eighth node;

The fourth first control circuit is electrically connected to the second clock signal terminal, the fourth third node, the fourth first control node, the fourth ninth node and the first voltage terminal respectively, and is configured to control the fourth third node to be connected to the fourth first control node under the control of the second clock signal provided by the second clock signal terminal, and control the fourth first control node to be connected to the first voltage terminal under the control of the potential of the fourth ninth node.

In a specific implementation, the fourth first control node control circuit may include a fourth seventh node control circuit, a fourth eighth node control circuit, a fourth third node control circuit and a fourth first control circuit; the fourth seventh node control circuit controls the potential of the fourth seventh node; the fourth eighth node control circuit controls the potential of the fourth eighth node; the fourth third node control circuit controls the potential of the fourth third node; the fourth first control circuit controls the potential of the fourth first control node.

In at least one embodiment of the present disclosure, the fourth second control node control circuit includes a fourth ninth node control circuit, a fourth tenth node control circuit, a fourth fourth node control circuit, a fourth eleventh node control circuit and a fourth second control circuit;

The fourth ninth node control circuit is electrically connected to the first clock signal terminal, the (N−1)th stage of driving signal output terminal, the fourth ninth node, the initial control terminal and the first voltage terminal respectively, and is configured to control the fourth ninth node to be connected to the (N−1)th stage of driving signal terminal under the control of the first clock signal provided by the first clock signal terminal, and to control the fourth ninth node to be connected to the first voltage terminal under the control of the initial control signal of the initial control terminal;

The fourth tenth node control circuit is electrically connected to the first clock signal terminal, the (N−1)th stage of driving signal output terminal and the fourth tenth node respectively, and is configured to control the fourth tenth node to be connected to the (N−1)th stage of driving signal output terminal under the control of the first clock signal provided by the first clock signal terminal;

The fourth fourth node control circuit is electrically connected to the first voltage terminal, the fourth seventh node, the fourth fourth node, the fourth eleventh node and the second clock signal terminal respectively, and is configured to control the connection between the fourth fourth node and the first voltage terminal under the control of the potential of the fourth seventh node, and to control the connection between the fourth fourth node and the second clock signal terminal under the control of the potential of the fourth eleventh node;

The fourth eleventh node control circuit is electrically connected to the fourth fourth node, the fourth eleventh node, the second voltage terminal and the fourth tenth node respectively, and is configured to control the potential of the fourth eleventh node according to the potential of the fourth fourth node, and to control the connection between the fourth eleventh node and the fourth tenth node under the control of the second voltage signal provided by the second voltage terminal;

The fourth second control circuit is electrically connected to the fourth eleventh node and the fourth second control node respectively, and is configured to control the potential of the fourth second control node under the control of the potential of the fourth eleventh node.

In a specific implementation, the fourth second control node control circuit may include a fourth ninth node control circuit, a fourth tenth node control circuit, a fourth fourth node control circuit, a fourth eleventh node control circuit and a fourth second control circuit; the fourth ninth node control circuit controls the potential of the fourth ninth node; the fourth tenth node control circuit controls the potential of the fourth tenth node; the fourth fourth node control circuit controls the potential of the fourth fourth node; the fourth eleventh node control circuit controls the potential of the fourth eleventh node; the fourth second control circuit controls the potential of the fourth second control node.

Optionally, the first voltage terminal may be a high voltage terminal, and the second voltage terminal may be a low voltage terminal, but is not limited thereto.

Figure 60:
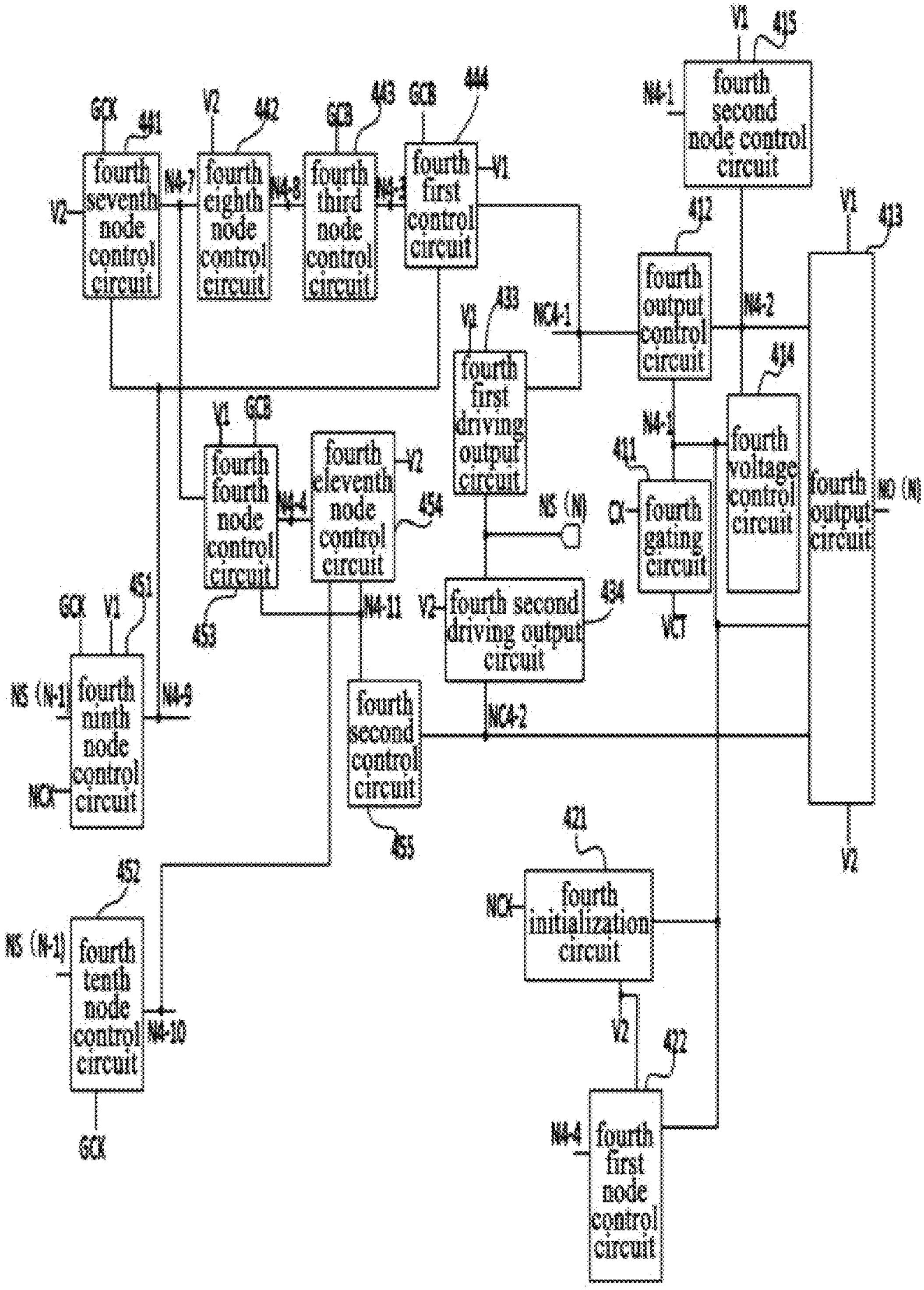
FIG. 60 is a structural diagram of the driving circuit according to at least one embodiment of the present disclosure.

As shown in FIG. 60, based on at least one embodiment of the driving circuit shown in FIG. 58, the fourth first control node control circuit includes a fourth seventh node control circuit 441, a fourth eighth node control circuit 442, a fourth third node control circuit 443 and a fourth first control circuit 444;

The fourth seventh node control circuit 441 is electrically connected to the first clock signal terminal GCK, the second voltage terminal V2, the fourth seventh node N4-7 and the fourth ninth node N4-9, respectively, and is configured to control the fourth seventh node N4-7 to be connected to the second voltage terminal V2 under the control of the first clock signal provided by the first clock signal terminal GCK, and to control the fourth seventh node N4-7 to be connected to the first clock signal terminal GCK under the control of the potential of the fourth ninth node N4-9;

The fourth eighth node control circuit 442 is electrically connected to the second voltage terminal V2, the fourth seventh node N4-7 and the fourth eighth node N4-8, respectively, and is configured to control the fourth seventh node N4-7 to be connected to the fourth eighth node N4-8 under the control of the second voltage signal provided by the second voltage terminal V2;

The fourth third node control circuit 443 is electrically connected to the fourth eighth node N4-8, the second clock signal terminal GCB and the fourth third node N4-3 respectively, and is configured to control the connection between the fourth third node N4-3 and the second clock signal terminal GCB under the control of the potential of the fourth eighth node N4-8, and control the potential of the fourth third node N4-3 according to the potential of the fourth eighth node N4-8;

The fourth first The control circuit 444 is electrically connected to the second clock signal terminal GCB, the fourth third node N4-3, the fourth first control node NC4-1, the fourth ninth node N4-9 and the first voltage terminal V1, respectively, and is configured to control the fourth third node N4-3 to be connected to the fourth first control node NC4-1 under the control of the second clock signal provided by the second clock signal terminal GCB, and to control the fourth first control node NC4-1 to be connected to the first voltage terminal V1 under the control of the potential of the fourth ninth node N4-9;

The fourth second control node control circuit includes a fourth ninth node control circuit 451, a fourth tenth node control circuit 452, a fourth fourth node control circuit 453, a fourth eleventh node control circuit 454 and a fourth second control circuit 455;

the fourth ninth node control circuit 451 is electrically connected to the first clock signal terminal GCK, the (N−1)th stage of driving signal output terminal NS (N−1), the fourth ninth node N4-9, the initial control terminal NCX and the first voltage terminal V1, respectively, and is configured to control to connect the fourth ninth node N4-9 and the (N−1)th stage of driving signal output terminal NS (N−1) under the control of the first clock signal provided by the first clock signal terminal GCK, control the fourth ninth node N4-9 to be connected with the first voltage terminal V1 under the control of the initial control signal of the initial control terminal NCX;

The fourth tenth node control circuit 452 is electrically connected to the first clock signal terminal GCK, the (N−1)th stage of driving signal output terminal NS (N−1) and the fourth tenth node N4-10, respectively, and is configured to control the fourth tenth node N4-10 to be connected with the (N−1)th stage of driving signal output terminal NS (N−1) under the control of the first clock signal provided by the first clock signal terminal GCK;

The fourth fourth node control circuit 453 is electrically connected to the first voltage terminal V1, the fourth seventh node N4-7, the fourth fourth node N4-4, the fourth eleventh node N4-11 and the second clock signal terminal GCB respectively, and is configured to control the fourth fourth node N4-4 to be connected to the first voltage terminal V1 under the control of the potential of the fourth seventh node N4-7, and to control the fourth fourth node N4-4 to be connected to the second clock signal terminal GCB under the control of the potential of the fourth eleventh node N4-11;

The fourth eleventh node control circuit 454 is electrically connected to the fourth fourth node N4-4, the fourth eleventh node N4-11, the second voltage terminal V2 and the fourth tenth node N4-10, and is configured to control the potential of the fourth eleventh node N4-11 according to the potential of the fourth fourth node N4-4, and control the fourth eleventh node N4-11 to be connected to the fourth tenth node N4-10 under the control of the second voltage signal provided by the second voltage terminal V2;

The fourth second control circuit 455 is electrically connected to the fourth eleventh node N4-11 and the fourth second control node NC4-2 respectively, and is configured to control the potential of the fourth second control node NC4-2 under the control of the potential of the fourth eleventh node N4-11.

Figure 61:
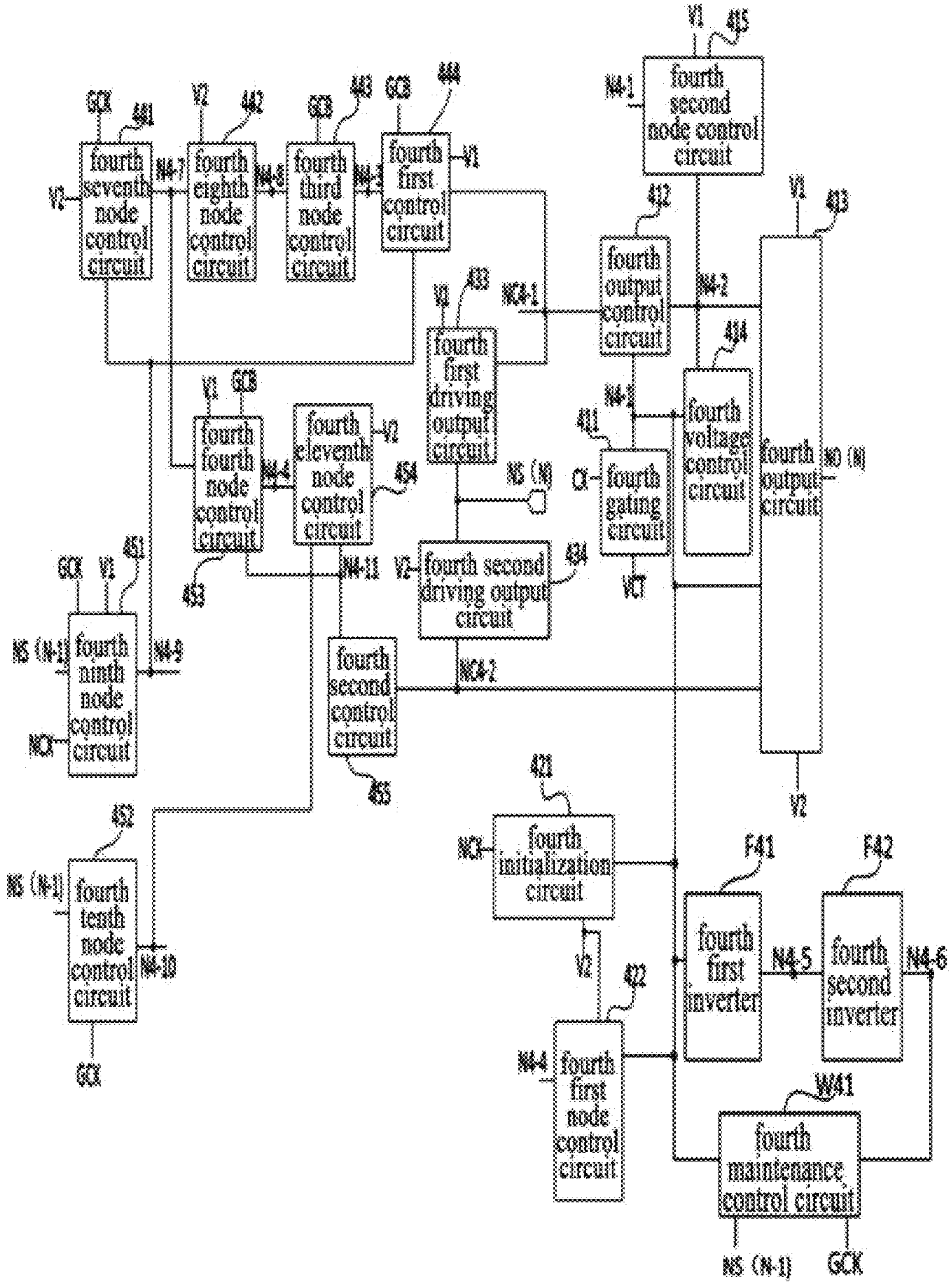
FIG. 61 is a structural diagram of the driving circuit according to at least one embodiment of the present disclosure.

As shown in FIG. 61, based on at least one embodiment of the driving circuit shown in FIG. 59, the fourth first control node control circuit includes a fourth seventh node control circuit 441, a fourth eighth node control circuit 442, a fourth third node control circuit 443 and a fourth first control circuit 444;

the fourth seventh node control circuit 441 is electrically connected to the first clock signal terminal GCK, the second voltage terminal V2, the fourth seventh node N4-7 and the fourth ninth node N4-9 respectively, and is configured to control the fourth seventh nodes N4-7 are connected to the second voltage terminal V2 under the control of the first clock signal provided by the first clock signal terminal GCK, and control the fourth seventh node N4-7 to be connected to the first clock signal terminal GCK under the control of the potential of the fourth ninth node N4-9;

The fourth eighth node control circuit 442 is electrically connected to the second voltage terminal V2, the fourth seventh node N4-7 and the fourth eighth node N4-8 respectively, and is configured to control to connect the fourth seventh node N4-7 and the fourth eighth node N4-8 under the control of the second voltage signal provided by the second voltage terminal V2;

The fourth third node control circuit 443 is electrically connected to the fourth eighth node N4-8, the second clock signal terminal GCB and the fourth third node N4-3 respectively, and is configured to control the fourth third node N4-3 to be connected to the second clock signal terminal GCB under the control of the potential of the fourth eighth node N4-8, and control the potential of the fourth third node N4-3 according to the potential of the fourth eighth node N4-8;

The fourth first control circuit 444 is electrically connected to the second clock signal terminal GCB, the fourth third node N4-3, the fourth first control node NC4-1, the fourth ninth node N4-9 and the first voltage terminal V1, and is configured to control the fourth third node N4-3 to be connected to the fourth first control node NC4-1 under the control of the second clock signal provided by the second clock signal terminal GCB, and to control the fourth first control node NC4-1 to be connected to the first voltage terminal V1 under the control of the potential of the fourth ninth node N4-9;

The fourth second control node control circuit includes a fourth ninth node control circuit 451, a fourth tenth node control circuit 452, a fourth fourth node control circuit 453, a fourth eleventh node control circuit 454 and a fourth second control circuit 455;

The fourth ninth node control circuit 451 is electrically connected to the first clock signal terminal GCK, the (N−1)th stage of driving signal output terminal NS (N−1), the fourth ninth node N4-9, the initial control terminal NCX and the first voltage terminal V1, respectively, and is configured to control the fourth ninth node N4-9 to be connected to the (N−1)th stage of driving signal terminal NS (N−1) under the control of the first clock signal provided by the first clock signal terminal GCK, and to control the fourth ninth node N4-9 to be connected to the (N−1)th stage of driving signal terminal NS (N−1) under the control of the initial control signal of the initial control terminal NCX.

The fourth tenth node control circuit 452 is electrically connected to the first clock signal terminal GCK, the (N−1)th stage of driving signal output terminal NS (N−1) and the fourth tenth node N4-10, respectively, and is configured to control the fourth tenth node N4-10 to be connected to the (N−1)th stage of driving signal output terminal NS (N−1) under the control of the first clock signal provided by the first clock signal terminal GCK;

the fourth fourth node control circuit 453 is electrically connected to the first voltage terminal V1, the fourth seventh node N4-7, the fourth fourth node N4-4, the fourth eleventh node N4-11 and the second clock signal terminal GCB, and is configured to control the fourth fourth node N4-4 to be connected to the first voltage terminal V1 under the control of the potential of the fourth seventh node N4-7, and to control the fourth fourth node N4-4 to be connected to the second clock signal terminal GCB under the control of the potential of the fourth eleventh node N4-11;

The fourth eleventh node control circuit 454 is respectively connected to the fourth fourth node N4-4, the fourth eleventh node N4-11, the second voltage terminal V2 and the fourth tenth node N4-10, is configured to control the potential of the fourth eleventh node N4-11 according to the potential of the fourth fourth node N4-4, and control the connection between the fourth eleventh node N4-11 and the fourth tenth node N4-10 under the control of the second voltage signal provided by the second voltage terminal V2;

The fourth second control circuit 455 is electrically connected to the fourth eleventh node N4-11 and the fourth second control node NC4-2 respectively, and is configured to control the potential of the fourth second control node NC4-2 under the control of the potential of the fourth eleventh node N4-11.

Optionally, the fourth seventh node control circuit includes a fourth sixteenth transistor and a fourth seventeenth transistor, the fourth eighth node control circuit includes a fourth eighteenth transistor, the fourth third node control circuit includes a fourth nineteenth transistor and a fourth third capacitor, and the fourth first control circuit includes a fourth twentieth transistor and a fourth twenty-first transistor;

a gate electrode of the fourth sixteenth transistor is electrically connected to the first clock signal terminal, a first electrode of the fourth sixteenth transistor is electrically connected to the second voltage terminal, and a second electrode of the fourth sixteenth transistor is electrically connected to the fourth seventh node;

a gate electrode of the fourth seventeenth transistor is electrically connected to the fourth ninth node, a first electrode of the fourth seventeenth transistor is electrically connected to the fourth seventh node, and a second electrode of the fourth seventeenth transistor is electrically connected to the first clock signal terminal;

a gate electrode of the fourth eighteenth transistor is electrically connected to the second voltage terminal, a first electrode of the fourth eighteenth transistor is electrically connected to the fourth seventh node, and a second electrode of the fourth eighteenth transistor is electrically connected to the fourth eighth node;

a gate electrode of the fourth nineteenth transistor is electrically connected to the fourth eighth node, a first electrode of the fourth nineteenth transistor is electrically connected to the second clock signal terminal, and a second electrode of the fourth nineteenth transistor is electrically connected to the fourth third node;

a first terminal of the fourth third capacitor is electrically connected to the fourth eighth node, and a second terminal of the fourth third capacitor is electrically connected to the fourth third node;

a gate electrode of the fourth twentieth transistor is electrically connected to the second clock signal terminal, a first electrode of the fourth twentieth transistor is electrically connected to the fourth third node, and a second electrode of the fourth twentieth transistor is electrically connected to the fourth first control node;

a gate electrode of the fourth twenty-first transistor is electrically connected to the fourth ninth node, a first electrode of the fourth twenty-first transistor is electrically connected to the fourth first control node, and a second electrode of the fourth twenty-first transistor is electrically connected to the first voltage terminal.

Optionally, the fourth ninth node control circuit includes a fourth twenty-second transistor and a fourth twenty-third transistor, the fourth tenth node control circuit includes a fourth twenty-fourth transistor, the fourth fourth node control circuit includes a fourth twenty-fifth transistor and a fourth twenty-sixth transistor, the fourth eleventh node control circuit includes a fourth twenty-seventh transistor and a fourth fourth capacitor, and the fourth second control circuit includes a fourth twenty-eighth transistor and a fourth twenty-ninth transistor;

a gate electrode of the fourth twenty-second transistor is electrically connected to the first clock signal terminal, and a first electrode of the fourth twenty-second transistor is electrically connected to the (N−1)th stage of driving signal terminal, a second electrode of the fourth twenty-second transistor is electrically connected to the fourth ninth node.

a gate electrode of the fourth twenty-third transistor is electrically connected to the initial control terminal, a first electrode of the fourth twenty-third transistor is electrically connected to the first voltage terminal, and a second electrode of the fourth twenty-third transistor is electrically connected to the fourth ninth node;

a gate electrode of the fourth twenty-fourth transistor is electrically connected to the first clock signal terminal, a first electrode of the fourth twenty-fourth transistor is electrically connected to the (N−1)th stage of driving signal output terminal, and a second electrode of the fourth twenty-fourth transistor is electrically connected to the fourth tenth node;

a gate electrode of the fourth twenty-fifth transistor is electrically connected to the fourth seventh node, a first electrode of the fourth twenty-fifth transistor is electrically connected to the first voltage terminal, a second electrode of the fourth twenty-fifth transistor is electrically connected to the fourth fourth node;

a gate electrode of the fourth twenty-sixth transistor is electrically connected to the fourth eleventh node, a first electrode of the fourth twenty-sixth transistor is electrically connected to the fourth fourth node, and a second electrode of the fourth twenty-sixth transistor is electrically connected to the second clock signal terminal;

a gate electrode of the fourth twenty-seventh transistor is electrically connected to the second voltage terminal, a first electrode of the fourth twenty-seventh transistor is electrically connected to the fourth tenth node, and a second electrode of the fourth twenty-seventh transistor is electrically connected to the fourth eleventh node;

a first terminal of the fourth fourth capacitor is electrically connected to the fourth fourth node, and a second terminal of the fourth fourth capacitor is electrically connected to the fourth eleventh node;

a gate electrode of the fourth twenty-eighth transistor is electrically connected to the fourth eleventh node, a first electrode of the fourth twenty-eighth transistor is electrically connected to the fourth second control node, and a second electrode of the fourth twenty-eighth transistor is electrically connected to the fourth eleventh node;

a gate electrode of the fourth twenty-ninth transistor is electrically connected to the second voltage terminal, a first electrode of the fourth twenty-ninth transistor is electrically connected to the fourth ninth node, and a second electrode of the fourth twenty-ninth transistor is electrically connected to the fourth second control node.

Optionally, the fourth first driving output circuit includes a fourth thirtieth transistor and a fourth fifth capacitor, and the fourth second driving output circuit includes a fourth thirty-first transistor and a fourth sixth capacitor;

a gate electrode of the fourth thirtieth transistor is electrically connected to the fourth first control node, a first electrode of the fourth thirtieth transistor is electrically connected to the first voltage terminal, and a second electrode of the fourth thirtieth transistor is electrically connected to the Nth stage of driving signal output terminal;

a first terminal of the fourth fifth capacitor is electrically connected to the fourth first control node, and a second terminal of the fourth fifth capacitor is electrically connected to the first voltage terminal;

a gate electrode of the fourth thirty-first transistor is electrically connected to the fourth second control node, a first electrode of the fourth thirty-first transistor is electrically connected to the Nth stage of driving signal output terminal, and a second electrode of the fourth thirty-first transistor is electrically connected to the second voltage terminal;

a first terminal of the fourth sixth capacitor is electrically connected to the Nth stage of driving signal output terminal, and a second terminal of the fourth sixth capacitor is electrically connected to the second voltage terminal.

Figure 62:
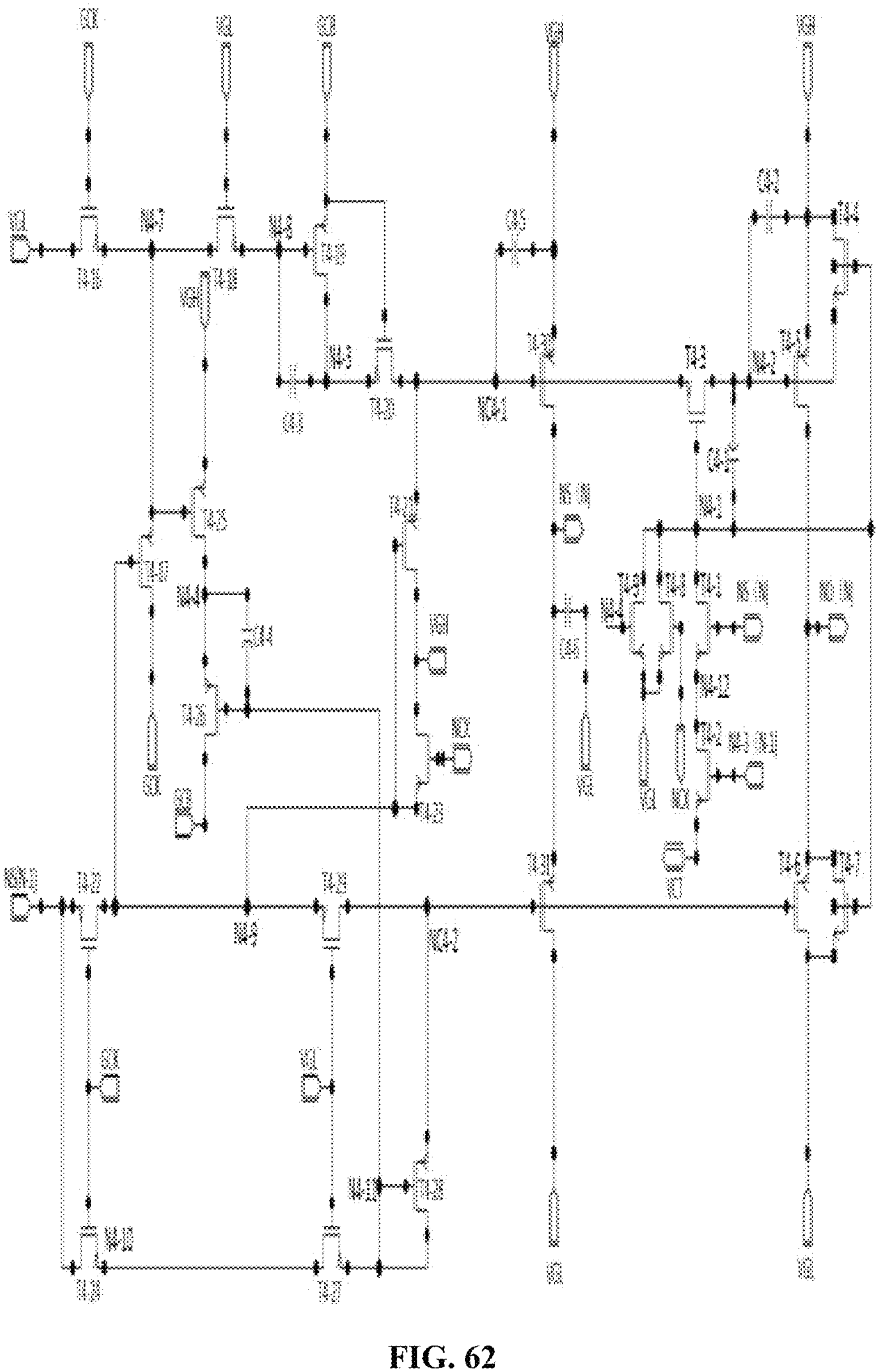
FIG. 62 is a circuit diagram of the driving circuit according to at least one embodiment of the present disclosure.

As shown in FIG. 62, based on at least one embodiment of the driving circuit shown in FIG. 60, the fourth gating circuit may include a fourth first transistor T4-1 and a fourth second transistor T4-2;

The gate electrode of the fourth first transistor T4-1 is electrically connected to the Nth stage of driving signal output terminal NS (N), the drain electrode of the fourth first transistor T4-1 is electrically connected to the fourth first node N4-1, and the source electrode of the fourth first transistor T4-1 is electrically connected to the drain electrode of the fourth second transistor T4-2;

The gate electrode of the fourth second transistor T4-2 is electrically connected to the fourth third node N4-3 (N−1) of the (N−1)th stage of, and the source electrode of the fourth second transistor T4-2 is electrically connected to the gating input terminal VCT;

The fourth output control circuit includes a fourth third transistor T4-3, and the fourth voltage control circuit includes a fourth first capacitor C4-1;

The gate electrode of the fourth third transistor T4-3 is electrically connected to the fourth first node N4-1, the source electrode of the fourth third transistor T4-3 is electrically connected to the fourth first control node NC4-1, and the drain electrode of the fourth third transistor T4-3 is electrically connected to the fourth second node N4-2;

The first terminal of the fourth first capacitor C4-1 is electrically connected to the fourth second node N4-2, and the second terminal of the fourth first capacitor C4-1 is electrically connected to the high voltage terminal VGH;

The fourth second node control circuit includes a fourth fourth transistor T4-4, and the fourth output circuit includes a fourth fifth transistor T4-5, a fourth sixth transistor T4-6, a fourth seventh transistor T4-7 and a fourth second capacitor C4-2;

The gate electrode of the fourth fourth transistor T4-4 is electrically connected to the fourth first node N4-1, the source electrode of the fourth fourth transistor T4-4 is electrically connected to the high voltage terminal VGH, and the drain electrode of the fourth fourth transistor T4-4 is electrically connected to the fourth second node N4-2;

The gate electrode of the fourth fifth transistor T4-5 is electrically connected to the fourth second node N4-2, the source electrode of the fourth fifth transistor T4-5 is electrically connected to the high voltage terminal VGH, and the drain electrode of the fourth fifth transistor T4-5 is electrically connected to the output driving terminal NO (N);

The gate electrode of the fourth sixth transistor T4-6 is electrically connected to the fourth second control node NC4-2, the source electrode of the fourth sixth transistor T4-6 is electrically connected to the output driving terminal NO (N), and the drain electrode of the fourth sixth transistor T4-6 is electrically connected to the low voltage terminal VGL;

the gate electrode of the fourth seventh transistor T4-7 is electrically connected to the fourth first control node NC4-2, the source electrode of the fourth seventh transistor T4-7 is electrically connected to the output driving terminal NO (N), and the drain electrode of the fourth seventh transistor T4-7 is electrically connected to the low voltage terminal VGL;

The first terminal of the fourth second capacitor C4-2 is electrically connected to the fourth second node N4-2, and the second terminal of the fourth second capacitor C4-2 is electrically connected to the high voltage terminal VGH;

The fourth initialization circuit includes a fourth eighth transistor T4-8;

The gate electrode of the fourth eighth transistor T4-8 is electrically connected to the initial control terminal NCX, and the source electrode of the fourth eighth transistor T4-8 is electrically connected to the fourth first node N4-1, and the drain electrode of the fourth eighth transistor T4-8 is electrically connected to the low voltage terminal VGL;

The fourth first node control circuit includes a fourth ninth transistor T4-9;

The gate electrode of the fourth ninth transistor T4-9 is electrically connected to the fourth fourth node N4-4, the source electrode of the fourth ninth transistor T4-9 is electrically connected to the fourth first node N4-1, and the drain electrode of the fourth ninth transistor T4-9 is electrically connected to the low voltage terminal VGL;

The fourth seventh node control circuit includes a fourth sixteenth transistor T4-6 and the fourth seventeenth transistor T4-17, the fourth eighth node control circuit includes the fourth eighteenth transistor T4-18, the fourth third node control circuit includes the fourth nineteenth transistor T4-19 and the fourth third capacitor C4-3, the fourth first control circuit includes the fourth twentieth transistor T4-20 and the fourth twenty-first transistor T4-21;

The gate electrode of the fourth sixteenth transistor T4-16 is electrically connected to the first clock signal terminal GCK, the source electrode of the fourth sixteenth transistor T4-16 is electrically connected to the low voltage terminal VGL, the drain electrode of the fourth sixteenth transistors T4-16 are electrically connected to the fourth seventh node N4-7;

The gate electrode of the fourth seventeenth transistor T4-17 is electrically connected to the fourth ninth node N4-9, the source electrode of the fourth seventeenth transistor T4-17 is electrically connected to the fourth seventh node N4-7, and the drain electrode of the fourth seventeenth transistor T4-17 is electrically connected to the first clock signal terminal GCK;

The gate electrode of the fourth eighteenth transistor T4-18 is electrically connected to the low voltage terminal VGL, and the source electrode of the fourth eighteenth transistor T4-18 is electrically connected to the fourth seventh node N4-7, the drain electrode of the fourth eighteenth transistor T4-18 is electrically connected to the fourth eighth node N4-8;

The gate electrode of the fourth nineteenth transistor T4-19 is electrically connected to the fourth eighth node N4-8, the source electrode of the fourth nineteenth transistor T4-19 is electrically connected to the second clock signal terminal GCB, and the drain electrode of the fourth nineteenth transistor T4-19 is electrically connected to the fourth third node N4-3;

The first terminal of the fourth third capacitor C4-3 is electrically connected to the fourth eighth node N4-8, and the second terminal of the fourth third capacitor C4-3 is electrically connected to the fourth third node N4-3;

The gate electrode of the fourth twentieth transistor T4-20 is electrically connected to the second clock signal terminal GCB, the source electrode of the fourth twentieth transistor T4-20 is electrically connected to the fourth third node N4-3, and the drain electrode of the fourth twentieth transistor T4-20 is electrically connected to the fourth first control node NC4-1;

The gate electrode of the fourth twenty-first transistor T4-21 is electrically connected to the fourth ninth node N4-9, the source electrode of the fourth twenty-first transistor T4-21 is electrically connected to the fourth first control node NC4-1, and the drain electrode of the fourth twenty-first transistor T4-21 is electrically connected to the high voltage terminal VGH;

The fourth ninth node control circuit includes a fourth twenty-second transistor T4-22 and a fourth twenty-third transistor T4-23, the fourth tenth node control circuit includes a fourth twenty-fourth transistor T4-24, the fourth fourth node control circuit includes a fourth twenty-fifth transistor T4-25 and a fourth twenty-sixth transistor T4-26, the fourth eleventh node control circuit includes a fourth twenty-seventh transistor T4-27 and a fourth fourth capacitor C4-4, the fourth second control circuit includes a fourth twenty-eighth transistor T4-28 and the fourth twenty-ninth transistor T4-29;

The gate electrode of the fourth twenty-second transistor T4-22 is electrically connected to the first clock signal terminal GCK, the source electrode of the fourth twenty-second transistor T4-22 is electrically connected to the (N−1)th stage of driving signal output terminal NS (N−1), and the drain electrode of the fourth twenty-second transistor T4-22 is electrically connected to the fourth ninth node N4-9;

The gate electrode of the fourth twenty-third transistor T4-23 is electrically connected to the initial control terminal NCX, and the source electrode of the fourth twenty-third transistor T4-23 is electrically connected to the high voltage terminal VGH is electrically connected, the drain electrode of the fourth twenty-third transistor T4-23 is electrically connected to the fourth ninth node N4-9;

The gate electrode of the fourth twenty-fourth transistor T4-24 is electrically connected to the first clock signal terminal GCK, the source electrode of the fourth twenty-fourth transistor T4-24 is electrically connected to the (N−1)th stage of driving signal output terminal NS (N−1), and the drain electrode of the fourth twenty-fourth transistor T4-24 is electrically connected to the fourth tenth node N4-10;

The gate electrode of the fourth twenty-fifth transistor T4-25 is electrically connected to the fourth seventh node N4-7, and the source electrode of the fourth twenty-fifth transistor T4-25 is electrically connected to the high voltage terminal VGH, and the drain electrode of the fourth twenty-fifth transistor T4-25 is electrically connected to the fourth fourth node N4-4;

The gate electrode of the fourth twenty-sixth transistor T4-26 is electrically connected to the fourth eleventh node N4-11, the source electrode of the fourth twenty-sixth transistor T4-26 is electrically connected to the fourth fourth node N4-4, and the drain electrode of the fourth twenty-sixth transistor T4-26 is electrically connected to the second clock signal terminal GCB;

The gate electrode of the fourth twenty-seventh transistor T4-27 is electrically connected to the low voltage terminal VGL, the source electrode of the fourth twenty-seventh transistor T4-27 is electrically connected to the fourth tenth node N4-10, and the drain electrode of the fourth twenty-seventh transistor T4-27 is electrically connected to the fourth eleventh node N4-11;

The first terminal of the fourth fourth capacitor C4-4 is electrically connected to the fourth fourth node N4-4, and the second terminal of the fourth fourth capacitor C4-4 is electrically connected to the fourth eleventh node N4-11;

The gate electrode of the fourth twenty-eighth transistor T4-28 is electrically connected to the fourth eleventh node N4-11, and the source electrode of the fourth twenty-eighth transistor T4-28 is electrically connected to the fourth second control node NC4-2, and the drain electrode of the fourth twenty-eighth transistor T4-28 is electrically connected to the fourth eleventh node N4-11;

The gate electrode of the fourth twenty-ninth transistor T4-29 is electrically connected to the low voltage terminal VGL, the source electrode of the fourth twenty-ninth transistor T4-29 is electrically connected to the fourth ninth node N4-9, and the drain electrode of the fourth twenty-ninth transistor T4-29 is electrically connected to the fourth second control node NC4-2;

The fourth first driving output circuit includes a fourth thirtieth transistor T4-30 and a fourth fifth capacitor C4-5. The fourth second driving output circuit includes a fourth thirty-first transistor T4-31 and a fourth sixth capacitor C4-6;

The gate electrode of the fourth thirtieth transistor T4-30 is electrically connected to the fourth first control node NC4-1, the source electrode of the fourth thirtieth transistor T4-30 is electrically connected to the high voltage terminal VGH, and the drain electrode of the fourth thirtieth transistor T4-30 is electrically connected to the Nth stage of driving signal output terminal NS (N−1);

The first terminal of the fourth fifth capacitor C4-5 is electrically connected to the fourth first control node NC4-1, and the second terminal of the fourth fifth capacitor C4-5 is electrically connected to the high voltage terminal VGH;

The gate electrode of the fourth thirty-first transistor T4-31 is electrically connected to the fourth second control node NC4-2, the source electrode of the fourth thirty-first transistor T4-31 is electrically connected to the Nth stage of driving signal output terminal NS (N), and the drain electrode of the fourth thirty-first transistor T4-31 is electrically connected to the low voltage terminal VGL;

The first terminal of the fourth sixth capacitor C4-6 is electrically connected to the Nth stage of driving signal output terminal NS (N), and the second terminal of the fourth sixth capacitor C4-6 is electrically connected to the low voltage terminal VGL.

In at least one embodiment of the driving circuit shown in FIGS. 62, T4-1 and T4-2 are p-type transistors, T4-3 is a p-type transistor, T4-4 is an n-type transistor, T4-5 is a p-type transistor, T4-6 is a p-type transistor, T4-7 is an n-type transistor, T4-8 and T4-9 are p-type transistors, and T4-16-T4-31 are p-type transistors.

In at least one embodiment of the driving circuit shown in FIG. 62, the first voltage terminal is a high voltage terminal, and the second voltage terminal is a low voltage terminal, but not limited thereto.

In at least one embodiment of the driving circuit shown in FIG. 62, N12 is the fourth twelfth node.

In at least one embodiment of the present disclosure, the structure of the fourth driving signal generation circuit is not limited to that shown in FIG. 23, and the fourth driving signal generation circuit can be, for example, a 16T3C circuit, a 13T3C circuit, a 12T3C circuit, a 10T3C circuit, etc., but not limited thereto.

At least one embodiment of the driving circuit shown in FIG. 62 of the present disclosure is in operation.

In the first phase, NS (N−1) outputs a low voltage signal, GCK outputs a low voltage signal, and GCB provides a high voltage signal. T4-22 and T4-24 are turned on, the potential of N4-9 and the potential of N4-11 are low voltage, T4-29 and T4-27 are turned on, ensuring that the potential of NC4-2 and the potential of N4-11 are low voltage, T4-31 is turned on, and NS (N) outputs a low voltage signal; the potential of N4-11 is low voltage to ensure that T4-28 is turned on, the potential of N4-9 is low voltage to turn on T4-17, T4-16 is turned on, T4-18 is turned on, the potential of N4-7 and N4-8 are pulled down, T4-19 is turned on, GCB writes a high voltage signal to N4-3, the potential of N4-9 is low voltage to turn on T4-21, and the potential of NC4-1 is pulled up to a high voltage to ensure that T4-30 is turned off;

In the second phase, NS (N−1) outputs a low voltage signal, the potential of the first clock signal output by GCK jumps from a low voltage to a high voltage, T4-22 and T4-24 are turned off, the potential of N4-9 is a low voltage, T4-17 is turned on, T4-16 is turned off, T4-18 is turned on, the potential of N4-7 and the potential of N4-8 are high voltages, T4-19 is turned off, the potential of N4-3 is maintained at a high voltage, GCB outputs a low voltage signal, T4-20 is turned on, the potential of NC4-1 is maintained at a high voltage, and T4-30 is turned off; at the same time, the potential of N4-11 is maintained at a low voltage, T4-28 is turned on, GCB writes the low voltage signal to N4-4, and the potential of N4-11 is pulled down to a lower voltage through C4-4 (5V~10V lower than the voltage value of the low voltage signal provided by GCB), T4-28 is turned on, and the low voltage signal is written to NC4-2 (the potential of NC4-2 is 3~8V lower than the voltage value of the low voltage signal provided by GCB), and T4-31 is fully turned on to ensure that NS (N) outputs a low voltage signal;

In the third phase, NS (N−1) outputs a high voltage signal, GCK outputs a low voltage signal, GCB outputs a high voltage signal, T4-22 and T4-24 are turned on, the potential of N4-9 and the potential of N4-11 are controlled to be high voltage, T4-29 and T4-27 are turned on, the potential of NC4-2 and the potential of N4-11 are high voltage, and T4-31 is turned off; the potential of N4-11 is high voltage, T4-26 is turned off, the potential of N4-9 is high voltage, T4-17 is turned off, T4-16 is turned on, T4-18 is turned on, the potential of N4-7 and the potential of N4-8 are pulled down, T4-19 is turned on, GCB writes a high voltage signal to N4-3, T4-20 is turned off, the potential of N4-9 is high voltage, T4-21 is turned off, the potential of NC4-1 is maintained at a high voltage, and T4-30 is turned off;

In the fourth phase, NS (N−1) outputs a high voltage signal, the potential of the first clock signal output by GCK jumps from low voltage to high voltage, GCB outputs a low voltage signal, T4-22 and T4-24 are turned off, the potential of N4-9 is high voltage, T4-17 is turned off, T4-16 is turned off, T4-18 is turned on, the potential of N4-7 and the potential of N4-8 are maintained at low voltage, T4-19 is turned on, T4-20 is turned on, the potential of N4-3 and the potential of NC4-1 are low voltage, T4-30 is turned on, and NS (N) outputs a high voltage signal; at the same time, the potential of N4-11 is high voltage, T4-26 is turned off, the potential of N4-4 remains unchanged, and the potential of N4-11 is ensured to be high voltage;

In the fifth phase, the potential of the (N−1)th stage of driving signal output by NS (N−1) jumps from high voltage to low voltage, GCK outputs a high voltage signal, GCB outputs a low voltage signal, T4-22 and T4-24 are turned off, the potential of N4-9 and the potential of N4-11 are maintained at a high voltage, and the potential of the remaining nodes remains unchanged, ensuring that NS (N) outputs a high voltage signal;

In the sixth phase, NS (N−1) outputs a low voltage signal, the potential of the first clock signal output by GCK jumps from high voltage to low voltage, GCB outputs a high voltage signal, T4-22 and T4-24 are turned on, the potential of N4-9 and the potential of N4-11 are low voltage, T4-29 and T4-27 are turned on, ensuring that the potential of NC4-2 and the potential of N4-11 are low voltage, to turn on T4-31, NS (N) outputs a low voltage signal; the potential of N4-11 is low voltage, ensuring that T4-26 is turned on, the potential of N4-9 is low voltage, to turn on T4-17, T4-16, T4-18, pull down the potential of N4-7 and the potential of N4-8, turn on T4-19, GCB writes a high voltage signal to N4-3, the potential of N4-9 is low voltage, to turn on T4-21, pull up the potential of NC4-1 to high voltage, and ensure that T4-30 is turned off.

Optionally, when the display starts (that is, when the display device is turned on), in order to prevent the display screen from flickering when it is turned on, in the power-on phase before the first phase, NCX outputs a low voltage signal, T4-8 is turned on, the potential of N4-1 is a low voltage, and T4-3 is turned on; T4-23 is turned on, the potential of N4-9 is a high voltage, and T4-17 is turned off. When GCK outputs a low voltage signal, T4-16 is turned on, so that the potential of N4-7 is a low voltage, T4-18 is turned on, and the potential of N4-8 is a low voltage. When GCB outputs a low voltage signal, T4-20 is turned on, the potential of NC4-1 is a low voltage, T4-30 is turned on, and NS (N) outputs a high voltage signal; since T4-3 is turned on, NC4-1 is connected to N4-2, the potential of N4-2 is a low voltage, T4-5 is turned on, and NO (N) outputs high voltage signal, to turn on the second display control transistor M2 included in all pixel circuits in the effective display area, clear the residual charge in the storage capacitor Cst, and improve the screen flickering problem when the device is turned on;

Afterwards, when NS (N) and N3 (N−1) both output low voltage signals, T4-1 and T4-2 are turned on to control the connection between VCT and N4-1;

When VCT provides a low voltage signal, the potential of N4-1 is low voltage, and C4-1 maintains the potential of N4-1; T4-3 is turned on to control the connection between NC4-1 and N4-2. At this time, the potential of NC4-1 is high voltage, the potential of N4-2 is high voltage, T4-5 is turned off, the potential of NC2 is low voltage, T4-6 is turned on, and NO (N) outputs a low voltage signal;

When VCT provides a high voltage signal, the potential of N4-1 is high voltage, T4-3 is turned off, NC4-1 is disconnected from N4-2, C4-1 controls the potential of N4-2 to be high voltage, T4-5 is turned off, the potential of NC4-2 is low voltage, T4-6 is turned on, and NO (N) outputs a low voltage signal; T4-4 is turned on to ensure that the potential of N4-2 is high voltage, and to ensure that T4-5 is turned off; T4-7 is turned on to ensure that NO (N) outputs a low voltage signal;

Afterwards, in the Nth stage of driving signal providing phase, NS (N) outputs a high voltage signal, at this time, the potential of NC4-1 is low voltage, and the potential of NC4-2 is high voltage;

When the potential of N4-1 is low voltage, T4-3 is turned on, NC4-1 is connected to N4-2, the potential of N4-2 is low voltage, T4-5 is turned on, and NO (N) outputs a high voltage signal;

When the potential of N4-1 is high voltage, T4-3 is turned off, NC4-1 is disconnected from N4-2, the potential of N4-2 is high, the potential of NC4-2 is high, and NO (N) maintains the output of low voltage signal; T4-4 is turned on to ensure that the potential of N4-2 is high, and to ensure that T4-5 is turned off; T4-7 is turned on to ensure that NO (N) outputs a low voltage signal;

After the Nth stage of driving signal supplying phase, when the potential of N4-4 is low, T4-9 is turned on to control the connection between N4-1 and VGL, the potential of N4-1 is low, T4-3 is turned on to control the connection between NC4-1 and N4-2, at this time, the potential of NC4-1 is high, the potential of NC4-2 is low, the potential of N4-2 is high, T4-5 is turned off, T4-6 is turned on, and NO (N) outputs a low voltage signal.

When at least one embodiment of the driving circuit shown in FIG. 62 of the present disclosure is working, when N4-3 (N−1) outputs a low voltage signal and NS (N) outputs a low voltage signal, T4-1 and T4-2 are turned on, and the state of the gated input signal within a high-low frequency switching cycle can be obtained by simultaneously gating the above two signals.

Figure 63:
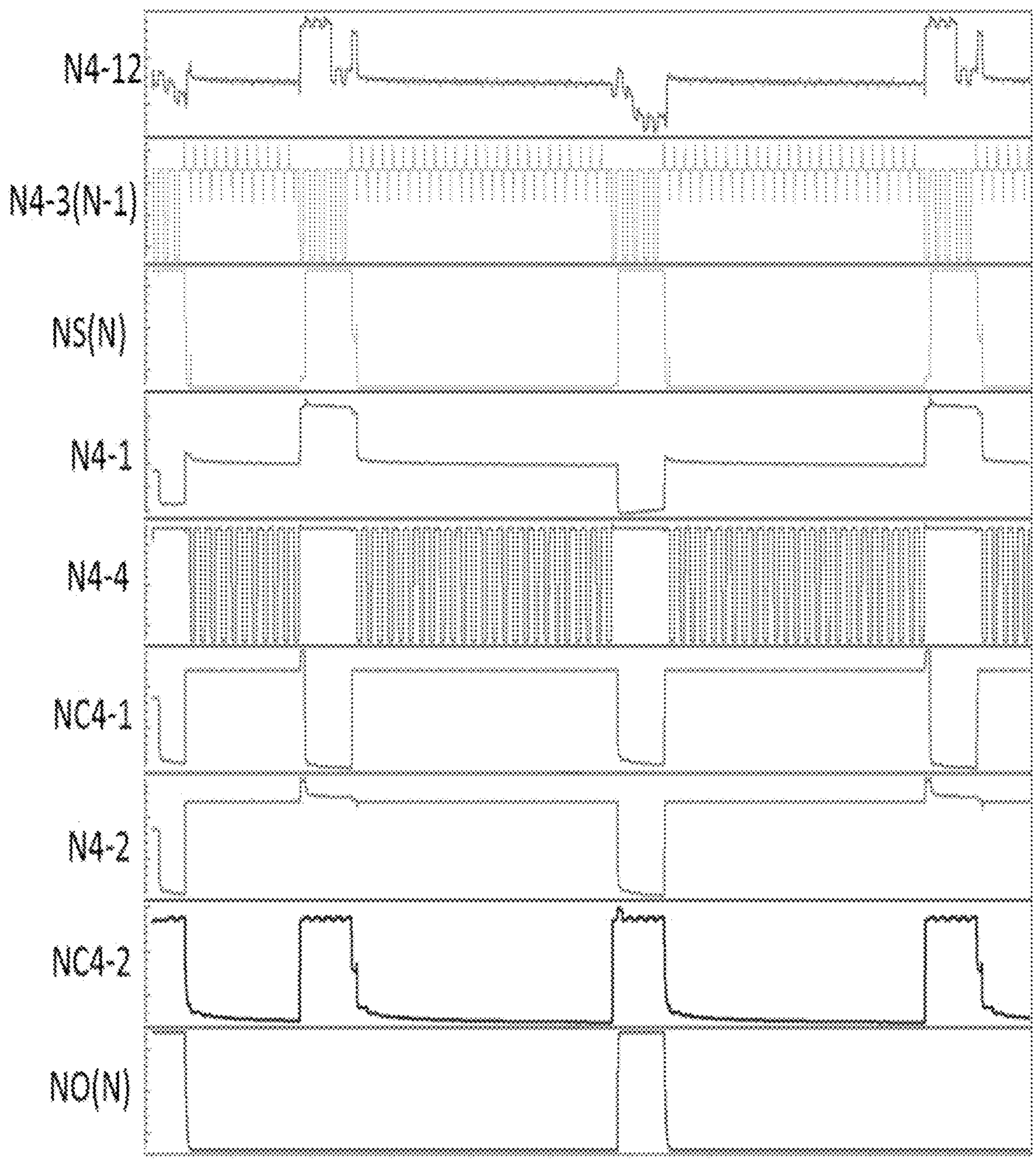
FIG. 63 is a simulation working timing diagram of the driving circuit shown in FIG. 62.
Figure 64:
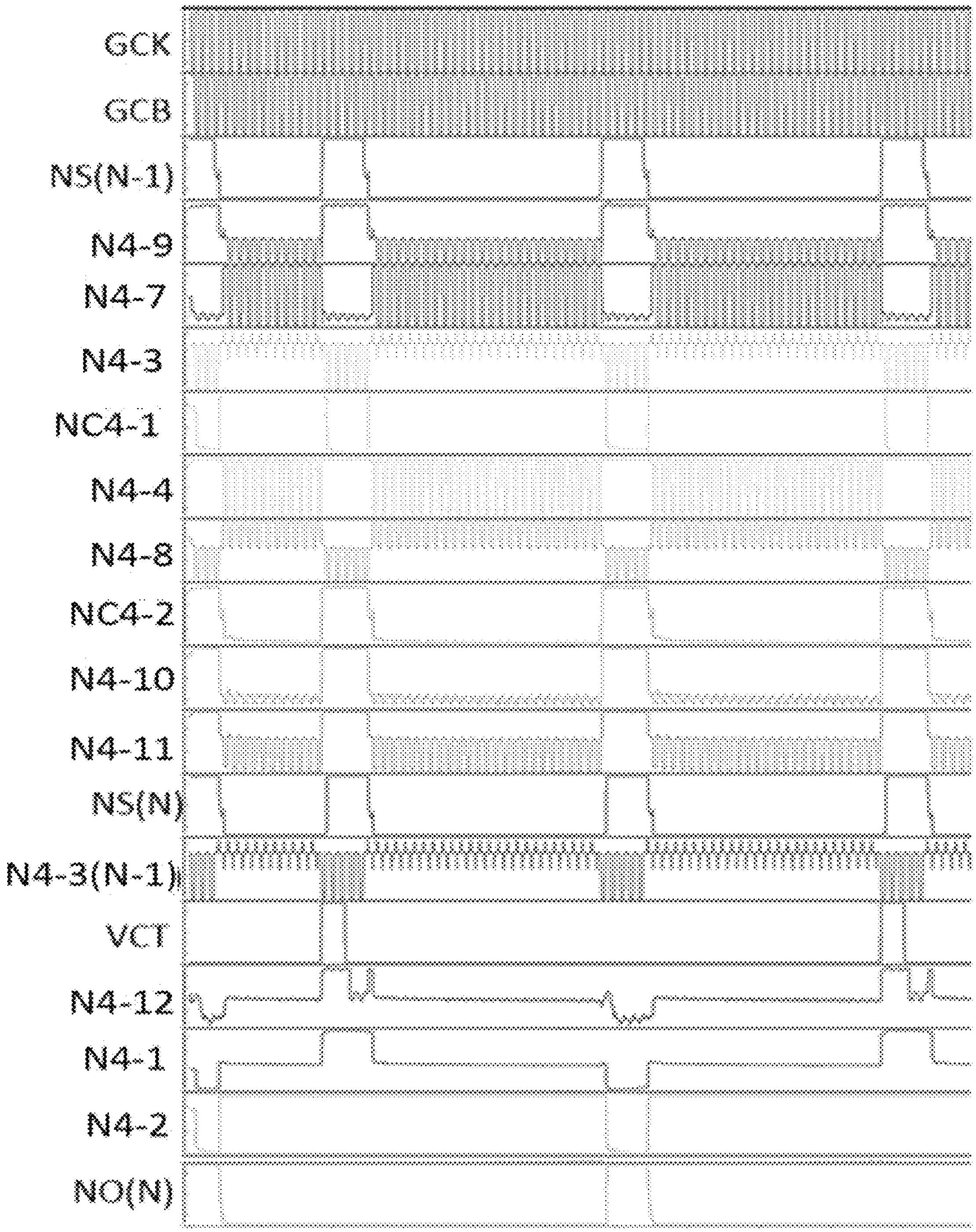
FIG. 64 is a simulation working timing diagram of the driving circuit shown in FIG. 62.

FIG. 63 is a simulation working timing diagram of the driving circuit shown in FIG. 62 of the present disclosure;

FIG. 64 is a simulation working timing diagram of the driving circuit shown in FIG. 62 of the present disclosure.

The difference between at least one embodiment of the driving circuit shown in FIG. 65 of the present disclosure and at least one embodiment of the driving circuit shown in FIG. 62 of the present disclosure is as follows: T4-9 is not provided.

Figure 65:
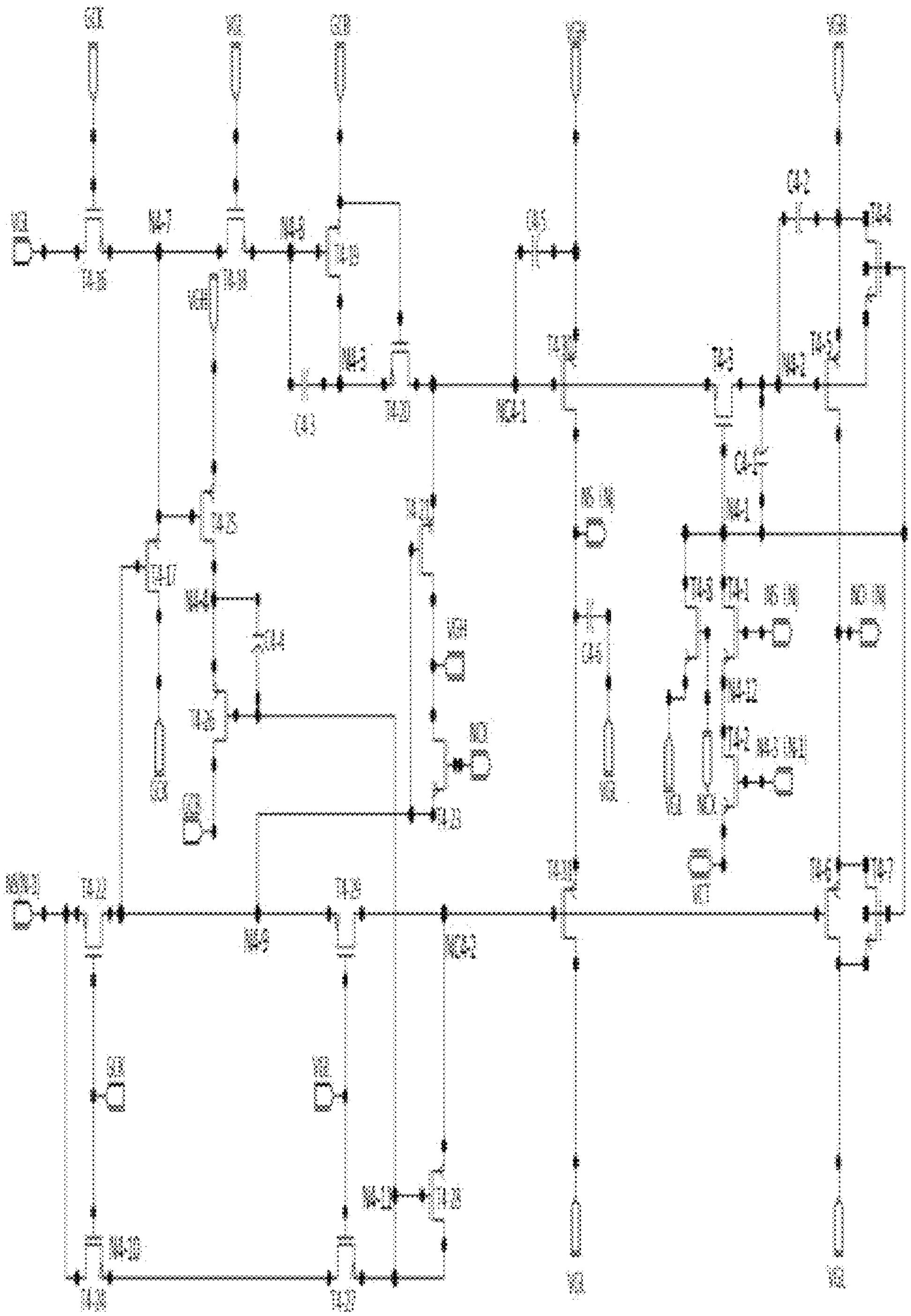
FIG. 65 is a circuit diagram of the driving circuit according to at least one embodiment of the present disclosure.
Figure 66:
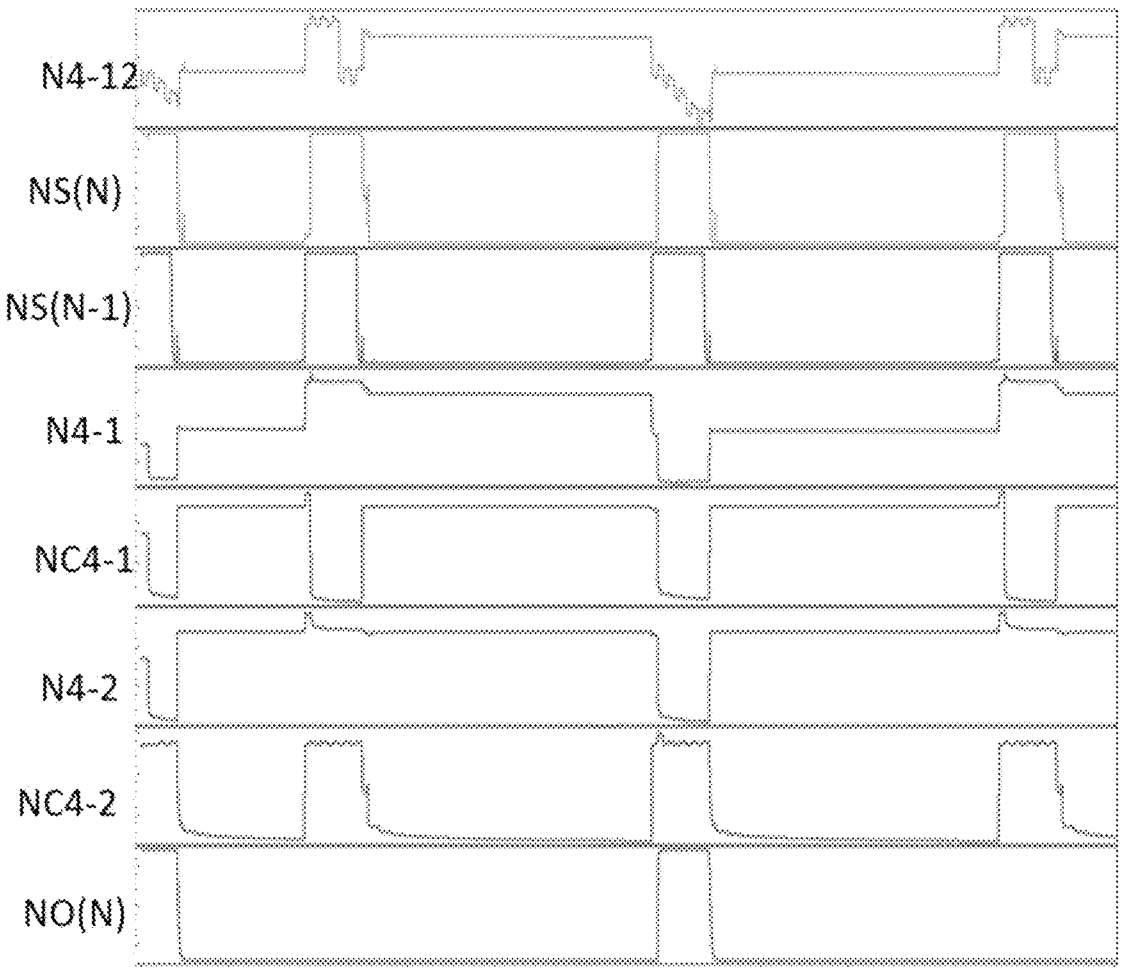
FIG. 66 is a simulation working timing diagram of the driving circuit shown in FIG. 65.

FIG. 66 is a simulation working timing diagram of the driving circuit shown in FIG. 65 of the present disclosure.

The difference between at least one embodiment of the driving circuit shown in FIG. 67 of the present disclosure and at least one embodiment of the driving circuit shown in FIG. 65 of the present disclosure is as follows: a fourth voltage maintenance circuit is added; T4-1 is an n-type transistor, the gate electrode of T4-1 is electrically connected to the (N−1)th stage of driving signal output terminal NS (N−1), and the gate electrode of T4-2 is electrically connected to the Nth stage of driving signal output terminal NS (N);

The fourth voltage maintenance circuit includes a fourth first inverter, a fourth second inverter and a fourth maintenance control circuit;

The fourth maintenance control circuit includes a fourth tenth transistor T4-10 and a fourth eleventh transistor T4-11;

The gate electrode of the fourth tenth transistor T4-10 is electrically connected to the (N−1)th stage of driving signal output terminal NS (N−1), and the source electrode of the fourth tenth transistor T4-10 is electrically connected to the fourth first node N1, and the drain electrode of the fourth tenth transistor T4-10 is electrically connected to the fourth sixth node N4-6.

The gate electrode of the fourth eleventh transistor T4-11 is electrically connected to the first clock signal terminal GCK, the source electrode of the fourth eleventh transistor T4-11 is electrically connected to the fourth sixth node N4-6, and the drain electrode of the fourth eleventh transistor T4-11 is electrically connected to the fourth first node N4-1;

The fourth tenth transistor T4-10 is a p-type transistor, and the fourth eleventh transistor T4-11 is an n-type transistor;

The fourth first inverter includes a fourth twelfth transistor T4-12 and a fourth thirteenth transistor T4-13, and the fourth second inverter includes a fourth fourteenth transistor T4-14 and the fourth fifteenth transistor T4-15.

The gate electrode of the fourth twelfth transistor T4-12 is electrically connected to the fourth first node N4-1, the source electrode of the fourth twelfth transistor T4-12 is electrically connected to the high voltage terminal VGH, and the drain electrode of the fourth twelfth transistor T4-12 is electrically connected to the fourth fifth node N4-5;

The gate electrode of the fourth thirteenth transistor T4-13 is electrically connected to the fourth first node N4-1, the source electrode of the fourth thirteenth transistor T4-13 is electrically connected to the fourth fifth node N4-5, and the drain electrode of the fourth thirteenth transistor T4-13 is electrically connected to the low voltage terminal VGL;

The fourth twelfth transistor T4-12 is a p-type transistor, and the fourth thirteenth transistor T4-13 is an n-type transistor;

The gate electrode of the fourth fourteenth transistor T4-14 is electrically connected to the fourth fifth node N4-5, the source electrode of the fourth fourteenth transistor T4-14 is electrically connected to the high voltage terminal VGH, and the drain electrode of the fourth fourteenth transistor T4-14 is electrically connected to the fourth sixth node N4-6;

The gate electrode of the fourth fifteenth transistor T4-15 is electrically connected to the fourth fifth node N4-5, the source electrode of the fourth fifteenth transistor T4-15 is electrically connected to the fourth sixth node N4-6, and the drain electrode of the fourth fifteenth transistor T4-15 is electrically connected to the low voltage terminal VGL;

The fourth fourteenth transistor T4-14 is a p-type transistor, and the fourth fifteenth transistor T4-15 is an n-type transistor.

Figure 67:
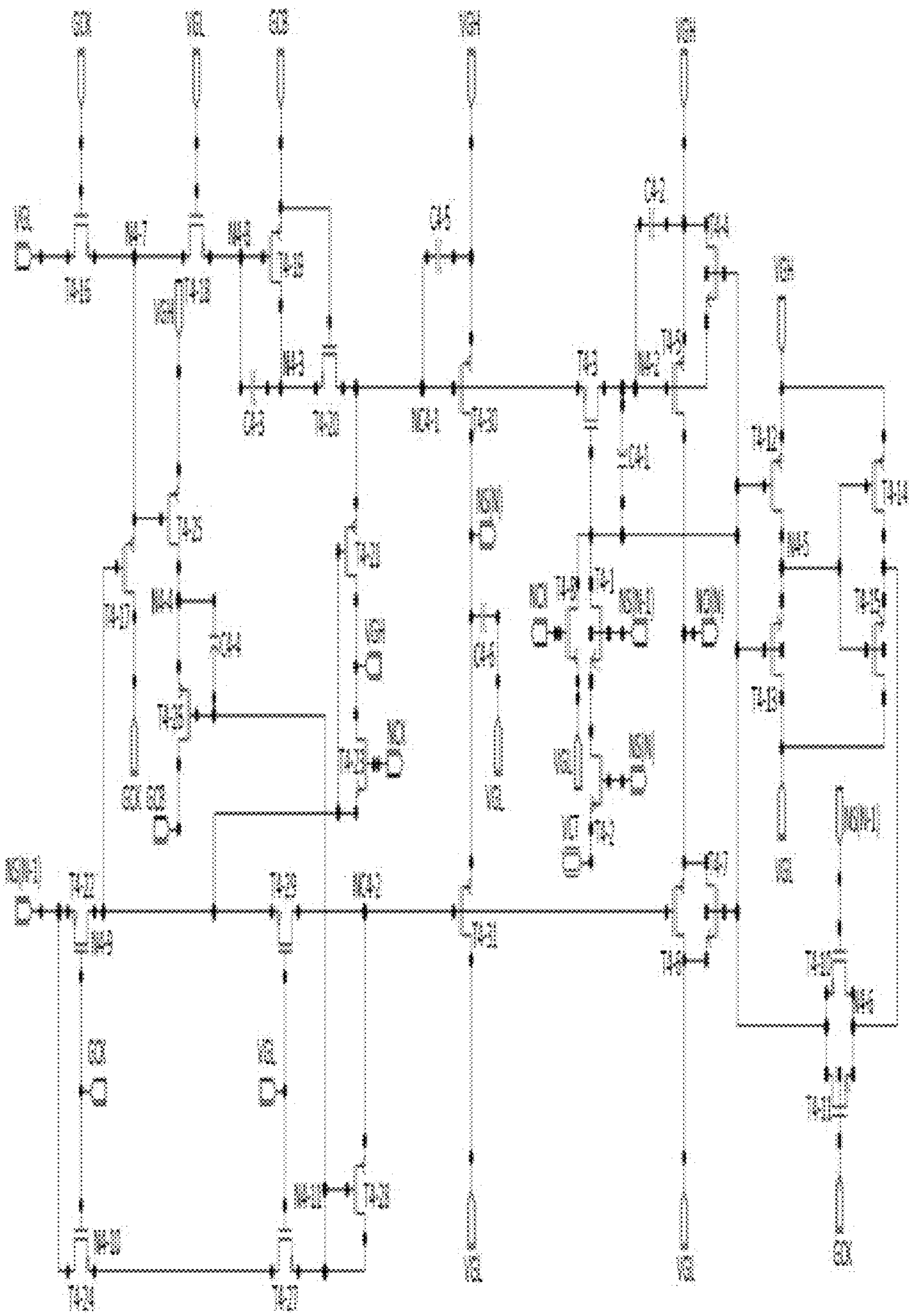
FIG. 67 is a structural diagram of the driving circuit according to at least one embodiment of the present disclosure.

In at least one embodiment of the driving circuit shown in FIG. 67 of the present disclosure, the first maintenance control terminal is the (N−1)th stage of driving signal terminal, and the second maintenance control terminal is the first clock signal terminal.

In at least one embodiment of the driving circuit shown in FIG. 67 of the present disclosure, since the p-type transistor has a threshold voltage loss when transmitting a low voltage, and the n-type transistor has a threshold voltage loss when transmitting a high voltage, the absolute value of the potential of N4-1 will be low, and the absolute value of the potential of N4-1 can be controlled to increase through the fourth first inverter, the fourth second inverter and the fourth voltage maintenance circuit, so as to better control the corresponding transistor in the fourth output circuit to turn on or off. When T4-1 and T4-2 are turned on, the fourth maintenance control circuit controls the disconnection between N4-1 and N4-6 so as not to affect the writing of the potential of N4-1.

In at least one embodiment of the driving circuit shown in FIG. 67 of the present disclosure, when NS (N−1) provides a low voltage signal, N4-1 is connected to N4-6, and when GCK provides a high voltage signal, N4-1 is connected to N4-6.

Figure 68:
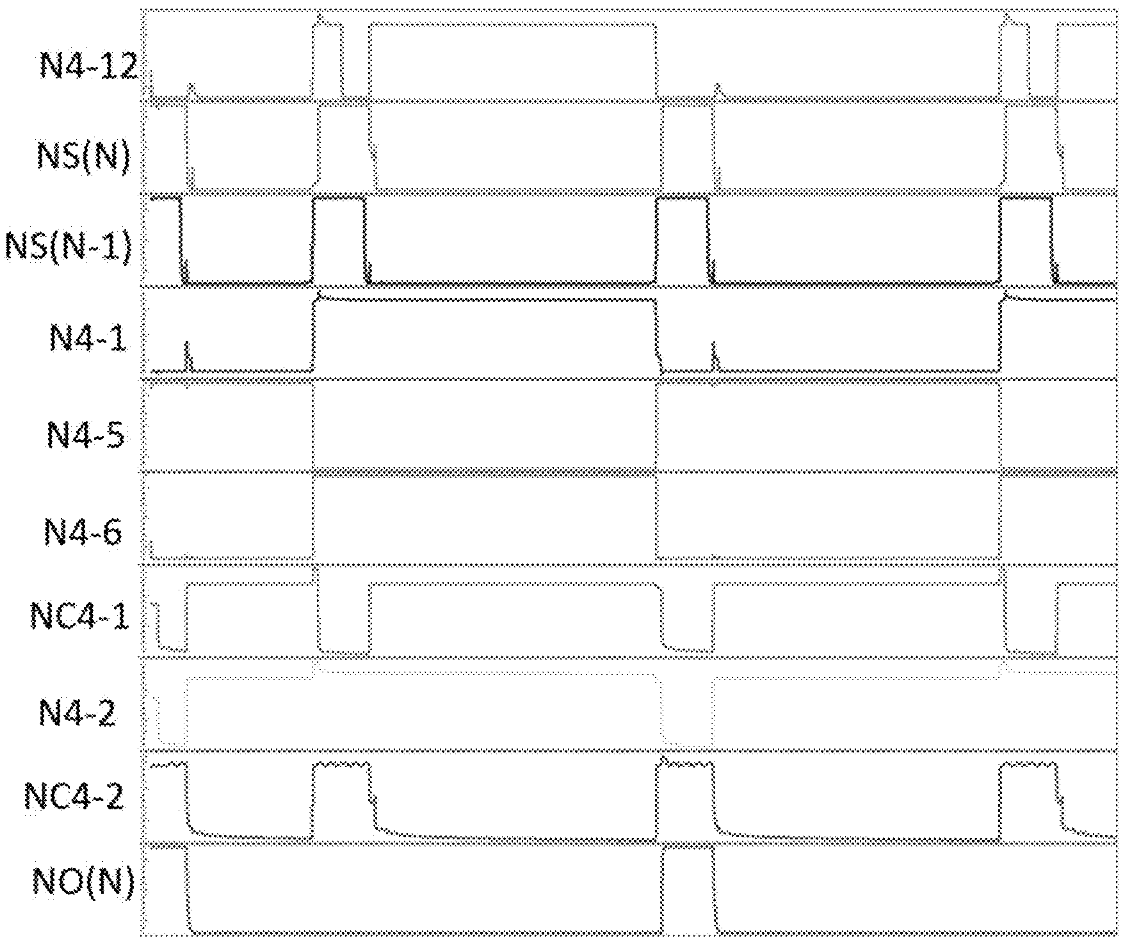
FIG. 68 is a working timing diagram of the driving circuit shown in FIG. 67.

FIG. 68 is a simulation operation timing diagram of at least one embodiment of the driving circuit shown in FIG. 67 of the present disclosure.

Figure 69:
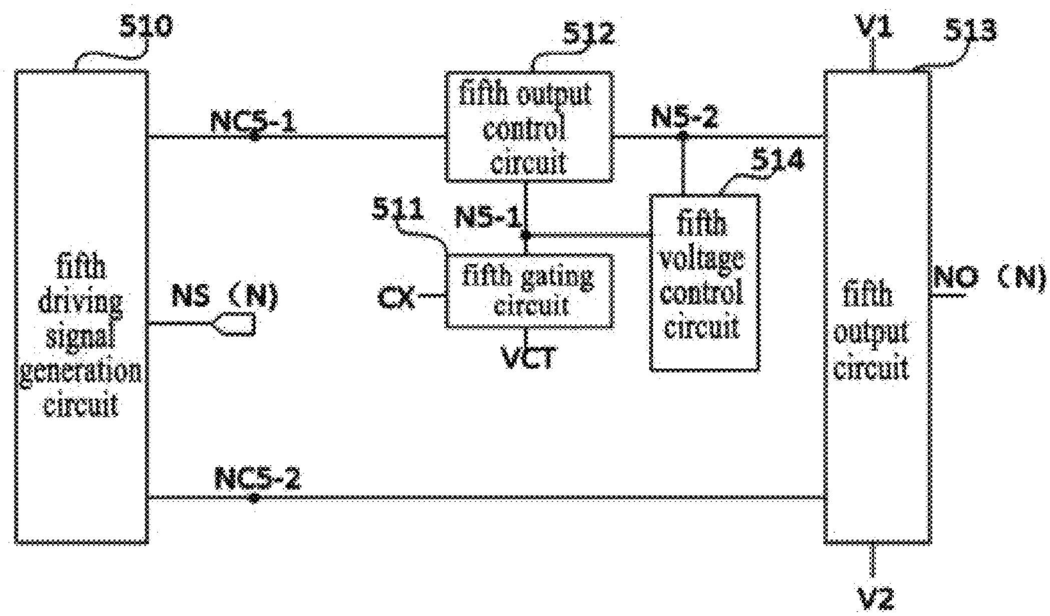
FIG. 69 is a structural diagram of a driving circuit according to an embodiment of the present disclosure.

As shown in FIG. 69, the driving circuit according to the embodiment of the present disclosure includes a fifth driving signal generation circuit 510, a fifth gating circuit 511, a fifth output control circuit 512, a fifth output circuit 513 and a fifth voltage control circuit 514;

The fifth driving signal generation circuit 510 is electrically connected to the fifth first control node NC5-1, the fifth second control node NC5-2 and the Nth stage of driving signal output terminal NS (N), and is configured to generate and output the Nth stage of driving signal through the Nth stage of driving signal output terminal NS (N) under the control of the potential of the fifth first control node NC5-1 and the potential of the fifth second control node NC5-2;

The fifth gating circuit 511 is electrically connected to the fifth first node N5-1, the gating input terminal VCT and the gating control terminal CX, respectively, and is configured to control the gating input signal provided by the gating input terminal VCT to be written into the fifth first node N5-1 under the control of the gating control signal provided by the gating control terminal CX;

The fifth output control circuit 512 is electrically connected to the fifth first node N5-1, the fifth first control node NC5-1, the fifth second control node NC5-2, and is configured to control the connection between the fifth first control node NC5-1 and the fifth second node N5-2 under the control of the potential of the fifth first node N5-1;

The fifth voltage control circuit 514 is electrically connected to the fifth first node N5-1 and the fifth second node N5-2 respectively, and is configured to control the potential of the fifth second node N5-2 according to the potential of the fifth first node N5-1;

The fifth output circuit 513 is electrically connected to the fifth second node N5-2, the fifth second control node NC5-2, the first voltage terminal V1, the second voltage terminal V2 and the output driving terminal NO (N), and is configured to control the connection between the output driving terminal NO (N) and the first voltage terminal V1 under the control of the potential of the fifth second node N5-2, and control the connection between the output driving terminal NO (N) and the second voltage terminal V2 under the control of the potential of the fifth second control node NC5-2;

N is a positive integer.

When the embodiment of the driving circuit shown in FIG. 69 of the present disclosure is working, the fifth driving signal generation circuit 510 generates and outputs the Nth stage of driving signal through the Nth stage of driving signal output terminal NS (N), and the fifth gating circuit 511 writes the gating input signal into the fifth first node N5-1 under the control of the gating control signal; the fifth output control circuit 512 controls the connection between the fifth first control node NC5-1 and the fifth second node N5-2 under the control of the potential of the fifth first node N5-1; the fifth voltage control circuit 514 controls the potential of the fifth second node N5-2 according to the potential of the fifth first node N5-1; the fifth output circuit 513 controls the connection between the output driving terminal NO (N) and the first voltage terminal V1 under the control of the potential of the fifth second control node NC5-2, and controls the connection between the output driving terminal NO (N) and the second voltage terminal V2 under the control of the potential of the fifth second control node NC5-2.

Optionally, the first voltage terminal may be a high voltage terminal, but is not limited thereto.

The embodiment of the driving circuit shown in FIG. 69 of the present disclosure can be an Nth stage of driving circuit.

When the embodiment of the driving circuit shown in FIG. 69 of the present disclosure is working, within one frame time, before the Nth stage of driving signal providing phase, the fifth gating circuit 511 writes the gating input signal provided by the gating input terminal VCT into the fifth first node N5-1 under the control of the gating control signal;

when the gating input signal is a high voltage signal, in the Nth stage of driving signal providing phase, the Nth stage of driving signal output terminal NS (N) outputs a high voltage signal, the potential of the fifth first node N5-1 is a high voltage, the fifth output control circuit 512 controls the fifth first control node NC5-1 to be disconnected from the fifth second node N5-2 under the control of the potential of the fifth first node N5-1, the fifth voltage control circuit 514 controls the potential of the fifth second node N5-2 to be a high voltage according to the potential of the fifth first node N5-1, and the fifth output circuit controls the output driving terminal NO (N) to maintain to output the low voltage signal, which can control the corresponding row pixel circuit not to update the pixel voltage;

When the gating input signal is a low voltage signal, in the Nth stage of driving signal providing phase, the Nth stage of driving signal output terminal NS (N) outputs a high voltage signal, and the potential of the fifth first node N5-1 is a low voltage. The fifth output control circuit 512 controls the connection between the fifth first control node NC5-1 and the fifth second node N5-2 under the control of the potential of the fifth first node N5-1, so that the potential of the fifth second node N5-2 is a low voltage. The fifth output circuit 513 controls the connection between the output driving terminal NO (N) and the first voltage terminal V1 under the control of the potential of the fifth second node N5-2, so that NO (N) outputs a high voltage signal, which can control the corresponding row pixel circuit to update the pixel voltage.

The embodiment can realize the update of the partial screen of the display screen by controlling the gating input signal provided by the gating input terminal VCT, thereby reducing power consumption, or realize ultra-low power consumption of OLED display products such as wearable products, mobile terminals, NB (laptop computers) by partial display screen update.

Optionally, the fifth output control circuit includes a fifth third transistor;

a gate electrode of the fifth third transistor is electrically connected to the fifth first node, a first electrode of the fifth third transistor is electrically connected to the fifth first control node, and a second electrode of the fifth third transistor is electrically connected to the fifth second node;

The fifth voltage control circuit includes a first capacitor;

a first terminal of the first capacitor is electrically connected to the fifth first node, and a second terminal of the first capacitor is electrically connected to the fifth second node.

Optionally, the fifth output circuit includes a fifth fourth transistor, a fifth fifth transistor and a second capacitor;

a gate electrode of the fifth fourth transistor is electrically connected to the fifth second node, a first electrode of the fifth fourth transistor is electrically connected to the first voltage terminal, and a second electrode of the fifth fourth transistor is electrically connected to the output driving terminal;

a first terminal of the second capacitor is electrically connected to the fifth second node, and a second terminal of the second capacitor is electrically connected to the first voltage terminal;

a gate electrode of the fifth fifth transistor is electrically connected to the fifth second control node, a first electrode of the fifth fifth transistor is electrically connected to the output driving terminal, and a second electrode of the fifth fifth transistor is electrically connected to the second voltage terminal.

In at least one embodiment of the present disclosure, the driving circuit may also include a fifth initialization circuit;

The fifth initialization circuit is electrically connected to the initial control terminal, the fifth first node and the second voltage terminal respectively, and is configured to control the connection between the fifth first node and the second voltage terminal under the control of the initial control signal provided by the initial control terminal.

In a specific implementation, the driving circuit may further include a fifth initialization circuit. When the display device is turned on, the fifth initialization circuit controls the connection between the fifth first node and the second voltage terminal under the control of the initial control signal to control the potential of the fifth first node to be the second voltage. The fifth output control circuit controls the connection between the fifth first control node and the fifth second node under the control of the potential of the fifth first node.

The driving circuit according to at least one embodiment of the present disclosure may further include a fifth first node control circuit;

The fifth first node control circuit is electrically connected to the fifth fourth node, the fifth first node and the second voltage terminal respectively, and is configured to control the connection between the fifth first node and the second voltage terminal under the control of the potential of the fifth fourth node.

In a specific implementation, the driving circuit may further include a fifth first node control circuit, which controls the fifth first node to be connected to the second voltage terminal under the control of the potential of the fifth fourth node; after the Nth stage of driving signal providing phase, when the potential of the fifth fourth node is an effective voltage, the fifth first node control circuit controls the fifth first node to be connected to the second voltage terminal, so that the potential of the fifth first node is the second voltage, and the fifth output control circuit controls the fifth first control node to be connected to the fifth second node under the control of the potential of the fifth first node.

In at least one embodiment of the present disclosure, when the transistor included in the fifth first node control circuit is a p-type transistor, the effective voltage may be a low voltage, and when the transistor included in the fifth first node control circuit is an n-type transistor, the effective voltage may be a high voltage.

Figure 70:
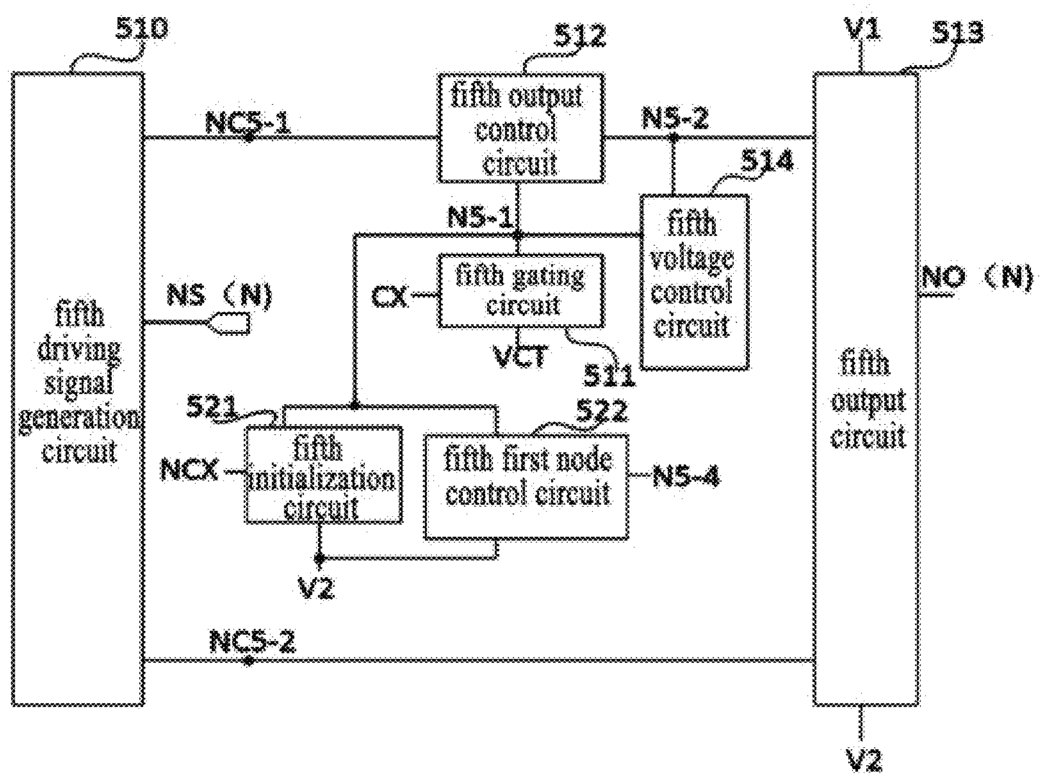
FIG. 70 is a structural diagram of a driving circuit according to at least one embodiment of the present disclosure.

As shown in FIG. 70, based on at least one embodiment of the driving circuit shown in FIG. 69, the driving circuit may further include a fifth initialization circuit 521 and a fifth first node control circuit 522;

The fifth initialization circuit 521 is electrically connected to the initial control terminal NCX, the fifth first node N5-1 and the second voltage terminal V2, respectively, and is configured to control the connection between the fifth first node N5-1 and the second voltage terminal V2 under the control of the initial control signal provided by the initial control terminal NCX;

The fifth first node control circuit 522 is electrically connected to the fifth fourth node N5-4, the fifth first node N5-1 and the second voltage terminal V2, respectively, and is configured to control the connection between the fifth first node N5-1 and the second voltage terminal V2 under the control of the potential of the fifth fourth node N5-4.

Optionally, the fifth initialization circuit includes a fifth sixth transistor;

a gate electrode of the fifth sixth transistor is electrically connected to the initial control terminal, a first electrode of the fifth sixth transistor is electrically connected to the fifth first node, and a second electrode of the fifth sixth transistor is electrically connected to the second voltage terminal.

Optionally, the fifth first node control circuit includes a fifth seventh transistor;

a gate electrode of the fifth seventh transistor is electrically connected to the fifth fourth node, a first electrode of the fifth seventh transistor is electrically connected to the fifth first node, and a second electrode of the fifth seventh transistor is electrically connected to the second voltage terminal.

In at least one embodiment of the present disclosure, the fifth driving signal generation circuit includes a fifth first control node control circuit, a fifth second control node control circuit, a fifth first driving output circuit and a fifth second driving output circuit;

The fifth first control node control circuit is configured to control the potential of the fifth first control node;

The fifth second control node control circuit is configured to control the potential of the fifth second control node;

The fifth first driving output circuit is electrically connected to the fifth first control node, the first voltage terminal and the Nth stage of driving signal output terminal respectively, and is configured to control the connection between the Nth stage of driving signal output terminal and the first voltage terminal under the control of the potential of the fifth first control node;

The fifth second driving output circuit is electrically connected to the fifth second control node, the Nth stage of driving signal output terminal and the second voltage terminal respectively, and is configured to control the connection between the Nth stage of driving signal output terminal and the second voltage terminal under the control of the potential of the fifth second control node.

Figure 71:
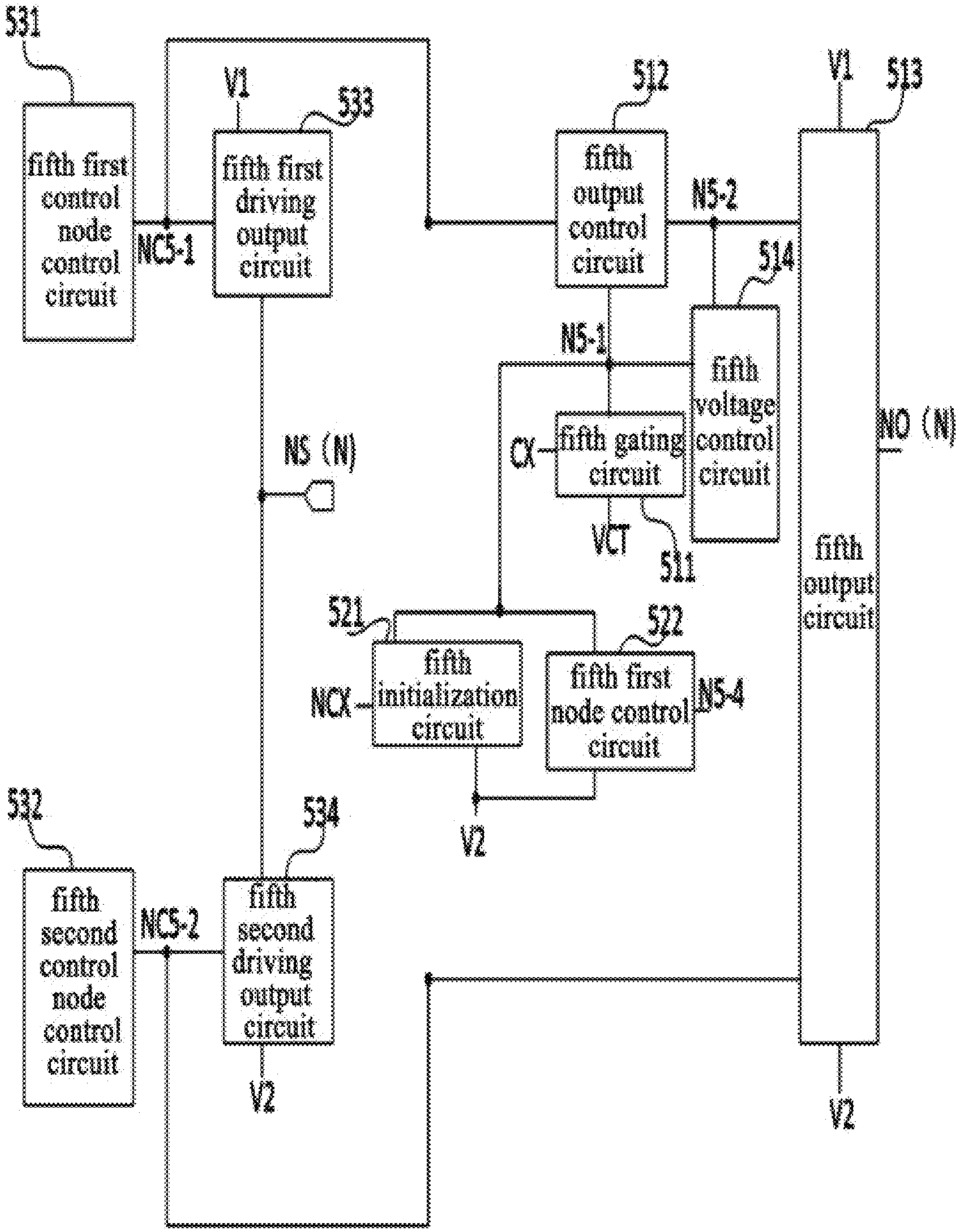
FIG. 71 is a structural diagram of a driving circuit according to at least one embodiment of the present disclosure.

As shown in FIG. 71, based on at least one embodiment of the driving circuit shown in FIG. 70, the fifth driving signal generation circuit includes a fifth first control node control circuit 531, a fifth second control node control circuit 532, a fifth first driving output circuit 533 and a fifth second driving output circuit 534;

The fifth first control node control circuit 531 is electrically connected to the fifth first control node NC5-1, and is configured to control the potential of the fifth first control node NC5-1;

The fifth second control node control circuit 532 is electrically connected to the fifth second control node NC5-2, and is configured to control the potential of the fifth second control node NC5-2;

The fifth first driving output circuit 533 is electrically connected to the fifth first control node NC5-1, the first voltage terminal V1 and the Nth stage of driving signal output terminal NS (N) respectively, and is configured to control the connection between the Nth stage of driving signal output terminal NS (N) and the first voltage terminal V1 under the control of the potential of the fifth first control node NC5-1;

The fifth second driving output circuit 534 is electrically connected to the fifth second control node NC5-2, the Nth stage of driving signal output terminal NS (N) and the second voltage terminal V2 respectively, and is configured to control the connection between the Nth stage of driving signal output terminal NS (N) and the second voltage terminal V2 under the control of the potential of the fifth second control node NC5-2.

In at least one embodiment of the present disclosure, the fifth first control node control circuit includes a fifth fifth node control circuit, a fifth sixth node control circuit, a fifth third node control circuit and a fifth first control circuit;

The fifth fifth node control circuit is electrically connected to the first clock signal terminal, the second voltage terminal, the fifth fifth node and the fifth seventh node respectively, and is configured to control the connection between the fifth fifth node and the second voltage terminal under the control of the first clock signal provided by the first clock signal terminal, and to control the connection between the fifth fifth node and the first clock signal terminal under the control of the potential of the fifth seventh node;

The fifth sixth node control circuit is electrically connected to the second voltage terminal, the fifth fifth node and the fifth sixth node respectively, and is configured to control the connection between the fifth fifth node and the first clock signal terminal under the control of the second voltage signal provided by the second voltage terminal.

The fifth third node control circuit is electrically connected to the fifth sixth node, the second clock signal terminal and the fifth third node respectively, and is configured to control the connection between the second clock signal terminal and the fifth third node under the control of the potential of the fifth sixth node, and control the potential of the fifth third node according to the potential of the fifth sixth node;

The fifth first control circuit is electrically connected to the second clock signal terminal, the fifth third node, the fifth first control node, the first voltage terminal and the fifth seventh node respectively, and is configured to control the connection between the fifth third node and the fifth first control node under the control of the second clock signal provided by the second clock signal terminal, and control the connection between the fifth first control node and the first voltage terminal under the control of the potential of the fifth seventh node.

In a specific implementation, the fifth first control node control circuit may include a fifth fifth node control circuit, a fifth sixth node control circuit, a fifth third node control circuit and a fifth first control circuit; the fifth fifth node control circuit controls the potential of the fifth fifth node, the fifth sixth node control circuit controls the potential of the fifth sixth node; the fifth third node control circuit controls the potential of the fifth third node; the fifth first control circuit controls the connection between the fifth third node and the fifth first control node under the control of the second clock signal, and controls the connection between the fifth first control node and the first voltage terminal under the control of the potential of the fifth seventh node.

In at least one embodiment of the present disclosure, the fifth second control node control circuit includes a fifth fourth node control circuit, a fifth seventh node control circuit, a fifth eighth node control circuit and a fifth second control circuit;

The fifth fourth node control circuit is electrically connected to the fifth fourth node, the fifth fifth node, the first voltage terminal, the fifth eighth node and the second clock signal terminal respectively, and is configured to control the connection between the fifth fourth node and the first voltage terminal under the control of the potential of the fifth fifth node, and to control the connection between the fifth fourth node and the second clock signal terminal under the control of the potential of the fifth eighth node;

The fifth seventh node control circuit is electrically connected to the fifth seventh node, the (N−1)th stage of driving signal output terminal, the first clock signal terminal, the initial control terminal and the first voltage terminal respectively, and is configured to control the connection between the fifth seventh node and the (N−1)th stage of driving signal output terminal under the control of the first clock signal provided by the first clock signal terminal, and to control the connection between the fifth seventh node and the first voltage terminal under the control of the initial control signal provided by the initial control terminal;

The fifth eighth node control circuit is electrically connected to the fifth eighth node, the first clock signal terminal, the second voltage terminal, the (N−1)th stage of driving signal output terminal, the fifth ninth node and the fifth fourth node respectively, and is configured to control the fifth ninth node to be connected to the (N−1)th stage of driving signal output terminal under the control of the first clock signal, and to control the fifth ninth node to be connected to the fifth eighth node under the control of the second voltage signal provided by the second voltage terminal, and to control the potential of the fifth eighth node according to the potential of the fifth fourth node;

The fifth second control circuit is electrically connected to the fifth seventh node, the second voltage terminal, the fifth second control node and the fifth eighth node respectively, and is configured to control the fifth second control node to be connected to the fifth seventh node under the control of the second voltage signal provided by the second voltage terminal, and to control the fifth second control node to be connected to the fifth eighth node under the control of the potential of the fifth eighth node.

In a specific implementation, the fifth second control node control circuit may include a fifth fourth node control circuit, a fifth seventh node control circuit, a fifth eighth node control circuit and a fifth second control circuit; the fifth fourth node control circuit controls the potential of the fifth fourth node, the fifth seventh node control circuit controls the potential of the fifth seventh node, and the fifth eighth node control circuit controls the potential of the fifth eighth node; the fifth second control circuit controls the connection between the fifth second control node and the fifth seventh node under the control of the second voltage signal, and controls the connection between the fifth second control node and the fifth eighth node under the control of the potential of the fifth eighth node.

Figure 72:
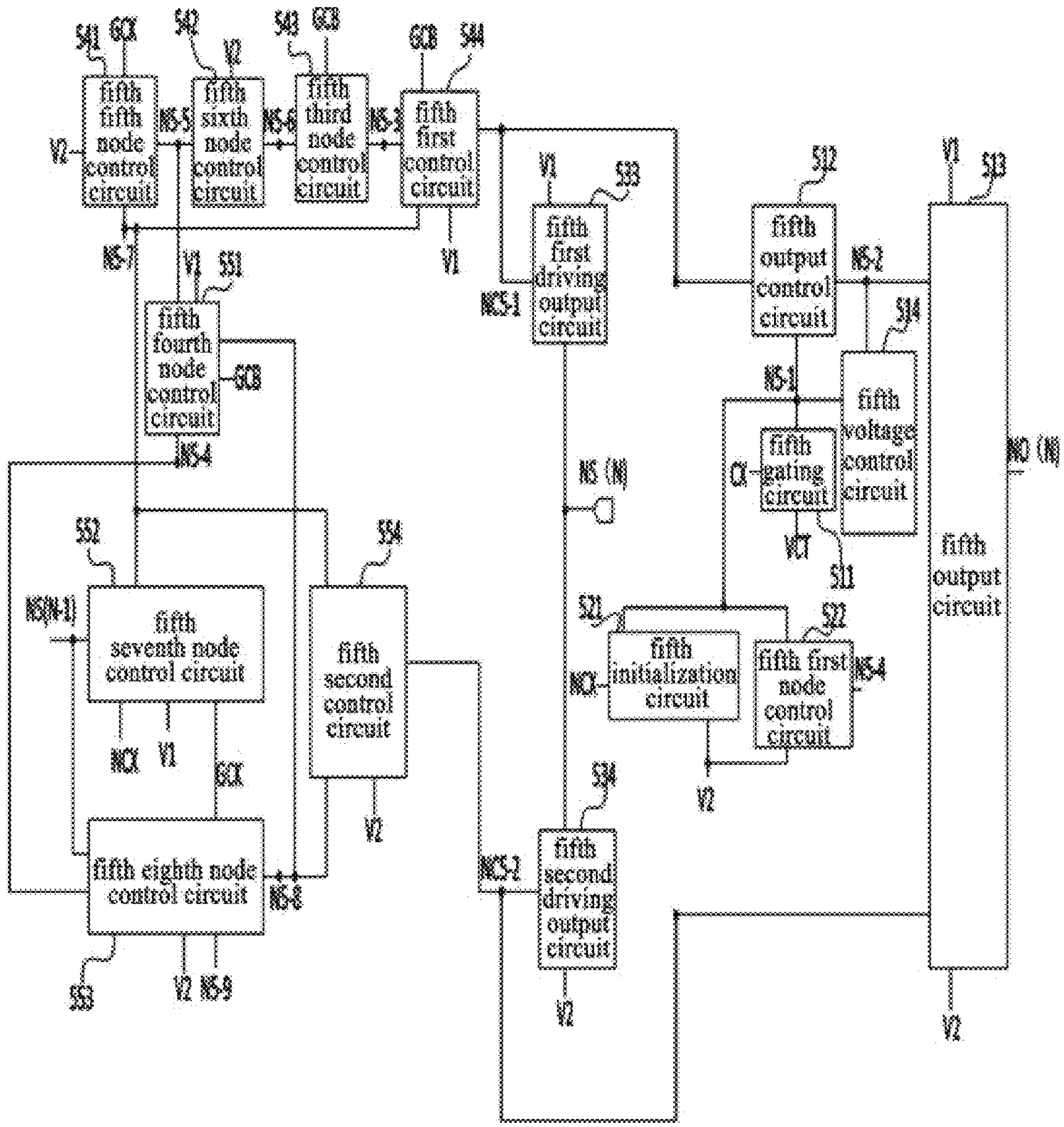
FIG. 72 is a structural diagram of a driving circuit according to at least one embodiment of the present disclosure.

As shown in FIG. 72, based on at least one embodiment of the driving circuit shown in FIG. 71, the fifth first control node control circuit includes a fifth fifth node control circuit 541, a fifth sixth node control circuit 542, a fifth third node control circuit 543 and a fifth first control circuit 544;

the fifth fifth node control circuit 541 is electrically connected to the first clock signal terminal GCK, the second voltage terminal V2, the fifth fifth node N5-5 and the fifth seventh node N5-7 respectively, and is configured to control the fifth fifth node N5-5 to be connected to the second voltage terminal V2 under the control of the first clock signal provided by the first clock signal terminal GCK, and control the fifth fifth node N5-5 to be connected to the first clock signal terminal GCK under the control of the potential of the fifth seventh node N5-7;

The fifth sixth node control circuit 542 is electrically connected to the second voltage terminal V2, the fifth fifth node N5-5 and the fifth sixth node N5-6 respectively, and is configured to control the connection between the fifth fifth node N5-5 and the fifth sixth node N5-6 under the control of the second voltage signal provided by the second voltage terminal V2;

The fifth third node control circuit 543 is electrically connected to the fifth sixth node N5-6, the second clock signal terminal GCB and the fifth third node N5-3 respectively, and is configured to control the connection between the second clock signal terminal GCB and the fifth third node N5-3 under the control of the potential of the fifth sixth node N5-6, and control the potential of the fifth third node N5-3 according to the potential of the fifth sixth node N5-6;

The fifth first control circuit 544 is electrically connected to the second clock signal terminal GCB, the fifth third node N5-3, the fifth first control node NC5-1, the first voltage terminal V1 and the fifth seventh node N5-7 respectively, and is configured to control the connection between the fifth third node N5-3 and the fifth first control node NC5-1 under the control of the second clock signal provided by the second clock signal terminal GCB, and to control the connection between the fifth first control node NC5-1 and the first voltage terminal V1 under the control of the potential of the fifth seventh node N5-7;

The fifth second control node control circuit includes a fifth fourth node control circuit 551, a fifth seventh node control circuit 552, a fifth eighth node control circuit 553 and a fifth second control circuit 554;

The fifth fourth node control circuits 551 is electrically connected to the fifth fourth node N5-4, the fifth fifth node N5-5, the first voltage terminal V1, the fifth eighth node N5-8 and the second clock signal terminal GCB respectively, and is configured to control the connection between the fifth fourth node N5-4 and the first voltage terminal V1 under the control of the potential of the fifth fifth node N5-5, and control the connection between the fifth fourth node N5-4 and the second clock signal terminal GCB under the control of the potential of the fifth eighth node N5-8;

The fifth seventh node control circuit 552 is electrically connected to the fifth seventh node N5-4, the (N−1)th stage of driving signal output terminal NS (N−1), the first clock signal terminal GCK, the initial control terminal NCX and the first voltage terminal V1, and is configured to control the connection between the fifth seventh node N5-7 and the (N−1)th stage of driving signal output terminal NS (N−1) under the control of the first clock signal provided by the first clock signal terminal GCK, and control the connection between the fifth seventh node N5-7 and the first voltage terminal V1 under the control of the initial control signal provided by the initial control terminal NCX;

The fifth eighth node control circuit 553 is respectively connected to the fifth eighth node N5-8, the first clock signal terminal GCK, the second voltage terminal V2, the (N−1)th stage of driving signal output terminal NS (N−1), the fifth ninth node N5-9 and the fifth fourth node N5-4, and is configured to control the fifth ninth node N5-9 to be connected to the (N−1)th stage of driving signal output terminal NS (N−1) under the control of the first clock signal, and to control the fifth ninth node N5-9 to be connected to the fifth eighth node N5-8 under the control of the second voltage signal provided by the second voltage terminal V2, and to control the potential of the fifth eighth node N5-8 according to the potential of the fifth fourth node N5-4;

The fifth second control circuit 554 is electrically connected to the fifth seventh node N5-7, the second voltage terminal V2, the fifth second control node NC5-2 and the fifth eighth node N5-8 respectively, and is configured to control the connection between the fifth second control node NC5-2 and the fifth seventh node N5-7 under the control of the second voltage signal provided by the second voltage terminal V2, and control the connection between the fifth second control node NC5-2 and the fifth eighth node N5-8 under the control of the potential of the fifth eighth node N5-8.

Optionally, the fifth fifth node control circuit includes a fifth eighth transistor and a fifth ninth transistor;

a gate electrode of the fifth eighth transistor is electrically connected to the first clock signal terminal, a first electrode of the fifth eighth transistor is electrically connected to the second voltage terminal, and a second electrode of the fifth eighth transistor is electrically connected to the fifth fifth node;

a gate electrode of the fifth ninth transistor is electrically connected to the fifth seventh node, a first electrode of the fifth ninth transistor is electrically connected to the fifth fifth node, and a second electrode of the fifth ninth transistor is electrically connected to the first clock signal terminal;

The fifth sixth node control circuit includes a fifth tenth transistor;

a gate electrode of the fifth tenth transistor is electrically connected to the second voltage terminal, a first electrode of the fifth tenth transistor is electrically connected to the fifth fifth node, and a second electrode of the fifth tenth transistor is electrically connected to the fifth sixth node;

The fifth third node control circuit includes a fifth eleventh transistor and a third capacitor;

a gate electrode of the fifth eleventh transistor is electrically connected to the fifth sixth node, a first electrode of the fifth eleventh transistor is electrically connected to the second clock signal terminal, and a second electrode of the fifth eleventh transistor is electrically connected to the fifth third node;

a first terminal of the third capacitor is electrically connected to the fifth sixth node, and a second terminal of the third capacitor is electrically connected to the fifth third node;

The fifth first control circuit includes a fifth twelfth transistor and a fifth thirteenth transistor;

a gate electrode of the fifth twelfth transistor is electrically connected to the fifth seventh node, a first electrode of the fifth twelfth transistor is electrically connected to the fifth first control node, and a second electrode of the fifth twelfth transistor is electrically connected to the first voltage terminal;

a gate electrode of the fifth thirteenth transistor is electrically connected to the second clock signal terminal, a first electrode of the fifth thirteenth transistor is electrically connected to the fifth third node, and a second electrode of the fifth thirteenth transistor is electrically connected to the fifth first control node.

Optionally, the fifth fourth node control circuit includes a fifth fourteenth transistor and a fifth fifteenth transistor;

a gate electrode of the fifth fourteenth transistor is electrically connected to the fifth fifth node, a first electrode of the fifth fourteenth transistor is electrically connected to the first voltage terminal, and a second electrode of the fifth fourteenth transistor is electrically connected to the fifth fourth node;

a gate electrode of the fifth fifteenth transistor is electrically connected to the fifth eighth node, a first electrode of the fifth fifteenth transistor is electrically connected to the fifth fourth node, and a second electrode of the fifth fifteenth transistor is electrically connected to the second clock signal terminal;

The fifth seventh node control circuit includes a fifth sixteenth transistor and a fifth seventeenth transistor;

a gate electrode of the fifth sixteenth transistor is electrically connected to the first clock signal terminal, a first electrode of the fifth sixteenth transistor is electrically connected to the (N−1)th stage of driving signal output terminal, and a second electrode of the fifth sixteenth transistor is electrically connected to the fifth seventh node;

a gate electrode of the fifth seventeenth transistor is electrically connected to the initial control terminal, a first electrode of the fifth seventeenth transistor is electrically connected to the first voltage terminal, and a second electrode of the fifth seventeenth transistor is electrically connected to the fifth seventh node;

The fifth eighth node control circuit includes a fifth eighteenth transistor, a fifth a nineteenth transistor and a fourth capacitor;

a gate electrode of the fifth eighteenth transistor is electrically connected to the first clock signal terminal, a first electrode of the fifth eighteenth transistor is electrically connected to the (N−1)th stage of driving signal output terminal, and a second electrode of the fifth eighteenth transistor is electrically connected to the fifth ninth node;

a gate electrode of the fifth nineteenth transistor is electrically connected to the second voltage terminal, a first electrode of the fifth nineteenth transistor is electrically connected to the fifth ninth node, and a second electrode of the fifth nineteenth transistor is electrically connected to the fifth eighth node;

a first terminal of the fourth capacitor is electrically connected to the fifth fourth node, and a second terminal of the fourth capacitor is electrically connected to the fifth eighth node;

The fifth second control circuit includes a fifth twentieth transistor and a fifth twenty-first transistor;

a gate electrode of the fifth twentieth transistor is electrically connected to the second voltage terminal, a first electrode of the fifth twentieth transistor is electrically connected to the fifth seventh node, and a second electrode of the fifth twentieth transistor is electrically connected to the fifth second control node;

a gate electrode of the fifth twenty-first transistor is electrically connected to the fifth eighth node, a first electrode of the fifth twenty-first transistor is electrically connected to the fifth second control node, and a second electrode of the fifth twenty-first transistor is electrically connected to the fifth eighth node.

Optionally, the fifth first driving output circuit includes a fifth twenty-second transistor and a fifth capacitor, and the fifth second driving output circuit includes a fifth twenty-third transistor and a sixth capacitor;

a gate electrode of the fifth twenty-second transistor is electrically connected to the fifth first control node, a first electrode of the fifth twenty-second transistor is electrically connected to the first voltage terminal, and a second electrode of the fifth twenty-second transistor is electrically connected to the Nth stage of driving signal output terminal;

a first terminal of the fifth capacitor is electrically connected to the fifth first control node, and a second terminal of the fifth capacitor is electrically connected to the first voltage terminal;

a gate electrode of the fifth twenty-third transistor is electrically connected to the fifth second control node, a first electrode of the fifth twenty-third transistor is electrically connected to the Nth stage of driving signal output terminal, and a second electrode of the fifth twenty-third transistor is electrically connected to the second voltage terminal;

a first terminal of the sixth capacitor is electrically connected to the Nth stage of driving signal output terminal, and a second terminal of the sixth capacitor is electrically connected to the second voltage terminal.

Figure 73:
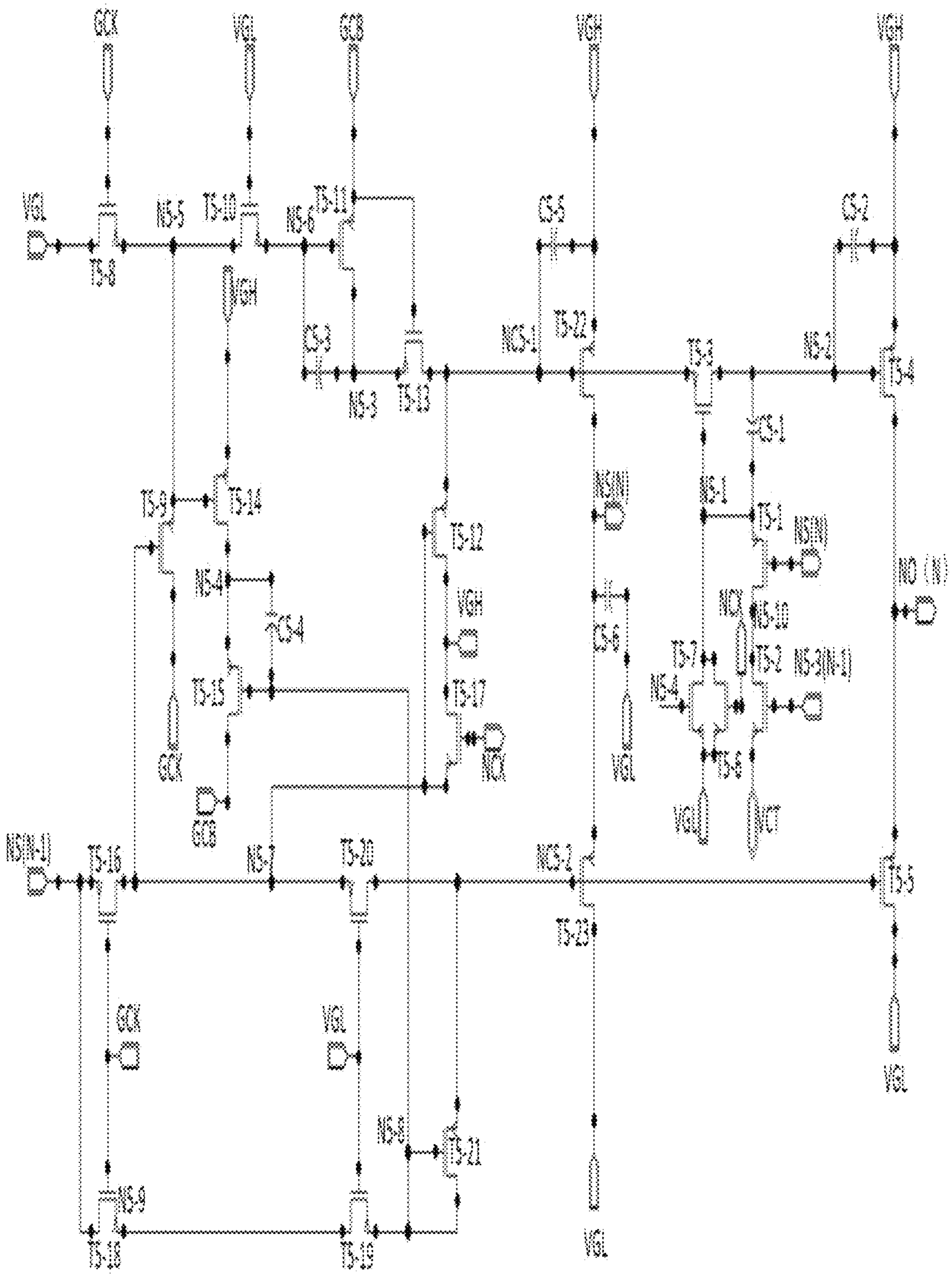
FIG. 73 is a circuit diagram of a driving circuit according to at least one embodiment of the present disclosure.

As shown in FIG. 73, based on at least one embodiment of the driving circuit shown in FIG. 72, the fifth gating circuit includes a fifth first transistor T5-1 and a fifth second transistor T5-2;

the gate electrode of the fifth first transistor T5-1 is electrically connected to the Nth stage of driving signal output terminal NS (N), the drain electrode of the fifth first transistor T5-1 is electrically connected to the fifth first node N5-1, and the source electrode of the fifth first transistor T5-1 is electrically connected to the drain electrode of the fifth second transistor T5-2;

the gate electrode of the fifth second transistor T5-2 is electrically connected to the (N−1)th stage of the fifth third node N5-3 (N−1), and the source electrode of the fifth second transistor T5-2 is electrically connected to the drain electrode of the gating input terminal VCT;

The fifth output control circuit includes a fifth third transistor T5-3;

The gate electrode of the fifth third transistor T5-3 is electrically connected to the fifth first node N5-1, the source electrode of the fifth third transistor T5-3 is electrically connected to the fifth first control node NC5-1, and the drain electrode of the fifth third transistor T5-3 is electrically connected to the fifth second node N5-2;

The fifth voltage control circuit includes a first capacitor C5-1;

The first terminal of the first capacitor C5-1 is electrically connected to the fifth first node N5-1, and the second terminal of the first capacitor C5-1 is electrically connected to the fifth second node N5-2.

The fifth output circuit includes a fifth fourth transistor T5-4, a fifth fifth transistor T5-5 and a second capacitor C5-2;

The gate electrode of the fifth fourth transistor T5-4 is electrically connected to the fifth second node N5-2, the source electrode of the fifth fourth transistor T5-4 is electrically connected to the high voltage terminal VGH, and the drain electrode of the fifth fourth transistor T5-4 is electrically connected to the output driving terminal NO (N);

The first terminal of the second capacitor C5-2 is electrically connected to the fifth second node N5-2, and the second terminal of the second capacitor is electrically connected to the high voltage terminal VGH;

The gate electrode of the fifth fifth transistors T5-5 is electrically connected to the fifth second control node NC5-2, the first electrode of the fifth fifth transistor T5-5 is electrically connected to the output driving terminal NO (N), and the drain electrode of the fifth fifth transistor T5-5 is electrically connected to the low voltage terminal VGL;

The fifth initialization circuit includes a fifth sixth transistor T5-6;

The gate electrode of the fifth sixth transistor T5-6 is electrically connected to the initial control terminal NCX, the source electrode of the fifth sixth transistor T5-6 is electrically connected to the fifth first node N5-1, and the drain electrode of the fifth sixth transistor T5-6 is electrically connected to the low voltage terminal VGL;

The fifth first node control circuit includes a fifth seventh transistor T5-7;

The gate electrode of the fifth seventh transistor T5-7 is electrically connected to the fifth fourth node N5-4, the source electrode of the fifth seventh transistor T5-7 is electrically connected to the fifth first node N5-1, and the drain electrode of the fifth seventh transistor T5-7 is electrically connected to the low voltage terminal VGL;

The fifth fifth node control circuit includes a fifth eighth transistor T5-8 and a fifth ninth transistor T5-9;

The gate electrode of the fifth eighth transistor T5-8 is electrically connected to the first clock signal terminal GCK, the source electrode of the fifth eighth transistor T5-8 is electrically connected to the low voltage terminal VGL, and the drain electrode of the fifth eighth transistor T5-8 is electrically connected to the fifth fifth node N5-5;

The gate electrode of the fifth ninth transistor T5-9 is electrically connected to the fifth seventh node N5-7, the source electrode of the fifth ninth transistor T5-9 is electrically connected to the fifth fifth node N5-5, and the drain electrode of the fifth ninth transistor T5-9 is electrically connected to the first clock signal terminal GCK;

The fifth sixth node control circuit includes a fifth tenth transistor T5-10;

The gate electrode of the fifth tenth transistor T5-10 is electrically connected to the low voltage terminal VGL, the source electrode of the fifth tenth transistor T5-10 is electrically connected to the fifth fifth node N5-5, and the drain electrode of the fifth tenth transistor T5-10 is electrically connected to the fifth sixth node N5-6;

The fifth third node control circuit includes a fifth eleventh transistor T5-11 and a third capacitor C5-3;

The gate electrode of the fifth eleventh transistor T5-11 is electrically connected to the fifth sixth node N5-6, the source electrode of the fifth eleventh transistor T5-11 is electrically connected to the second clock signal terminal GCB, and the drain electrode of the fifth eleventh transistor T5-11 is electrically connected to the fifth third node N5-3;

The first terminal of the third capacitor C5-3 is electrically connected to the fifth sixth node N5-6, and the second terminal of the third capacitor C5-3 is electrically connected to the fifth third node N5-3;

The fifth first control circuit includes a fifth twelfth transistor T5-12 and a fifth thirteenth transistor T5-13;

The gate electrode of the fifth twelfth transistor T5-12 is electrically connected to the fifth seventh node N5-7, the source electrode of the fifth twelfth transistor T5-12 is electrically connected to the fifth first control node NC5-1, and the drain electrode of the fifth twelfth transistor T5-12 is electrically connected to the high voltage terminal VGH;

The gate electrode of the fifth thirteenth transistor T5-13 is electrically connected to the second clock signal terminal GCB, and the source electrode of the fifth thirteenth transistor T5-13 is electrically connected to the fifth third node N5-3, the drain electrode of the fifth thirteenth transistor T5-13 is electrically connected to the fifth first control node NC5-1;

The fifth fourth node control circuit includes a fifth fourteenth transistor T5-14 and a fifth fifteenth transistor T5-15;

The gate electrode of the fifth fourteenth transistor T5-14 is electrically connected to the fifth fifth node N5-5, the source electrode of the fifth fourteenth transistor T5-14 is electrically connected to the high voltage terminal VGH, and the drain electrode of the fifth fourteenth transistor T5-14 is electrically connected to the fifth fourth node N5-4;

The gate electrode of the fifth fifteenth transistor T5-15 is electrically connected to the fifth eighth node N5-8, and the source electrode of the fifth fifteenth transistor T5-15 is electrically connected to the fifth fourth node N5-4, the drain electrode of the fifth fifteenth transistor T5-15 is electrically connected to the second clock signal terminal GCB;

The fifth seventh node control circuit includes a fifth sixteenth transistor T5-16 and a fifth seventeenth transistor T5-17;

The gate electrode of the fifth sixteenth transistor T5-16 is electrically connected to the first clock signal terminal GCK, the source electrode of the fifth sixteenth transistor T5-16 is electrically connected to the (N−1)th stage of driving signal output terminal NS (N), and the drain electrode of the fifth sixteenth transistor T5-16 is electrically connected to the fifth seventh node N5-7;

The gate electrode of the fifth seventeenth transistor T5-17 is electrically connected to the initial control terminal NCX, the source electrode of the fifth seventeenth transistor T5-17 is electrically connected to the high voltage terminal VGH, and the drain electrode of the fifth seventeenth transistor T5-17 is electrically connected to the fifth seventh node N5-7;

The fifth eighth node control circuit includes a fifth eighteenth transistor T5-18, a fifth nineteenth transistor T5-19 and a fourth capacitor C5-4;

The gate electrode of the fifth eighteenth transistor T5-18 is electrically connected to the first clock signal terminal GCK, the source electrode of the fifth eighteenth transistor T5-18 is electrically connected to the (N−1)th stage of driving signal output terminal NS (N−1), and the drain electrode of the fifth eighteenth transistor T5-18 is electrically connected to the fifth ninth node N5-9;

The gate electrode of the fifth nineteenth transistor T5-19 is electrically connected to the low voltage terminal VGL, and the source electrode of the fifth nineteenth transistor T5-19 is electrically connected to the fifth ninth node N5-9, the drain electrode of the fifth nineteenth transistor T5-19 is electrically connected to the fifth eighth node N5-8;

The first terminal of the fourth capacitor C5-4 is electrically connected to the fifth fourth node N5-4, and the second terminal of the fourth capacitor C5-4 is electrically connected to the fifth eighth node N5-8;

The fifth second control circuit includes a fifth twentieth transistor T5-20 and a fifth twenty-first transistor T5-21;

The gate electrode of the fifth twentieth transistor T5-20 is electrically connected to the low voltage terminal VGL, the source electrode of the fifth twentieth transistor T5-20 is electrically connected to the fifth seventh node N5-7, and the drain electrode of the fifth twentieth transistor T5-20 is electrically connected to the fifth second control node NC5-2;

The fifth twenty-first transistor T5-21 is electrically connected to the fifth eighth node N5-8, the source electrode of the fifth twenty-first transistor T5-21 is electrically connected to the fifth second control node NC5-2, and the drain electrode of the fifth twenty-first transistor T5-21 is electrically connected to the fifth eighth node N5-8;

The fifth first driving output circuit includes the fifth twenty-second transistor T5-22 and the fifth capacitor C5-5, and the fifth second driving output circuit includes the fifth twenty-third transistor T5-23 and the sixth capacitor C5-6;

The gate electrode of the fifth twenty-second transistor T5-22 is electrically connected to the fifth first control node NC5-1, the source electrode of the fifth twenty-second transistor T5-22 is electrically connected to the high voltage terminal VGH, and the drain electrode of the fifth twenty-second transistor T5-22 is electrically connected to the Nth stage of driving signal output terminal NS (N);

The first terminal of the fifth capacitor C5-5 is electrically connected to the fifth first control node NC5-1, and the second terminal of the fifth capacitor C5-5 is electrically connected to the high voltage terminal VGH;

The gate electrode of the fifth twenty-third transistor T5-23 is electrically connected to the fifth second control node NC5-2, the source electrode of the fifth twenty-third transistor T5-23 is electrically connected to the Nth stage of driving signal output terminal NS (N), and the drain electrode of the fifth twenty-third transistor T5-23 is electrically connected to the low voltage terminal VGL;

The first terminal of the sixth capacitor C5-6 is electrically connected to the Nth stage of driving signal output terminal NS (N), and the second terminal of the sixth capacitor C5-6 is electrically connected to the low voltage terminal VGL.

In at least one embodiment of the driving circuit shown in FIG. 73, the first voltage terminal is a high voltage terminal, and the second voltage terminal is a low voltage terminal, but this is not limited to it.

In at least one embodiment of the driving circuit shown in FIG. 73, all transistors are p-type transistors, but not limited thereto.

In at least one embodiment of the driving circuit shown in FIG. 73, N5-10 is the fifth tenth node.

In at least one embodiment of the present disclosure, the structure of the fifth driving signal generation circuit is not limited to that shown in FIG. 20. The fifth driving signal generation circuit can be, for example, a 16T3C circuit, a 13T3C circuit, a 12T3C circuit, a 10T3C circuit, etc., but not limited thereto.

When at least one embodiment of the driving circuit shown in FIG. 73 of the present disclosure is working, In the first phase, when NS (N−1) outputs a low voltage signal, GCK outputs a low voltage signal, and GCB provides a high voltage signal, T5-16 and T5-18 are turned on, the potential of N5-7 and the potential of N5-8 are low voltages, T5-20 and T5-19 are turned on, ensuring that the potential of NC5-2 and the potential of N5-8 are low voltages, T5-23 is turned on, and NS (N) outputs a low voltage signal; the potential of N5-8 is low voltage to ensure that T5-15 is turned on, the potential of N5-7 is low voltage to turn on T5-9, T5-8 is turned on, T5-10 is turned on, the potential of N5-5 and N5-6 are pulled down, T5-11 is turned on, GCB writes a high voltage signal to N5-3, the potential of N5-7 is low voltage to turn on T5-12, and the potential of NC5-1 is pulled up to a high voltage to ensure that T5-22 is turned off;

In the second phase, NS (N−1) outputs a low voltage signal, the potential of the first clock signal output by GCK jumps from a low voltage to a high voltage, T5-16 and T5-18 are turned off, the potential of N5-7 is a low voltage, T5-9 is turned on, T5-8 is turned off, T5-10 is turned on, the potential of N5-5 and the potential of N5-6 are high voltages, T5-11 is turned off, the potential of N5-3 is maintained at a high voltage, GCB outputs a low voltage signal, T5-13 is turned on, the potential of NC5-1 is maintained at a high voltage, and T5-22 is turned off; at the same time, the potential of N5-8 is maintained at a low voltage, T5-15 is turned on, GCB writes the low voltage signal to N5-4, and pulls the potential of N5-8 down to a lower voltage through C5-4 (5V~10V lower than the voltage value of the low voltage signal provided by GCB), T5-21 is turned on, and the low voltage signal is written to NC5-2 (the potential of NC5-2 is 3~8V lower than the voltage value of the low voltage signal provided by GCB), and T5-23 is fully turned on to ensure that NS (N) outputs a low voltage signal;

In the third phase, NS (N−1) outputs a high voltage signal, GCK outputs a low voltage signal, GCB outputs a high voltage signal, T5-16 and T5-18 are turned on, the potential of N5-7 and the potential of N5-9 are controlled to be high voltage, T5-20 and T5-19 are turned on, the potential of NC5-2 and the potential of N5-8 are high voltage, and T5-23 is turned off; the potential of N5-8 is high voltage, T5-15 is turned off, the potential of N5-7 is high voltage, T5-9 is turned off, T5-8 is turned on, T5-10 is turned on, the potential of N5-5 and the potential of N5-6 are pulled down, T5-11 is turned on, GCB writes a high voltage signal to N5-3, T5-13 is turned off, the potential of N5-7 is high voltage, T5-12 is turned off, the potential of NC5-1 is maintained at a high voltage, and T5-22 is turned off;

In the fourth phase, NS (N−1) outputs a high voltage signal, the potential of the first clock signal output by GCK jumps from low voltage to high voltage, GCB outputs a low voltage signal, T5-16 and T5-18 are turned off, the potential of N5-7 is high voltage, T5-9 is turned off, T5-8 is turned off, T5-10 is turned on, the potential of N5-5 and the potential of N5-6 are maintained at low voltage, T5-11 is turned on, T5-13 is turned on, the potential of N5-3 and the potential of NC5-1 are low voltage, T5-22 is turned on, and NS (N) outputs a high voltage signal; at the same time, the potential of N5-8 is high voltage, T5-15 is turned off, and the potential of N5-4 remains unchanged, ensuring that the potential of N5-8 is high voltage;

In the fifth phase, the potential of the (N−1)th stage of driving signal output by NS (N−1) jumps from high voltage to low voltage, GCK outputs a high voltage signal, GCB outputs a low voltage signal, T5-16 and T5-18 are turned off, the potential of N5-7 and the potential of N5-9 are maintained at a high voltage, and the potential of the remaining nodes remains unchanged, ensuring that NS (N) outputs a high voltage signal;

In the sixth phase, NS (N−1) outputs a low voltage signal, the potential of the first clock signal output by GCK jumps from high voltage to low voltage, GCB outputs a high voltage signal, T5-16 and T5-18 are turned on, the potential of N5-7 and the potential of N5-8 are low voltage, T5-20 and T5-19 are turned on, ensuring that the potential of NC5-2 and the potential of N5-8 are low voltage, to turn on T5-23, NS (N) outputs a low voltage signal; the potential of N5-8 is low voltage, ensuring that T5-15 is turned on, the potential of N5-7 is low voltage, to turn on T5-9, T5-8, turn on T5-10, pull down the potential of N5-5 and the potential of N5-6, turn on T5-11, GCB writes a high voltage signal to N5-3, the potential of N5-7 is low voltage, to turn on T5-12, pull up the potential of NC5-1 to high voltage, and ensure that T5-22 is turned off.

Optionally, when the display starts (that is, when the display device is turned on), in order to prevent the display screen from flickering when it is turned on, in the power-on phase before the first phase, NCX outputs a low voltage signal, T5-6 is turned on, the potential of N5-1 is a low voltage, and T5-3 is turned on; T5-17 is turned on, the potential of N5-7 is a high voltage, and T5-9 is turned off. When GCK outputs a low voltage signal, T5-8 is turned on, so that the potential of N5-5 is a low voltage, T5-10 is turned on, and the potential of N5-6 is a low voltage. When GCB outputs a low voltage signal, T5-13 is turned on, the potential of NC5-1 is a low voltage, T5-22 is turned on, and NS (N) outputs a high voltage signal; since T5-3 is turned on, NC5-1 is connected to N5-2, and N5-2 has a low voltage potential, T5-4 is turned on, and NO (N) outputs a high voltage signal, which can turn on the second display control transistor M2 included in all pixel circuits in the effective display area, clear the residual charge in the storage capacitor Cst, and improve the poor screen flickering when the power is turned on;

Afterwards, when NS (N) and N3 (N−1) both output low voltage signals, T5-1 and T5-2 are turned on to control the connection between VCT and N5-1;

When VCT provides a low voltage signal, the potential of N5-1 is a low voltage, and C5-1 maintains the potential of N5-1; T5-3 is turned on to control the connection between NC5-1 and N5-2. At this time, the potential of NC5-1 is a high voltage, the potential of N5-2 is a high voltage, T5-4 is turned off, and NC5-2 is low voltage, T5-5 is turned on, and NO (N) outputs a low voltage signal;

When VCT provides a high voltage signal, the potential of N5-1 is high voltage, T5-3 is turned off, NC5-1 and N5-2 are disconnected, C5-1 controls the potential of N5-2 to be high voltage, T5-4 is turned off, the potential of NC5-2 is low voltage, T5-5 is turned on, and NO (N) outputs a low voltage signal;

Afterwards, in the Nth stage of driving signal supplying phase, NS (N) outputs a high voltage signal, at this time, the potential of NC5-1 is low voltage, and the potential of NC5-2 is high voltage;

When the potential of N5-1 is low voltage, T5-3 is turned on, NC5-1 and N5-2 are connected, the potential of N5-2 is low voltage, and T5-4 is turned on, NO (N) outputs a high voltage signal;

When the potential of N5-1 is high voltage, T5-3 is turned off, NC5-1 is disconnected from N5-2, the potential of N5-2 is high voltage, the potential of NC5-2 is high voltage, NO (N) maintains the output of a low voltage signal;

After the Nth stage of driving signal providing phase, when the potential of N5-4 is low voltage, T5-7 is turned on to control the connection between N5-1 and VGL, the potential of N5-1 is low voltage, T5-3 is turned on to control the connection between NC5-1 and N5-2, at this time, the potential of NC5-1 is high voltage, the potential of NC5-2 is low voltage, the potential of N5-2 is high voltage, T5-4 is turned off, T5-5 is turned on, and NO (N) outputs a low voltage signal.

When at least one embodiment of the driving circuit shown in FIG. 73 of the present disclosure is working, when N3 (N−1) outputs a low voltage signal and NS (N) outputs a low voltage signal, T5-1 and T5-2 are turned on, and the state of the gated input signal within a high-low frequency switching cycle can be obtained by simultaneously gating the above two signals.

Figure 74:
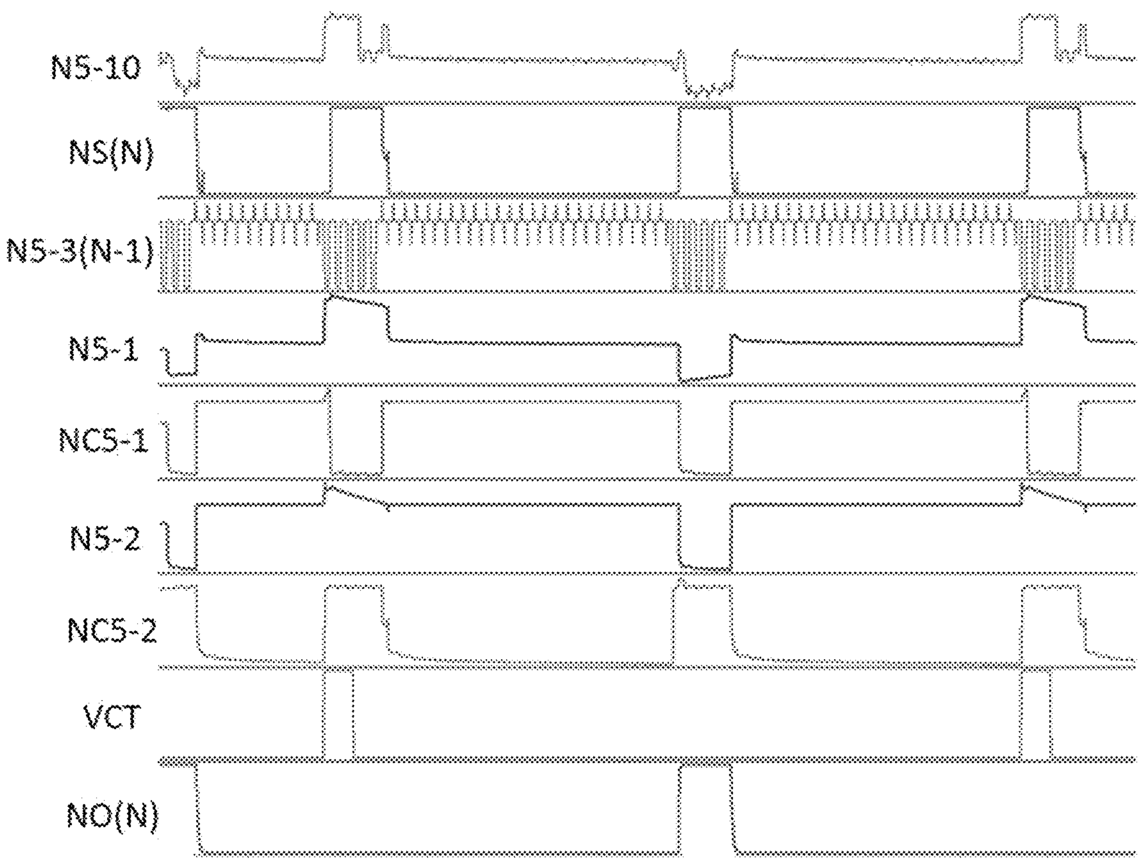
FIG. 74 is a simulation working timing diagram of the driving circuit shown in FIG. 73.
Figure 75:
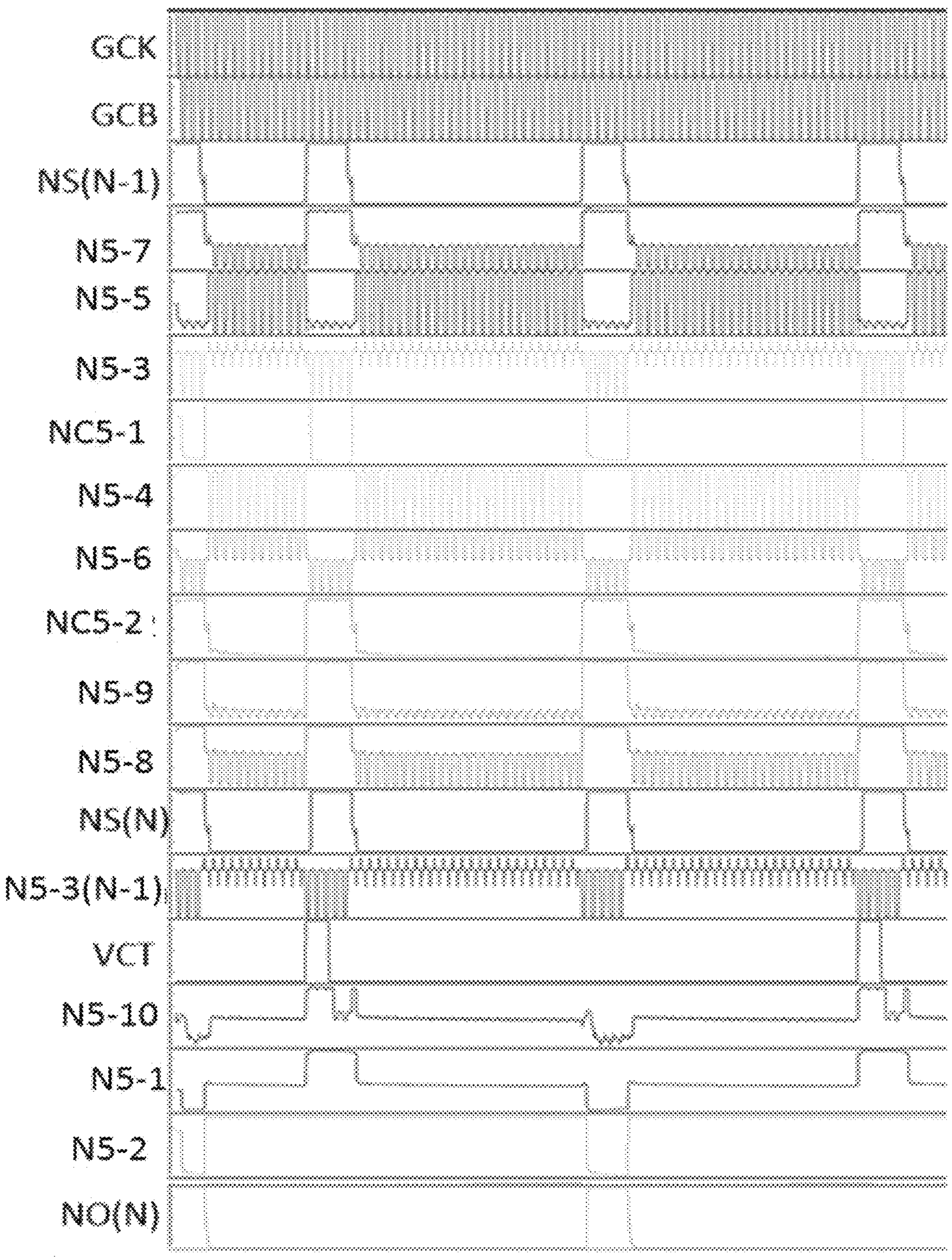
FIG. 75 is a simulation working timing diagram of the driving circuit shown in FIG. 73.

FIG. 74 is a simulation working timing diagram of the driving circuit shown in FIG. 73 of the present disclosure;

FIG. 75 is a simulation working timing diagram of the driving circuit shown in FIG. 73 of the present disclosure.

The difference between at least one embodiment of the driving circuit shown in FIG. 76 of the present disclosure and at least one embodiment of the driving circuit shown in FIG. 73 of the present disclosure is as follows: T5-7 is not provided.

Figure 76:
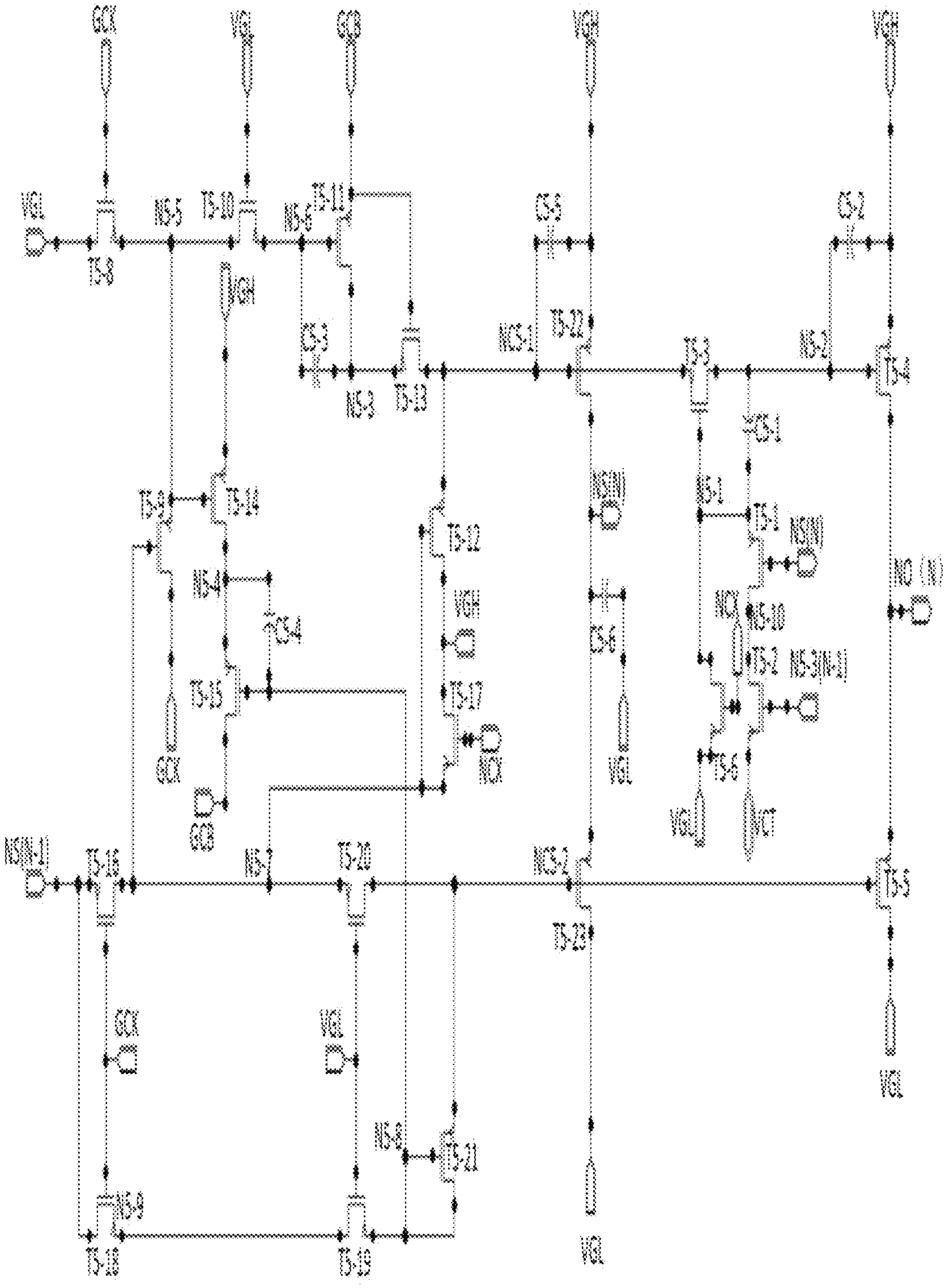
FIG. 76 is a circuit diagram of a driving circuit according to at least one embodiment of the present disclosure.
Figure 77:
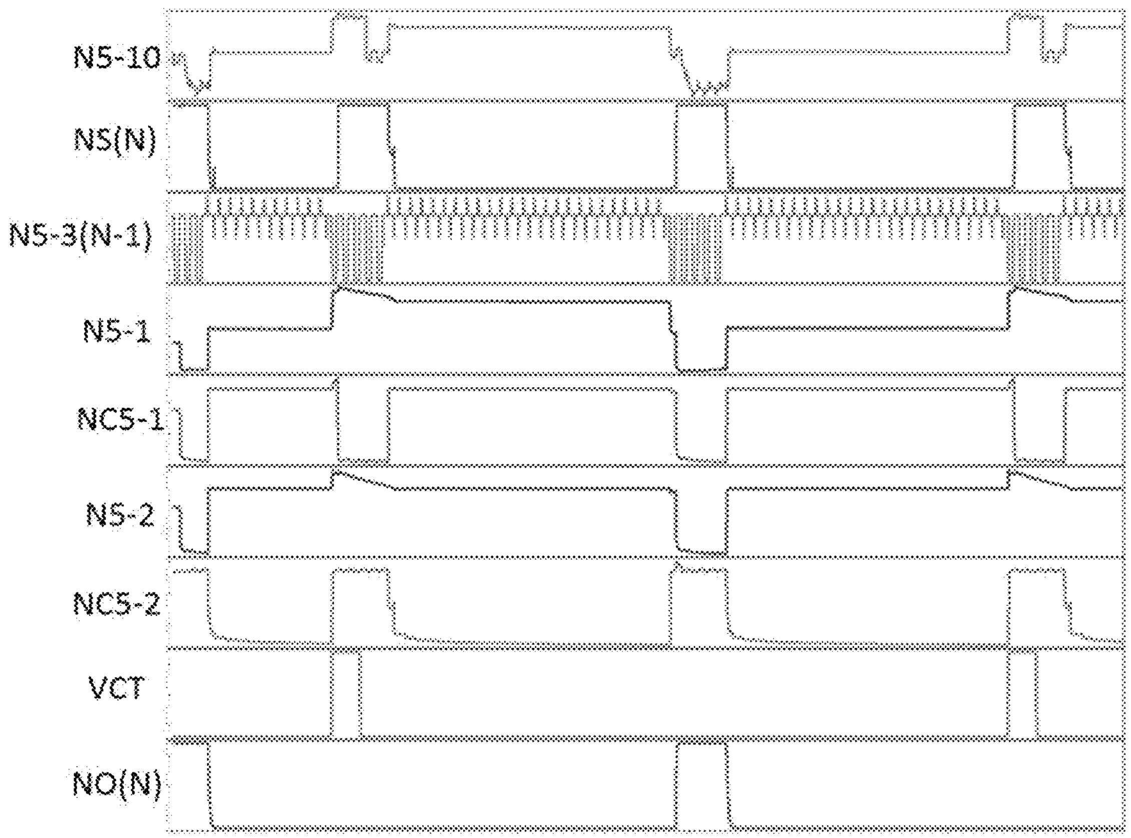
FIG. 77 is a simulation working timing diagram of the driving circuit shown in FIG. 76.

FIG. 77 is a simulation working timing diagram of the driving circuit shown in FIG. 76 of the present disclosure.

The driving method according to the embodiment of the present disclosure is applied to the above-mentioned driving circuit, and the driving method includes:

Generating and outputting, by the first driving signal generation circuit, the Nth stage of driving signal through the Nth stage of driving signal output terminal under the control of the potential of the first first control node and the potential of the first second control node;

Controlling, by the first output control circuit, the connection between the first first control node and the first second node under the control of the potential of the first first node;

Controlling, by the first gating circuit, the gating input signal to be written into the first first node under the control of the gating control signal;

Controlling, by the first first energy storage circuit, the potential of the first second node according to the potential of the first first node;

Controlling, by the first second energy storage circuit, the potential of the first third control node according to the Nth stage of driving output signal provided by the Nth stage of output driving terminal;

Controlling, by the first output circuit, the connection between the Nth stage of output driving terminal and the first voltage terminal under the control of the potential of the first second node, and controlling the connection between the Nth stage of output driving terminal and the second voltage terminal under the control of the potential of the first third control node;

The first third control node and the first second control node are different nodes, and N is a positive integer.

The driving method according to the embodiment of the present disclosure uses the above-mentioned driving circuit, and the driving method includes:

Generating and outputting, by the second driving signal generation circuit, the Nth stage of driving signal through the Nth stage of driving signal output terminal;

Controlling, by the second gating circuit, to write the gating input signal provided by the gating input terminal into the second first node under the control of the gating control signal provided by the gating control terminal;

Performing, by the second output control circuit, an NAND operation on the potential of the Nth stage of driving signal and the second terminal of the second output control circuit to obtain a first output signal;

Inverting, by the second output circuit, the first output signal to obtain and provide an output driving signal through the output driving terminal;

N is a positive integer.

The driving method according to the embodiment of the present disclosure is applied to the above-mentioned driving circuit, and the driving method includes:

Generating and outputting, by the third driving signal generation circuit, the Nth stage of driving signal through the Nth stage of driving signal output terminal under the control of the potential of the third first control node and the potential of the third second control node;

Controlling, by the third output control circuit, the connection between the third first control node and the third second node under the control of the potential of the third first node;

Controlling, by the third gating circuit, to write the gating input signal provided by the gating input terminal into the third first node under the control of the gating control signal;

Controlling, by the third voltage control circuit, the potential of the third second node according to the potential of the third first node;

Controlling, by the third output circuit, the connection between the output driving terminal and the first voltage terminal under the control of the potential of the third second node, and controlling the connection between the output driving terminal and the second voltage terminal under the control of the potential of the third third control node;

The third third control node and the third second control node are different nodes; N is a positive integer.

The driving method according to the embodiment of the present disclosure uses the above-mentioned driving circuit, and the driving method includes:

Generating and outputting, by the fourth driving signal generation circuit, the Nth stage of driving signal through the Nth stage of driving signal output terminal under the control of the potential of the fourth first control node and the potential of the fourth second control node; N is a positive integer;

Controlling, by the fourth output control circuit, the connection between the fourth first control node and the fourth second node under the control of the potential of the fourth first node;

Controlling, by the fourth gating circuit, to write the gating input signal into the fourth first node under the control of the gating control signal;

Controlling, by the fourth voltage control circuit, the potential of the fourth second node according to the potential of the fourth first node;

Controlling, by the fourth second node control circuit, the connection between the fourth second node and the first voltage terminal under the control of the potential of the fourth first node;

Controlling, by the fourth output circuit, the connection between the output driving terminal and the first voltage terminal under the control of the potential of the fourth second node, and controlling the connection between the output driving terminal and the second voltage terminal under the control of the potential of the fourth second control node, and controlling the connection between the output driving terminal and the second voltage terminal under the control of the potential of the fourth first node.

The driving method according to the embodiment of the present disclosure uses the above-mentioned driving circuit, and the driving method includes:

Generating and outputting, by the fifth driving signal generation circuit, the Nth stage of driving signal through the Nth stage of driving signal output terminal under the control of the potential of the fifth first control node and the potential of the fifth second control node;

Controlling, by the fifth gating circuit, to write the gating input signal provided by the gating input terminal into the fifth first node under the control of the gating control signal;

Controlling, by the fifth output control circuit, the connection between the fifth first control node and the fifth second node under the control of the potential of the fifth first node;

Controlling, by the fifth voltage control circuit, the potential of the fifth second node according to the potential of the fifth first node;

Controlling, by the fifth output circuit, the connection between the output driving terminal and the first voltage terminal under the control of the potential of the fifth second node, and controlling the connection between the output driving terminal and the second voltage terminal under the control of the potential of the fifth second control node.

The driving module according to the embodiment of the present disclosure includes a plurality of stages of the above-mentioned driving circuits;

The Nth stage of driving circuit is electrically connected to the driving signal output terminal included in the (N−1)th stage of driving circuit; N is a positive integer.

Figure 78:
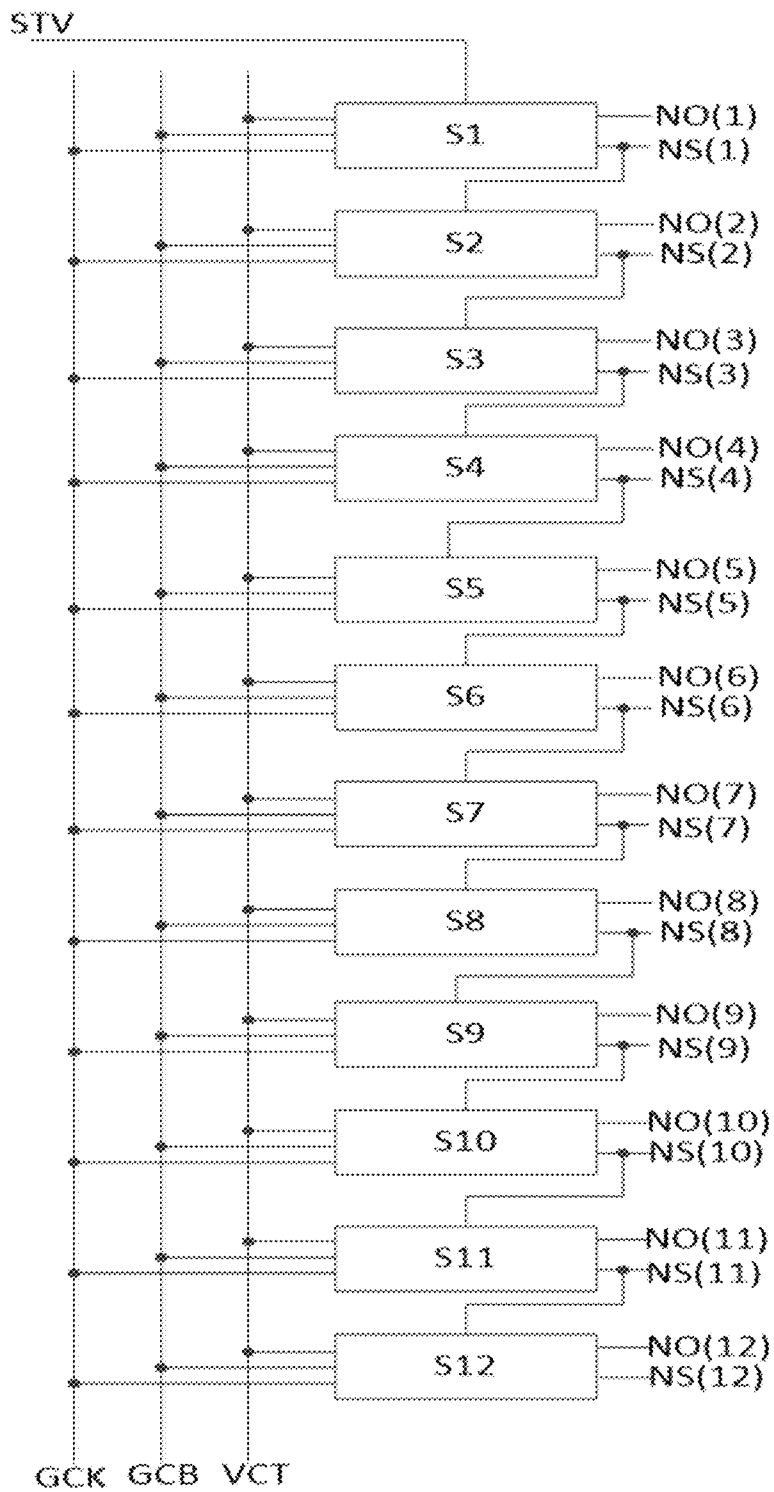
FIG. 78 is a structural diagram of a driving module according to at least one embodiment of the present disclosure.

As shown in FIG. 78, the first stage of driving circuit is labeled S1, the second stage of driving circuit is labeled S2, the third stage of driving circuit is labeled S3, the fourth stage of driving circuit is labeled S4, the fifth stage of driving circuit is labeled S5, the sixth stage of driving circuit is labeled S6, the seventh stage of driving circuit is labeled S7, the eighth stage of driving circuit is labeled S8, the ninth stage of driving circuit is labeled S9, the tenth stage of driving circuit is labeled S10, the eleventh stage of driving circuit is labeled S11, and the twelfth stage of driving circuit is labeled S12;

The terminal labeled NS (1) is the driving signal output terminal of S1, and the terminal labeled NO (1) is the output driving terminal of S1;

The terminal labeled NS (2) is the driving signal output terminal of S2, and the terminal labeled NO (2) is the output driving terminal of S2; S2 is electrically connected to NS (1);

The terminal labeled NS (3) is the driving signal output terminal of S3, and the terminal labeled NO (3) is the output driving terminal of S3; S3 is electrically connected to NS (2);

The terminal labeled NS (4) is the driving signal output terminal of S4, and the terminal labeled NO (4) is the output driving terminal of S4; S4 is electrically connected to NS (3);

The terminal labeled NS (5) is the driving signal output terminal of S5, and the terminal labeled NO (5) is the output driving terminal of S5; S5 is electrically connected to NS (4);

The terminal labeled NS (6) is the driving signal output terminal of S6, and the terminal labeled NO (6) is the output driving terminal of S6; S6 is electrically connected to NS (5);

The terminal labeled NS (7) is the driving signal output terminal of S7, and the terminal labeled NO (7) is the output driving terminal of S7; S7 is electrically connected to NS (6);

The terminal labeled NS (8) is the driving signal output terminal of S8, and the terminal labeled NO (8) is the output driving terminal of S8; S8 is electrically connected to NS (7);

The terminal labeled NS (9) is the driving signal output terminal of S9, and the terminal labeled NO (9) is the output driving terminal of S9; S9 is electrically connected to NS (8);

The terminal labeled NS (10) is the driving signal output terminal of S10, and the terminal labeled NO (10) is the output driving terminal of $10; S10 is electrically connected to NS (9);

The terminal labeled NS (11) is the driving signal output terminal of S11, and the terminal labeled NO (11) is the output driving terminal of S11; S11 is electrically connected to NS (10);

The terminal labeled NS (12) is the driving signal output terminal of S12 The output terminal, labeled NO (12) is the output driving terminal of S12; S12 is electrically connected to NS (11);

S1, S2, S3, S4, S5, S6, S7, S8, S9, S10, S11 and S12 are all electrically connected to the gating input terminal VCT;

S1, S2, S3, S4, S5, S6, S7, S8, S9, S10, S11 and S12 are all electrically connected to the first clock signal terminal GCK;

S1, S2, S3, S4, S5, S6, S7, S8, S9, S10, S11 and S12 are all electrically connected to the second clock signal terminal GCB.

In FIG. 78, the terminal labeled STV is the starting voltage terminal, and S1 is electrically connected to STV.

Figure 79:
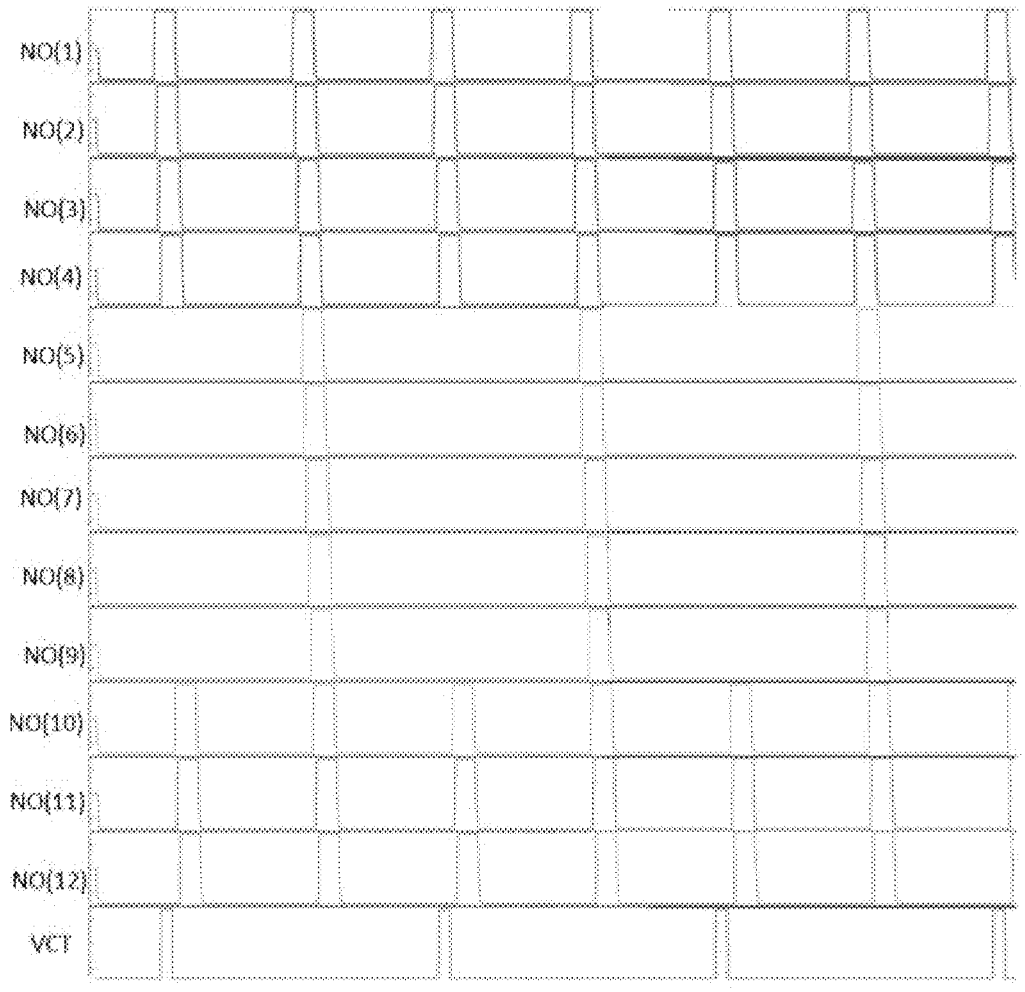
FIG. 79 is a working timing diagram of the driving module shown in FIG. 78.

FIG. 79 is a working timing diagram of the driving module shown in FIG. 78.

At least one embodiment of the driving module shown in FIG. 78 of the present disclosure is in operation. When NS (N−1) outputs a high voltage signal and NS (N) outputs a low voltage signal, if VCT outputs a low voltage signal, then when NS (N) outputs a high voltage signal, NO (N) outputs a high voltage signal;

When NS (N−1) outputs a high voltage signal and NS (N) outputs a low voltage signal, if VCT outputs a high voltage signal, then when NS (N) outputs a high voltage signal, NO (N) outputs a low voltage signal.

Figure 80:
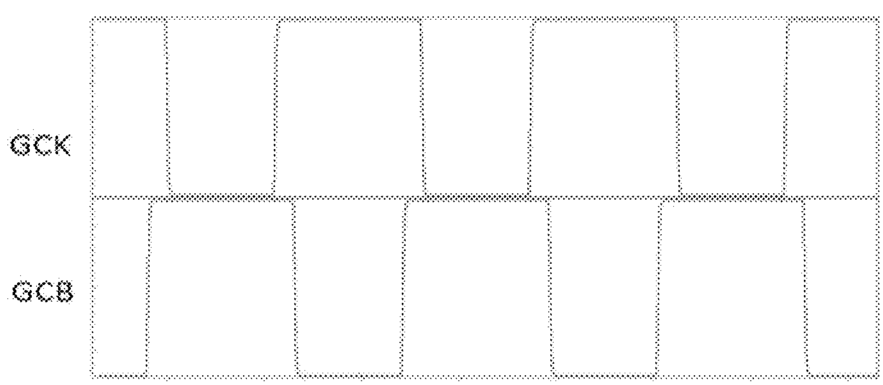
FIG. 80 is a waveform diagram of a first clock signal provided by GCK and a second clock signal provided by GCB.

FIG. 80 is a waveform diagram of the first clock signal provided by GCK and the second clock signal provided by GCB.

The display device according to the embodiment of the present disclosure includes the above-mentioned driving module.

The display device provided in the embodiment of the present disclosure can be any product or component with display function, such as a mobile phone, a tablet computer, a television, a display, a laptop computer, a digital photo frame, a navigator, etc.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A driving circuit, comprising a first driving signal generation circuit, a first output control circuit, a first gating circuit, a first first energy storage circuit, a first second energy storage circuit and a first output circuit; wherein N is a positive integer;

the first driving signal generation circuit is electrically connected to a first first control node, a first second control node and an Nth stage of driving signal output terminal respectively, and is configured to generate and output an Nth stage of driving signal through the Nth stage of driving signal output terminal under the control of a potential of the first first control node and a potential of the first second control node;

the first output control circuit is electrically connected to a first first node, the first first control node and a first second node respectively, and is configured to control to connect the first first control node and the first second node under the control of a potential of the first first node;

the first gating circuit is electrically connected to the first first node, a gating input terminal and a gating control terminal respectively, and is configured to control to write a gating input signal provided by the gating input terminal into the first first node under the control of a gating control signal provided by the gating control terminal;

the first first energy storage circuit is electrically connected to the first first node and the first second node respectively, and is configured to control a potential of the first second node according to the potential of the first first node;

the first second energy storage circuit is electrically connected to a first third control node and an Nth stage of output driving terminal respectively, and is configured to control a potential of the first third control node according to an Nth stage of driving output signal provided by the Nth stage of output driving terminal;

the first output circuit is electrically connected to the first second node, the first third control node, a first voltage terminal, a second voltage terminal and the Nth stage of output driving terminal respectively, and is configured to control the connection between the Nth stage of output driving terminal and the first voltage terminal under the control of the potential of the first second node, and control the connection between the Nth stage of output driving terminal and the second voltage terminal under the control of the potential of the first third control node;

the first third control node and the first second control node are different nodes.

2. The driving circuit according to claim 1, wherein the first gating circuit is configured to control to write the gating input signal provided by the gating input terminal into the first first node when a potential of an (N-1)th stage of the first third node is a second voltage and a potential of an Nth stage of driving signal is the second voltage.

3. The driving circuit according to claim 1, wherein the first gating circuit includes a first first transistor; a gate electrode of the first first transistor is electrically connected to the gating control terminal, a first electrode of the first first transistor is electrically connected to the first first node, and a second electrode of the first first transistor is electrically connected to the gating input terminal.

4. The driving circuit according to claim 1, wherein the gating control terminal includes a first gating control terminal and a second gating control terminal; the first gating circuit includes a first first transistor and a first second transistor;

a gate electrode of the first first transistor is electrically connected to the first gating control terminal, a first electrode of the first first transistor is electrically connected to the first first node, and a second electrode of the first first transistor is electrically connected to a first electrode of the first second transistor;

a gate electrode of the first second transistor is electrically connected to the second gating control terminal, and a second electrode of the first second transistor is electrically connected to the gating input terminal;

the first gating control terminal is the Nth stage of driving signal output terminal, the second gating control terminal is the (N-1)th stage of first third node, and the first first transistor and the first second transistor are both p-type transistors; or, the first gating control terminal is the (N-1)th stage of first third node, the second gating control terminal is the Nth stage of driving signal output terminal, and the first first transistor and the first second transistor are both p-type transistors; or, the first gating control terminal is the (N-1)th stage of driving signal output terminal, the second gating control terminal is the Nth stage of driving signal output terminal, the first first transistor is an n-type transistor, and the first second transistor is a p-type transistor; or, the first gating control terminal is the Nth stage of driving signal output terminal, the second gating control terminal is the (N-1)th stage of driving signal output terminal, the first first transistor is a p-type transistor, and the first second transistor is an n-type transistor; or, the first gating control terminal is connected to an inverted signal of the (N-1)th stage of driving signal, the second gating control terminal is the Nth stage of driving signal output terminal, and the first first transistor and the first second transistor are both p-type transistors; or, the first gating control terminal is the Nth stage of driving signal output terminal, and the second gating control terminal is connected to the inverted signal of the (N-1)th stage of driving signal; the first first transistor and the first second transistor are both p-type transistors; or, the first gating control terminal is the (N-1)th stage of driving signal terminal, the second gating control terminal is connected to an inverted signal of the Nth stage of driving signal, and the first first transistor and the first second transistor are both n-type transistors; or, the first gating control terminal is connected to the inverted signal of the Nth stage of driving signal, the second gating control terminal is the (N-1)th stage of driving signal terminal, and the first first transistor and the first second transistor are both n-type transistors.

5. The driving circuit according to claim 1, wherein the first first energy storage circuit includes a first first capacitor, and the first second energy storage circuit includes a first second capacitor;

a first terminal of the first first capacitor is electrically connected to the first first node, and a second terminal of the first first capacitor is electrically connected to the first second node;

a first terminal of the first second capacitor is electrically connected to the first third control node, and a second terminal of the first second capacitor is electrically connected to the Nth stage of output driving terminal;

or wherein the first output control circuit includes a first third transistor;

a gate electrode of the first third transistor is electrically connected to the first first node, a first electrode of the first third transistor is electrically connected to the first first control node, and a second electrode of the first third transistor is electrically connected to the first second node;

or the driving circuit further includes a first second node control circuit; wherein the first second node control circuit is electrically connected to the first third control node, the first second node and the first voltage terminal, respectively, and is configured to control the connection between the first second node and the first voltage terminal under the control of the potential of the first third control node;

or the driving circuit further includes a first second node control circuit; wherein the first second node control circuit is electrically connected to the first third control node, the Nth stage of output driving terminal, the first second node and the first voltage terminal respectively, and is configured to control the connection between the first second node and the first voltage terminal under the control of the potential of the first third control node and the Nth stage of driving output signal provided by the Nth stage of output driving terminal;

wherein the first second node control circuit comprises a first fourth transistor;

a gate electrode of the first fourth transistor is electrically connected to the first third control node, a first electrode of the first fourth transistor is electrically connected to the first second node, and a second electrode of the first fourth transistor is electrically connected to the first voltage terminal;

wherein the first second node control circuit comprises a first fourth transistor and a first control transistor;

a gate electrode of the first fourth transistor is electrically connected to the first third control node, a first electrode of the first fourth transistor is electrically connected to a second electrode of the first control transistor, and a second electrode of the first fourth transistor is electrically connected to the first voltage terminal; and a gate electrode of the first control transistor is electrically connected to the Nth stage of output driving terminal, and a first electrode of the first control transistor is electrically connected to the first second node.

6. The driving circuit according to claim 1, wherein the first output circuit comprises a first fifth transistor, a first sixth transistor and a first third capacitor;

a gate electrode of the first fifth transistor is electrically connected to the first second node, a first electrode of the first fifth transistor is electrically connected to the first voltage terminal, and a second electrode of the first fifth transistor is electrically connected to the Nth stage of output driving terminal;

a gate electrode of the first sixth transistor is electrically connected to the first third control node, a first electrode of the first sixth transistor is electrically connected to the Nth stage of output driving terminal, and a second electrode of the first sixth transistor is electrically connected to the second voltage terminal;

a first terminal of the first third capacitor is electrically connected to the first second node, and a second terminal of the first third capacitor is electrically connected to the first voltage terminal.

7. The driving circuit according to claim 1, further comprising a first initialization circuit; wherein the first initialization circuit is electrically connected to an initial control terminal, the second voltage terminal and the first first node respectively, and is configured to control the connection between the first first node and the second voltage terminal under the control of an initial control signal provided by the initial control terminal.

8. The driving circuit according to claim 7, wherein the first initialization circuit comprises a first seventh transistor;

a gate electrode of the first seventh transistor is electrically connected to the initial control terminal, a first electrode of the first seventh transistor is electrically connected to the first first node, and a second electrode of the first seventh transistor is electrically connected to the second voltage terminal.

9. The driving circuit according to claim 1, further comprising a first first node control circuit; wherein the first first node control circuit is electrically connected to a first fourth node, the second voltage terminal and the first first node respectively, and is configured to control the connection between the first first node and the second voltage terminal under the control of a potential of the first fourth node.

10. The driving circuit according to claim 9, wherein the first first node control circuit comprises a first eighth transistor;

a gate electrode of the first eighth transistor is electrically connected to the first fourth node, a first electrode of the first eighth transistor is electrically connected to the first first node, and a second electrode of the first eighth transistor is electrically connected to the second voltage terminal.

11. The driving circuit according to claim 1, further comprising a first third control node control circuit; wherein the first third control node control circuit is electrically connected to the first first node, a first fifth node, the first second control node, the first third control node and a first sixth node, respectively, and is configured to control the connection between the first fifth node and the first third control node under the control of the potential of the first first node, control the connection between the first second control node and the first sixth node under the control of the potential of the first sixth node, and control the connection between the first sixth node and the first third control node;

wherein the first third control node control circuit includes a first ninth transistor, a first tenth transistor and a first eleventh transistor;

a gate electrode of the first ninth transistor is electrically connected to the first first node, a first electrode of the first ninth transistor is electrically connected to the first fifth node, and a second electrode of the first ninth transistor is electrically connected to the first third control node;

a gate electrode of the first tenth transistor and a second electrode of the first tenth transistor are both electrically connected to the first sixth node, and a first electrode of the first tenth transistor is electrically connected to the first second control node;

a gate electrode of the first eleventh transistor and a first electrode of the first eleventh transistor are both electrically connected to the first sixth node, and a second electrode of the first eleventh transistor is electrically connected to the first third control node.

12. The driving circuit according to claim 1, further comprising a first output pull-down circuit; wherein the first output pull-down circuit is electrically connected to the first first control node, the Nth stage of driving signal output terminal and the second voltage terminal respectively, and is configured to control the connection between the Nth stage of driving signal output terminal and the second voltage terminal under the control of the potential of the first first control node.

13. The driving circuit according to claim 1, wherein the first driving signal generation circuit includes a first first driving output circuit, a first second driving output circuit, a first first control node control circuit and a first second control node control circuit;

the first first control node control circuit is configured to control the potential of the first control node;

the first second control node control circuit is configured to control the potential of the second control node;

the first first driving output circuit is electrically connected to the first first control node, the first voltage terminal and the Nth stage of driving signal output terminal respectively, and is configured to control the connection between the Nth stage of driving signal output terminal and the first voltage terminal under the control of the potential of the first first control node;

the first second driving output circuit is electrically connected to the first second control node, the second voltage terminal and the Nth stage of driving signal output terminal respectively, and is configured to control the connection between the Nth stage of driving signal output terminal and the second voltage terminal under the control of the potential of the first second control node.

14. The driving circuit according to claim 13, wherein the first first control node control circuit includes a first seventh node control circuit, a first eighth node control circuit, a first third node control circuit and a first first control circuit;

the first seventh node control circuit is electrically connected to a first seventh node, the second voltage terminal, a first clock signal terminal and a first fifth node respectively, and is configured to control the connection between the first seventh node and the second voltage terminal under the control of a first clock signal provided by the first clock signal terminal, and to control the connection between the first seventh node and the first clock signal terminal under the control of a potential of the first fifth node;

the first eighth node control circuit is electrically connected to the second voltage terminal, a first seventh node and a first eighth node respectively, and is configured to control the connection between the first seventh node and the first eighth node under the control of the second voltage signal provided by the second voltage terminal;

the first third node control circuit is electrically connected to the first eighth node, a second clock signal terminal and the first third node respectively, and is configured to control the first third node to be electrically connected to the second clock signal terminal under the control of a potential of the first eighth node, and control the potential of the first third node according to the potential of the first eighth node;

the first first control circuit is electrically connected to the second clock signal terminal, the first third node, the first first control node, the first fifth node and the first voltage terminal respectively, and is configured to control the first third node to be connected to the first first control node under the control of a second clock signal provided by the second clock signal terminal, and control the first first control node to be connected to the first voltage terminal under the control of the potential of the first fifth node.

15. The driving circuit according to claim 14, wherein the first seventh node control circuit includes a first twelfth transistor and a first thirteenth transistor, the first eighth node control circuit includes a first fourteenth transistor, the first third node control circuit includes a first fifteenth transistor and a first fourth capacitor, and the first first control circuit includes a first sixteenth transistor and a first seventeenth transistor;

a gate electrode of the first twelfth transistor is electrically connected to the first clock signal terminal, a first electrode of the first twelfth transistor is electrically connected to the second voltage terminal, and a second electrode of the first twelfth transistor is electrically connected to the first seventh node;

a gate electrode of the first thirteenth transistor is electrically connected to the first fifth node, a first electrode of the first thirteenth transistor is electrically connected to the first seventh node, and a second electrode of the first thirteenth transistor is electrically connected to the first clock signal terminal;

a gate electrode of the first fourteenth transistor is electrically connected to the second voltage terminal, a first electrode of the first fourteenth transistor is electrically connected to the first seventh node, and a second electrode of the first fourteenth transistor is electrically connected to the first eighth node;

a gate electrode of the first fifteenth transistor is electrically connected to the first eighth node, a first electrode of the first fifteenth transistor is electrically connected to the second clock signal terminal, and a second electrode of the first fifteenth transistor is electrically connected to the first third node;

a first terminal of the first fourth capacitor is electrically connected to the first eighth node, and a second terminal of the first fourth capacitor is electrically connected to the first third node;

a gate electrode of the first sixteenth transistor is electrically connected to the second clock signal terminal, a first electrode of the first sixteenth transistor is electrically connected to the first third node, and a second electrode of the first sixteenth transistor is electrically connected to the first first control node;

a gate electrode of the first seventeenth transistor is electrically connected to the first fifth node, a first electrode of the first seventeenth transistor is electrically connected to the first first control node, and a second electrode of the first seventeenth transistor is electrically connected to the first voltage terminal.

16. The driving circuit according to claim 13, wherein the first second control node control circuit includes a first sixth node control circuit, a first fifth node control circuit, a first ninth node control circuit, a first fourth node control circuit and a first second control circuit;

the first sixth node control circuit is electrically connected to the second voltage terminal, the first ninth node, the first sixth node and the first fourth node respectively, and is configured to control the connection between the first ninth node and the first sixth node under the control of the second voltage signal provided by the second voltage terminal, and control the potential of the first sixth node according to the potential of the first fourth node;

the first fifth node control circuit is electrically connected to the (N-1)th stage of driving signal output terminal, the first clock signal terminal, the first fifth node, the initial control terminal and the first voltage terminal respectively, and is configured to control the connection between the first fifth node and the (N-1)th stage of driving signal output terminal under the control of the first clock signal provided by the first clock signal terminal, and control the first fifth node to be connected to the first voltage terminal;

the first ninth node control circuit is electrically connected to the first clock signal terminal, the (N-1)th stage of driving signal output terminal and the first ninth node respectively, and is configured to control the connection between the first ninth node and the (N-1)th stage of driving signal output terminal under the control of the first clock signal provided by the first clock signal terminal;

the first fourth node control circuit is electrically connected to the first seventh node, the first voltage terminal, the first fourth node, the second clock signal terminal and the first sixth node respectively, and is configured to control the connection between the first fourth node and the first voltage terminal under the control of the potential of the first seventh node, and control the connection between the first fourth node and the second clock signal terminal under the control of the potential of the first sixth node;

the first second control circuit is electrically connected to the second voltage terminal, the first fifth node and the first second control node respectively, and is configured to control the connection between the first fifth node and the first second control node under the control of the second voltage signal provided by the second voltage terminal.

17. The driving circuit according to claim 16, wherein the first sixth node control circuit includes a first eighteenth transistor and a first fifth capacitor, the first fifth node control circuit includes a first nineteenth transistor and a first twentieth transistor, the first ninth node control circuit includes a first twenty-first transistor, the first fourth node control circuit includes a first twenty-second transistor and a first twenty-third transistor, and the first second control circuit includes a first twenty-fourth transistor;

a gate electrode of the first eighteenth transistor is electrically connected to the second voltage terminal, a first electrode of the first eighteenth transistor is electrically connected to the first ninth node, and a second electrode of the first eighteenth transistor is electrically connected to the first sixth node;

a first terminal of the first fifth capacitor is electrically connected to the first fourth node, and a second terminal of the first fifth capacitor is electrically connected to the first sixth node;

a gate electrode of the first nineteenth transistor is electrically connected to the first clock signal terminal, a first electrode of the first nineteenth transistor is electrically connected to the (N-1)th stage of driving signal output terminal, and a second electrode of the first nineteenth transistor is electrically connected to the first fifth node;

a gate electrode of the first twentieth transistor is electrically connected to the initial control terminal; a first electrode of the first twentieth transistor is electrically connected to the first voltage terminal, and a second electrode of the first twentieth transistor is electrically connected to the first fifth node;

a gate electrode of the first twenty-first transistor is electrically connected to the first clock signal terminal, a first electrode of the first twenty-first transistor is electrically connected to the (N-1)th stage of driving signal output terminal, and a second electrode of the first twenty-first transistor is electrically connected to the first ninth node;

a gate electrode of the first twenty-second transistor is electrically connected to the first seventh node, a first electrode of the first twenty-second transistor is electrically connected to the first voltage terminal, and a second electrode of the first twenty-second transistor is electrically connected to the first fourth node;

a gate electrode of the first twenty-third transistor is electrically connected to the first sixth node, a first electrode of the first twenty-third transistor is electrically connected to the first fourth node, and a second electrode of the first twenty-third transistor is electrically connected to the second clock signal terminal;

a gate electrode of the first twenty-fourth transistor is electrically connected to the second voltage terminal, a first electrode of the first twenty-fourth transistor is electrically connected to the first ninth node, and a second electrode of the first twenty-fourth transistor is electrically connected to the first second control node.

18. A driving method, applied to the driving circuit according claim 1, comprising:

generating and outputting, by the first driving signal generation circuit, the Nth stage of driving signal through the Nth stage of driving signal output terminal under the control of the potential of the first first control node and the potential of the first second control node;

controlling, by the first output control circuit, the connection between the first first control node and the first second node under the control of the potential of the first first node;

controlling, by the first gating circuit, the gating input signal to be written into the first first node under the control of the gating control signal;

controlling, by the first first energy storage circuit, the potential of the first second node according to the potential of the first first node;

controlling, by the first second energy storage circuit, the potential of the first third control node according to the Nth stage of driving output signal provided by the Nth stage of output driving terminal;

controlling, by the first output circuit, the connection between the Nth stage of output driving terminal and the first voltage terminal under the control of the potential of the first second node, and controlling the connection between the Nth stage of output driving terminal and the second voltage terminal under the control of the potential of the first third control node;

wherein the first third control node and the first second control node are different nodes, and N is a positive integer.

19. A driving module, comprising a plurality of driving circuits according to claim 1; wherein an Nth driving circuit is electrically connected to the driving signal output terminal of an (N-1)th driving circuit; N is a positive integer.

20. A display device, comprising the driving module according to claim 19.

* * * * *